(12) United States Patent
Ito et al.

(10) Patent No.: US 10,103,333 B2
(45) Date of Patent: Oct. 16, 2018

(54) ORGANIC LIGHT-EMITTING DEVICE

(71) Applicant: SAMSUNG DISPLAY CO., LTD., Yongin, Gyeonggi-Do (KR)

(72) Inventors: Naoyuki Ito, Yongin (KR); Seulong Kim, Yongin (KR); Younsun Kim, Yongin (KR); Dongwoo Shin, Yongin (KR); Jungsub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 14/752,534

(22) Filed: Jun. 26, 2015

(65) Prior Publication Data

US 2016/0211459 A1    Jul. 21, 2016

(30) Foreign Application Priority Data

Jan. 21, 2015    (KR) .................. 10-2015-0010027

(51) Int. Cl.
*H01L 51/50*    (2006.01)
*H01L 51/00*    (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS

2006/0043858 A1    3/2006  Ikeda et al.
2006/0158102 A1    7/2006  Kawamura et al.
(Continued)

FOREIGN PATENT DOCUMENTS

JP    2008-235917 A    10/2008
JP    2010-238937    * 10/2010 ............. H01L 50/51
(Continued)

OTHER PUBLICATIONS

U.S. Office Action dated Aug. 3, 2017, issued in cross-reference U.S. Appl. No. 14/752,483 (10 pages).
(Continued)

*Primary Examiner* — Gregory Clark
(74) *Attorney, Agent, or Firm* — Lewis Roca Rothgerber Christie LLP

(57) ABSTRACT

An organic light-emitting device with improved efficiency and improved lifetime includes: a first electrode; a second electrode facing the first electrode; and an organic layer between the first electrode and the second electrode and including an emission layer. The emission layer includes a first material represented by Formula 1, a second material
(Continued)

represented by Formula 2, and a third material different from the second material and represented by Formula 8:

Formula 1

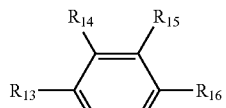

Formula 2

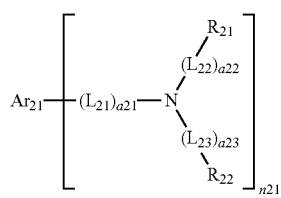

Formula 8

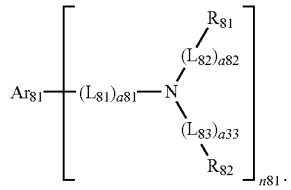

20 Claims, 1 Drawing Sheet

(51) Int. Cl.
*H01L 27/32* (2006.01)
*C09K 11/02* (2006.01)
*C09K 11/06* (2006.01)

(52) U.S. Cl.
CPC ........ *H01L 27/3244* (2013.01); *H01L 51/006* (2013.01); *H01L 51/0059* (2013.01); *H01L 51/0061* (2013.01); *H01L 51/0073* (2013.01); *H01L 51/0094* (2013.01); *C09K 2211/1007* (2013.01); *C09K 2211/1011* (2013.01); *C09K 2211/1014* (2013.01); *H01L 51/0054* (2013.01); *H01L 51/0072* (2013.01); *H01L 2251/5384* (2013.01)

(56) References Cited

U.S. PATENT DOCUMENTS

| | | |
|---|---|---|
| 2009/0053557 A1 | 2/2009 | Spindler et al. |
| 2009/0302313 A1 | 12/2009 | Choi et al. |
| 2011/0037056 A1 | 2/2011 | Dubois et al. |
| 2011/0198580 A1 | 8/2011 | Herron et al. |
| 2011/0248246 A1 | 10/2011 | Ogita et al. |
| 2012/0112169 A1 | 5/2012 | Mizuki et al. |
| 2014/0034943 A1 | 2/2014 | Mizuki et al. |
| 2014/0061599 A1 | 3/2014 | Lee et al. |
| 2014/0159006 A1 | 6/2014 | Yabunouchi et al. |
| 2015/0325800 A1 | 11/2015 | Ito et al. |
| 2016/0181542 A1 | 6/2016 | Kawamura et al. |

FOREIGN PATENT DOCUMENTS

| | | |
|---|---|---|
| JP | 2010-283384 A | 12/2010 |
| JP | 2013-157552 A | 8/2013 |
| KR | 10-0924145 B1 | 10/2009 |
| KR | 10-2010-0057870 A | 6/2010 |
| KR | 10-2011-0104022 A | 9/2011 |
| KR | 10-2011-0114594 A | 10/2011 |
| KR | 10-2012-0039470 A | 4/2012 |
| KR | 10-2014-0031031 A | 3/2014 |
| KR | 10-2014-0091074 A | 7/2014 |

OTHER PUBLICATIONS

Concise Description of Relevance of the Third-Party Submission, submitted in cross-reference U.S. Appl. No. 14/752,508, 11 pages.
Concise Description of Relevance of the Third Party Submission, submitted in cross-reference U.S. Appl. No. 14/752,483, 9 pages.

* cited by examiner

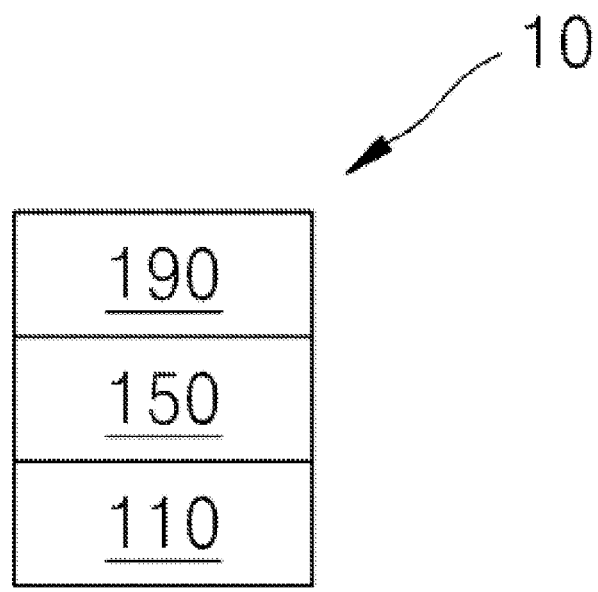

ORGANIC LIGHT-EMITTING DEVICE

CROSS-REFERENCE TO RELATED APPLICATION

This application claims priority to and the benefit of Korean Patent Application No. 10-2015-0010027, filed on Jan. 21, 2015, in the Korean Intellectual Property Office, the entire content of which is incorporated herein by reference.

BACKGROUND

1. Field

One or more embodiments of the present disclosure relate to organic light-emitting devices.

2. Description of the Related Art

Organic light-emitting devices (OLEDs), which are self-emitting devices, have features such as wide viewing angles, excellent contrast, quick response, high brightness, excellent driving voltage characteristics, and can provide multicolored images.

An organic light-emitting device may have a structure in which a first electrode, a hole transport region, an emission layer, an electron transport region, and a second electrode are sequentially disposed in this order on a substrate. Holes injected from the first electrode move to the emission layer via the hole transport region, while electrons injected from the second electrode move to the emission layer via the electron transport region. Carriers such as the holes and electrons recombine in the emission layer to generate excitons. When the excitons drop from an excited state to a ground state, light is emitted.

SUMMARY

Aspects according to one or more embodiments of the present disclosure7 are directed toward organic light-emitting devices.

Additional aspects will be set forth in part in the description which follows and, in part, will be apparent from the description, or may be learned by practice of the presented embodiments.

According to one or more embodiments of the present disclosure, an organic light-emitting device includes: a first electrode; a second electrode facing the first electrode; and an organic layer between the first electrode and the second electrode and including an emission layer.

The emission layer includes a first material represented by Formula 1, a second material represented by Formula 2, and a third material different from the second material and represented by Formula 8:

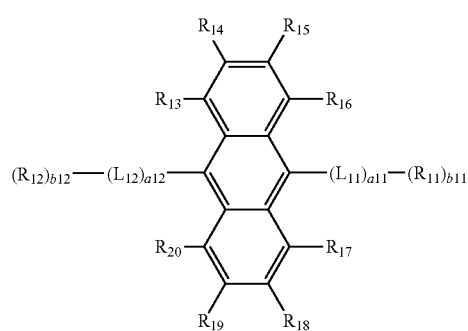

Formula 1

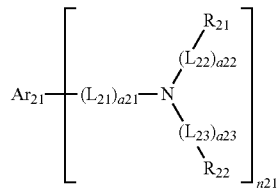

Formula 2

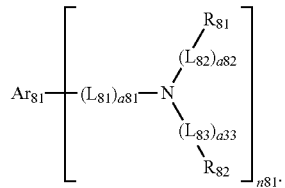

Formula 8

In Formulae 1, 2 and 8, $L_{11}$ and $L_{12}$ are each independently selected from a substituted or unsubstituted $C_6$-$C_{60}$ arylene group, and a substituted or unsubstituted $C_1$-$C_{60}$ heteroarylene group;

a11 and a12 are each independently selected from 0, 1, 2, and 3;

$R_{11}$ and $R_{12}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b11 and b12 are each independently selected from 1, 2, and 3;

$R_{13}$ to $R_{20}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and $Si(Q_1)(Q_2)(Q_3)$;

$Ar_{21}$ is selected from a mono, di, or tri-valent substituted or unsubstituted $C_6$-$C_{60}$ arene and a mono, di, or tri-valent substituted or unsubstituted non-aromatic condensed polycycle, a valency of the $C_6$-$C_{60}$ arene and the non-aromatic condensed polycycle corresponding to a value of n21;

$L_{21}$ to $L_{23}$ are each independently selected from a substituted or unsubstituted $C_6$-$C_{60}$ arylene group, and a substituted or unsubstituted $C_1$-$C_{60}$ heteroarylene group;

a21 to a23 are each independently selected from 0, 1, 2, and 3;

$R_{21}$ and $R_{22}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

n21 is selected from 1, 2, and 3;

$Ar_{81}$ is selected from a mono, di, or tri-valent substituted or unsubstituted $C_6$-$C_{60}$ arene, a mono, di, or tri-valent substituted or unsubstituted non-aromatic condensed polycycle, a mono, di, or tri-valent substituted or unsubstituted non-aromatic condensed heteropolycycle, and a mono, di, or tri-valent substituted or unsubstituted $C_2$-$C_{60}$ alkene, a valency of the $C_6$-$C_{60}$ arene, the non-aromatic condensed polycycle, the non-aromatic condensed heteropolycycle, and the $C_2$-$C_{60}$ alkene corresponding to a value of n81;

$L_{81}$ to $L_{83}$ are each independently selected from a substituted or unsubstituted $C_6$-$C_{60}$ arylene group, and a substituted or unsubstituted $C_1$-$C_{60}$ heteroarylene group;

a81 to a83 are each independently selected from 0, 1, 2, and 3;

$R_{81}$ and $R_{82}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; and n81 is selected from 1, 2, and 3, wherein at least one substituent of the substituted $C_6$-$C_{60}$ arene, the substituted non-aromatic condensed polycycle, the substituted non-aromatic condensed heteropolycycle, the substituted $C_2$-$C_{60}$ alkene, the substituted $C_6$-$C_{60}$ arylene group, the substituted $C_1$-$C_{60}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{11})(Q_{12})(Q_{13})$, —N$(Q_{14})(Q_{15})$, and —B$(Q_{16})(Q_{17})$;

a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{21})(Q_{22})(Q_{23})$, —N$(Q_{24})(Q_{25})$, and —B$(Q_{26})(Q_{27})$; and —Si$(Q_{31})(Q_{32})(Q_{33})$; —N$(Q_{34})(Q_{35})$; and —B$(Q_{36})(Q_{37})$;

$Q_1$ to $Q_3$, $Q_{11}$ to $Q_{17}$, $Q_{21}$ to $Q_{27}$, and $Q_{31}$ to $Q_{37}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

These and/or other aspects will become apparent and more readily appreciated from the following description of the embodiments, taken in connection with the accompanying drawing in which:

The drawing is a schematic view of a structure of an organic light-emitting device according to an embodiment of the present disclosure.

DETAILED DESCRIPTION

Reference will now be made in more detail to certain embodiments, an example of which is illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when a layer, region, or an element is referred to as being "on" another layer, region, or element, the layer, region, or element can be directly on another layer, region, or element, or intervening layers, regions or elements may be present. As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112(a), and 35 U.S.C. §132(a).

In the drawing, sizes and thicknesses of layers, regions, and elements may be exaggerated for clarity, and thus the sizes and thicknesses are not limited thereto.

As used herein, when an organic layer is described as including a first material, the organic layer may include one or at least two first materials represented by Formula 1.

As used herein, the term "organic layer" refers to a single layer and/or a plurality of layers disposed between first and second electrodes of an organic light-emitting device. A material in the "organic layer" is not limited to an organic material.

The drawing is a schematic cross-sectional view of an organic light-emitting device 10 according to an embodiment of the present disclosure. Referring to the drawing, the organic light-emitting device 10 includes a first electrode 110, an organic layer 150, and a second electrode 190.

A substrate may be disposed under the first electrode 110 or on the second electrode 190 in the drawing. The substrate may be a glass or transparent plastic substrate with good mechanical strength, thermal stability, transparency, surface smoothness, ease of handling, and/or water resistance.

For example, the first electrode 110 may be formed by depositing or sputtering a first electrode-forming material on the substrate. When the first electrode 110 is an anode, a material having a high work function may be utilized as the first electrode-forming material to facilitate hole injection. The first electrode 110 may be a reflective electrode, a semi-transmissive electrode, or a transmissive electrode.

Transparent and conductive materials such as ITO, IZO, $SnO_2$, and ZnO may be utilized to form the first electrode. The first electrode 110 as a semi-transmissive electrode or a reflective electrode may be formed of at least one material selected from magnesium (Mg), aluminum (Al), aluminum-lithium (Al—Li), calcium (Ca), magnesium-indium (Mg—In), and magnesium-silver (Mg—Ag).

The first electrode 110 may have a single-layered structure or a multi-layered structure including a plurality of layers. For example, the first electrode 110 may have a three-layered structure of ITO/Ag/ITO, but the structure of the first electrode 110 is not limited thereto.

The organic layer 150 that includes an emission layer (EML) may be disposed on the first electrode 110. The organic layer 150 may include a hole transport region disposed between the first electrode 110 and the EML, and an electron transport region disposed between the EML and the second electrode 190.

For example, the hole transport region may include at least one of a hole injection layer (HIL), a hole transport layer (HTL), a buffer layer (BL), and an electron blocking layer (EBL). For example, the electron transport region may include at least one of a hole blocking layer (HBL), an electron transport layer (ETL), and an electron injection layer (EIL). However, embodiments of the present disclosure are not limited thereto.

The hole transport region may have a single-layered structure including a single material, a single-layered structure including a plurality of materials, or a multi-layered structure including a plurality of layers including different materials.

In some embodiments, the hole transport region may have a single-layered structure including a plurality of materials, or a multi-layered structure of HIL/HTL, HIL/HTL/buffer layer, HIL/buffer layer, HTL/buffer layer, HIL/HTL/EBL, or HTL/EBL, wherein these layers forming a multi-layered structure are sequentially disposed on the first electrode 110 in the order stated above. However, embodiments of the present disclosure are not limited thereto.

When the hole transport region includes an HIL, the HIL may be formed on the first electrode 110 by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like.

When the HIL is formed utilizing vacuum deposition, the deposition conditions may vary depending on the material that is utilized to form the HIL and the structure of the HIL. For example, the deposition conditions may be selected from the following conditions: a deposition temperature of about 100° C. to about 500° C., a degree of vacuum of about $10^{-8}$ to about $10^{-3}$ torr, and a deposition rate of about 0.01 to 100 Å/sec.

When the HIL is formed utilizing spin coating, the coating conditions may vary depending on the material that is utilized to form the HIL and the structure of the HIL. For example, the coating conditions may be selected from the following conditions: a coating rate of about 2,000 rpm to about 5,000 rpm and a heat treatment temperature of about 800° C. to about 200° C.

When the hole transport region includes an HTL, the HTL may be formed on the first electrode 110 or the HIL by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like. When the HTL is formed utilizing vacuum deposition or spin coating, the conditions for deposition and coating may be similar to the above-described deposition and coating conditions for forming the HIL, and accordingly will not be described in more detail here.

In some embodiments, the hole transport region may include at least one of m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (PANI/PSS), a compound represented by Formula 201, and a compound represented by Formula 202.

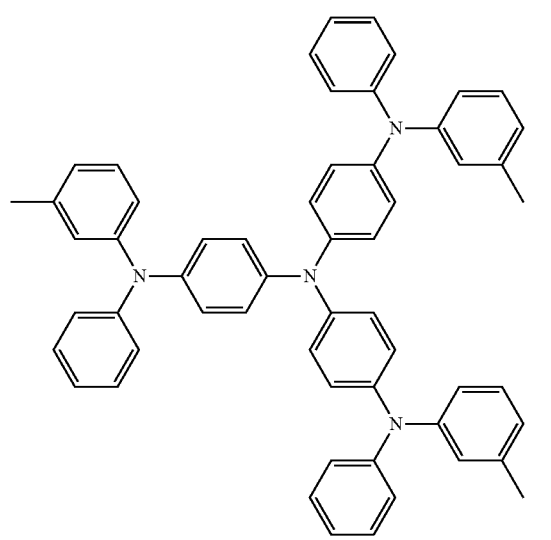

m-MTDATA

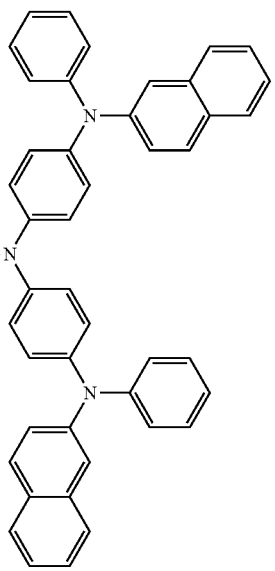

2-TNATA

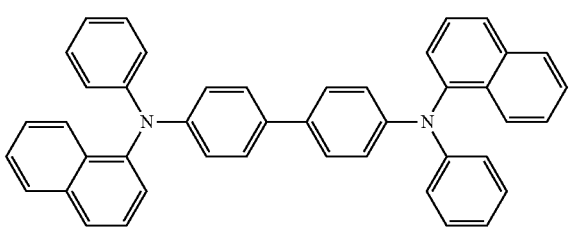

NPB

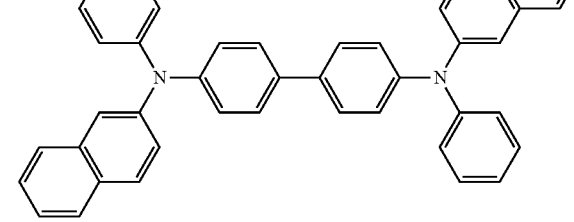

β-NPB

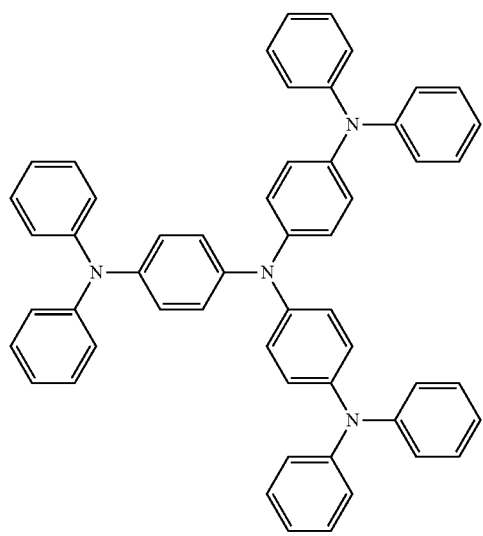

TDATA

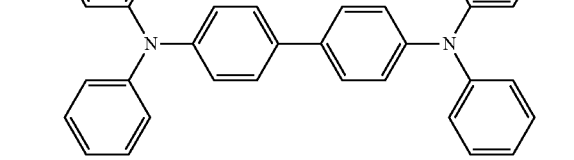

TPD

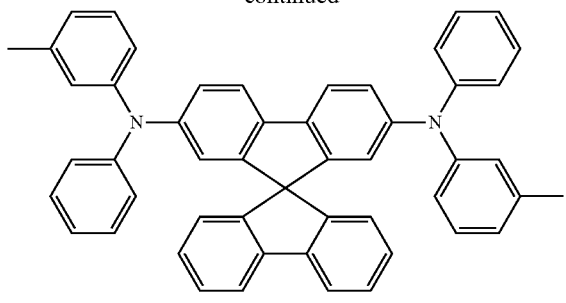

Spiro-TPD

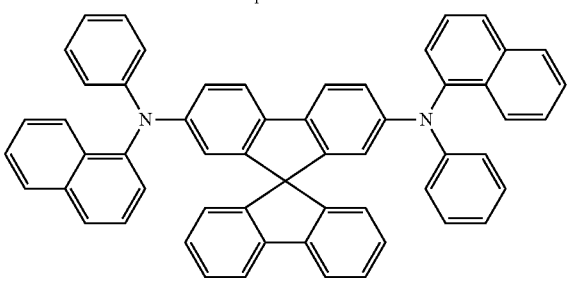

Spiro-NPB

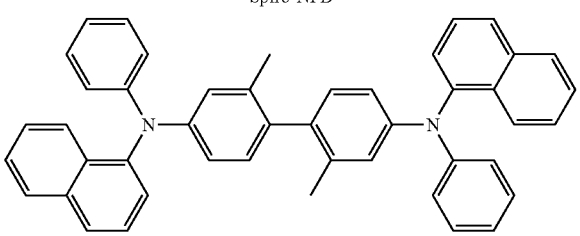

methylated NPB

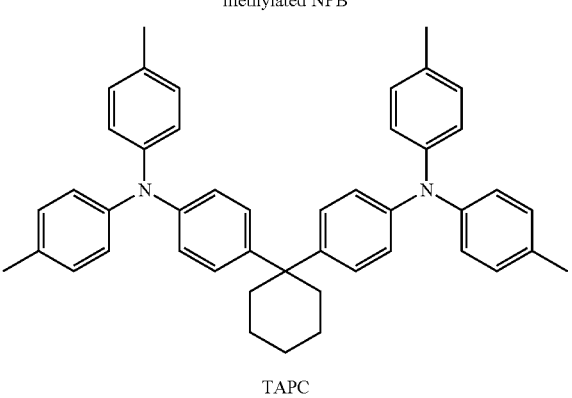

TAPC

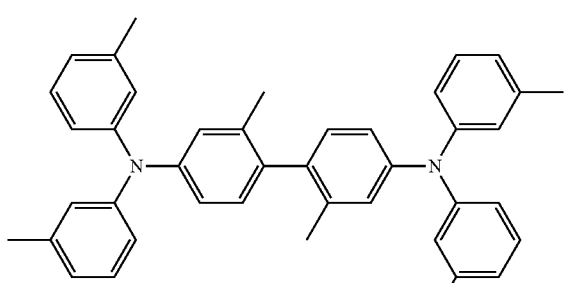

HMTPD

Formula 201

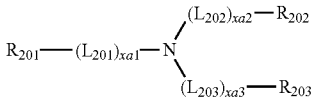

Formula 202

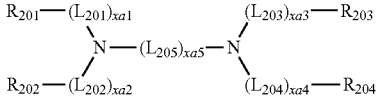

In Formulae 201 and 202, $L_{201}$ to $L_{205}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

At least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{211}$)($Q_{212}$), —Si($Q_{213}$)($Q_{214}$)($Q_{215}$), and —B($Q_{216}$)($Q_{217}$); and —N($Q_{221}$)($Q_{222}$), —Si($Q_{223}$)($Q_{224}$)($Q_{225}$) and —B($Q_{226}$)($Q_{227}$);

xa1 to xa4 may be each independently selected from 0, 1, 2, and 3;

xa5 may be selected from 1, 2, 3, 4, and 5; and $R_{201}$ to $R_{204}$ may be each independently selected from:

a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{231}$)($Q_{232}$), —Si($Q_{233}$)($Q_{234}$)($Q_{235}$), and —B($Q_{236}$)($Q_{237}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{241}$)($Q_{242}$), —Si($Q_{243}$)($Q_{244}$)($Q_{245}$), and —B($Q_{246}$)($Q_{247}$).

$Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201 and 202, $L_{201}$ to $L_{205}$ may be each independently selected from:

a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

For example, the compound of Formula 201 may be a compound represented by Formula 201A.

Formula 201A

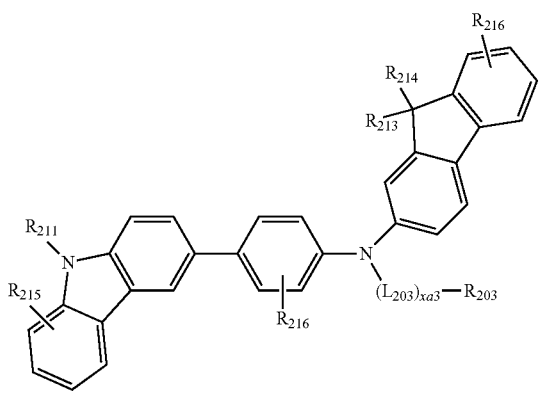

For example, the compound of Formula 201 may be a compound represented by Formula 201A-1, but it is not limited thereto:

Formula 201A-1

The compound of Formula 202 may be a compound represented by Formula 202A, but it is not limited thereto.

Formula 202A

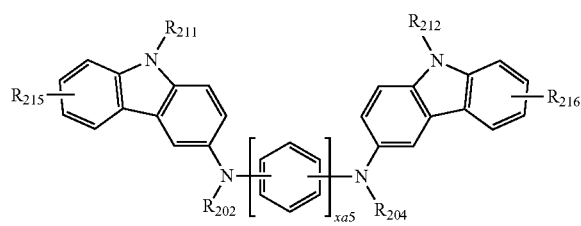

In Formulae 201A, 201A-1, and 202A, $L_{201}$ to $L_{203}$, xa1 to xa3, xa5, and $R_{202}$ to $R_{204}$ may be defined the same as those defined above with respect to Formulae 201 and 202;

$R_{211}$ and $R_{212}$ may be defined the same as $R_{203}$ defined above with respect to Formulae 201 and 202; and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from:

a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{202}$ to $R_{204}$, $R_{211}$ and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof;

a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be linked to each other to form a saturated or unsaturated ring.

The compound of Formula 201 and the compound of Formula 202 may be each independently selected from Compounds HT1 to HT20, but the compound of Formula 201 and the compound of Formula 202 are not limited thereto.

HT1

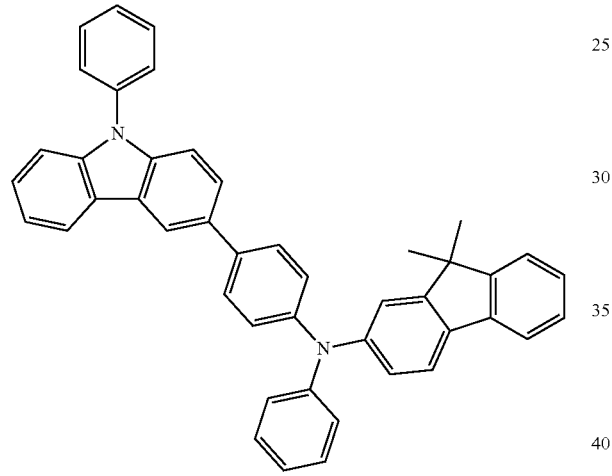

HT2

HT3

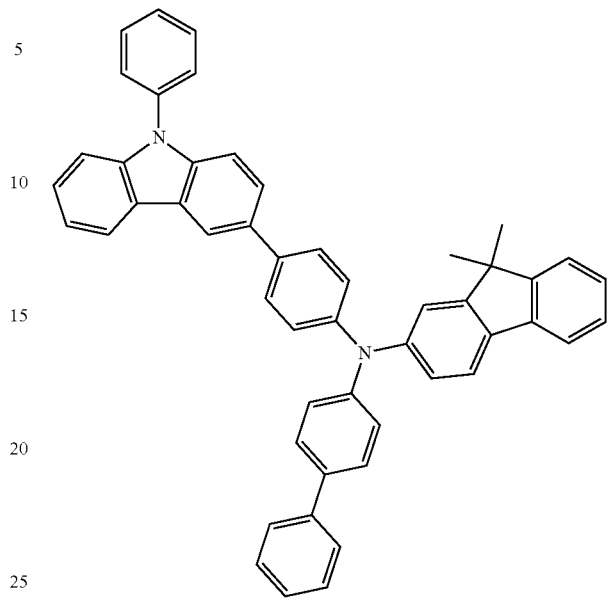

HT4

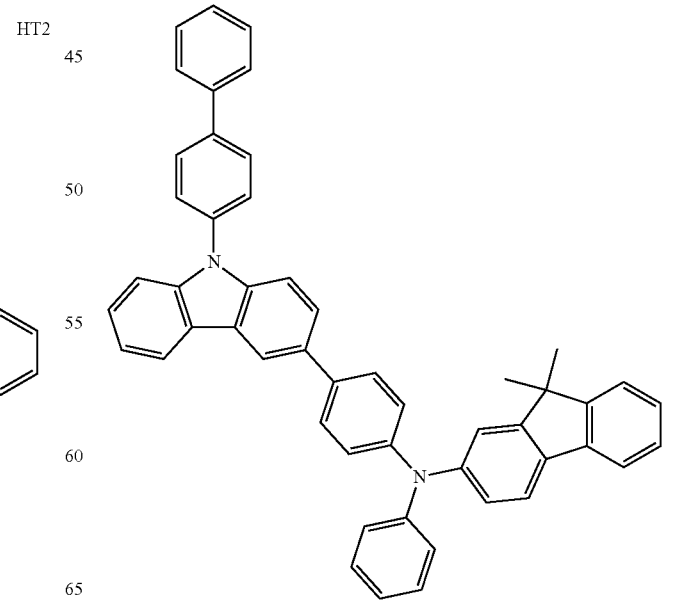

HT5
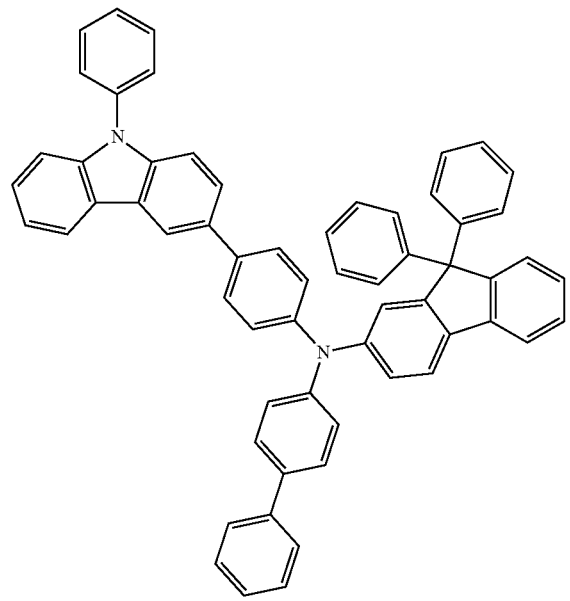
HT6
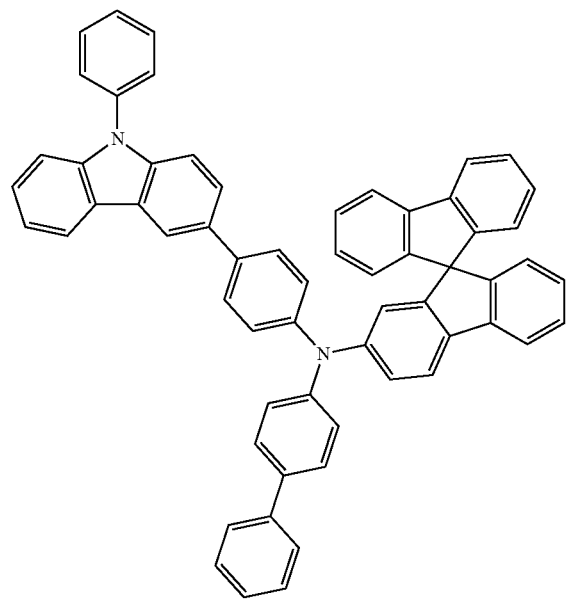
HT7
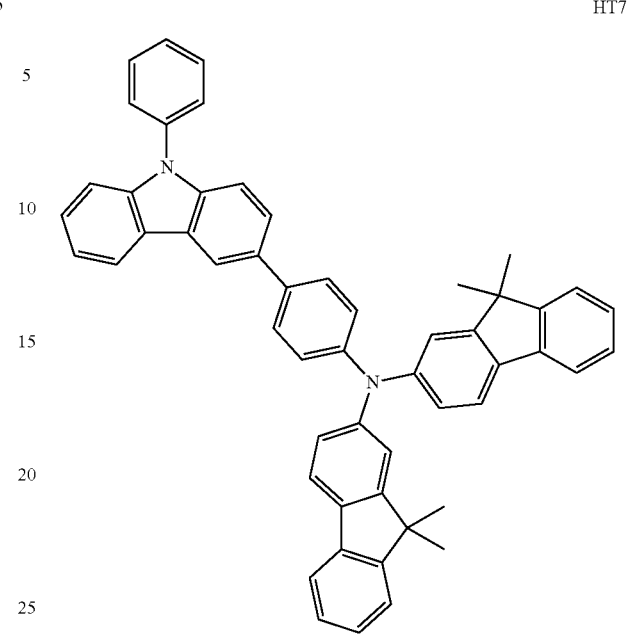
HT8
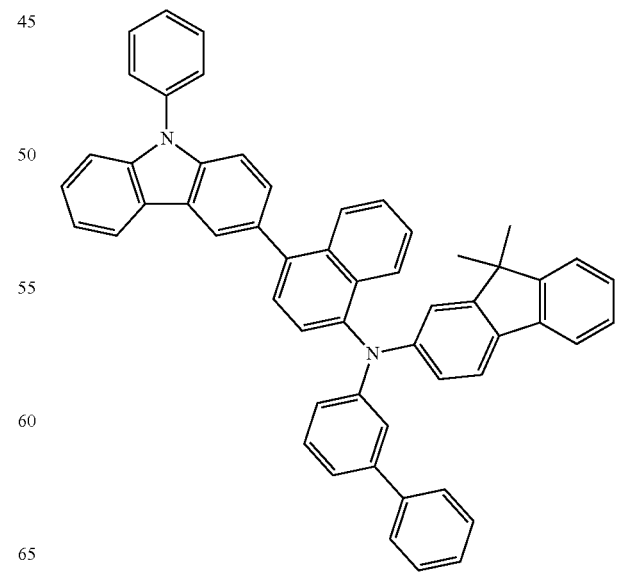

HT9
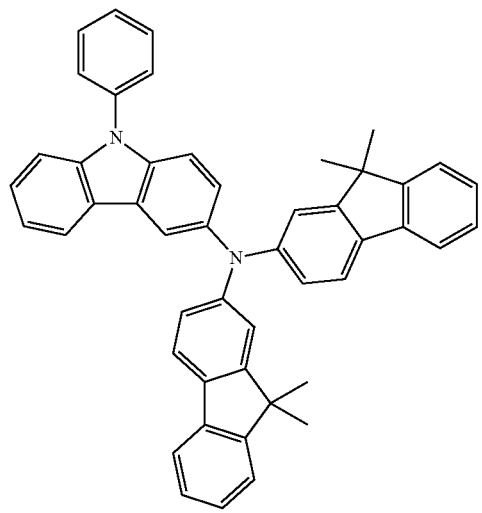
HT10
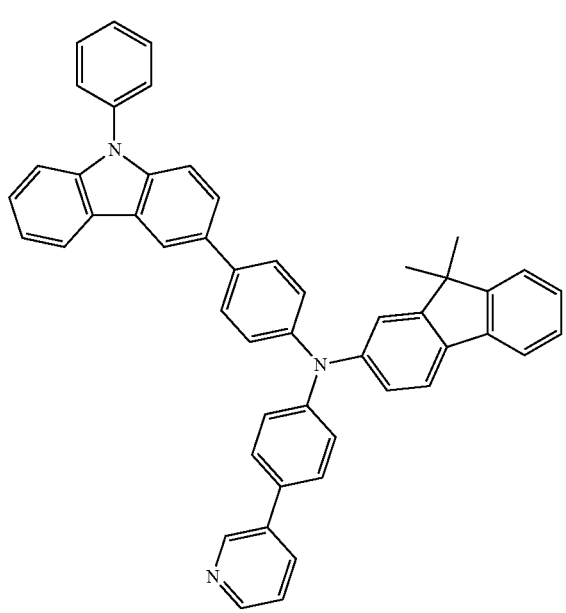
HT11
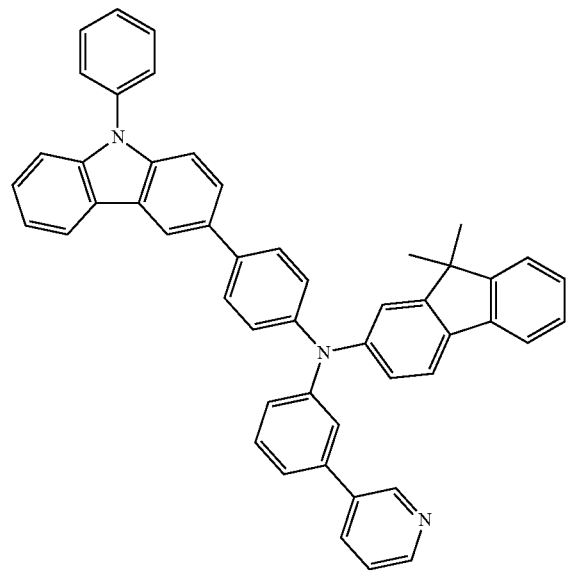
HT12
HT13

HT14

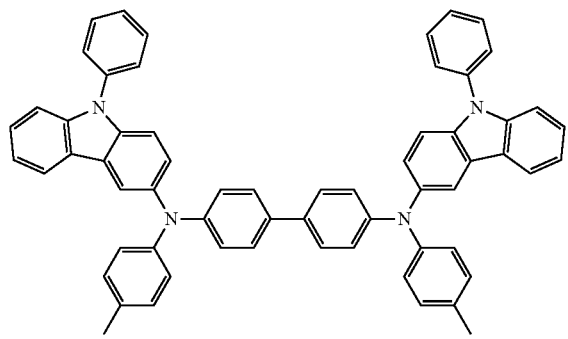

HT15

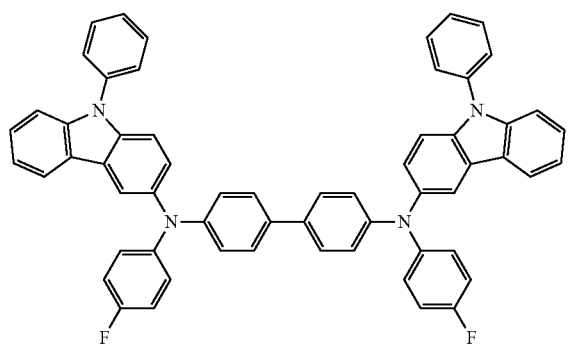

HT16

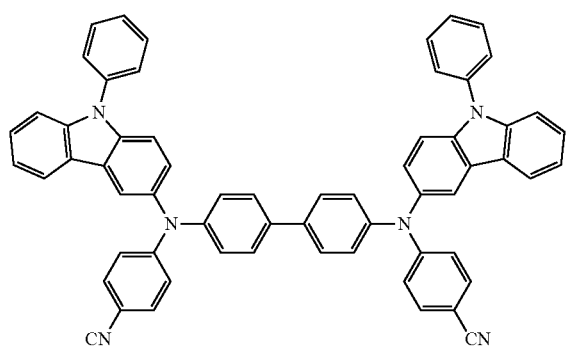

HT17

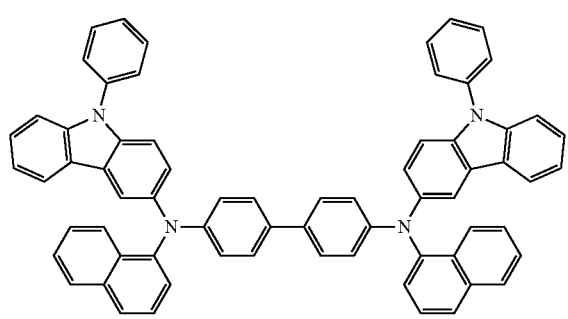

HT18

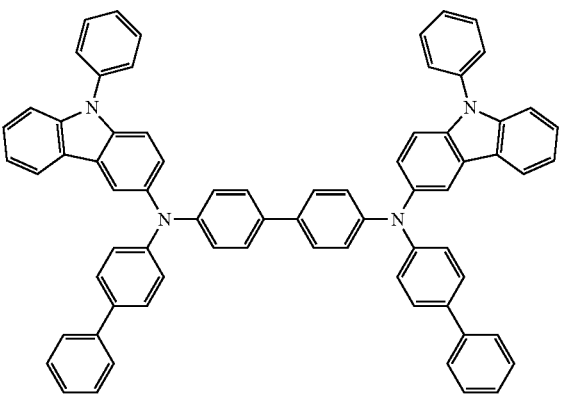

HT19

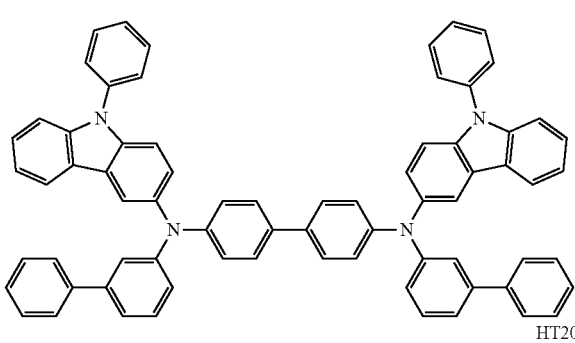

HT20

A thickness of the hole transport region may be from about 100 Å to about 10000 Å, and in some embodiments, from about 100 Å to about 1000 Å. When the hole transport region includes an HIL and an HTL, a thickness of the HIL may be from about 100 Å to about 10,000 Å, and in some embodiments, from about 100 Å to about 1,000 Å; and a thickness of the HTL may be from about 50 Å to about 2,000 Å, and in some embodiments, from about 100 Å to about 1,500 Å. In one embodiment, when the thicknesses of the hole transport region, the HIL, and the HTL are within these ranges, satisfactory or suitable hole transport characteristics are obtained without a substantial increase in driving voltage.

The hole transport region may further include a charge-generating material to improve the conductivity, in addition to the materials described above. The charge-generating material may be homogeneously or inhomogeneously dispersed in the hole transport region.

The charge-generating material may be, for example, a p-dopant. The p-dopant may be one of quinine derivatives, metal oxides, and cyano group-containing compounds, but it is not limited thereto. Non-limiting examples of the p-dopant are quinone derivatives (such as tetracyanoquinonedimethane (TCNQ), 2,3,5,6-tetrafluoro-tetracyano-1,4-benzoquinonedimethane (F4-TCNQ), or the like); metal oxides (such as tungsten oxide, molybdenum oxide, or the like); and Compound HT-D1.

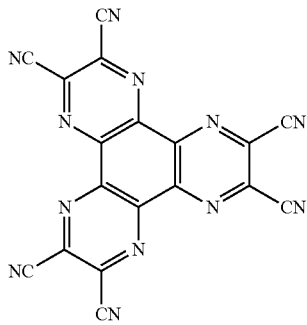

Compound HT-D1

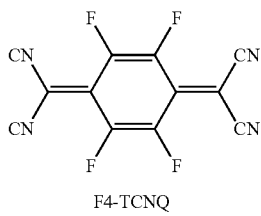

F4-TCNQ

The hole transport region may further include at least one of a buffer layer and an EBL, in addition to the HIL and HTL described above. The buffer layer may compensate for an optical resonance distance of light according to a wavelength of the light emitted from the EML, and thus may improve the light-emission efficiency. A material in the buffer layer may be any suitable material utilized in the hole transport region. The EBL may block migration of electrons from the electron transport region into the EML.

The EML may be formed on the first electrode 110 or the hole transport region by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like. When the EML is formed utilizing vacuum deposition or spin coating, the deposition and coating conditions for forming the EML may be similar to the above-described deposition and coating conditions for forming the HIL, and accordingly will not be described in more detail here.

When the organic light-emitting device 10 is a full color organic light-emitting device, the EML may be patterned into a red emission layer, a green emission layer, and a blue emission layer to correspond to individual subpixels, respectively. In other words, each subpixel may include a red emission layer, a green emission layer, or a blue emission layer. Each subpixel may include a single EML.

The EML may include a host and a dopant.

The host may include a first material represented by Formula 1 and a second material represented by Formula 2:

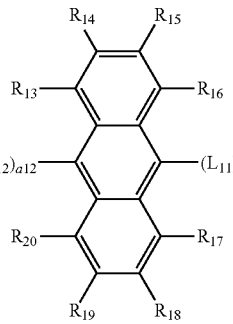

Formula 1

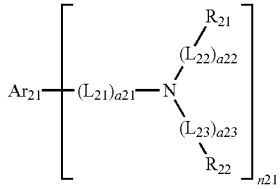

Formula 2

In Formula 1, $L_{11}$ and $L_{12}$ may be each independently selected from a substituted or unsubstituted $C_6$-$C_{60}$ arylene group, and a substituted or unsubstituted $C_1$-$C_{60}$ heteroarylene group.

At least one substituent of the substituted $C_6$-$C_{60}$ arylene group, and the substituted $C_1$-$C_{60}$ heteroarylene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$) and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 1, $L_{11}$ and $L_{12}$ may be each independently selected from:

a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

However, embodiments of the present disclosure are not limited thereto.

In some embodiments, in Formula 1, $L_{11}$ and $L_{12}$ may be each independently selected from:

a phenylene group and a naphthylene group; and a phenylene group and a naphthylene group, each substituted with at least one of a deuterium, —F, —Cl, —Br, —I, a cyano group, a nitro group, a $C_1$-$C_{20}$ alkyl group, a phenyl group, and a naphthyl group. However, embodiments of the present disclosure are not limited thereto.

In some other embodiments, in Formula 1, $L_{11}$ and $L_{12}$ may be each independently selected from groups represented by Formulae 3-1 to 3-15, but $L_{11}$ and $L_{12}$ are not limited thereto.

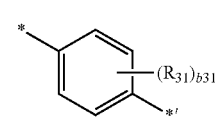

3-1

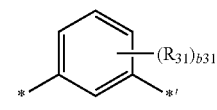

3-2

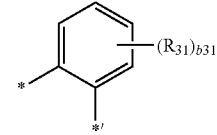

3-3

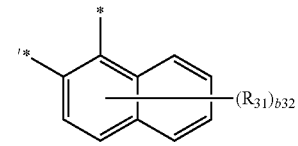

3-4

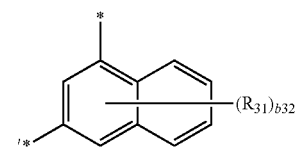

3-5

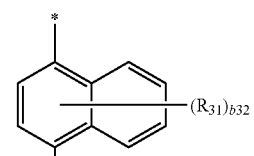

3-6

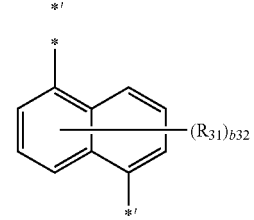

3-7

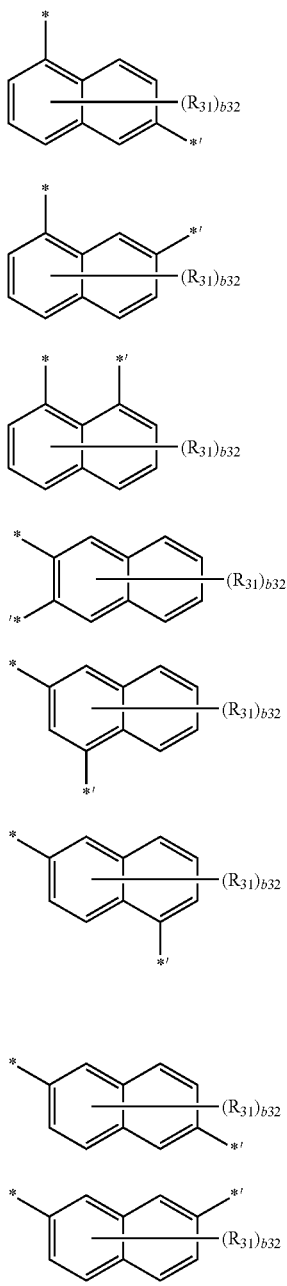

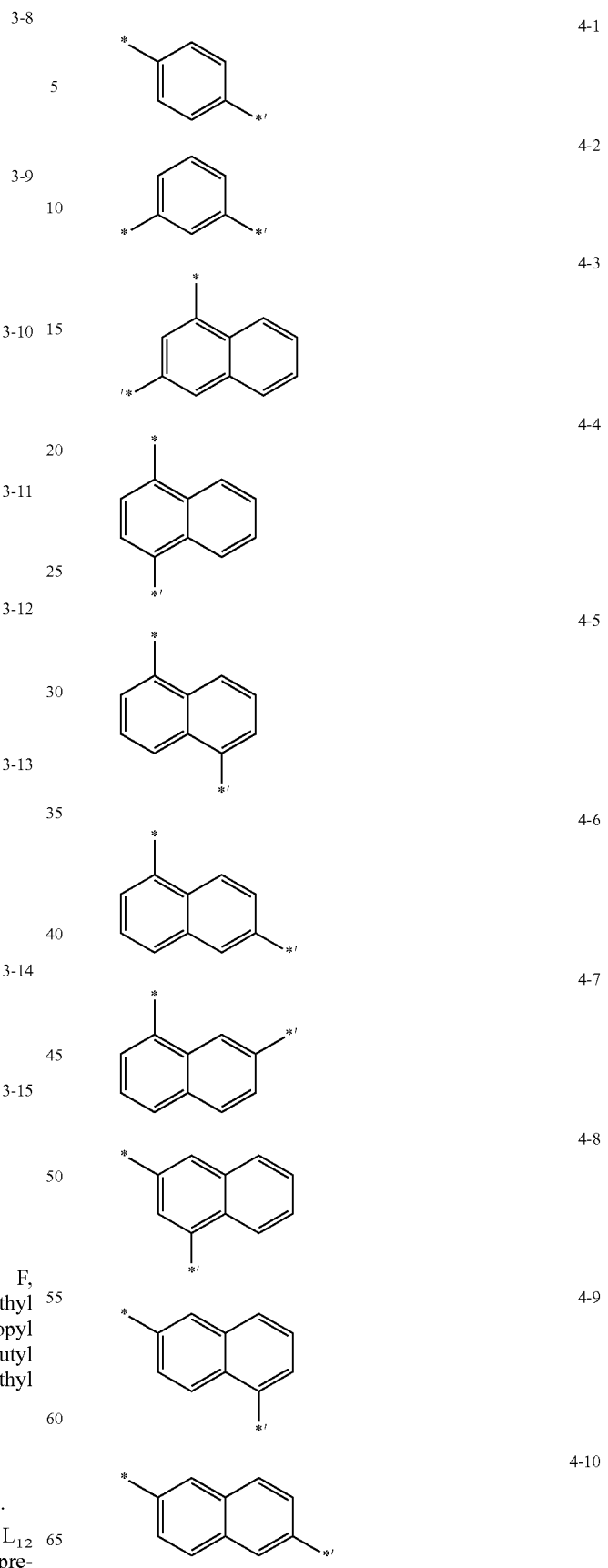

In Formulae 3-1 to 3-15, $R_{31}$ may be selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6; and

* and *' may be binding sites with an adjacent atom.

In some other embodiments, in Formula 1, $L_{11}$ and $L_{12}$ may be each independently selected from groups represented by Formulae 4-1 to 4-11, but are not limited thereto.

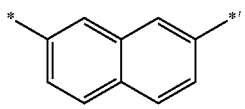

4-11

In Formulae 4-1 to 4-11, * and *' may be binding sites with an adjacent atom.

In Formula 1, a11, which indicates the number of $L_{11}$s, may be selected from 0, 1, 2, and 3. When a11 is 0, $(L_{11})_{a11}$ indicates a single bond. When a11 is 2 or greater, the plurality of $L_{11}$s may be the same or different. For example, in Formula 1, a11 may be selected from 0 and 1, but it is not limited thereto.

In Formula 1, a12, which indicates the number of $L_{12}$s, may be selected from 0, 1, 2, and 3. When a12 is 0, $(L_{12})_{a12}$ indicates a single bond. When a12 is 2 or greater, the plurality of $L_{12}$S may be the same or different. For example, in Formula 1, a12 may be selected from 0 and 1, but it is not limited thereto.

In Formula 1, $R_{11}$ and $R_{12}$ may be each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

At least one substituent of the substituted $C_6$-$C_{60}$ aryl group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 1, $R_{11}$ and $R_{12}$ may be each independently selected from:

a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group. However, embodiments of the present disclosure are not limited thereto.

In some other embodiments, in Formula 1, $R_{11}$ and $R_{12}$ may be each independently selected from:

a phenyl group, a naphthyl group, a fluorenyl group, a phenanthrenyl group, an anthracenyl group, a dibenzofuranyl group, and a dibenzothiophenyl group; and a phenyl group, a naphthyl group, a fluorenyl group, a phenanthrenyl group, an anthracenyl group, a dibenzofuranyl group, and a dibenzothiophenyl group, each substituted with at least one of a methyl group, an ethyl group, an n-propyl group, an iso-propyl group, an n-butyl group, a sec-butyl group, an iso-butyl group, a tert-butyl group, a phenyl group, and a naphthyl group. However, embodiments of the present disclosure are not limited thereto.

In some other embodiments, in Formula 1, $R_{11}$ and $R_{12}$ may be each independently selected from groups represented by Formulae 5-1 to 5-26, but are not limited thereto.

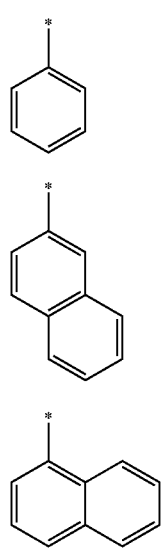

5-1

5-2

5-3

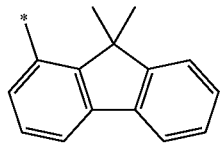

5-4

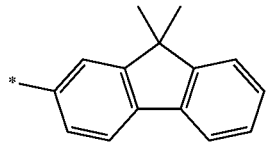

5-5

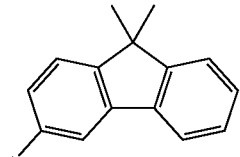

5-6

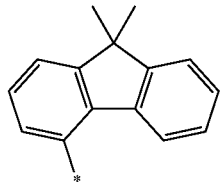

5-7

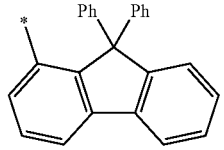

5-8

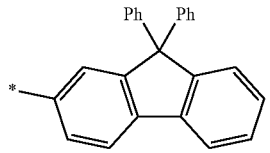

5-9

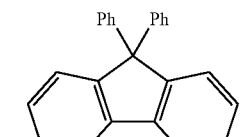

5-10

5-11

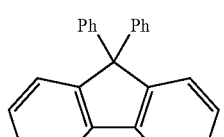

5-12

-continued

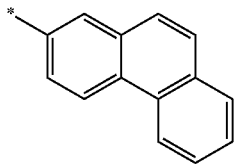
5-13

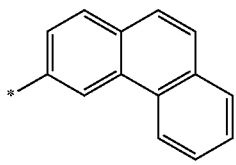
5-14

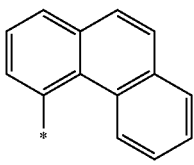
5-15

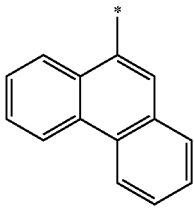
5-16

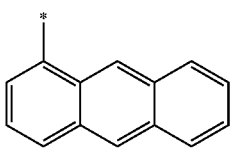
5-17

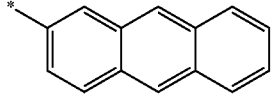
5-18

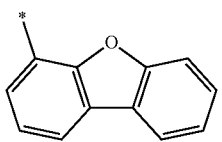
5-19

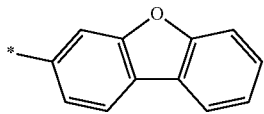
5-20

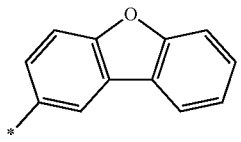
5-21

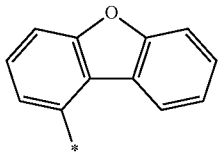
5-22

-continued

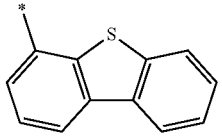
5-23

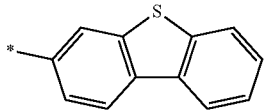
5-24

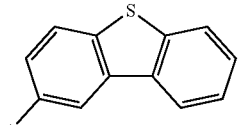
5-25

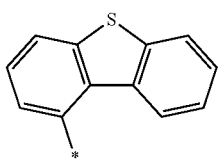
5-26

In Formulae 5-1 to 5-26,

Ph is a phenyl group; and

* is a binding site with an adjacent atom.

In Formula 1, b11, which indicates the number of $R_{11}$s, may be selected from 1, 2, and 3. When b11 is 2 or greater, the plurality of $R_{11}$s may be the same or different. For example, in Formula 1, b11 may be selected from 1 and 2, but it is not limited thereto. For example, in Formula 1, b11 may be 1, but it is not limited thereto.

In Formula 1, b12, which indicates the number of $R_{12}$s, may be selected from 1, 2, and 3. When b12 is 2 or greater, the plurality of $R_{12}$s may be the same or different. For example, in Formula 1, b12 may be selected from 1 and 2, but it is not limited thereto. For example, in Formula 1, b12 may be 1, but it is not limited thereto.

In Formula 1, $R_{13}$ to $R_{20}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$).

At least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_1$ to $Q_3$, $Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 1, $R_{13}$ to $R_{20}$ may be each independently selected from a hydrogen, a deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, and —Si($Q_1$)($Q_2$)($Q_3$); $Q_1$ to $Q_3$ may be each independently selected from a $C_1$-$C_{60}$ alkyl group and a $C_6$-$C_{60}$ aryl group. However, embodiments of the present disclosure are not limited thereto.

In some other embodiments, in Formula 1, $R_{13}$ to $R_{20}$ may be each independently selected from a hydrogen, a deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a naphthyl group, a pyridinyl group, and —Si($Q_1$)($Q_2$)($Q_3$); $Q_1$ to $Q_3$ may be each independently selected from a methyl group, an ethyl group, an n-propyl group, an iso-propyl group, and a phenyl group. However, embodiments of the present disclosure are not limited thereto.

In some other embodiments, in Formula 1, $R_{13}$ to $R_{20}$ may be each independently selected from a hydrogen, a deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, and —Si($CH_3$)$_3$, but embodiments of the present disclosure are not limited thereto.

In Formula 2, $Ar_{21}$ may be selected from a mono, di, or tri-valent substituted or unsubstituted $C_6$-$C_{60}$ arene and a mono, di, or tri-valent substituted or unsubstituted non-aromatic condensed polycycle, the valency of the $C_6$-$C_{60}$ arene and the non-aromatic condensed polycycle corresponding to (i.e., having the same value as) the value of n21 (e.g., $Ar_{21}$ may be selected from an n21-valent substituted or unsubstituted $C_6$-$C_{60}$ arene and an n21-valent substituted or unsubstituted non-aromatic condensed polycycle). At least one substituent of the substituted $C_6$-$C_{60}$ arene and the substituted non-aromatic condensed polycycle may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 2, $Ar_{21}$ may be selected from:

a mono, di, or tri-valent benzene, a mono, di, or tri-valent naphthalene, a mono, di, or tri-valent anthracene, a mono, di, or tri-valent phenanthrene, a mono, di, or tri-valent triphenylene, and a mono, di, or tri-valent fluorene (e.g., an n21-valent benzene, an n21-valent naphthalene, an n21-valent anthracene, an n21-valent phenanthrene, an n21-valent triphenylene, and an n21-valent fluorene); and a mono, di, or tri-valent benzene, a mono, di, or tri-valent naphthalene, a mono, di, or tri-valent anthracene, a mono, di, or tri-valent phenanthrene, a mono, di, or tri-valent triphenylene, and a mono, di, or tri-valent fluorene (e.g., an n21-valent benzene, an n21-valent naphthalene, an n21-valent anthracene, an n21-valent phenanthrene, an n21-valent triphenylene, and an n21-valent fluorene), each substituted with at least one of a methyl group, a phenyl group, and a naphthyl group. However, embodiments of the present disclosure are not limited thereto.

In some other embodiments, in Formula 2, $Ar_{21}$ may be selected from:

a mono, di, or tri-valent benzene and a mono, di, or tri-valent naphthalene (e.g., an n21-valent benzene and an n21-valent naphthalene); and a mono, di, or tri-valent benzene and a mono, di, or tri-valent naphthalene (e.g., an n21-valent benzene and an n21-valent naphthalene), each substituted with at least one of a phenyl group, and a naphthyl group. However, embodiments of the present disclosure are not limited thereto.

In some other embodiments, in Formula 2, $Ar_{21}$ may be selected from a mono, di, or tri-valent benzene and a mono, di, or tri-valent naphthalene (e.g., an n21-valent benzene and an n21-valent naphthalene), but it is not limited thereto.

In Formula 2, $L_{21}$ to $L_{23}$ may be each independently selected from a substituted or unsubstituted $C_6$-$C_{60}$ arylene group and a substituted or unsubstituted $C_1$-$C_{60}$ heteroarylene group.

At least one substituent of the substituted $C_6$-$C_{60}$ arylene group and the substituted $C_1$-$C_{60}$ heteroarylene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 2, $L_{21}$ to $L_{23}$ may be each independently selected from:

a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group. However, embodiments of the present disclosure are not limited thereto.

In some embodiments, in Formula 2, $L_{21}$ to $L_{23}$ may be each independently selected from:

a phenylene group and a naphthylene group; and a phenylene group and a naphthylene group, each substituted with at least one of a deuterium, —F, —Cl, —Br, —I, a cyano group, a nitro group, a $C_1$-$C_{20}$ alkyl group, a phenyl group, and a naphthyl group. However, embodiments of the present disclosure are not limited thereto.

In some other embodiments, in Formula 2, $L_{21}$ to $L_{23}$ may be each independently selected from groups represented by Formulae 3-1 to 3-15, but embodiments of the present disclosure are not limited thereto.

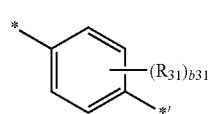

3-1

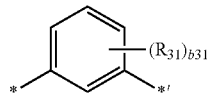

3-2

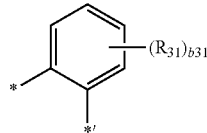

3-3

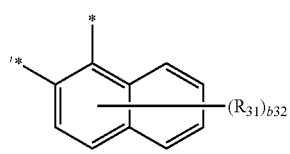

3-4

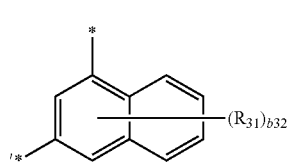

3-5

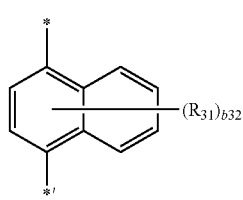

3-6

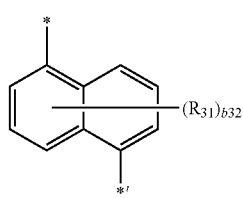

3-7

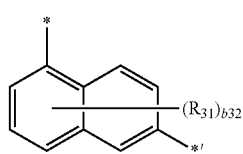

3-8

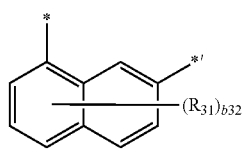

3-9

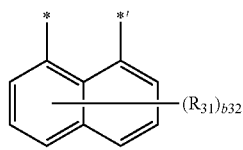

3-10

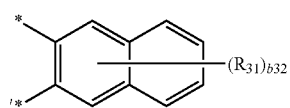

3-11

-continued

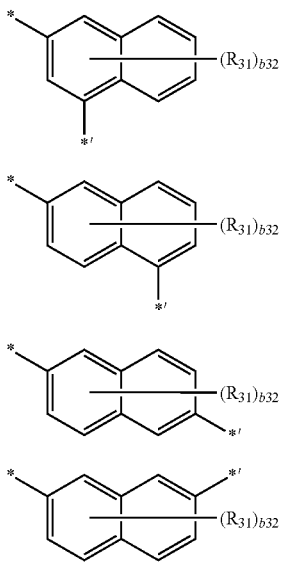

In Formulae 3-1 to 3-15, $R_{31}$ may be selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6; and

* and *' may be binding sites with an adjacent atom.

In some other embodiments, in Formula 2, $L_{21}$ to $L_{23}$ may be each independently selected from groups represented by Formulae 4-1 to 4-11, but embodiments of the present disclosure are not limited thereto.

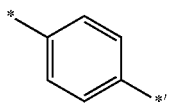

4-1

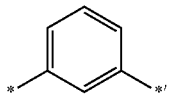

4-2

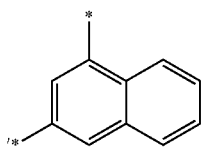

4-3

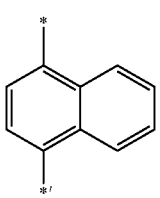

4-4

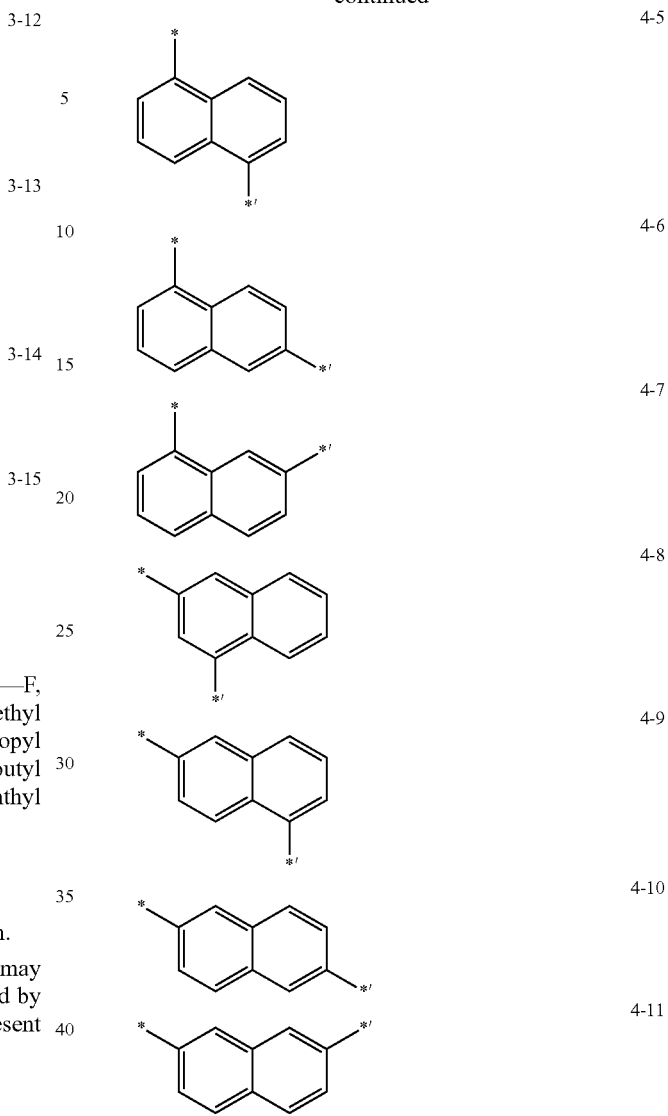

In Formulae 4-1 to 4-11, * and *' may be binding sites with an adjacent atom.

In Formula 2, a21, which indicates the number of $L_{21}$s, may be selected from 0, 1, 2, and 3. When a21 is 0, $(L_{21})_{a21}$ indicates a single bond. When a21 is 2 or greater, the plurality of $L_{21}$S may be the same or different.

In Formula 2, a22, which indicates the number of $L_{22}$S, may be selected from 0, 1, 2, and 3. When a22 is 0, $(L_{22})_{a22}$ indicates a single bond. When a22 is 2 or greater, the plurality of $L_{22}$S may be the same or different.

In Formula 2, a23, which indicates the number of $L_{23}$S, may be selected from 0, 1, 2, and 3. When a23 is 0, $(L_{23})_{a23}$ indicates a single bond. When a23 is 2 or greater, the plurality of $L_{23}$S may be the same or different.

For example, in Formula 2, a21 to a23 may be each independently selected from 0 and 1, but embodiments of the present disclosure are not limited thereto.

In Formula 2, $R_{21}$ and $R_{22}$ may be each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

At least one substituent of the substituted $C_6$-$C_{60}$ aryl group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$) and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 2, $R_{21}$ and $R_{22}$ may be each independently selected from:

a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyridinyl group, a pyrazinyl group, a pyrimidinyl group, an indolyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a fluorenyl group, a benzofluorenyl group, a spiro-fluorenyl group, a carbazolyl group, a benzocarbazolyl group, a dibenzofuranyl group, and a dibenzothiophenyl group; and a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyridinyl group, a pyrazinyl group, a pyrimidinyl group, an indolyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a fluorenyl group, a benzofluorenyl group, a spiro-fluorenyl group, a carbazolyl group, a benzocarbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —N($Q_{34}$)($Q_{35}$).

$Q_{34}$ and $Q_{35}$ may be each independently selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group. However, embodiments of the present disclosure are not limited thereto.

In some embodiments, in Formula 2, $R_{21}$ and $R_{22}$ may be each independently selected from:

a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a thiophenyl group, a furanyl group, a benzofuranyl group, a benzothiophenyl group, a fluorenyl group, a spiro-fluorenyl group, a carbazolyl group, a dibenzofuranyl group, and a dibenzothiophenyl group; and a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a thiophenyl group, a furanyl group, a benzofuranyl group, a benzothiophenyl group, a fluorenyl group, a spiro-fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, and —N($Q_{34}$)($Q_{35}$).

$Q_{34}$ and $Q_{35}$ may be each independently selected from a $C_6$-$C_{60}$ aryl group, a monovalent non-aromatic condensed polycyclic group, and a monovalent non-aromatic condensed heteropolycyclic group. However, embodiments of the present disclosure are not limited thereto.

In some other embodiments, in Formula 2, $R_{21}$ and $R_{22}$ may be each independently selected from groups represented by Formulae 6-1 to 6-49, but embodiments of the present disclosure are not limited thereto.

6-1

6-2

6-3

6-4

6-5

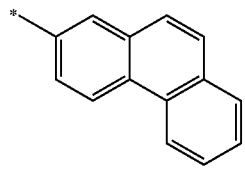

6-6

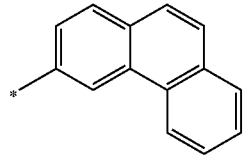

6-7

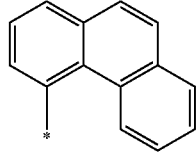

6-8

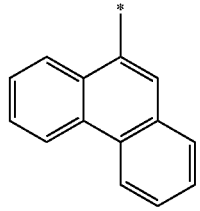

6-9

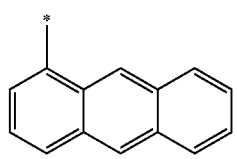

6-10

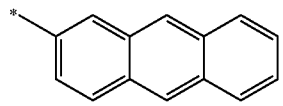

6-11

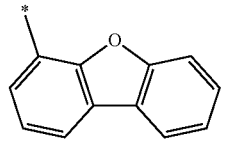

6-12

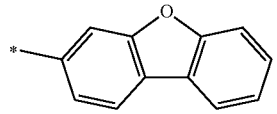

6-13

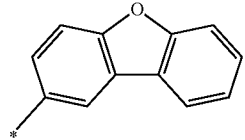

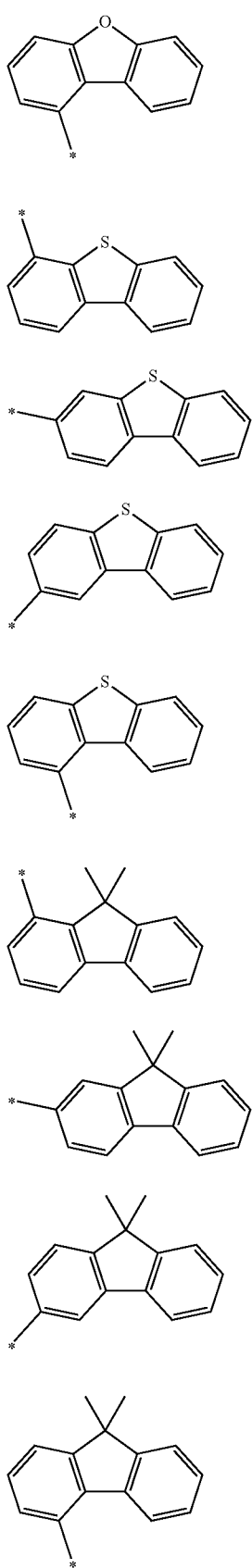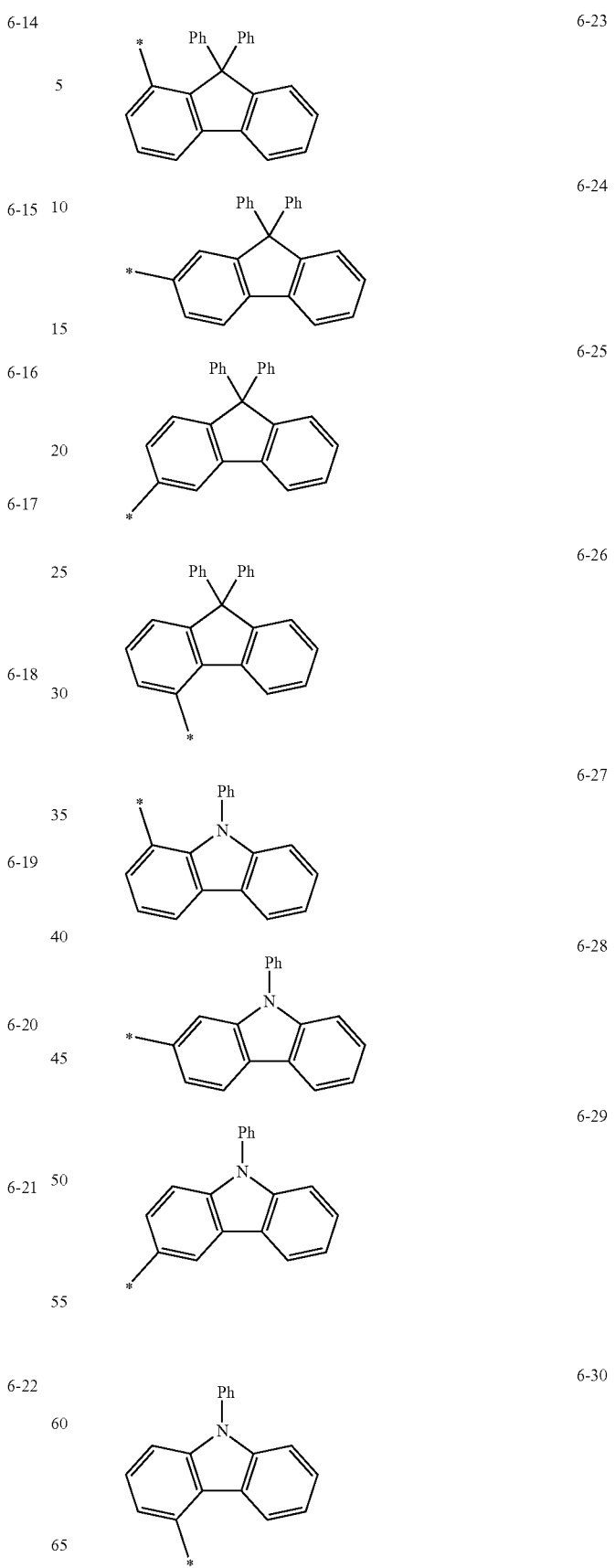

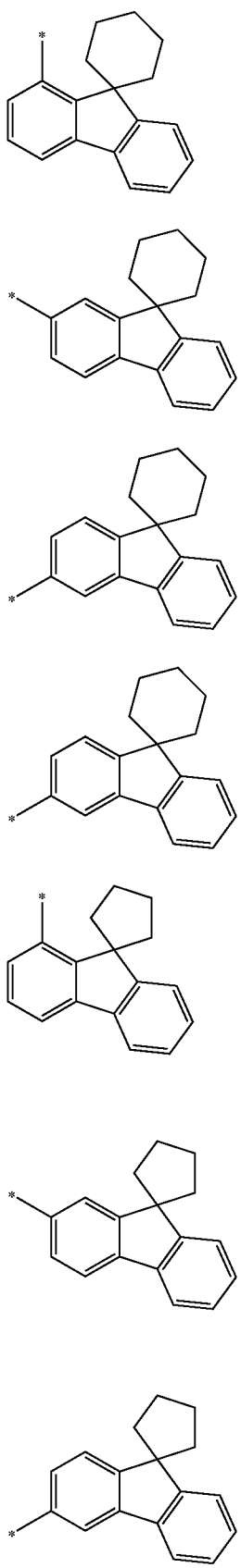
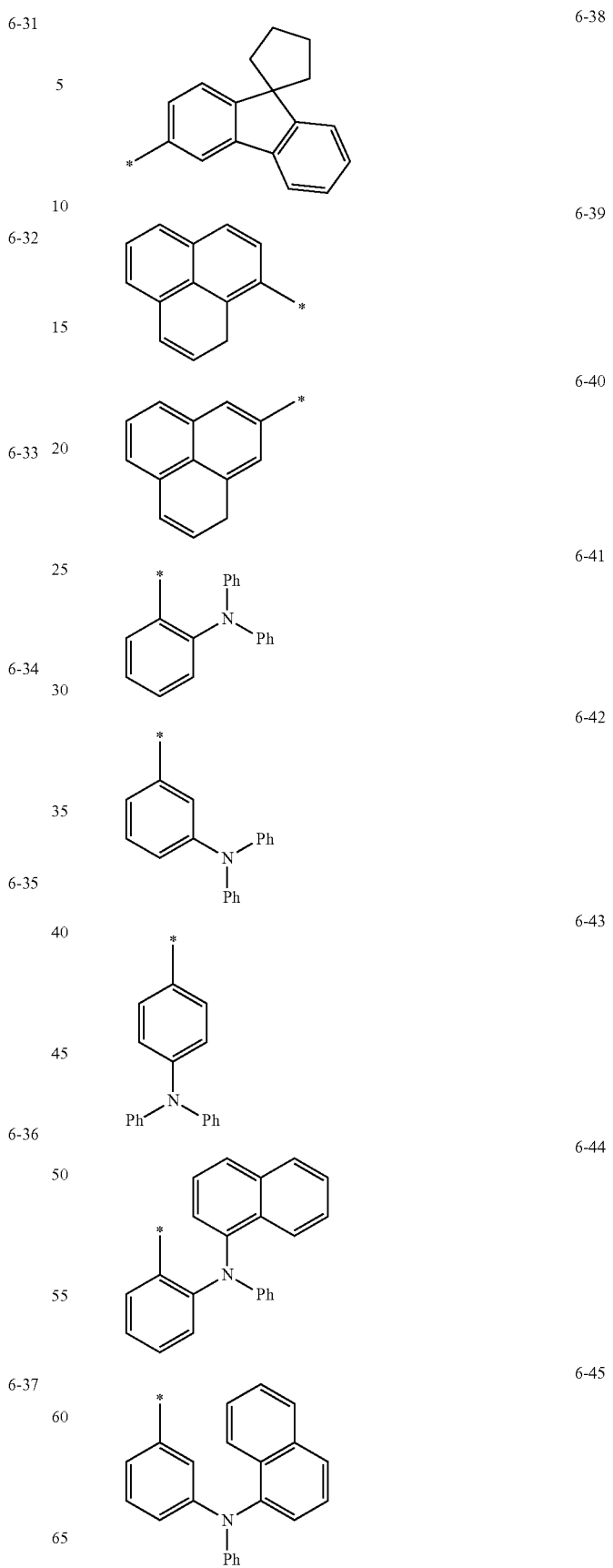

-continued 6-46

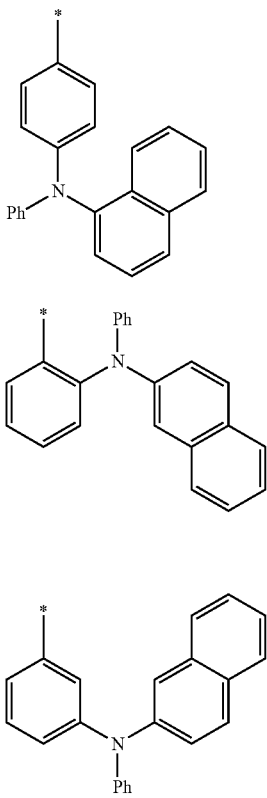

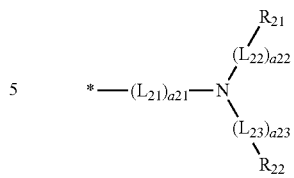

may be the same or different. For example, in Formula 2, n21 may be selected from 1 and 2, but it is not limited thereto.

For example, the first material may be represented by Formula 1-1, but embodiments of the present disclosure are not limited thereto.

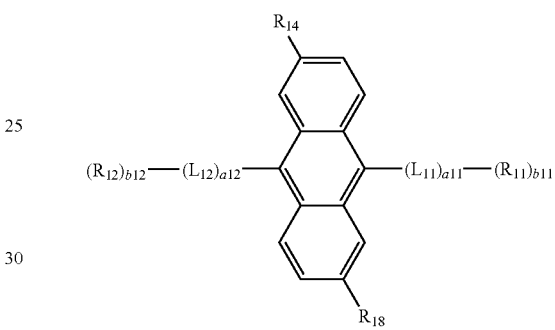

Formula 1-1

In Formula 1-1, $L_{11}$, $L_{12}$, a11, a12, $R_{11}$, $R_{12}$, $R_{14}$, $R_{18}$, b11, and b12 may be defined the same as those defined in Formula 1.

In some embodiments, the first material may be represented by Formula 1-11, but embodiments of the present disclosure are not limited thereto.

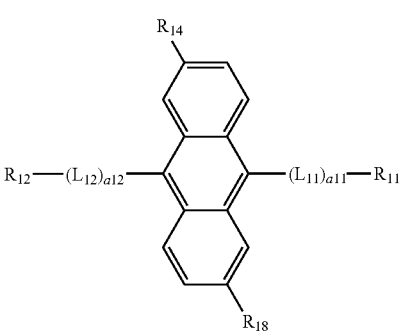

Formula 1-11

In Formula 1-11, $L_{11}$, $L_{12}$, $R_{11}$, $R_{12}$, $R_{14}$, and $R_{18}$ may be defined the same as defined in Formula 1; and a11 and a12 may be each independently selected from 0 and 1.

For example, the second material may be represented by one of Formulae 2-1 and 2-2, but embodiments of the present disclosure are not limited thereto.

In Formulae 6-1 to 6-49,

Ph is a phenyl group; and

* is a binding site with an adjacent atom.

In Formula 2, n21, which indicates the number of moieties represented by

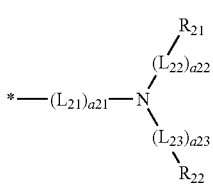

(where * is a binding site with $Ar_{21}$), may be selected from 1, 2, and 3. When n21 is 2 or greater, the plurality of moieties represented by

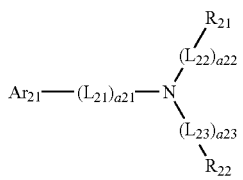

Formula 2-1

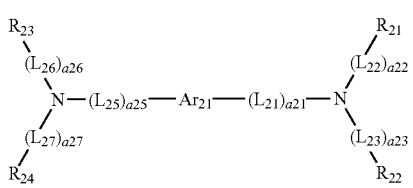

Formula 2-2

In Formulae 2-1 and 2-2, $Ar_{21}$, $L_{21}$ to $L_{23}$, a21 to a23, $R_{21}$, and $R_{22}$ may be defined the same as defined in Formula 2;

$L_{25}$ to $L_{27}$ may be each independently defined the same as $L_{21}$ in Formula 2;

a25 to a27 may be each independently defined the same as a21 in Formula 2; and $R_{23}$ and $R_{24}$ may be each independently defined the same as $R_{21}$ in Formula 2.

In some other embodiments, when the second material is represented by one of Formulae 2-1 and 2-2, $R_{21}$ to $R_{24}$ may be each independently selected from:

a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a thiophenyl group, a furanyl group, a benzofuranyl group, a benzothiophenyl group, a fluorenyl group, a carbazolyl group, a dibenzofuranyl group, and a dibenzothiophenyl group; and a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a thiophenyl group, a furanyl group, a benzofuranyl group, a benzothiophenyl group, a fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and —N($Q_{34}$)($Q_{35}$).

$Q_{34}$ and $Q_{35}$ may be each independently selected from a $C_6$-$C_{60}$ aryl group, a monovalent non-aromatic condensed polycyclic group, and a monovalent non-aromatic condensed heteropolycyclic group. However, embodiments of the present disclosure are not limited thereto.

In some other embodiments, the first material may be selected from the following compounds, but it is not limited thereto.

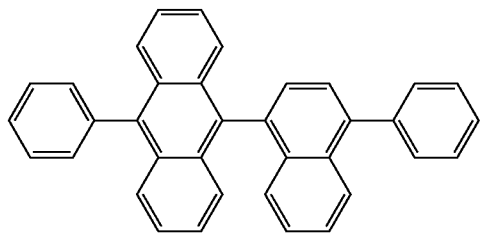

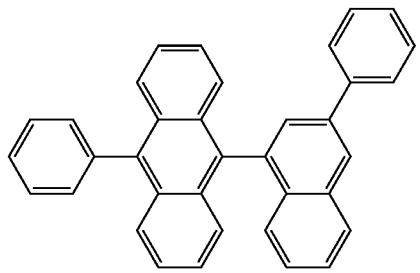

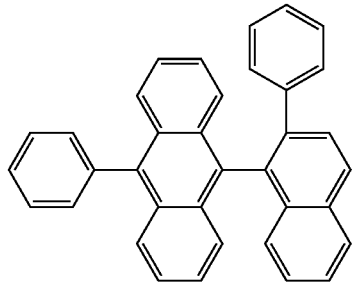

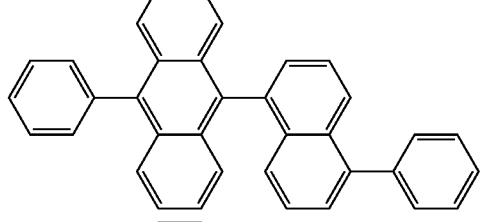

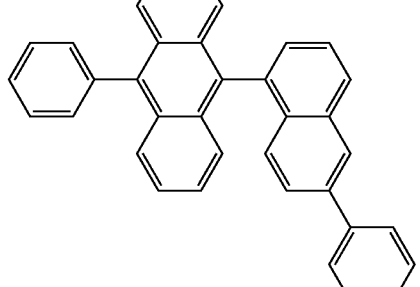

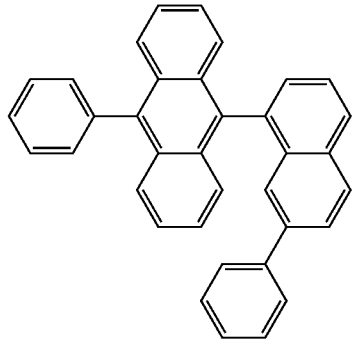

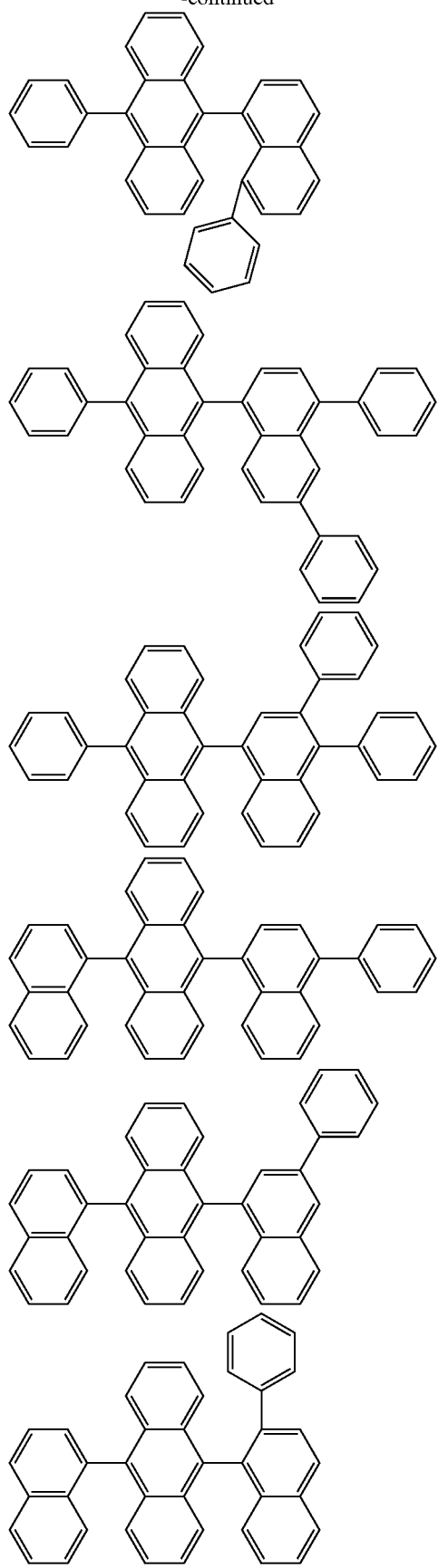
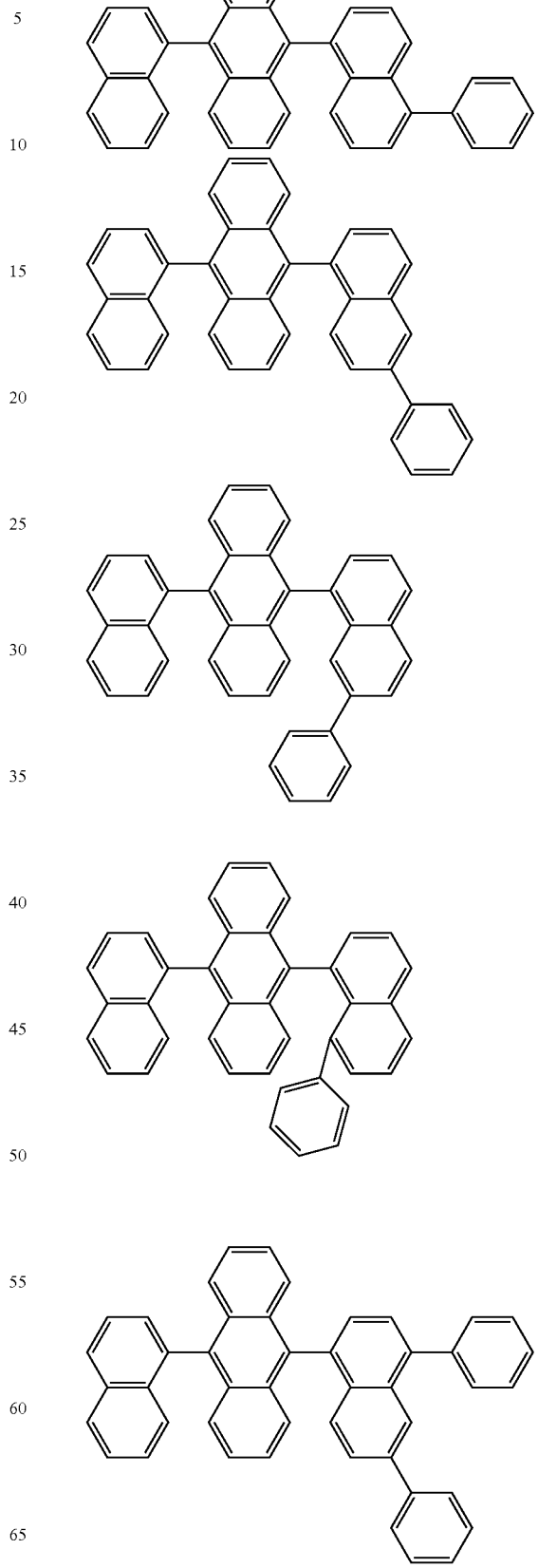

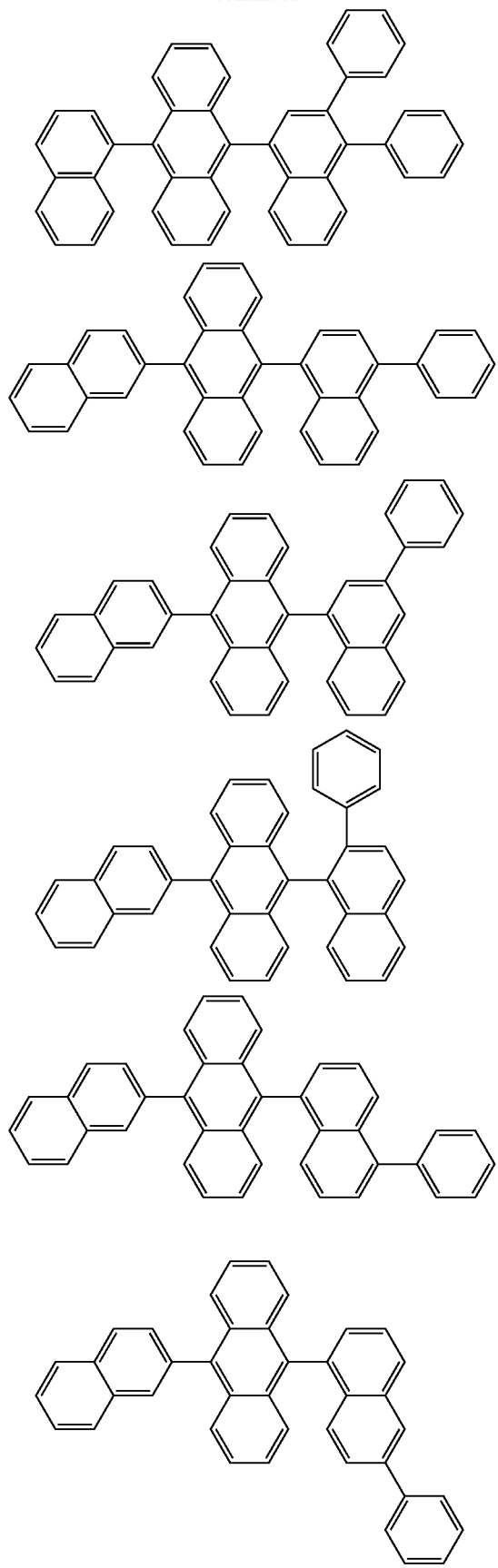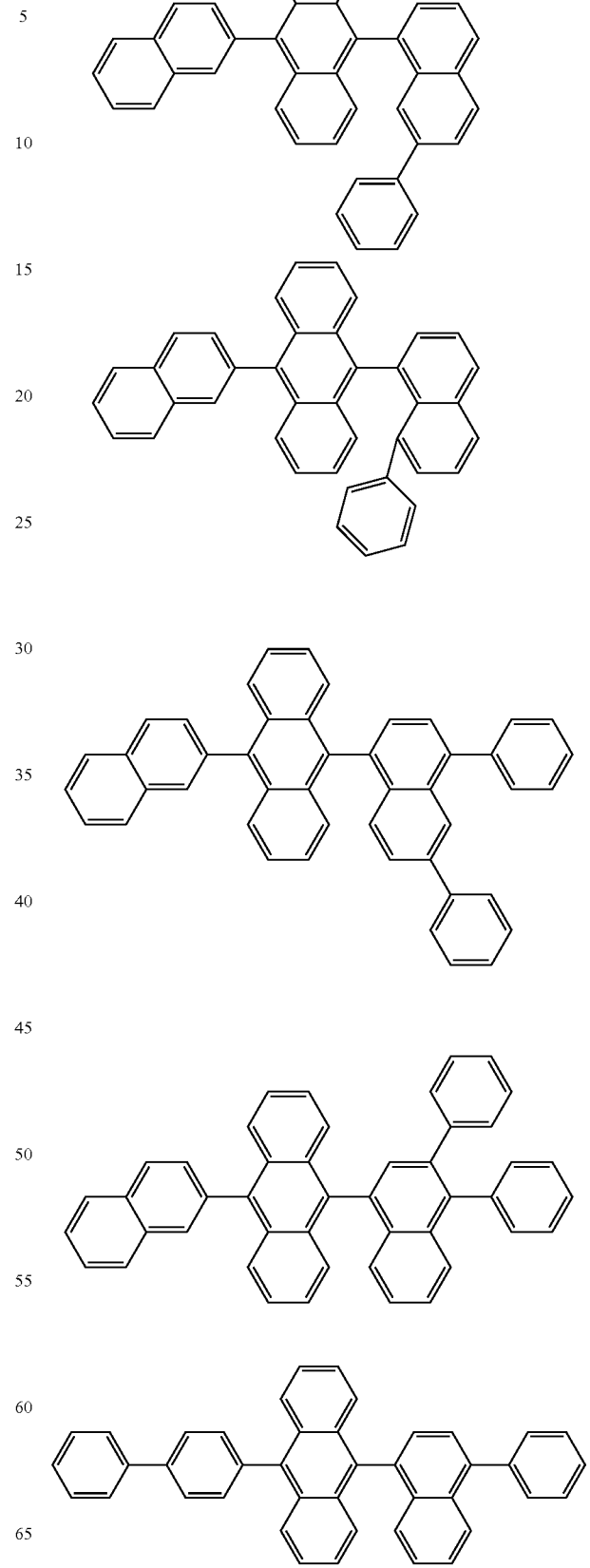

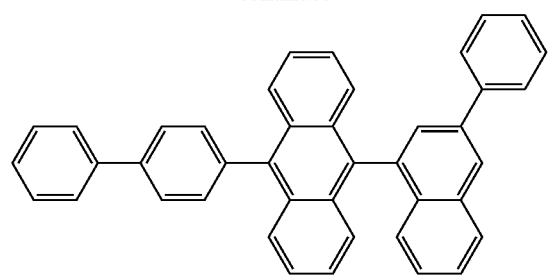
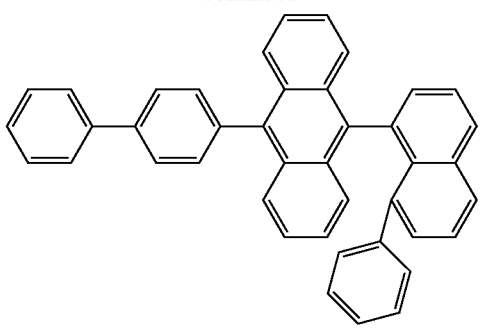
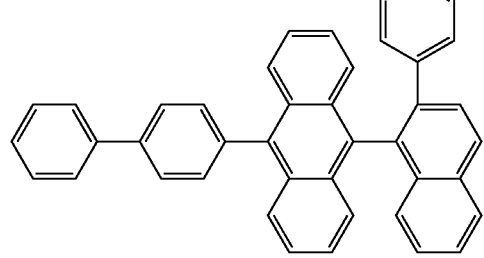
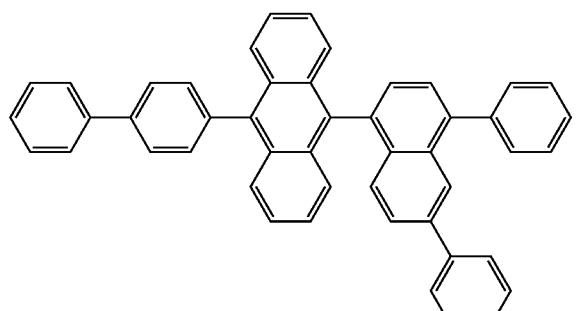
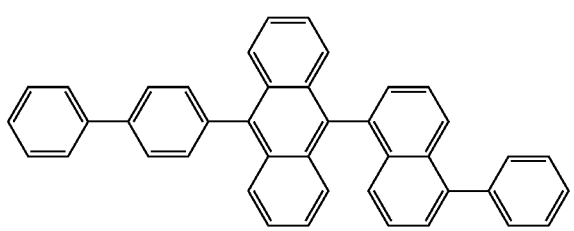
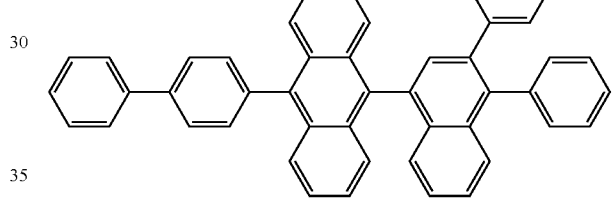
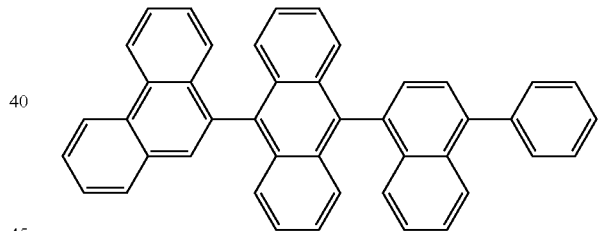
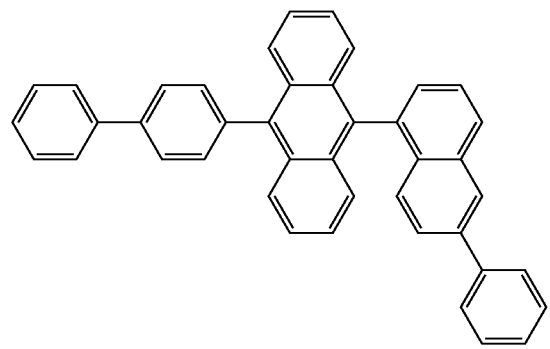
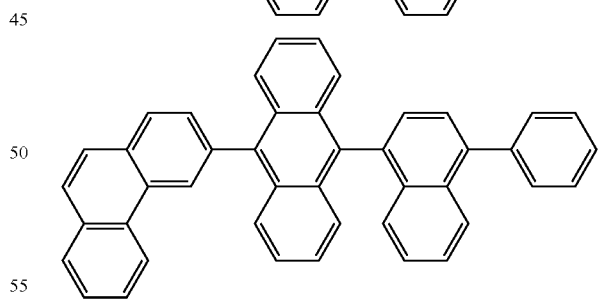
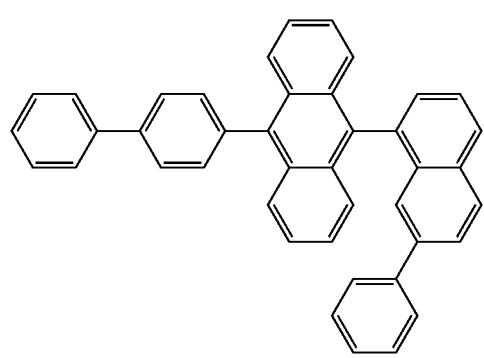
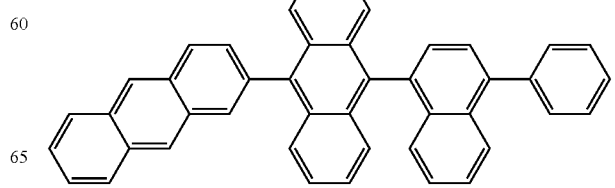

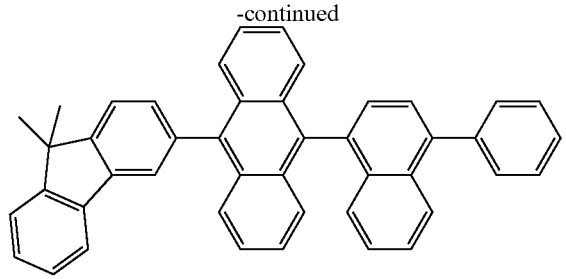
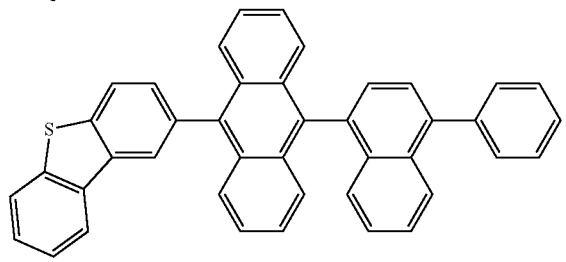
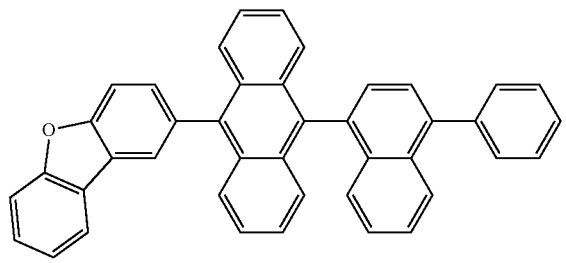
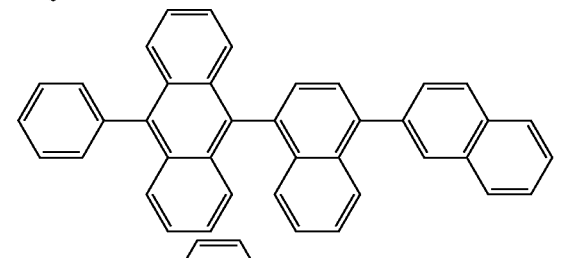
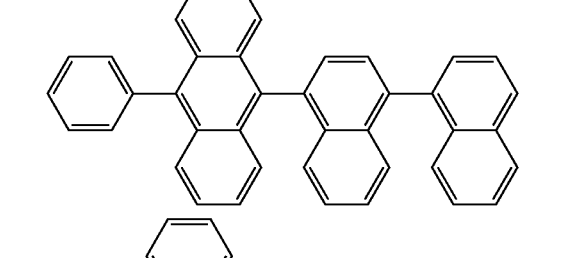
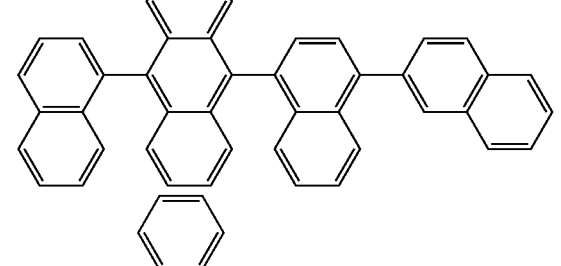
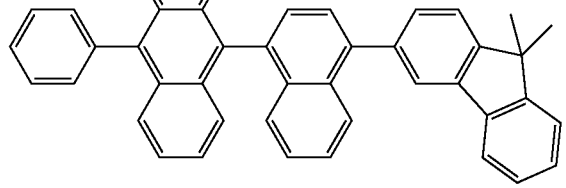
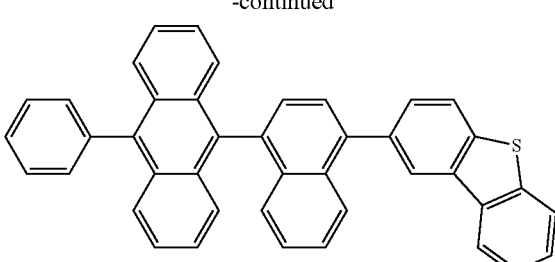
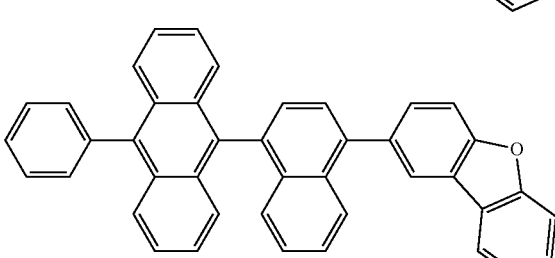
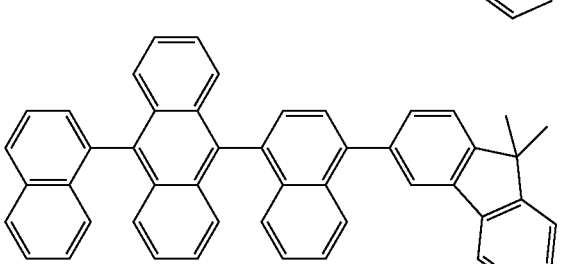
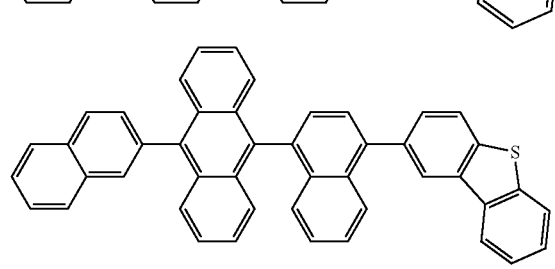
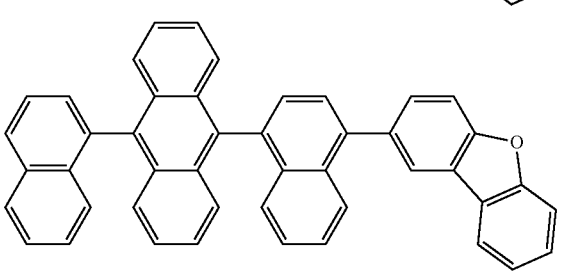
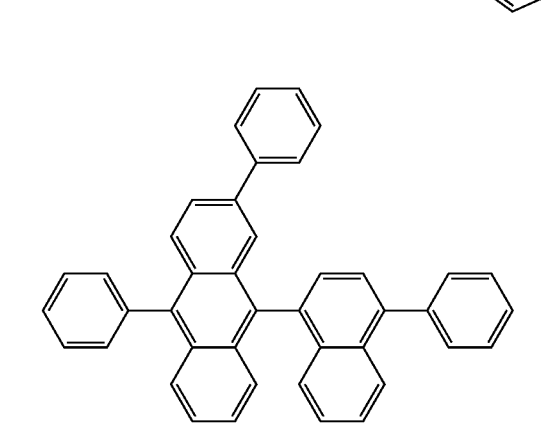

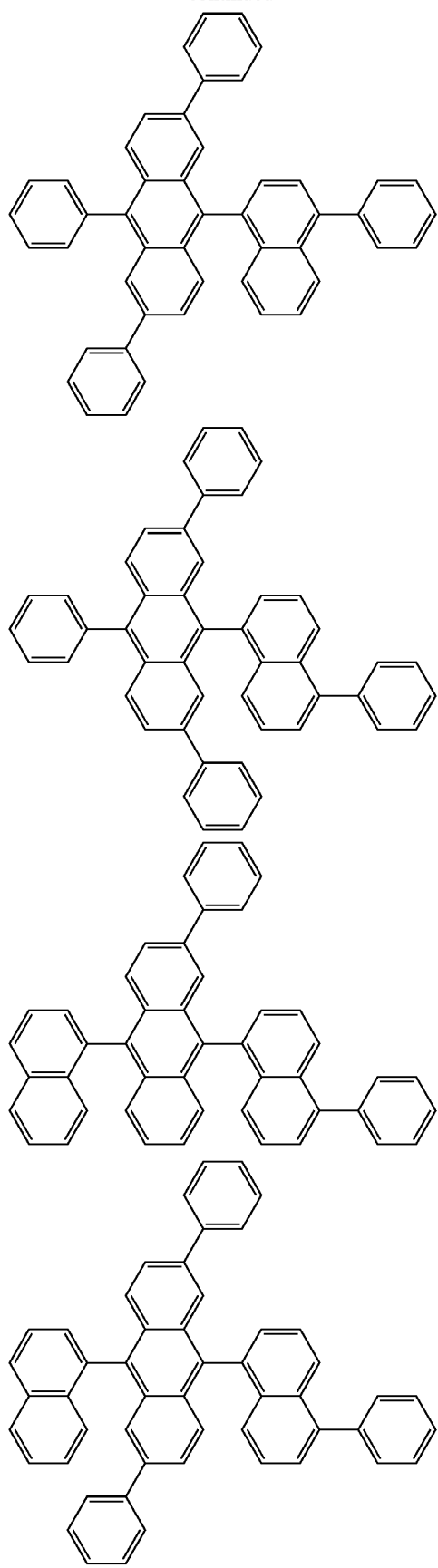
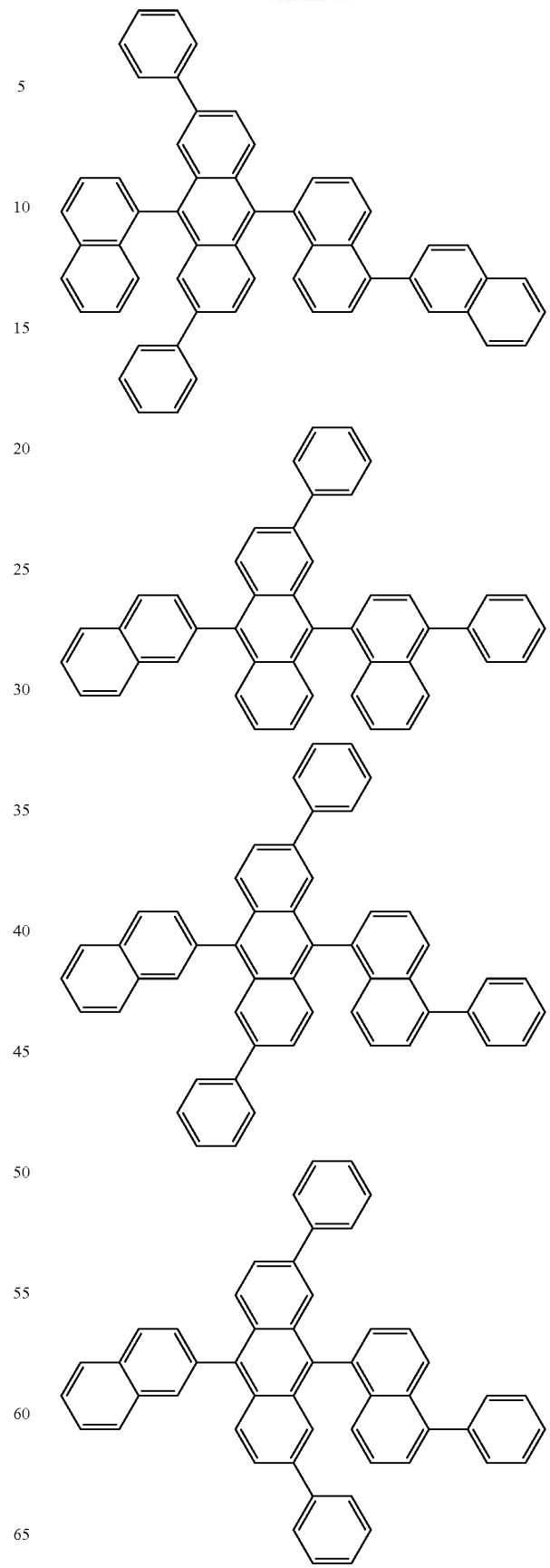

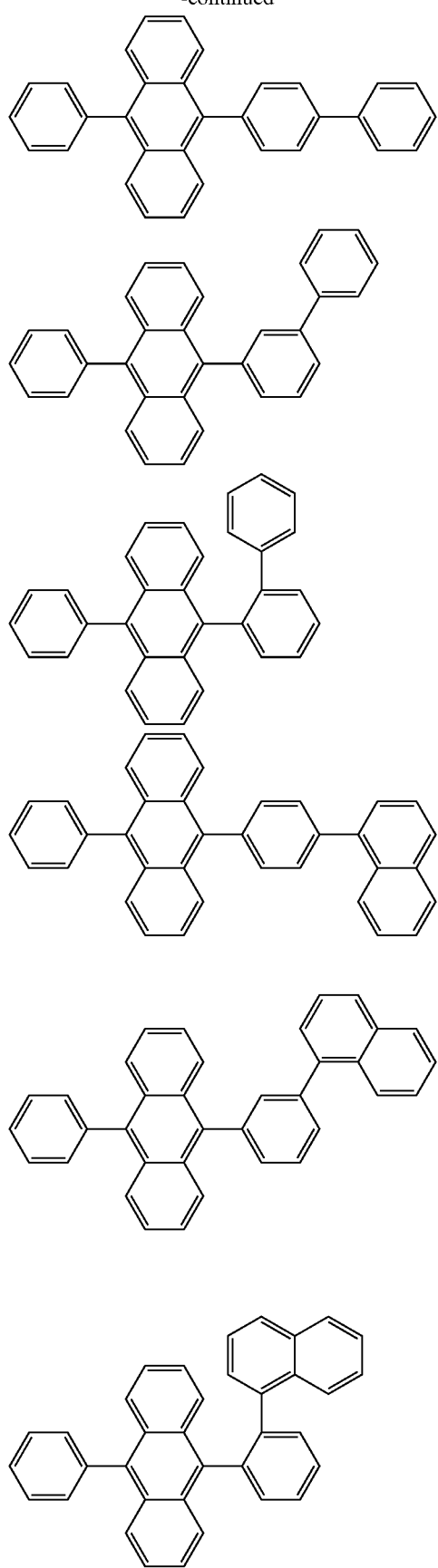

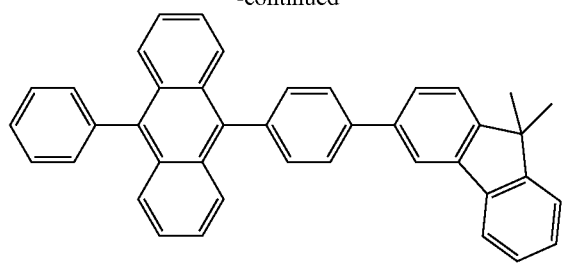
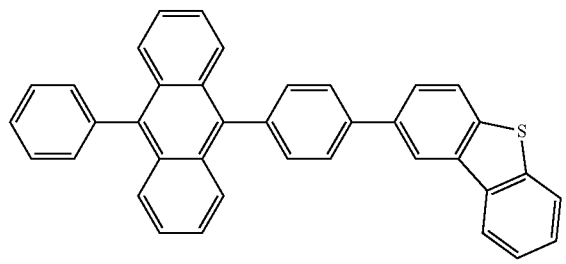
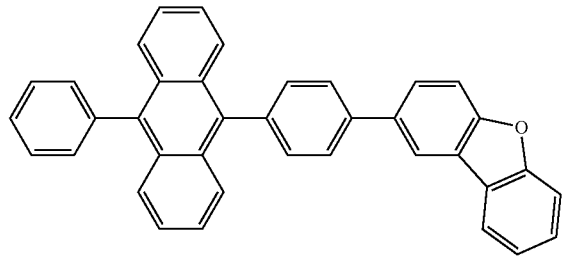
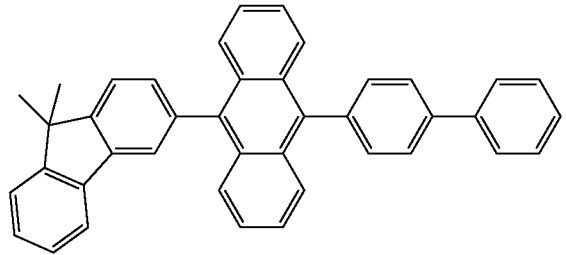
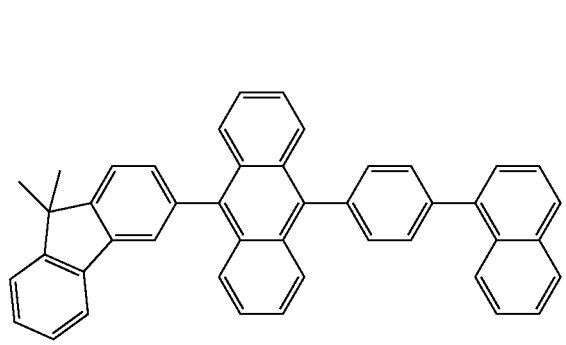
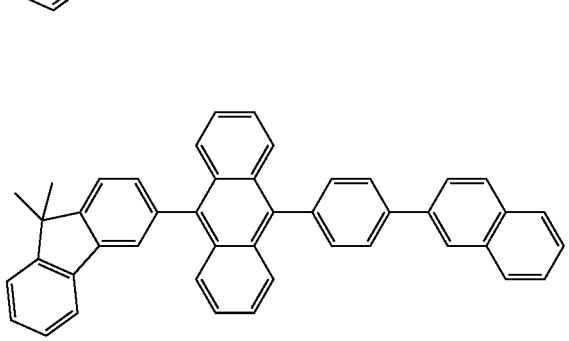
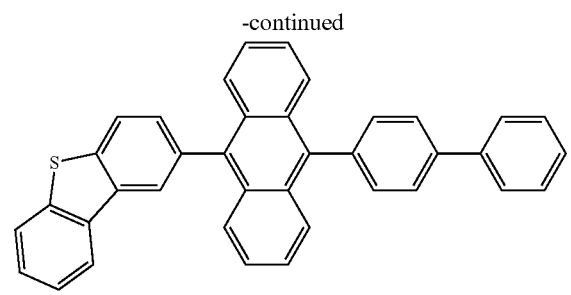
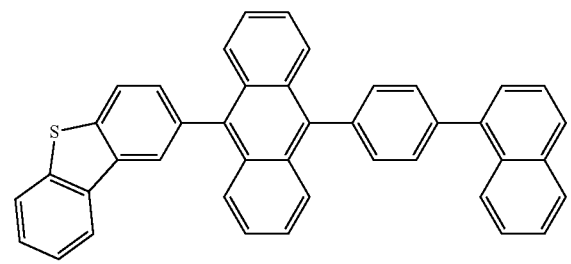
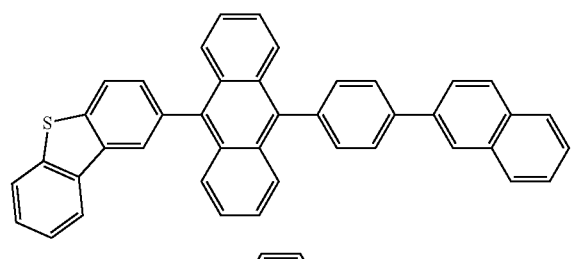
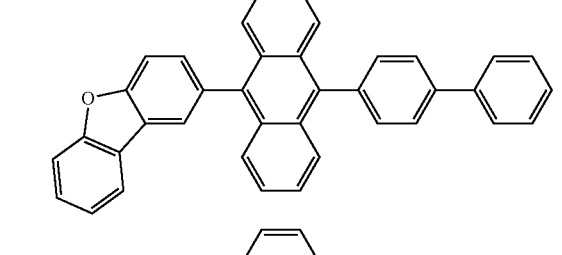
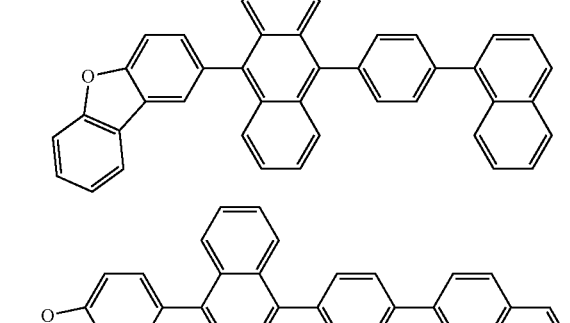
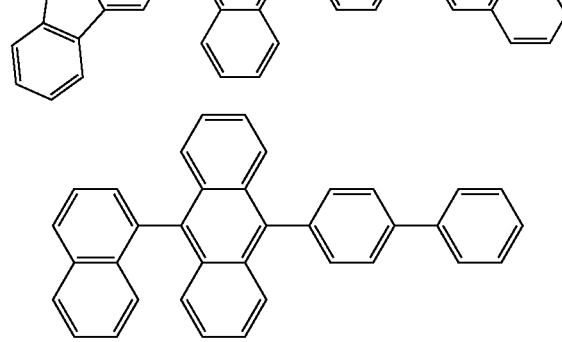

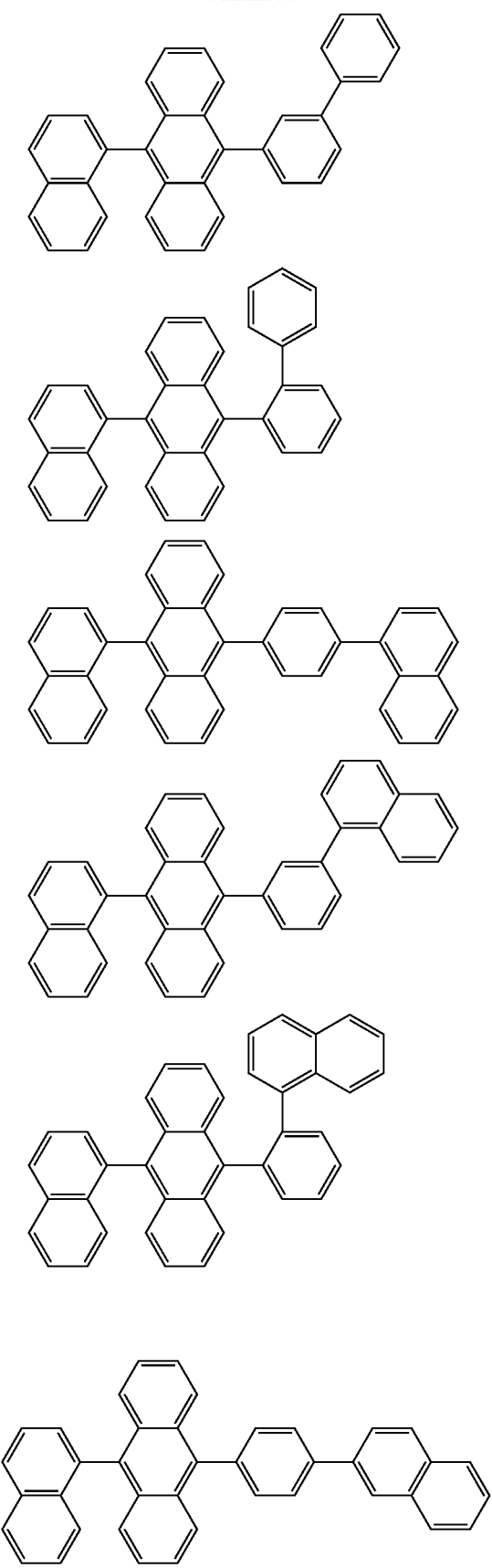
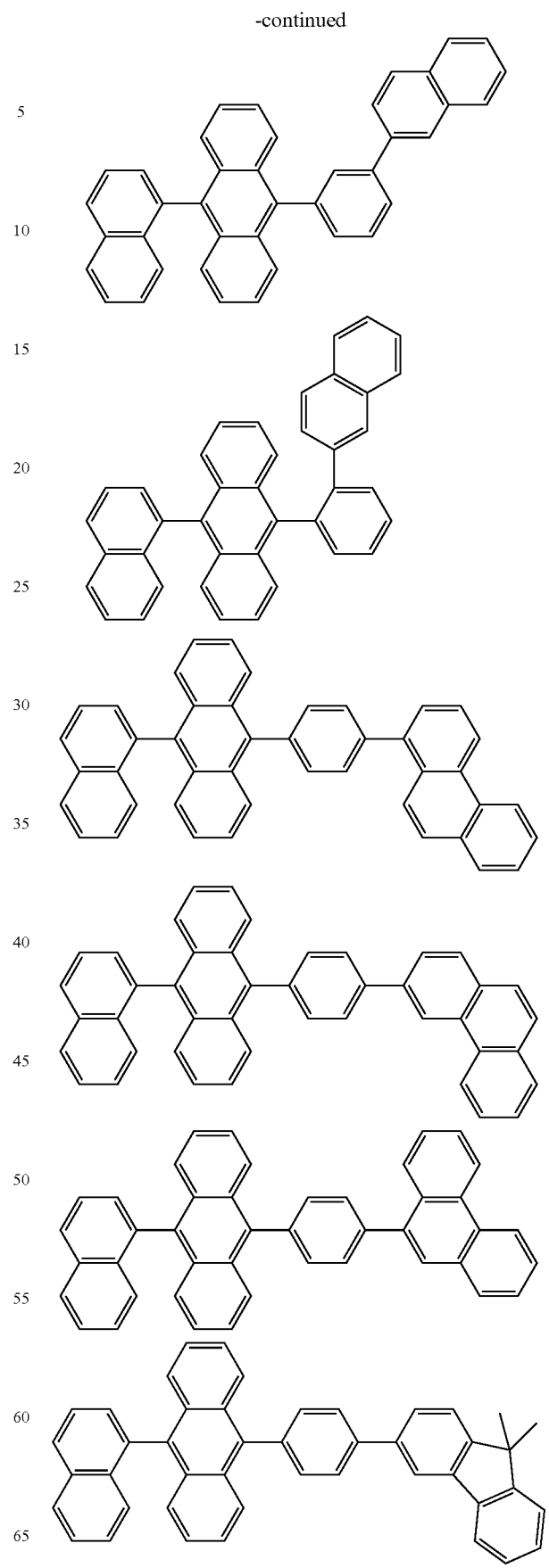

-continued
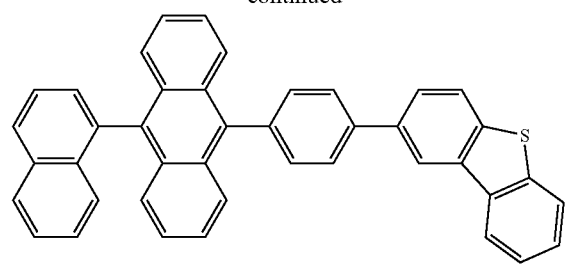
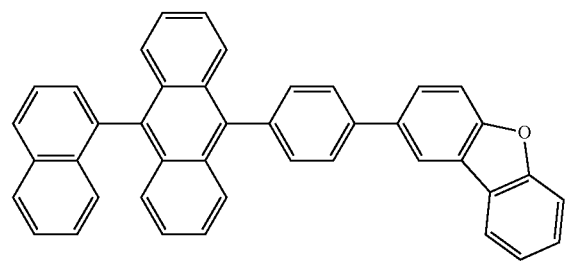
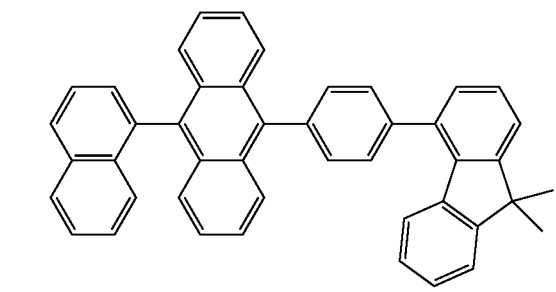
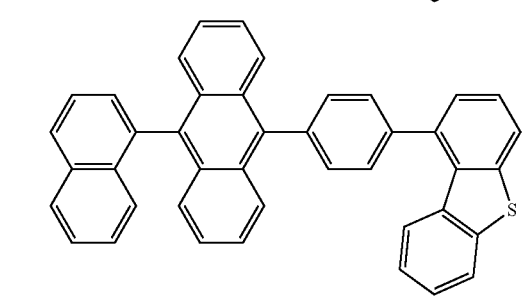
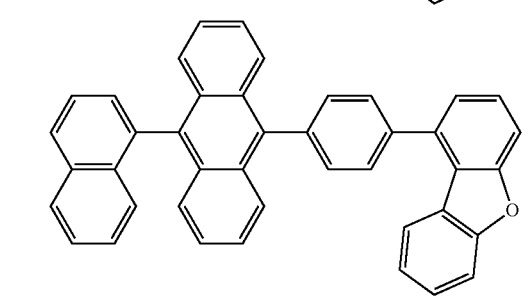
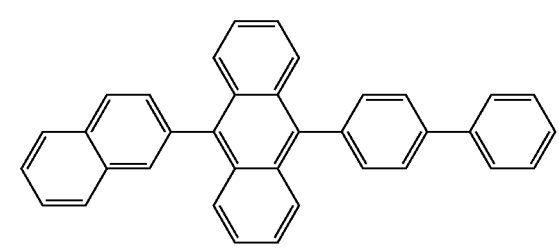
-continued
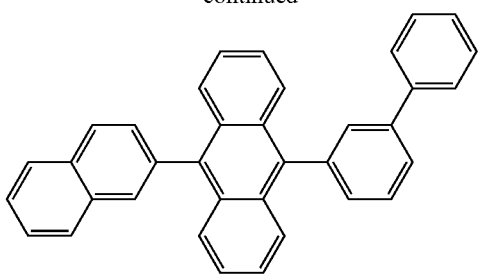
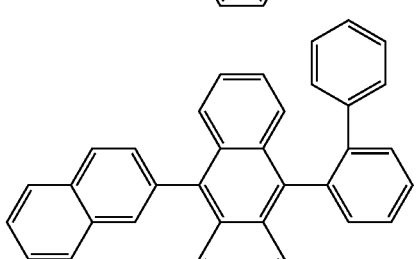
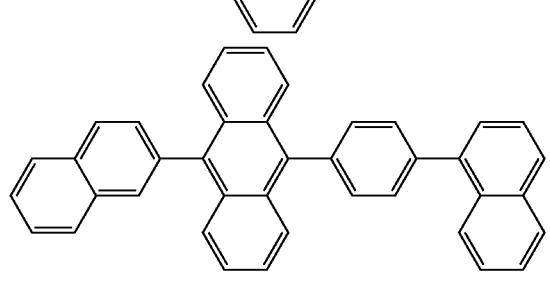
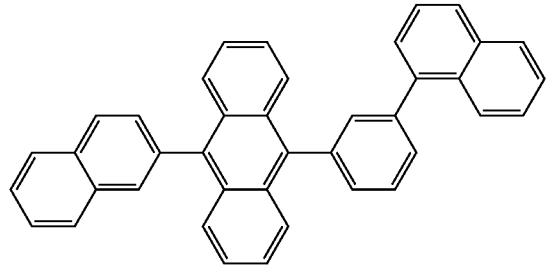
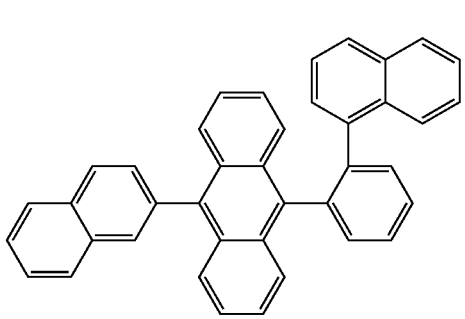
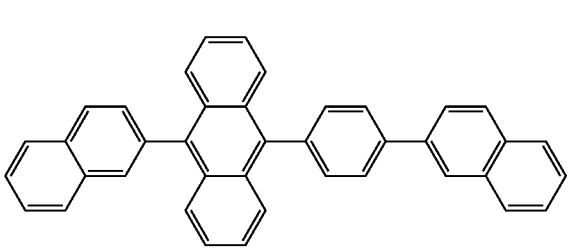

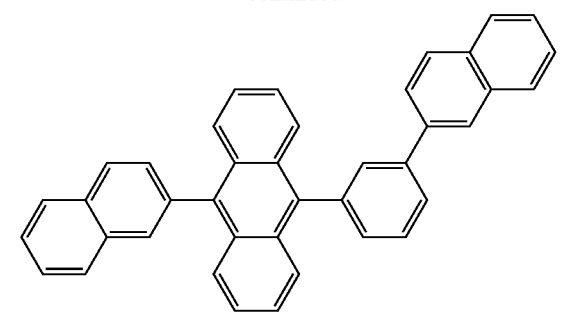
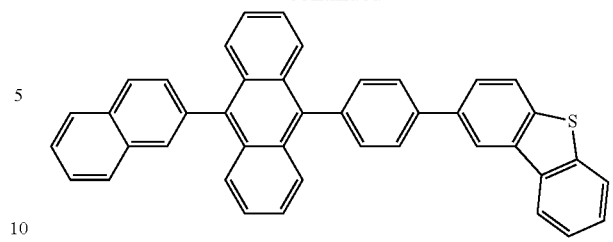
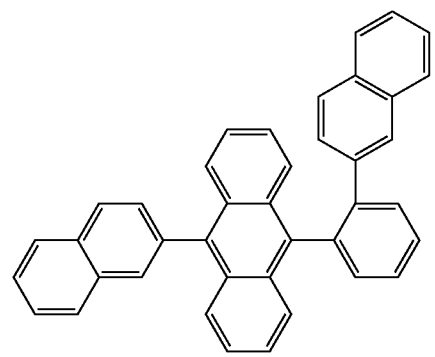
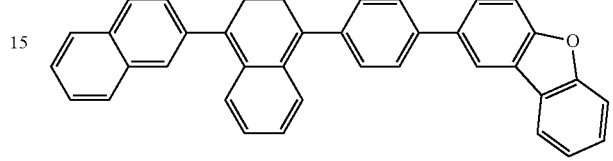
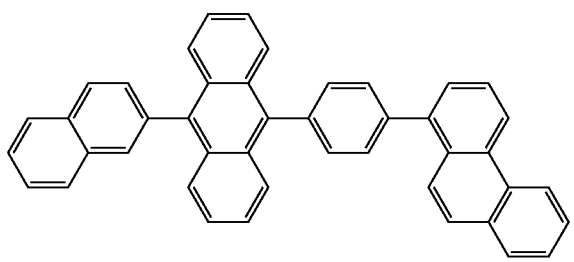
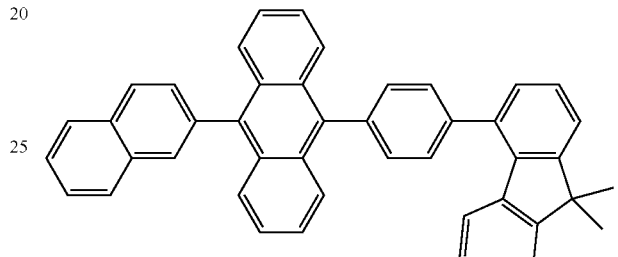
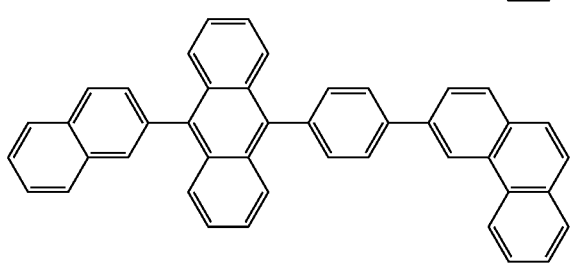
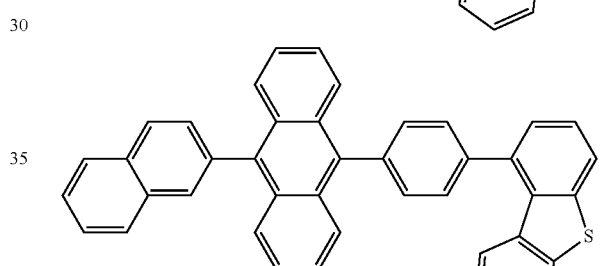
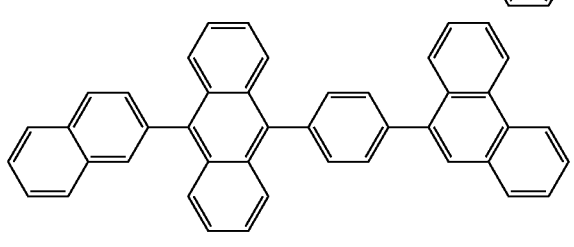
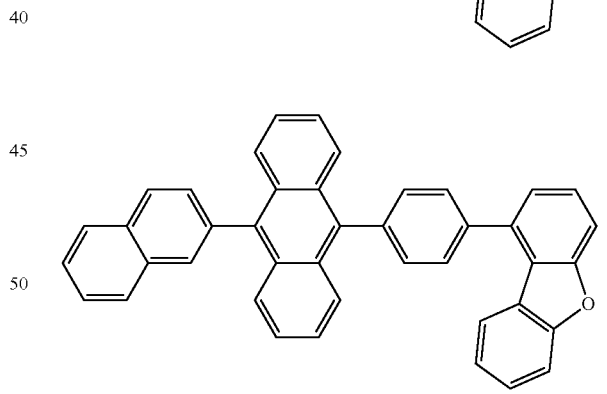
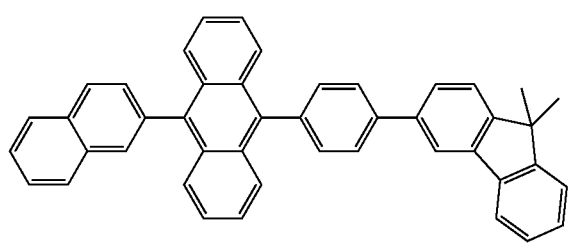
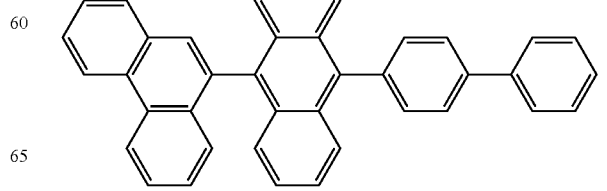

77
-continued
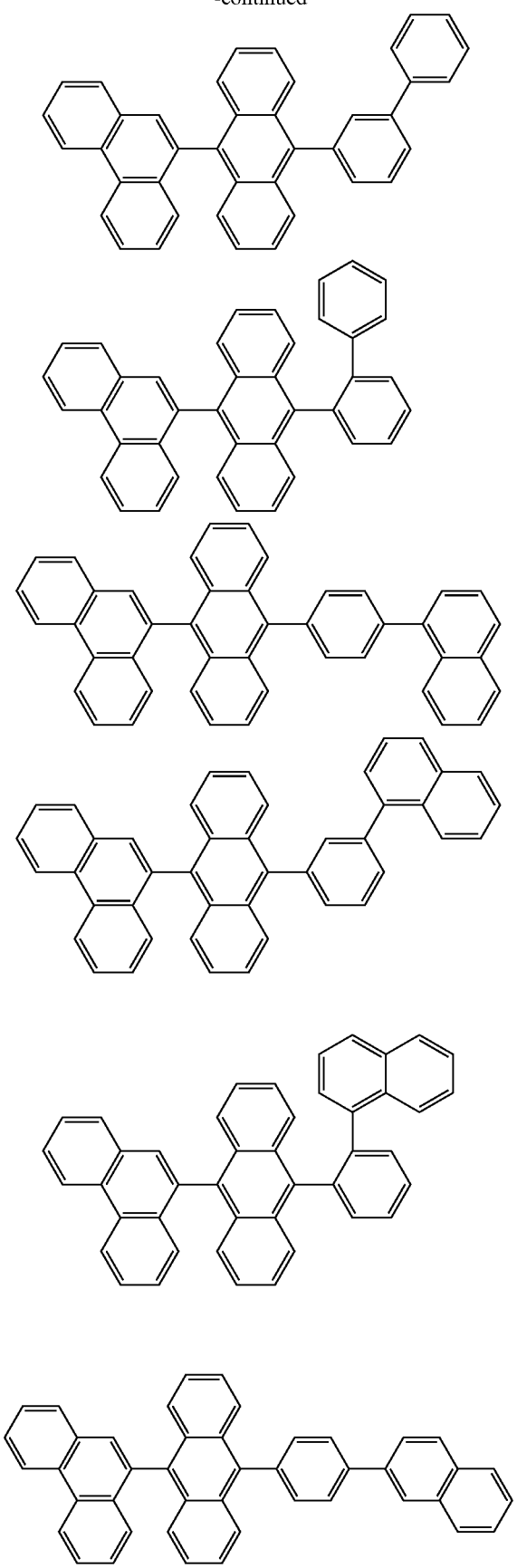
78
-continued
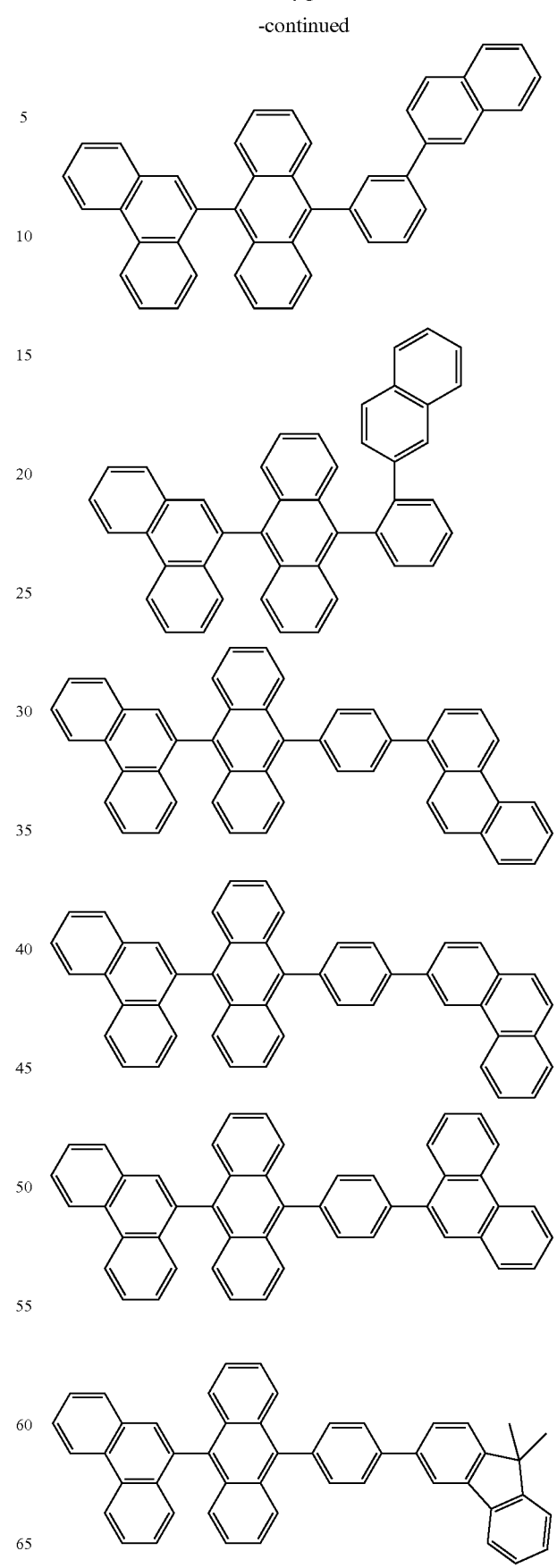

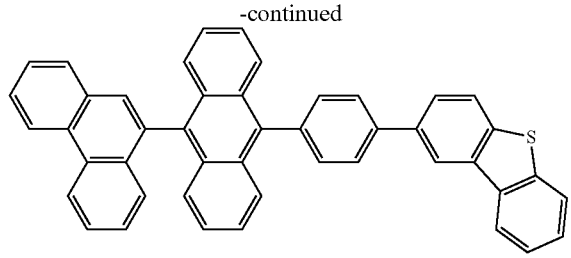
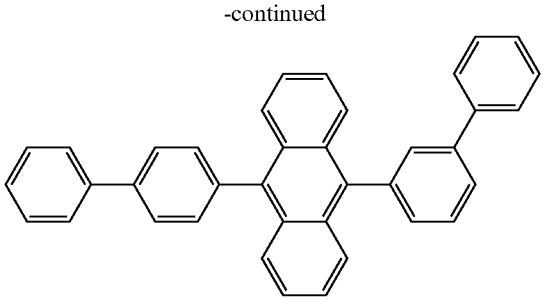
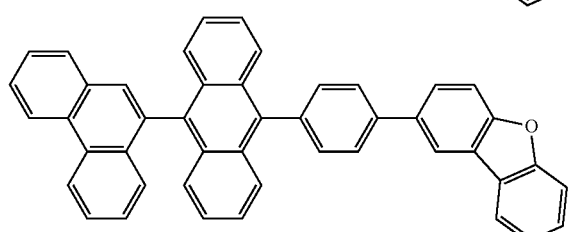
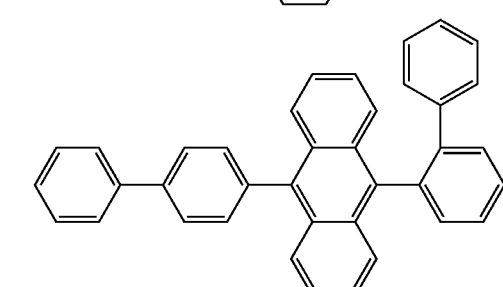
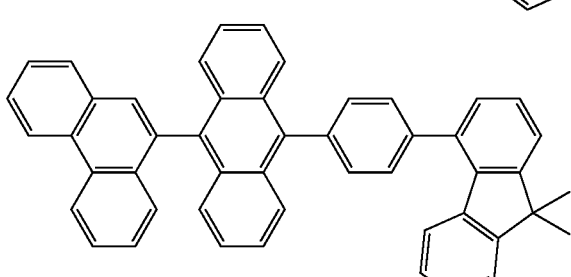
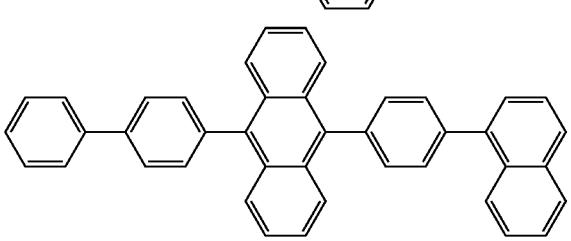
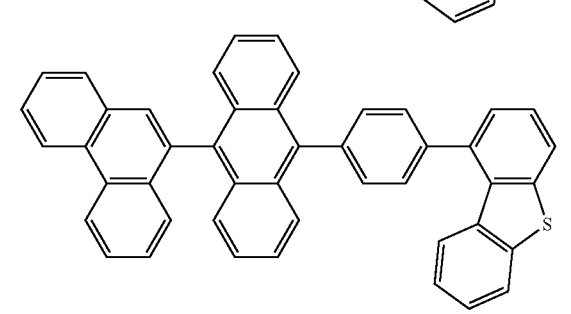
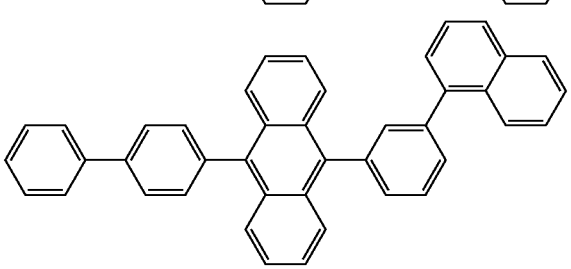
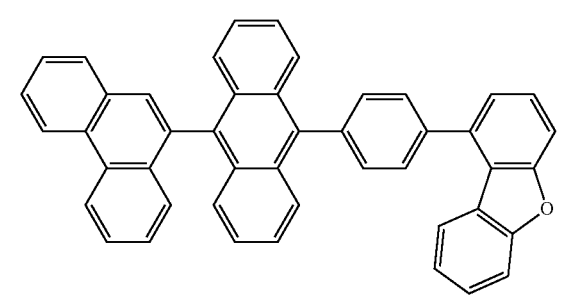
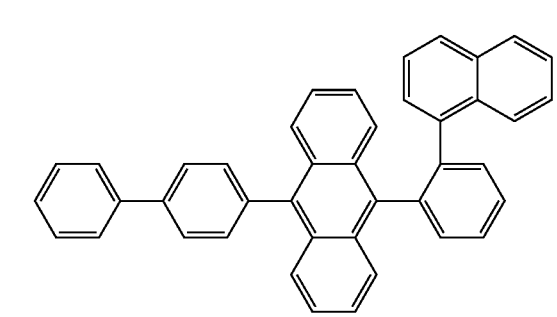
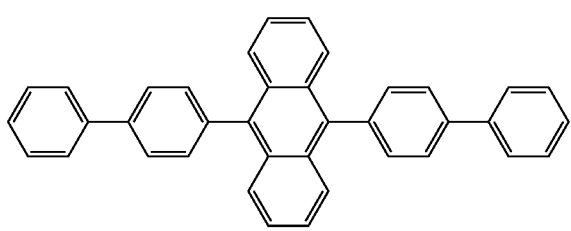
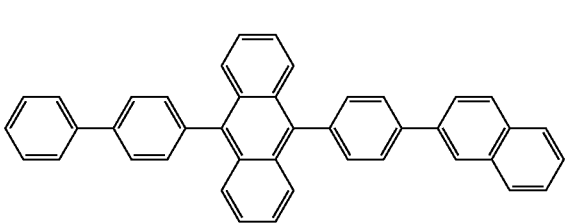

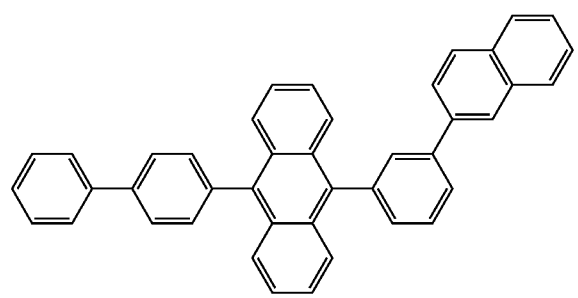
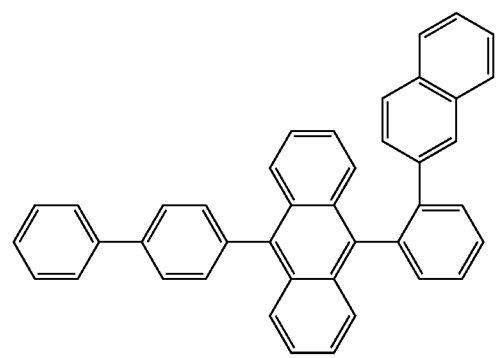
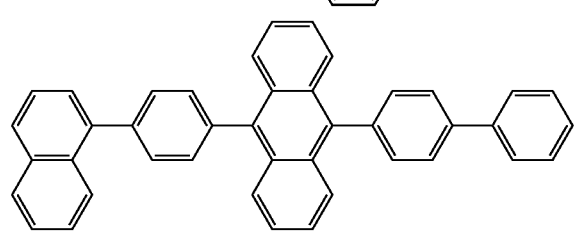
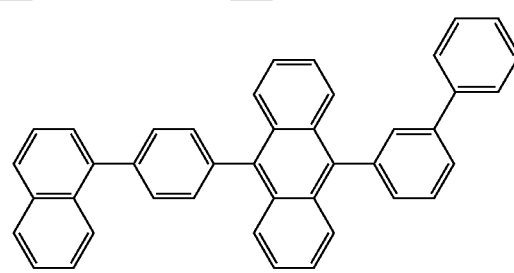
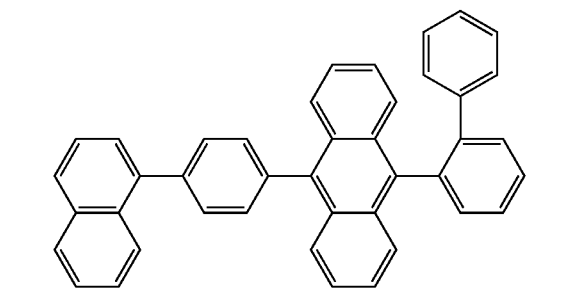
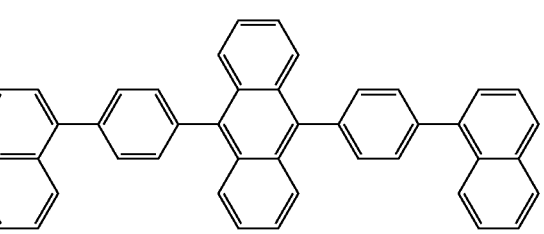
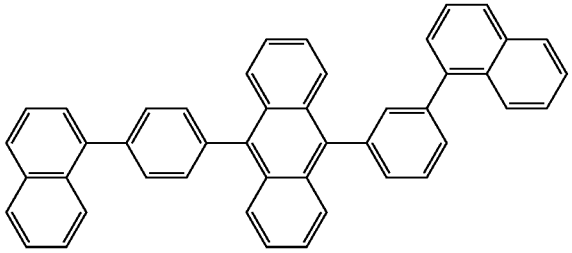
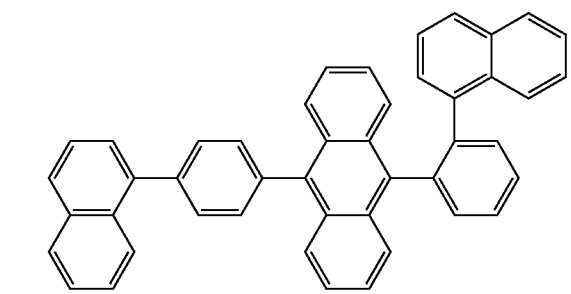
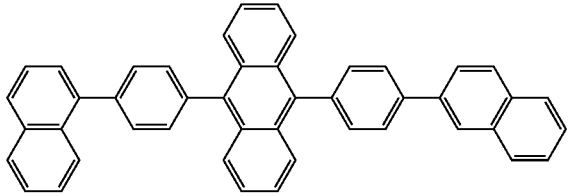
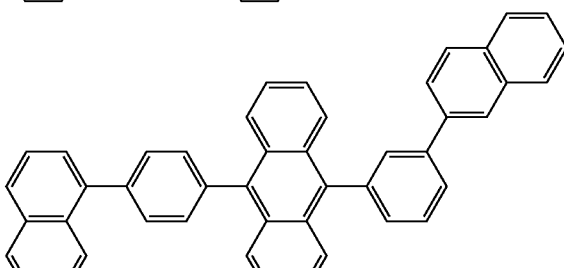
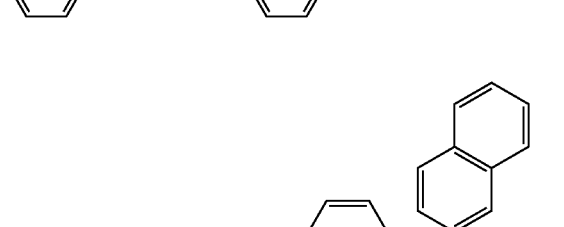
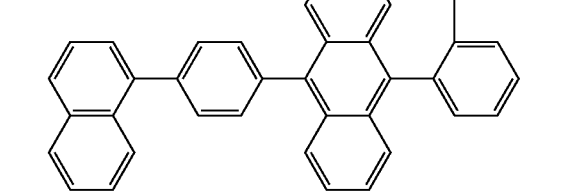
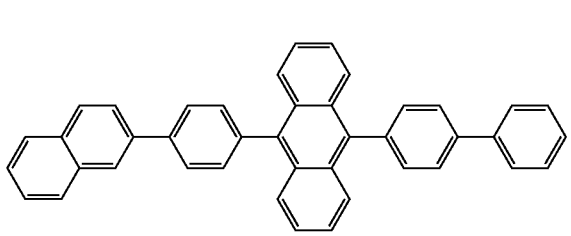

83
-continued
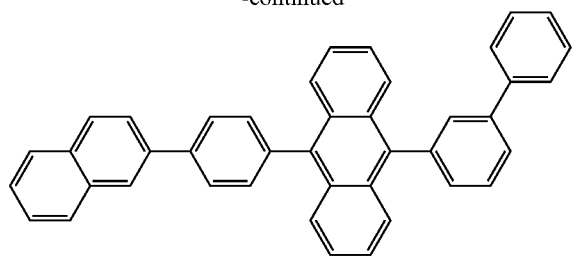
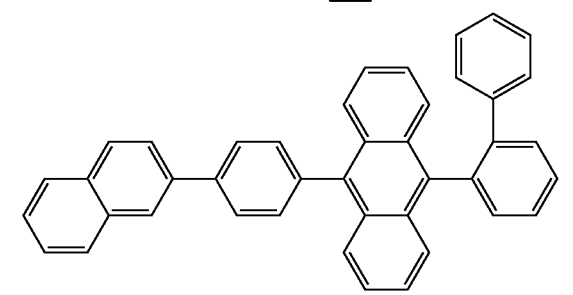
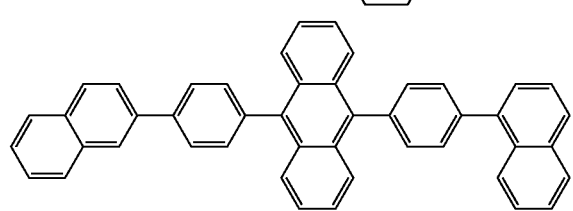
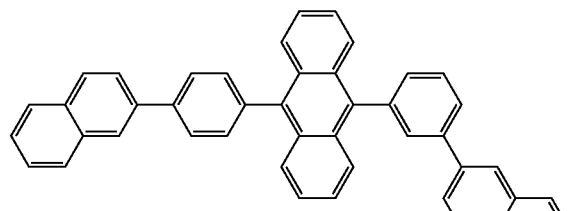
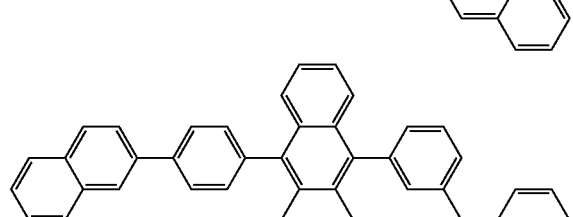
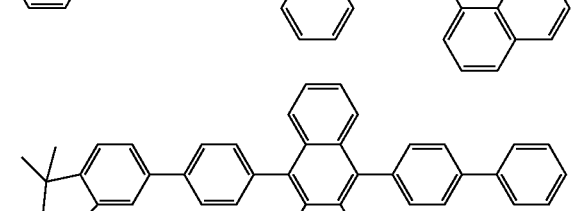
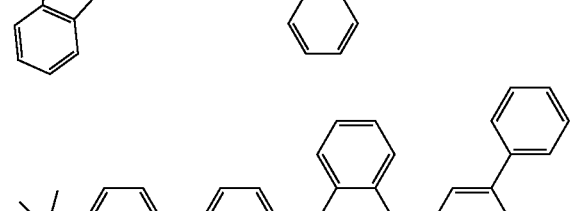
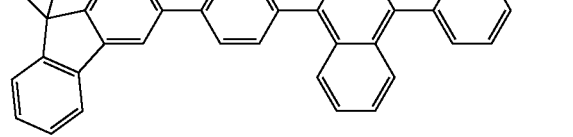
84
-continued
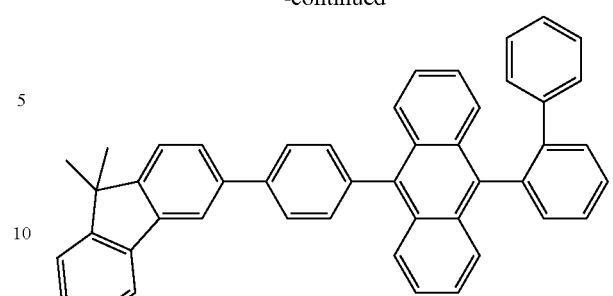
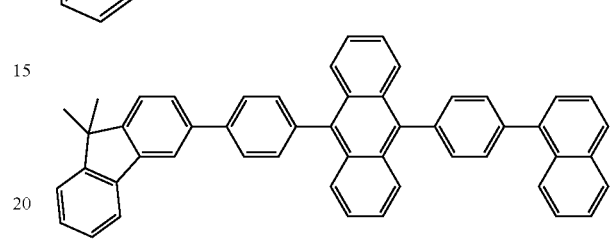
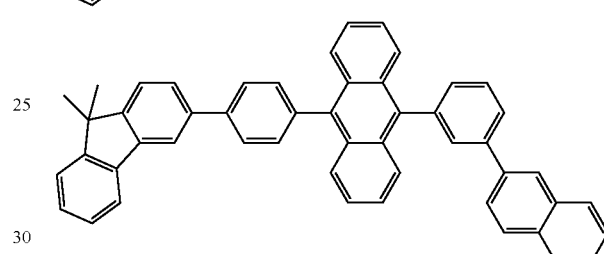
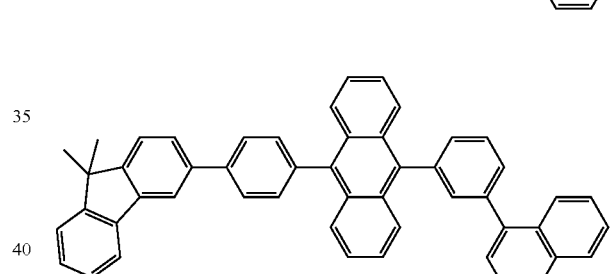
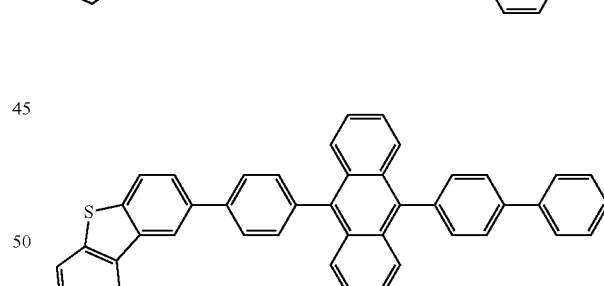
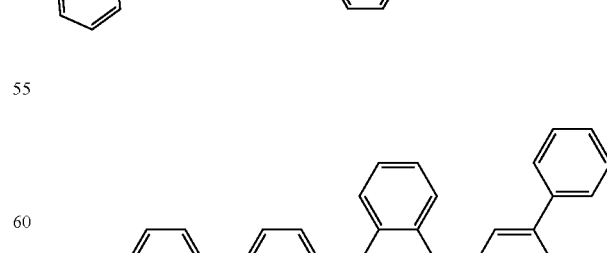
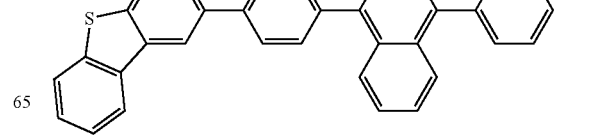

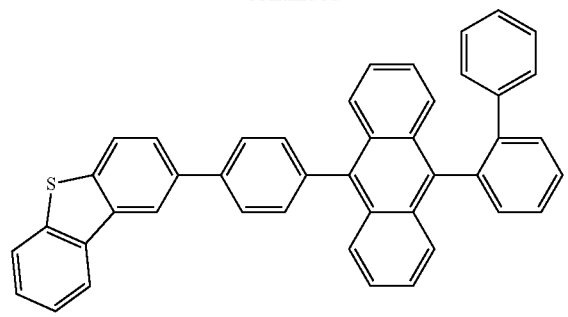
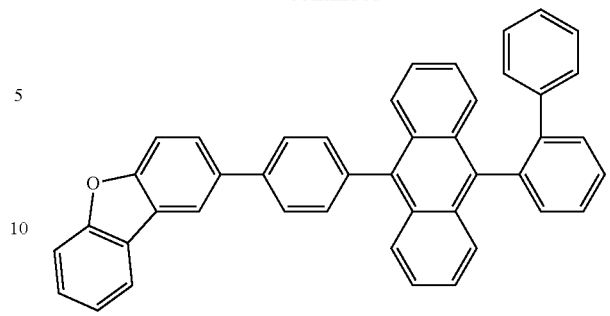
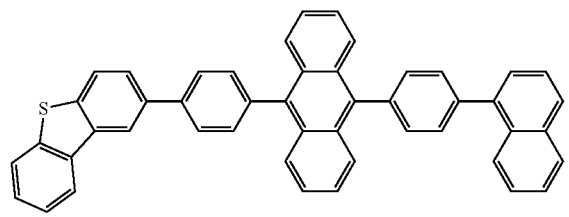
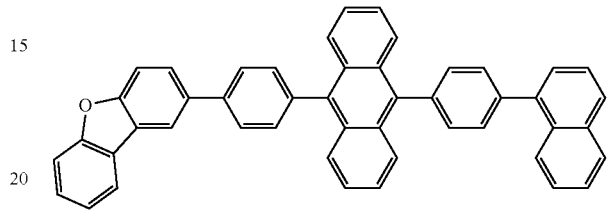
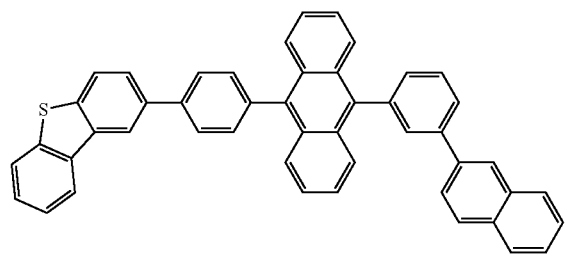
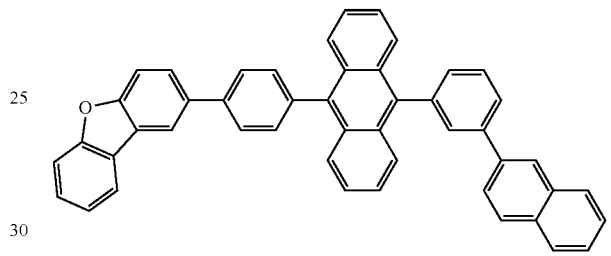
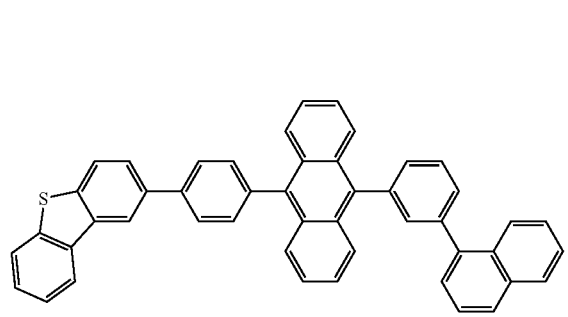
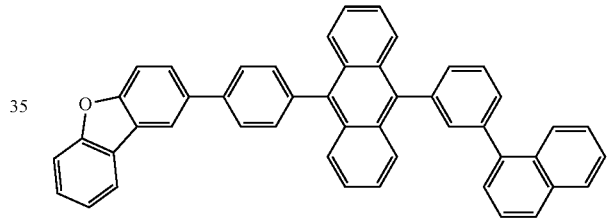
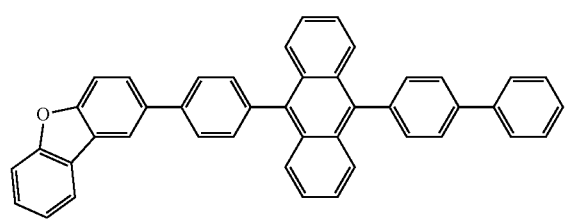
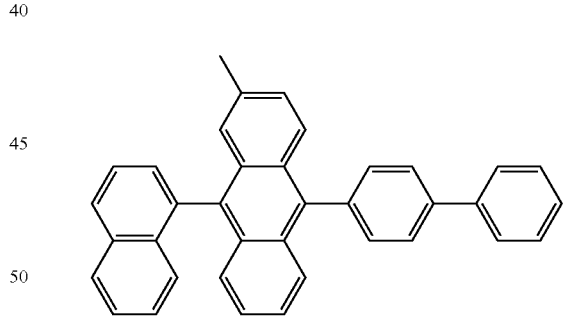
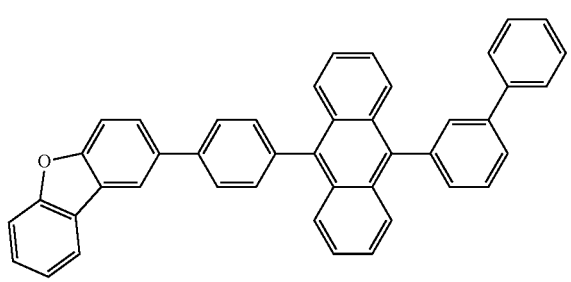
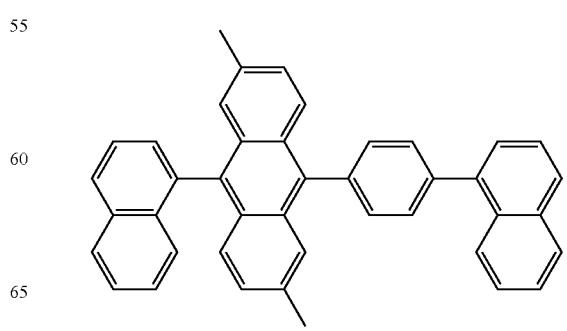

87
-continued
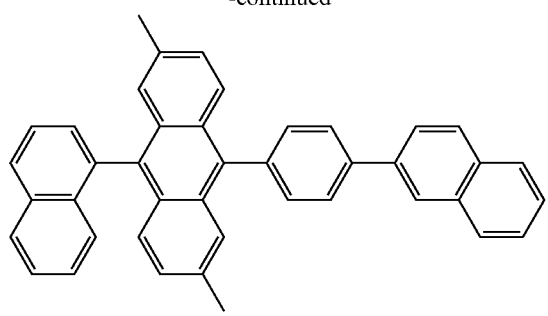
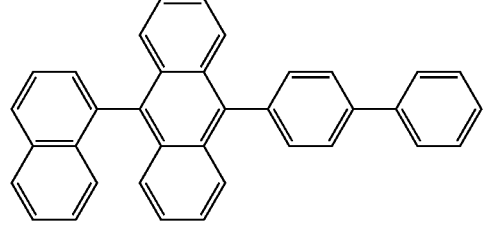
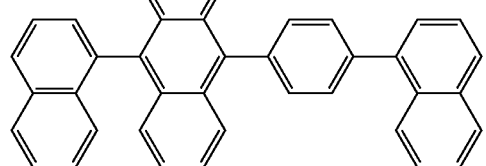
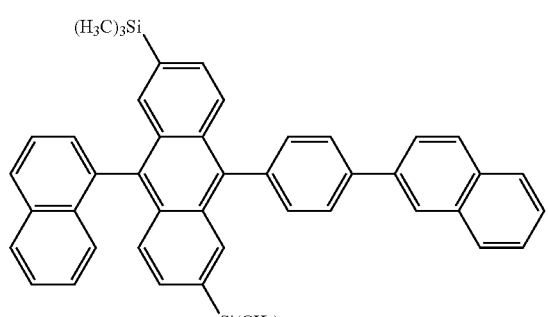
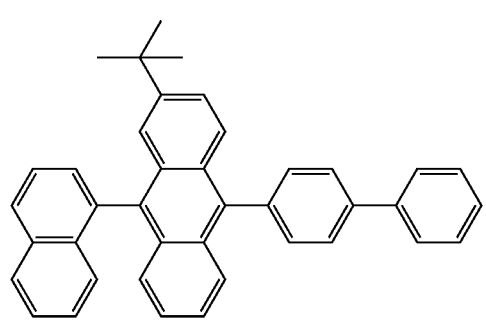
88
-continued
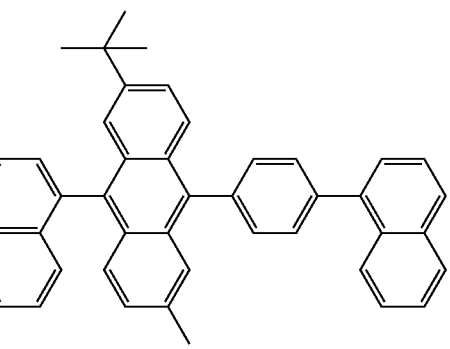
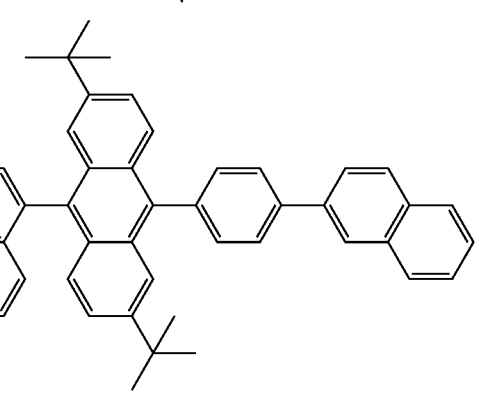
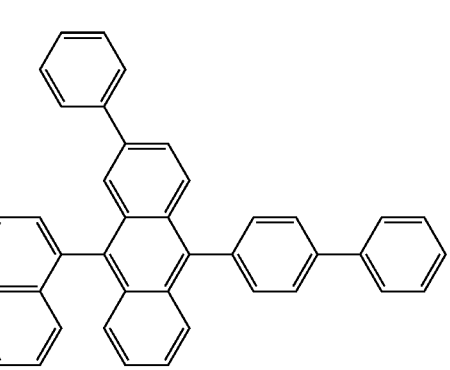
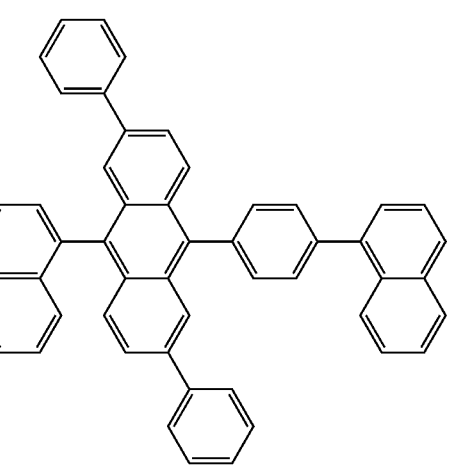

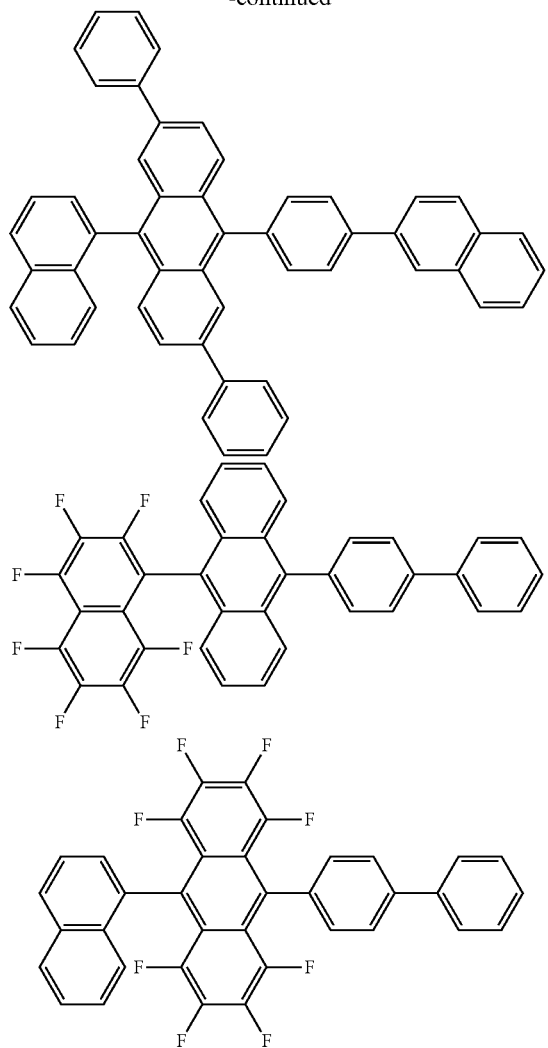
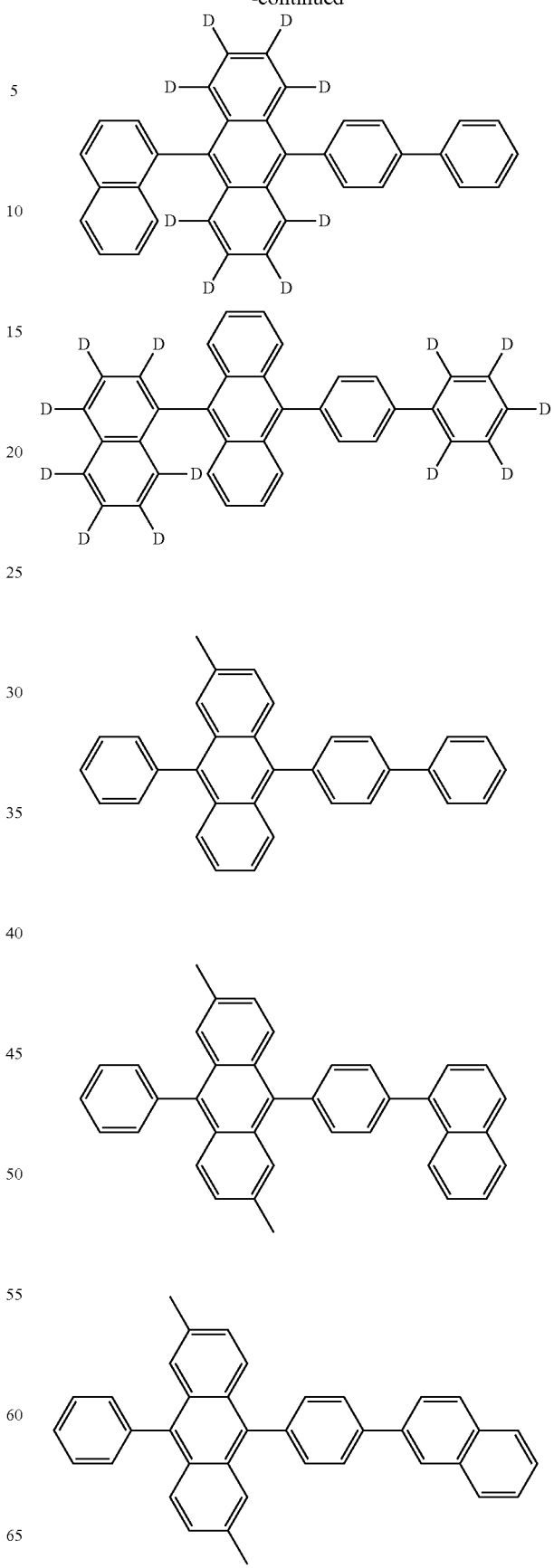

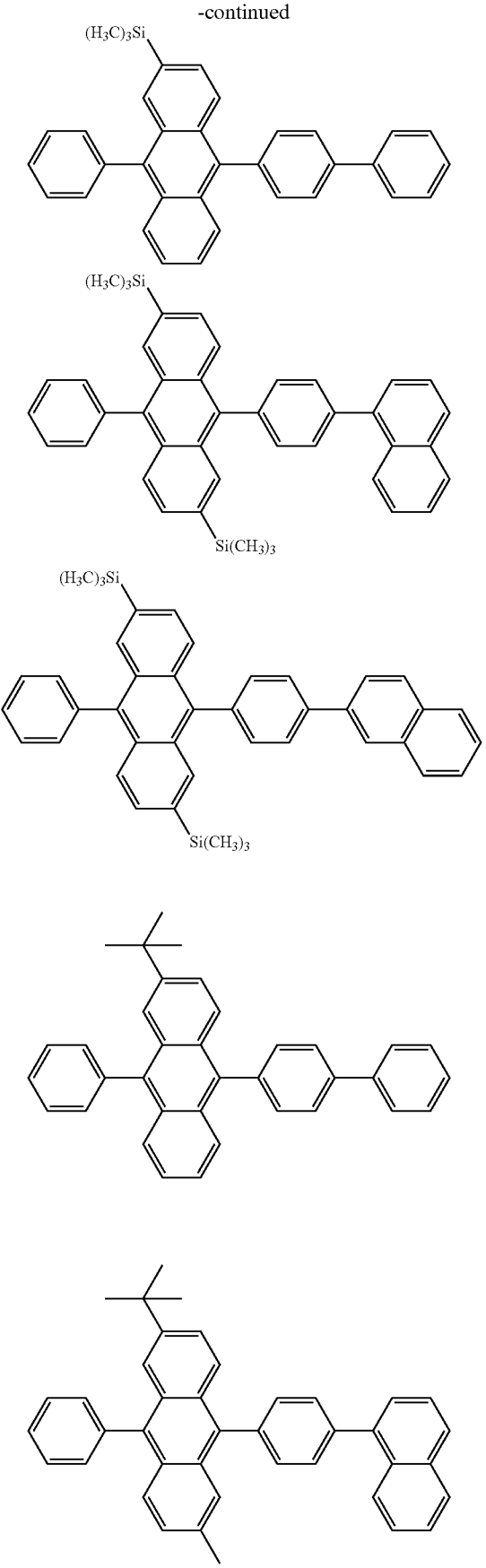
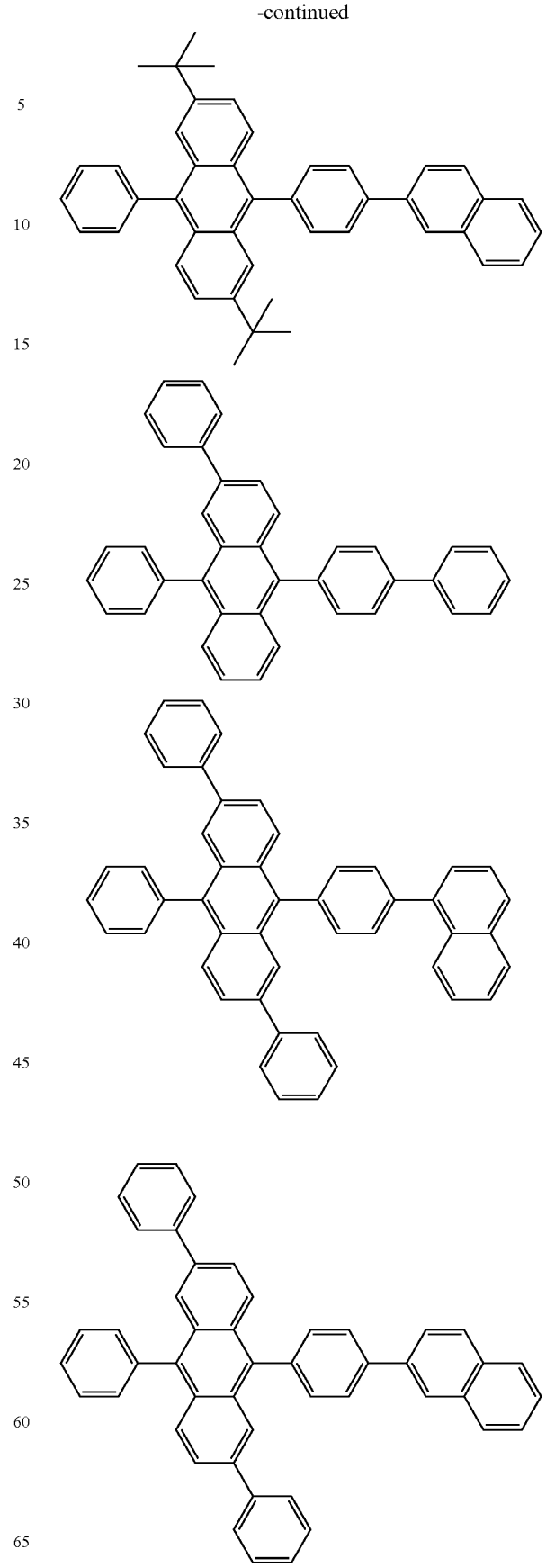

-continued
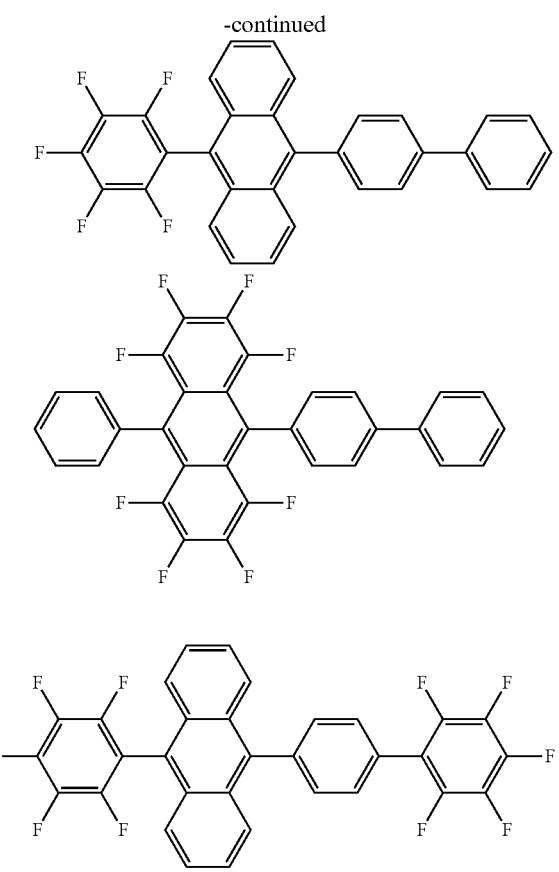
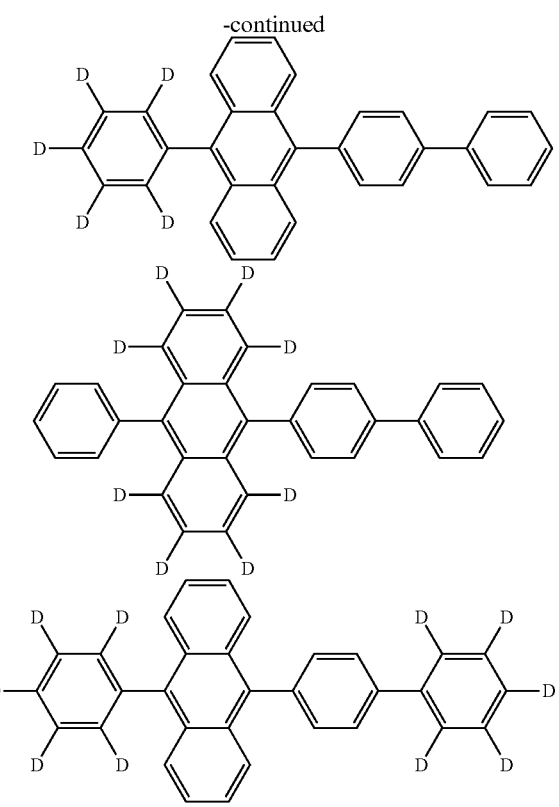
In some other embodiments, the second material may be selected from the following compounds, but it is not limited thereto.
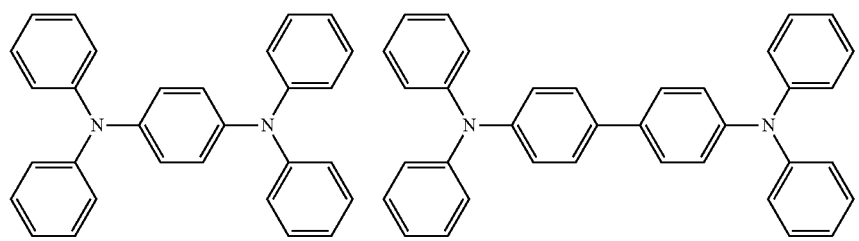
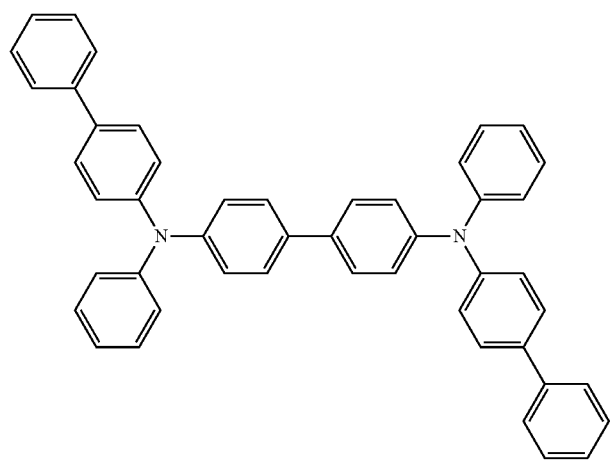

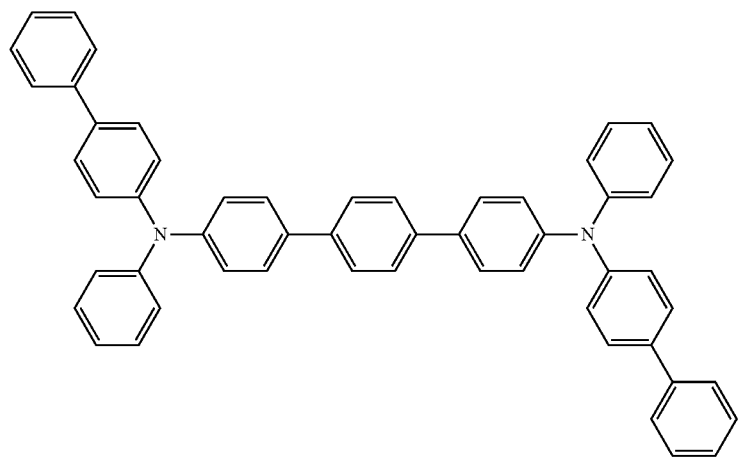
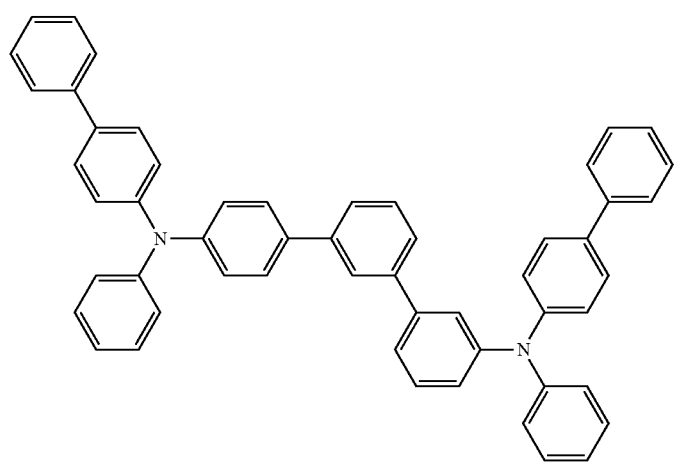
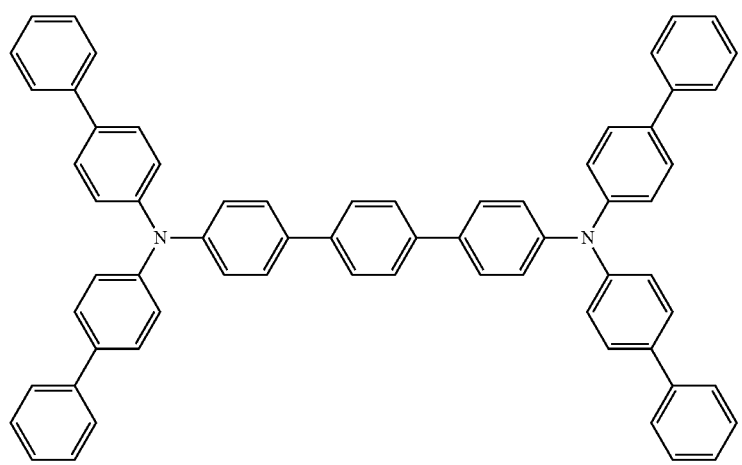

-continued
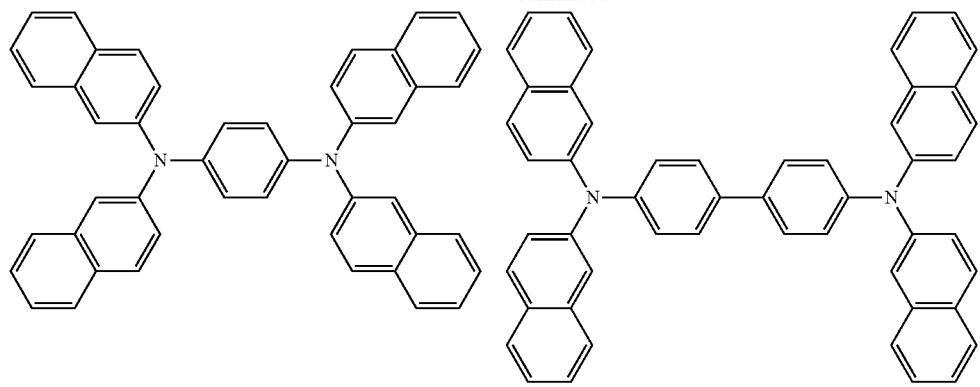
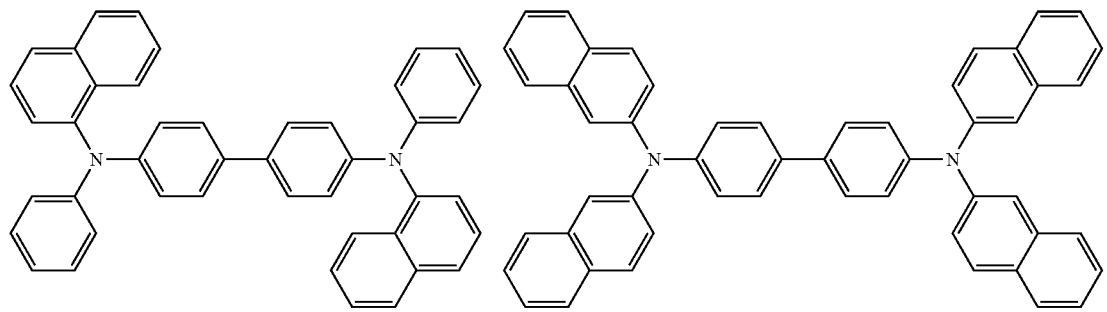
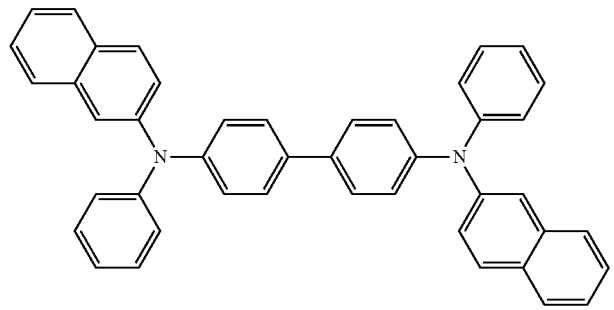
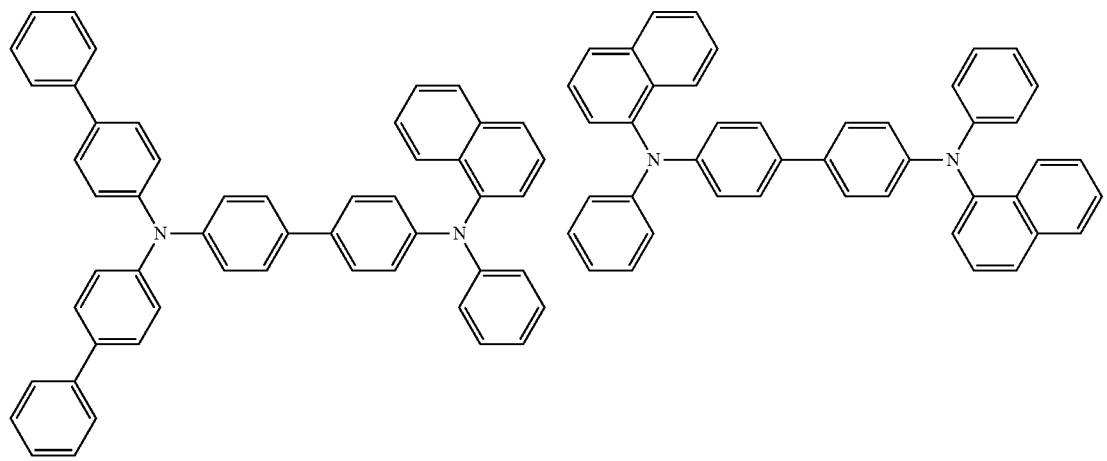

-continued
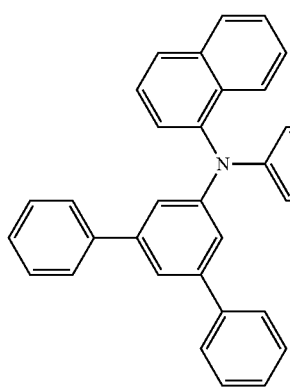 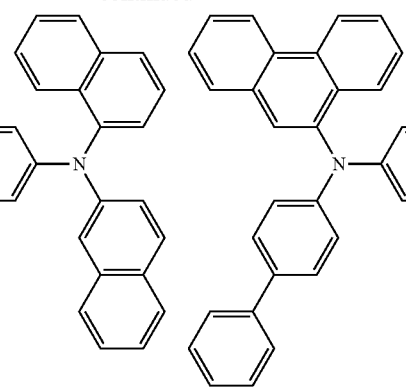 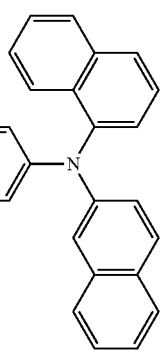
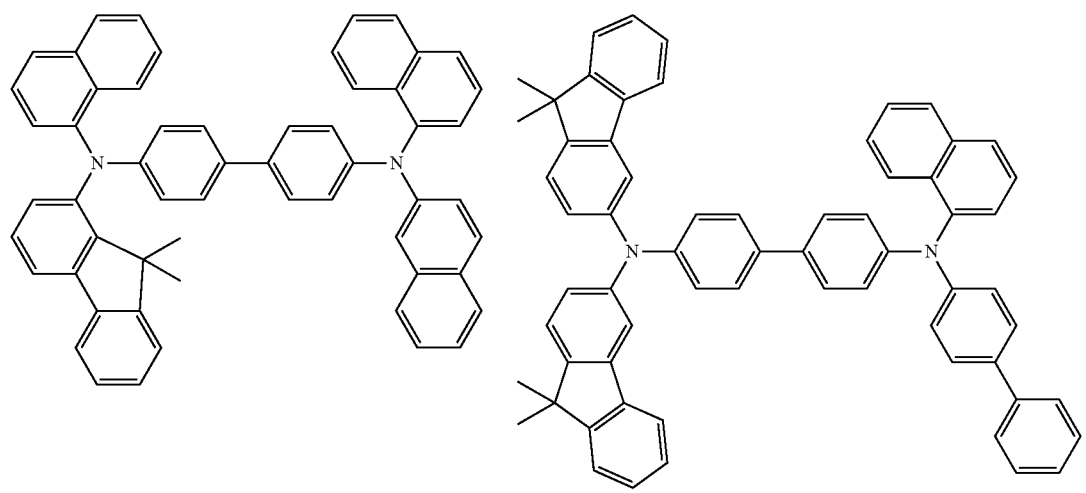
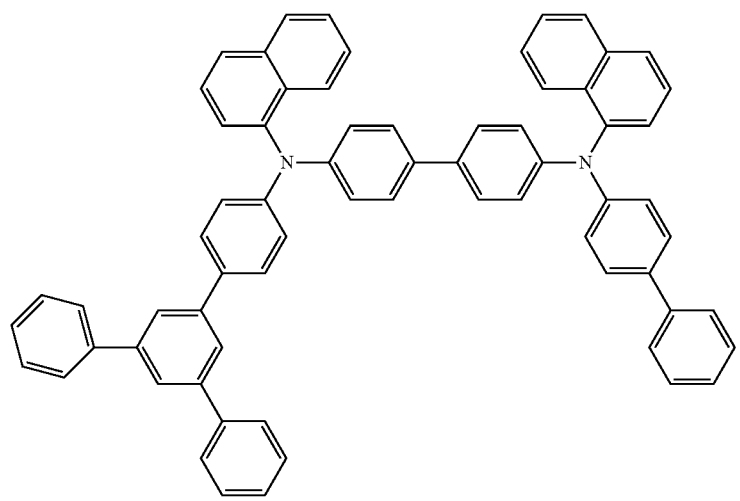

-continued
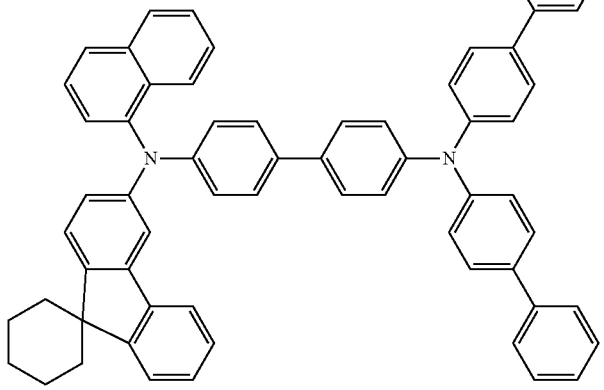
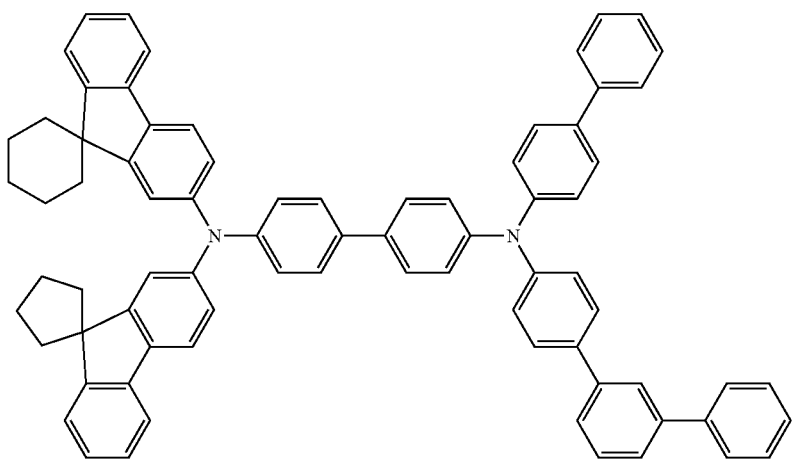
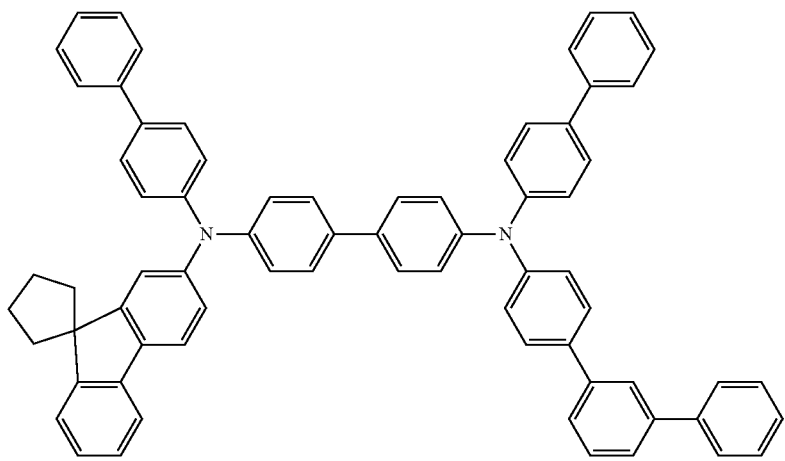

-continued
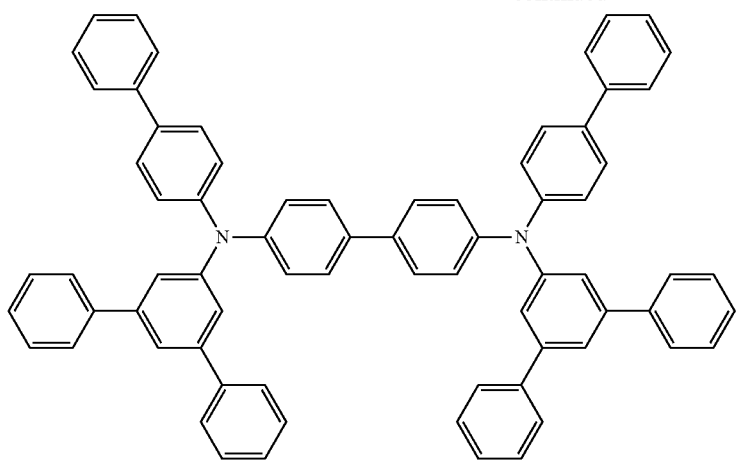
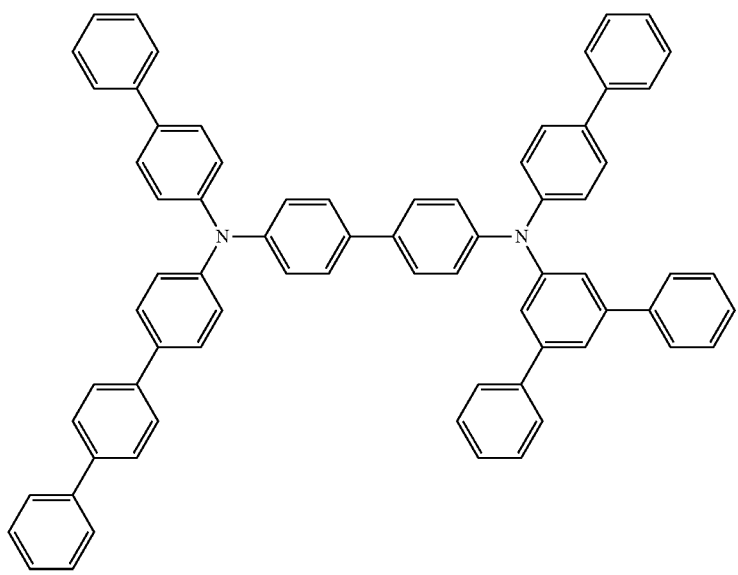
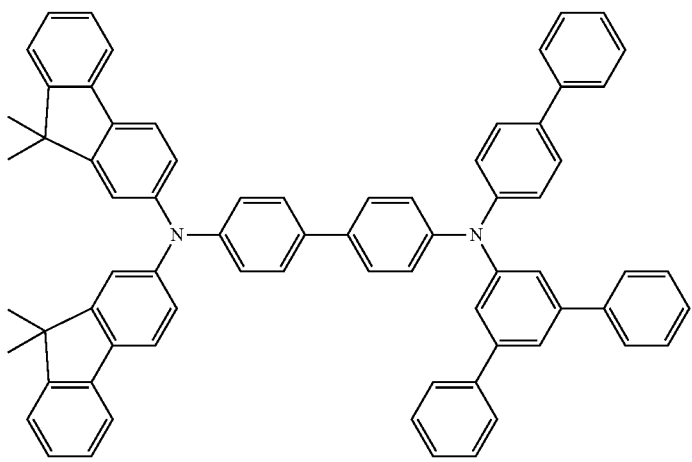

-continued
105
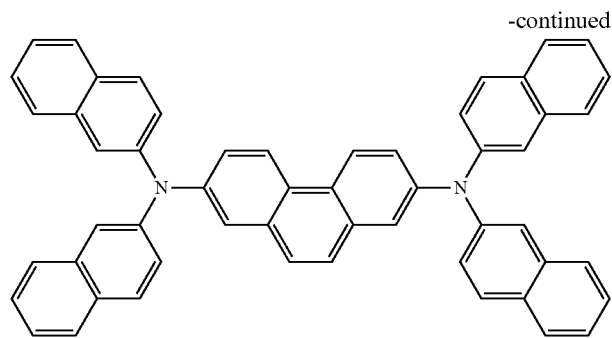
106
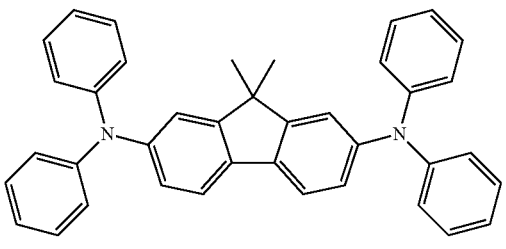
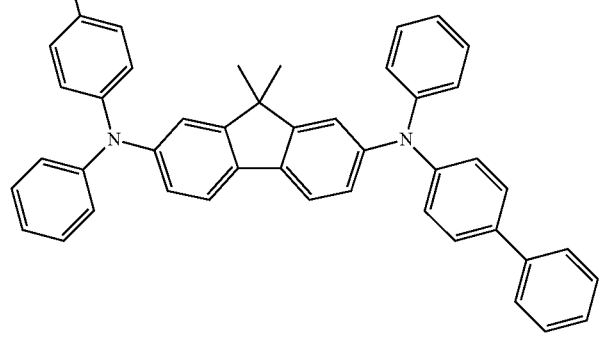
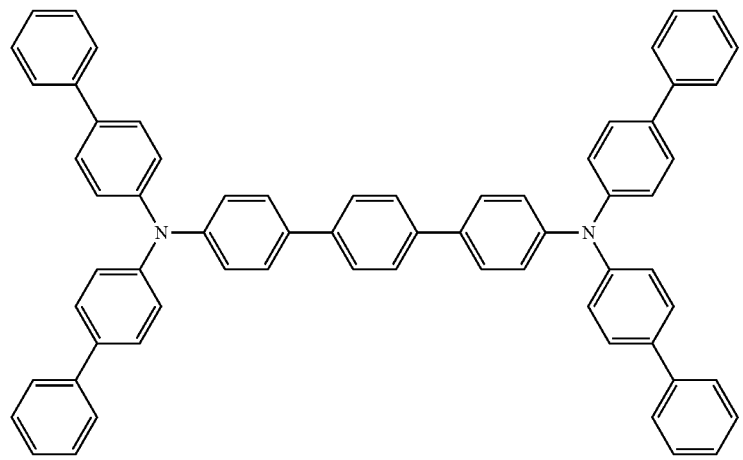
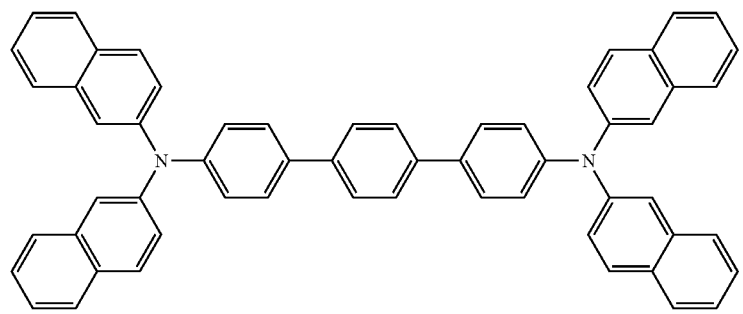

-continued
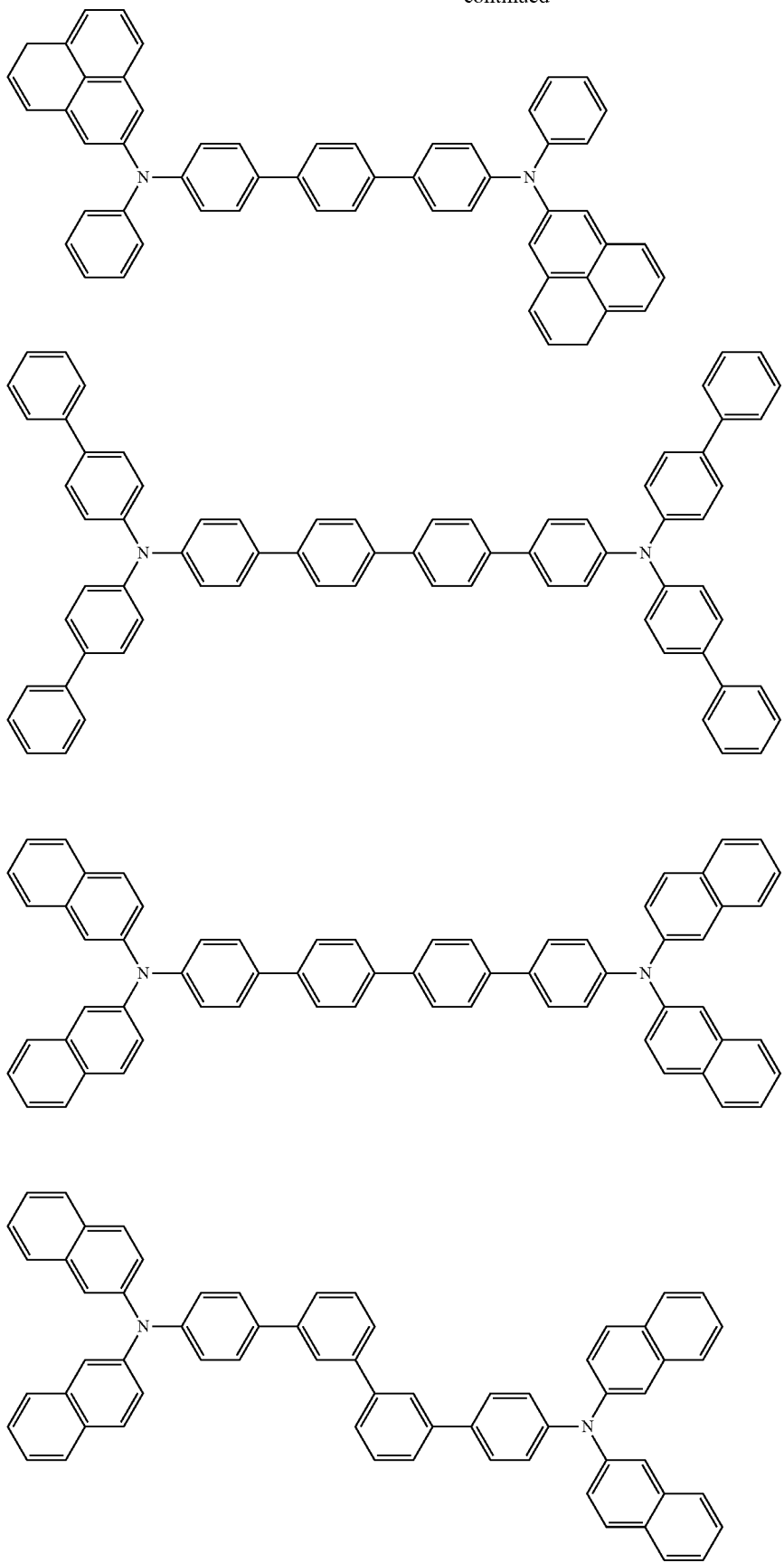

-continued
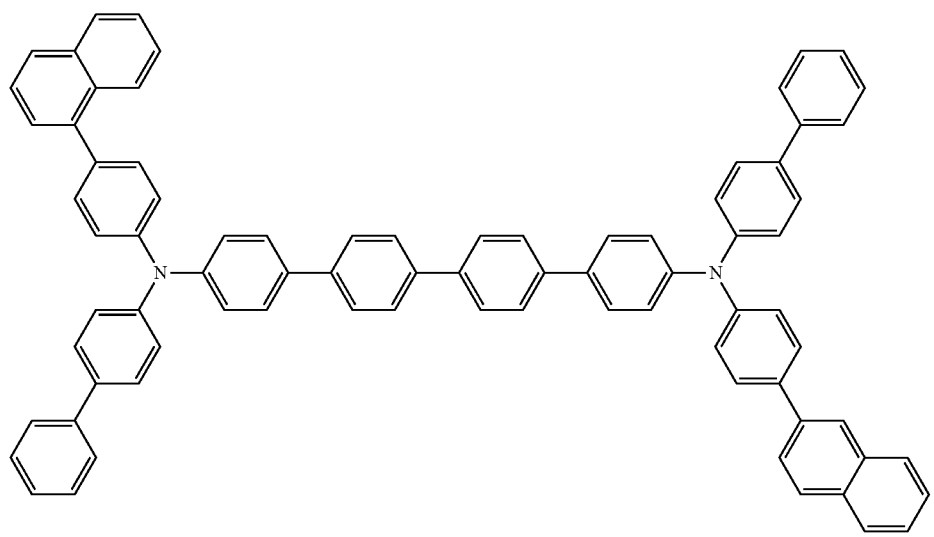
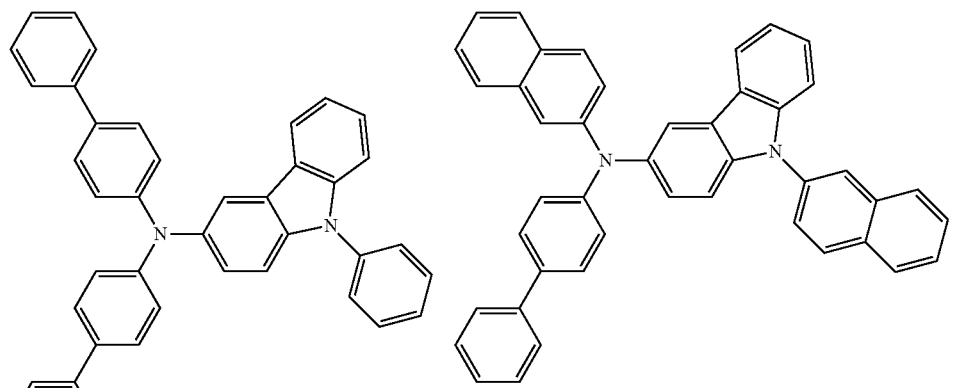
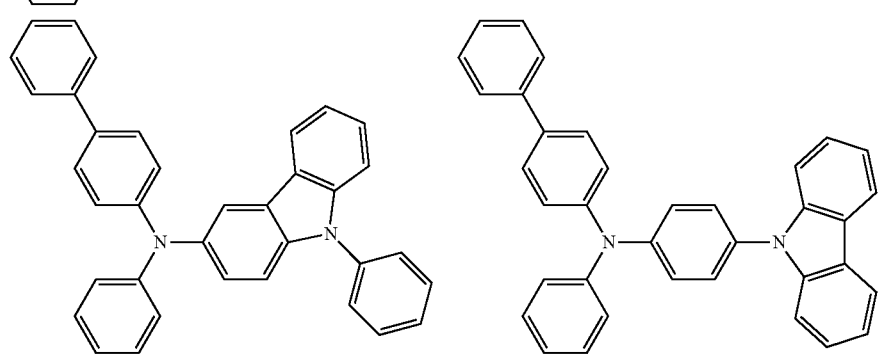
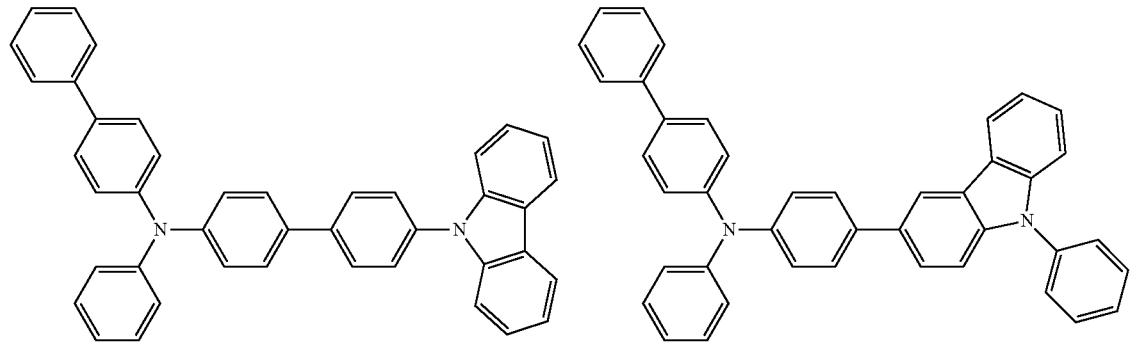

111
112
-continued
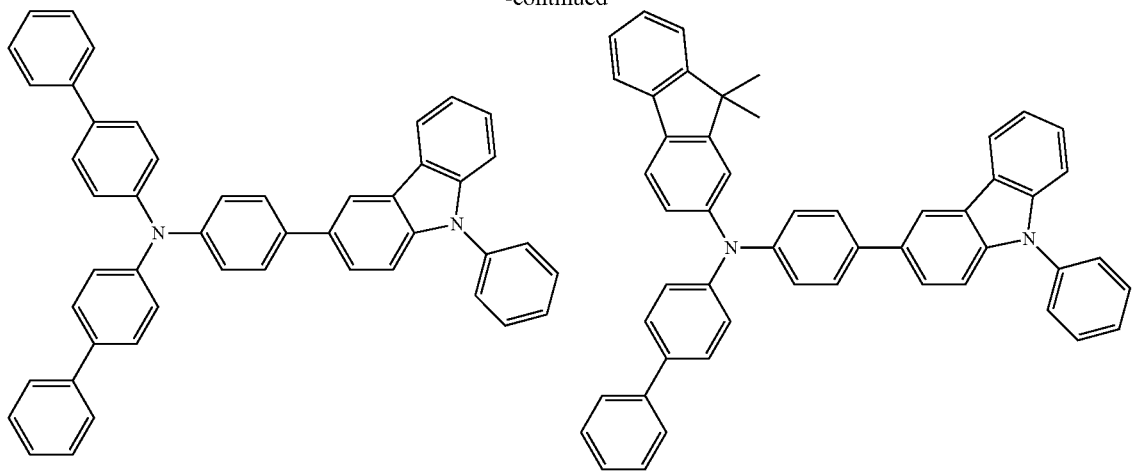
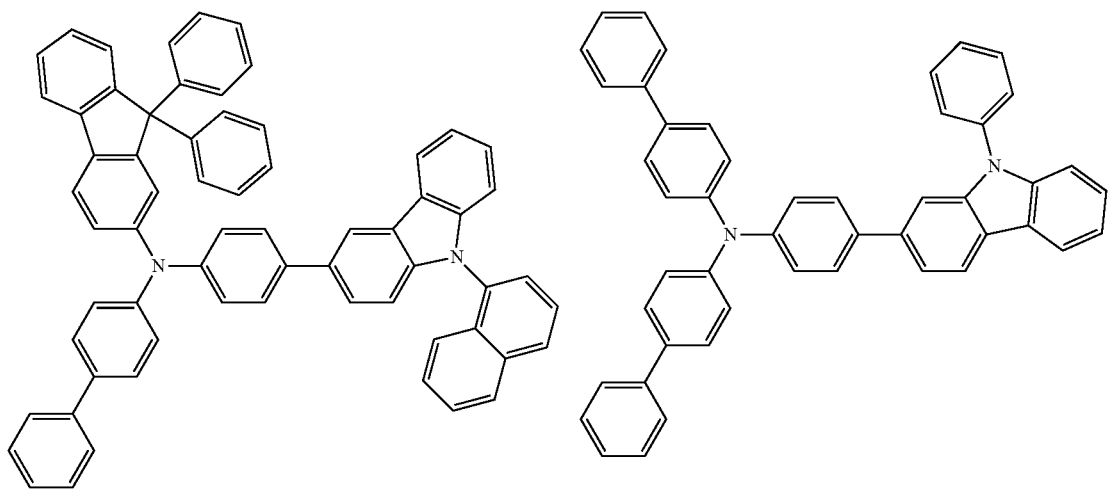
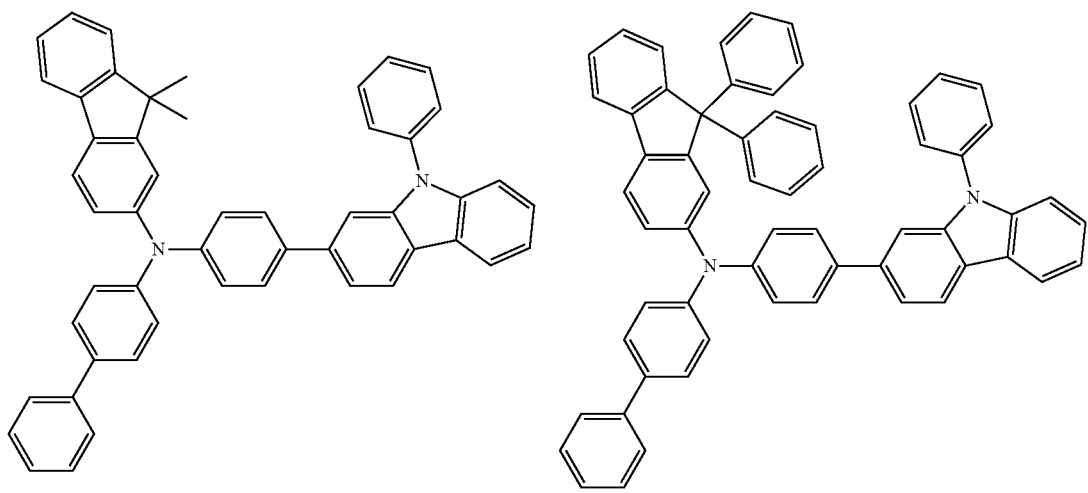

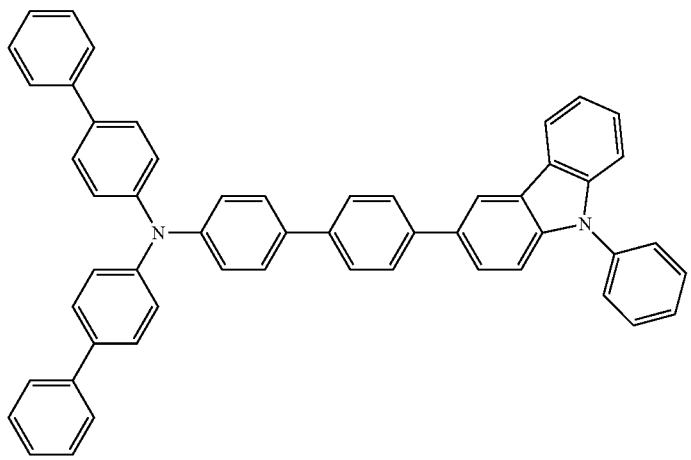
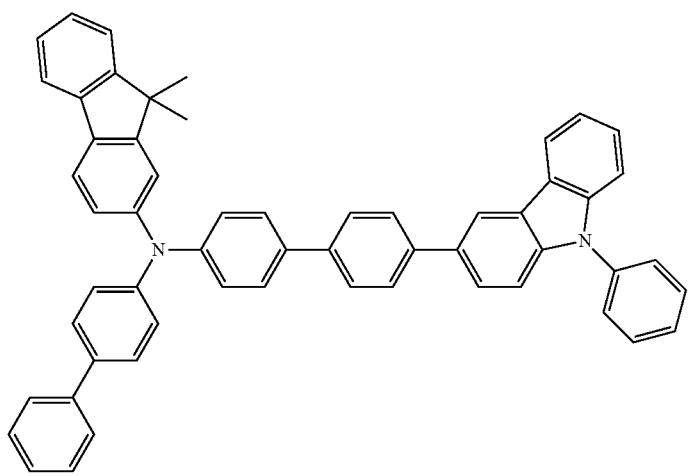
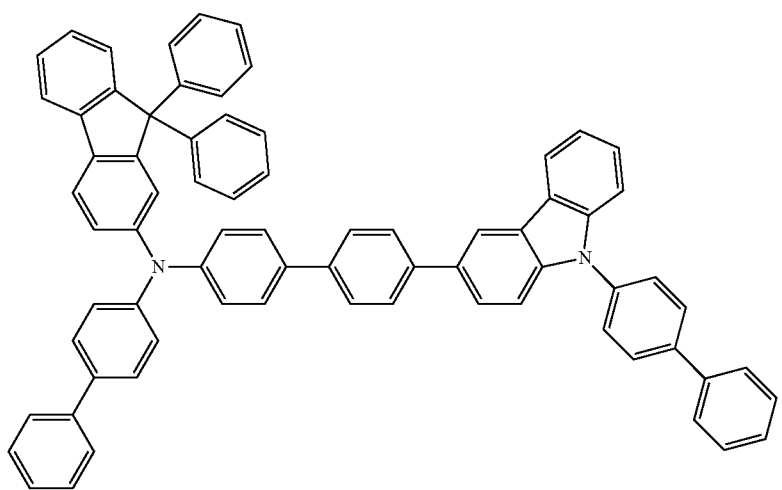

115
-continued
116
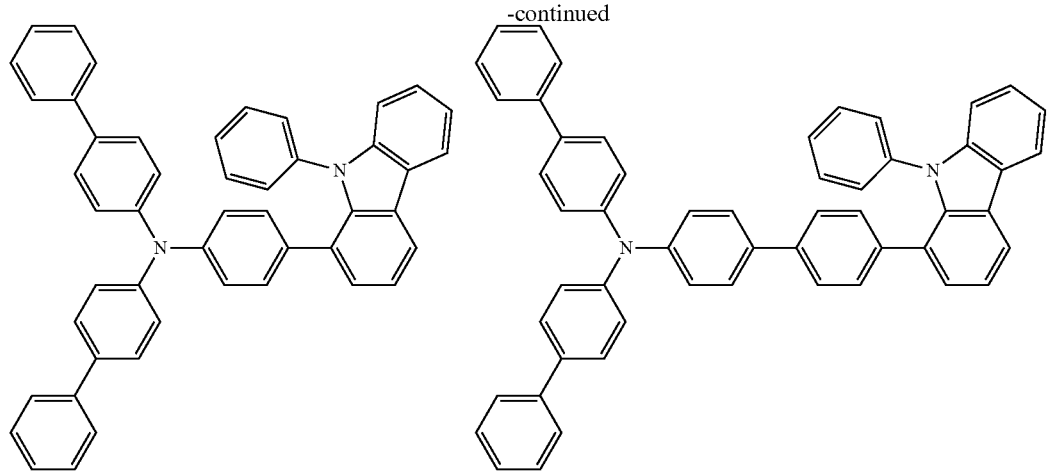
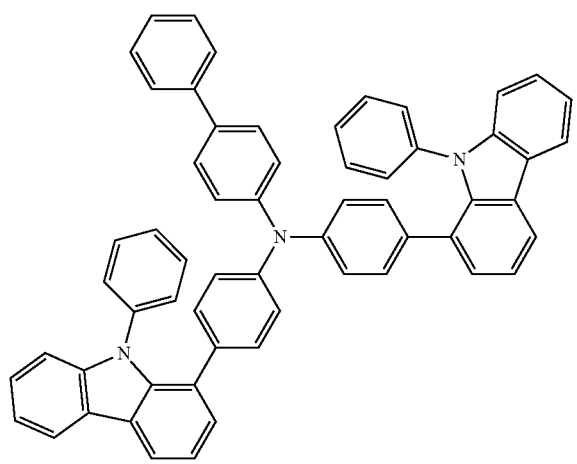
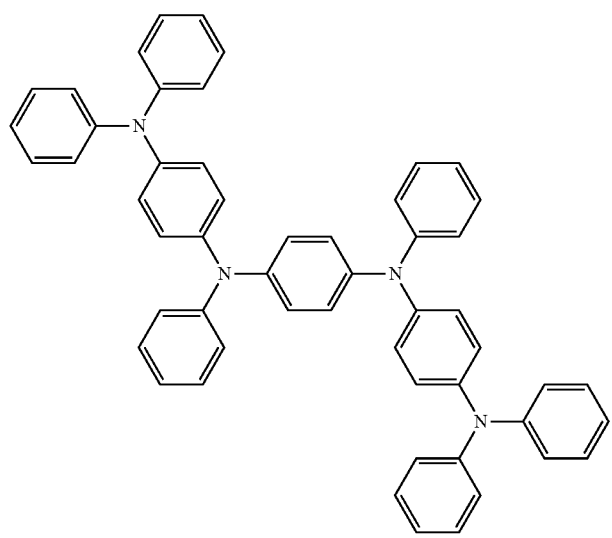

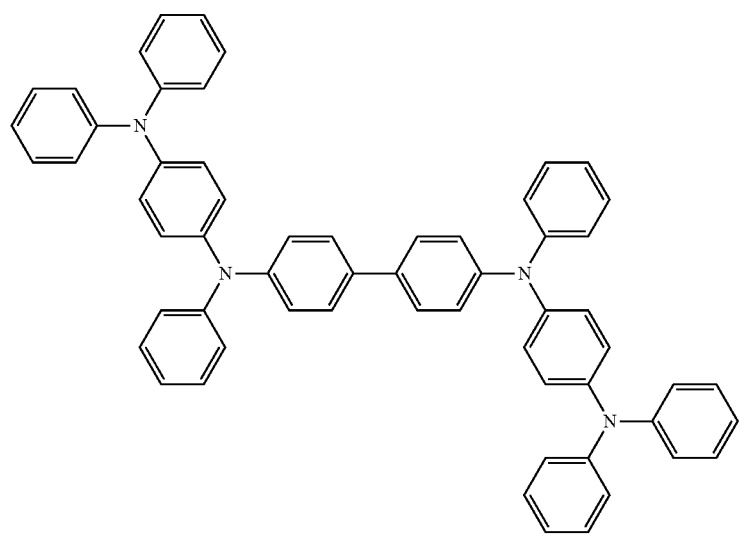
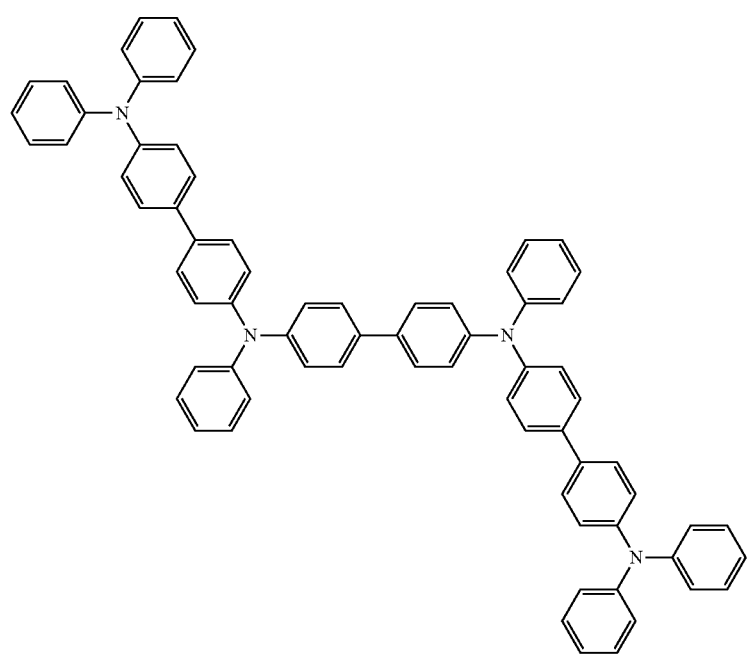

-continued
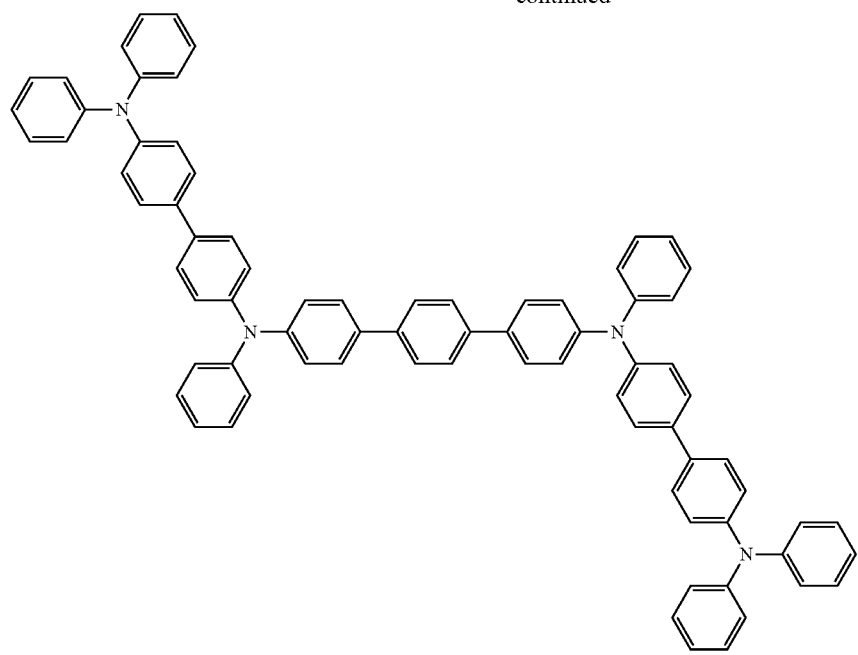
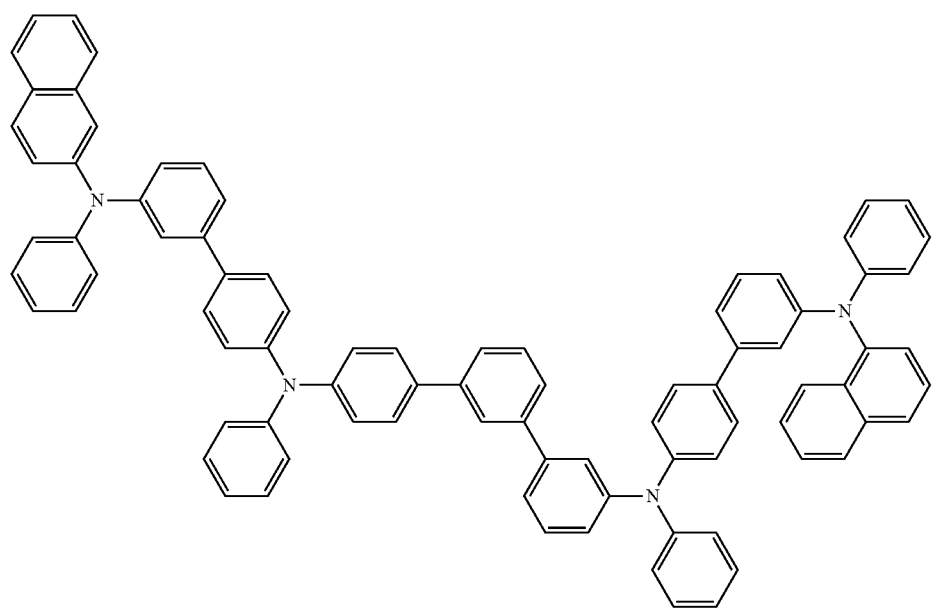

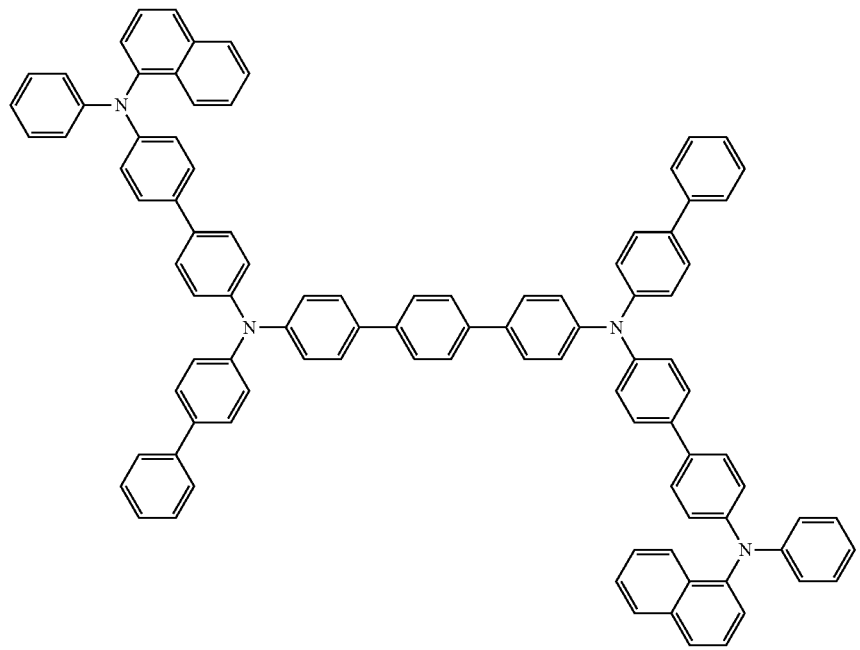
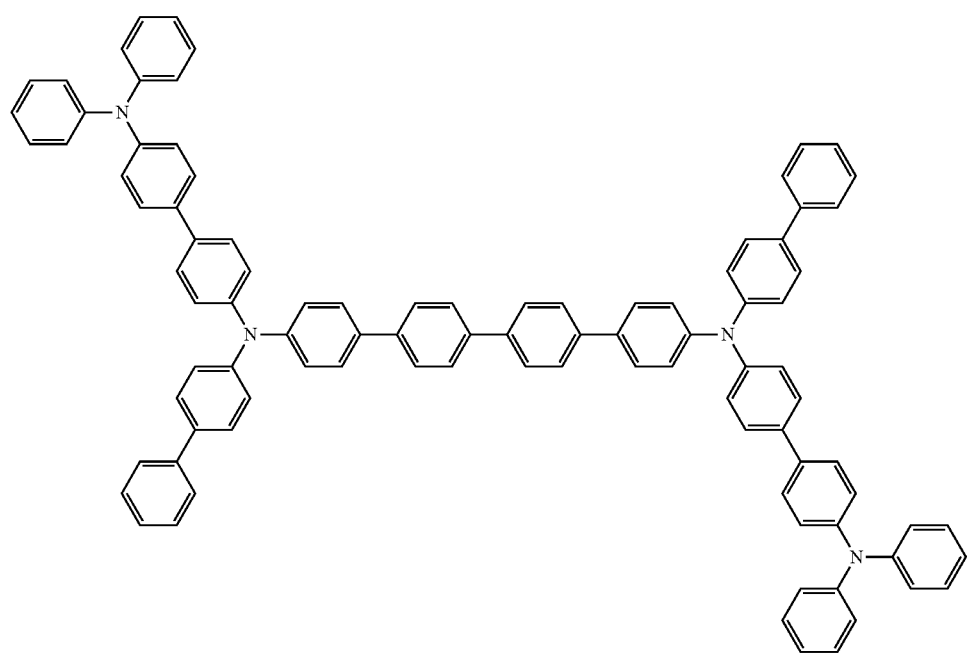
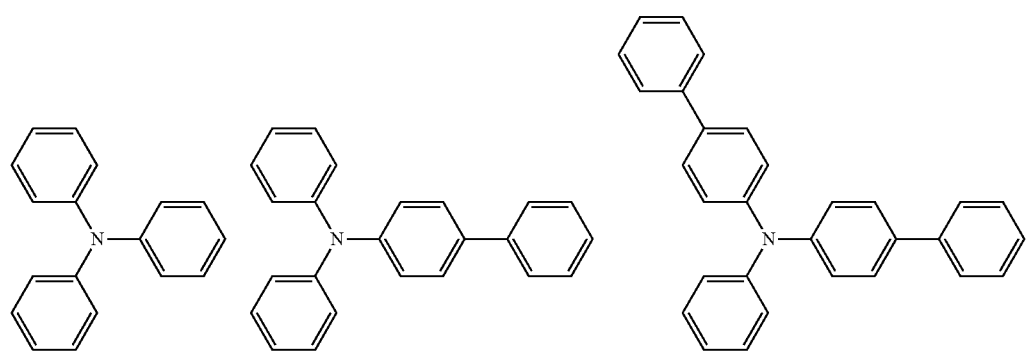

-continued
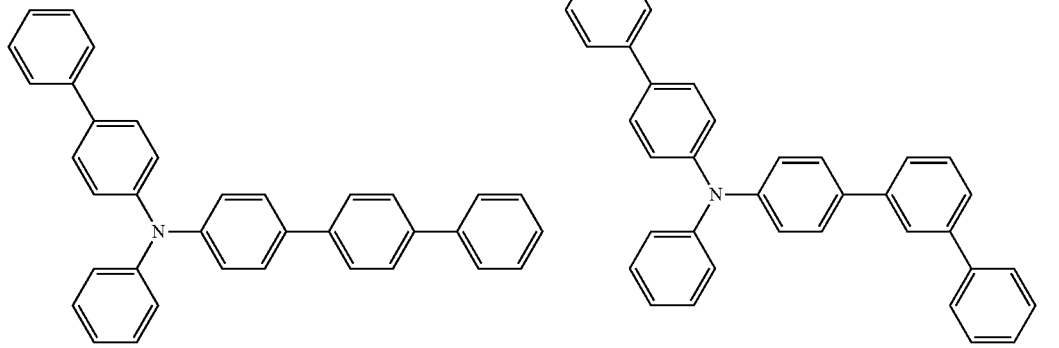
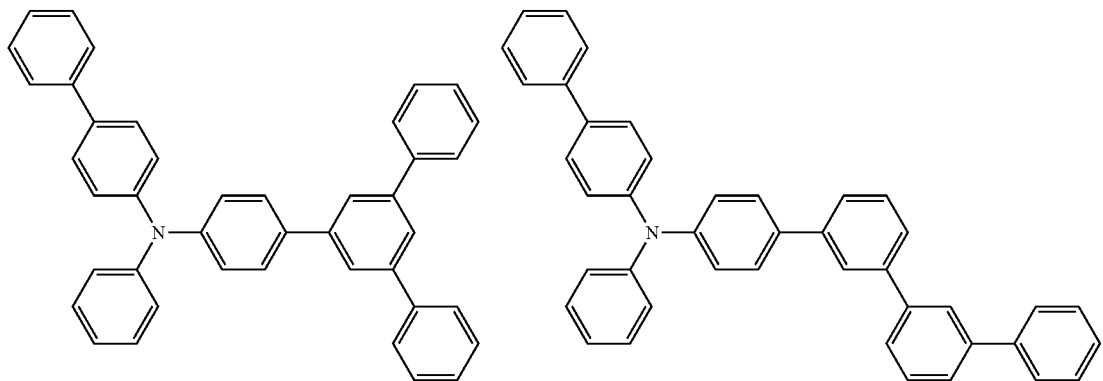
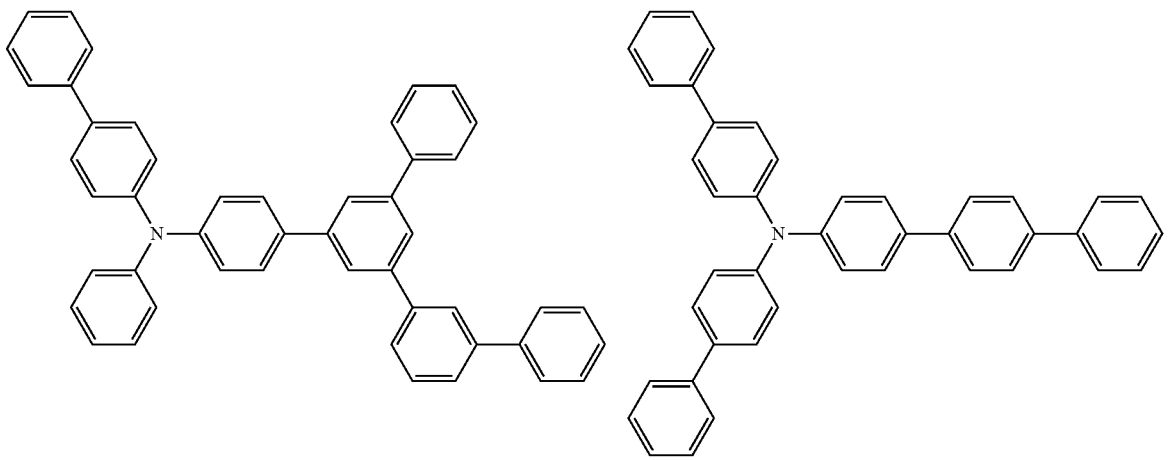
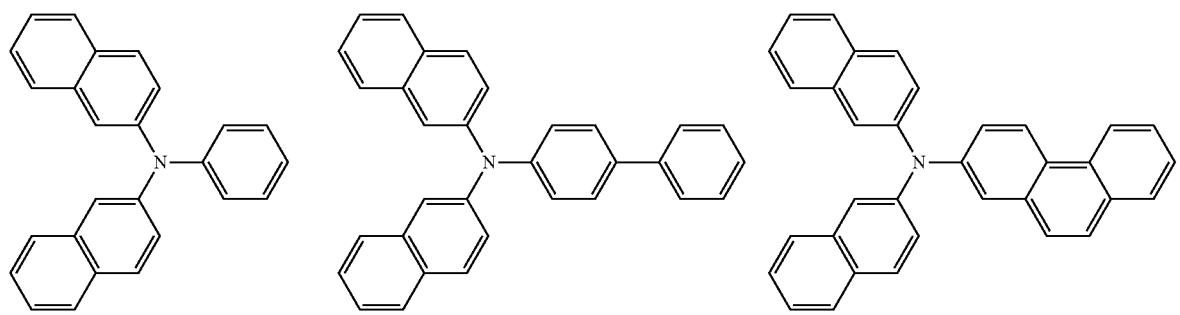

-continued
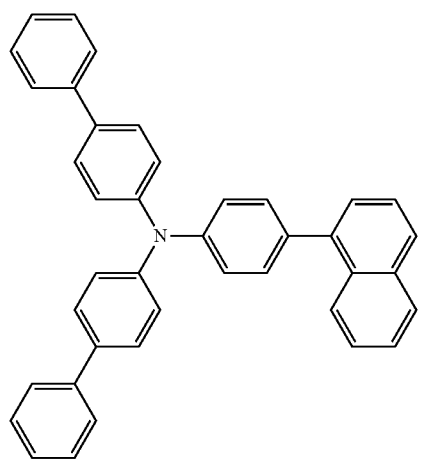
125
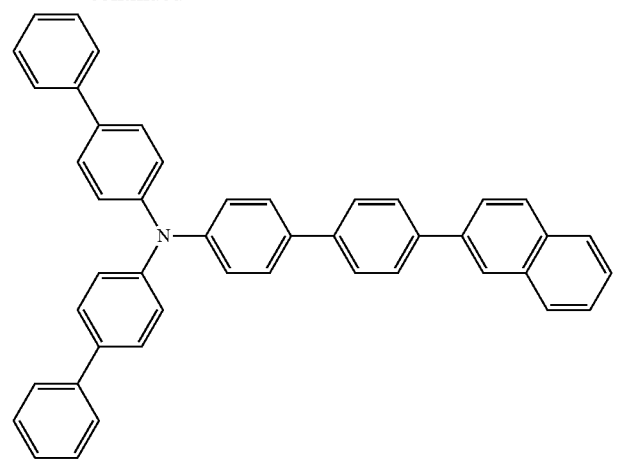
126
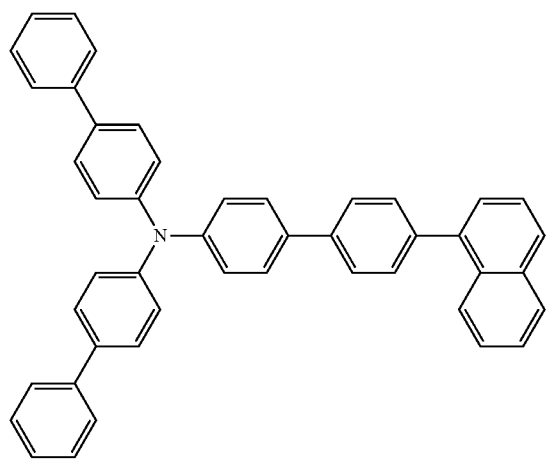
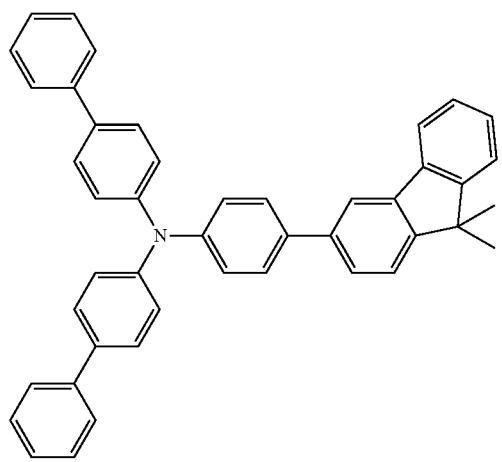
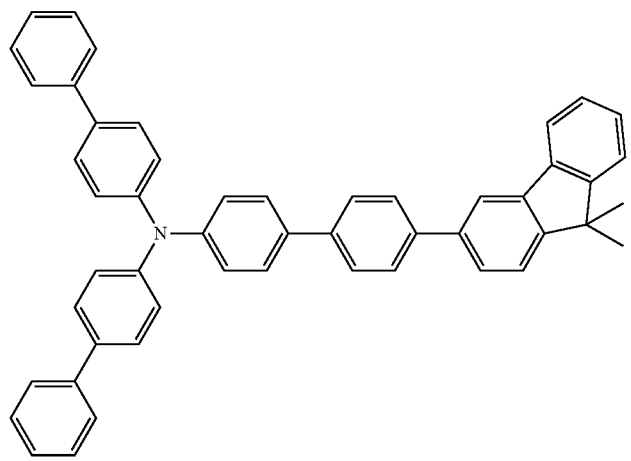

-continued

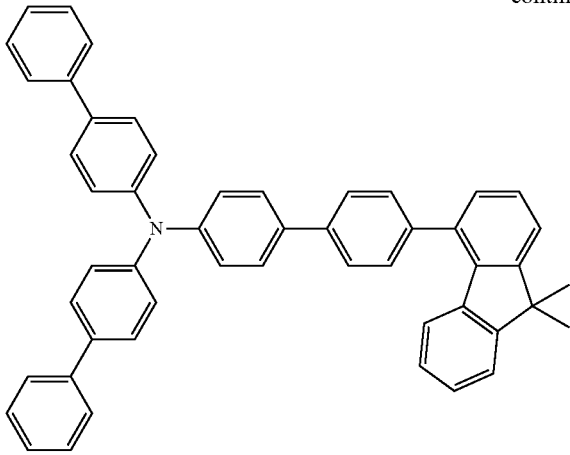

A volume ratio of the first material to the second material may be in a range of about 96:1 to about 77:20. For example, a volume ratio of the first material to the second material may be in a range of about 94:3 to about 87:10, but embodiments of the present disclosure are not limited thereto. In one embodiment, when the volume ratio is within these ranges, carriers are effectively or suitably captured so that an organic light-emitting device with improved efficiency and long lifespan may be provided.

The dopant may include a third material represented by Formula 8. The second material and the third material may be different from each other.

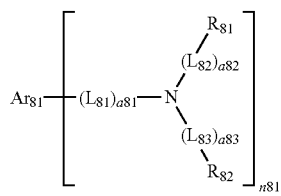

Formula 8

In Formula 8, $Ar_{81}$ may be selected from a mono, di, or tri-valent substituted or unsubstituted $C_6$-$C_{60}$ arene, a mono, di, or tri-valent substituted or unsubstituted non-aromatic condensed polycycle, a mono, di, or tri-valent substituted or unsubstituted non-aromatic condensed heteropolycycle, and a mono, di, or tri-valent substituted or unsubstituted $C_2$-$C_{60}$ alkene, the valency of the $C_6$-$C_{60}$ arene, the non-aromatic condensed polycycle, the non-aromatic condensed heteropolycycle, and the $C_2$-$C_{60}$ alkene corresponding to (e.g., having the same value as) the value of n81 (e.g., $Ar_{81}$ may be selected from an n81-valent substituted or unsubstituted $C_6$-$C_{60}$ arene, an n81-valent substituted or unsubstituted non-aromatic condensed polycycle, an n81-valent substituted or unsubstituted non-aromatic condensed heteropolycycle, and an n81-valent substituted or unsubstituted $C_2$-$C_{60}$ alkene).

At least one substituent of the substituted $C_6$-$C_{60}$ arene, the substituted non-aromatic condensed polycycle, the substituted non-aromatic condensed heteropolycycle, and the substituted $C_2$-$C_{60}$ alkene may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 8, $Ar_{81}$ may be selected from:

a mono, di, or tri-valent anthracene, a mono, di, or tri-valent fluoranthene, a mono, di, or tri-valent triphenylene, a mono, di, or tri-valent pyrene, a mono, di, or tri-valent chrysene, a mono, di, or tri-valent perylene, a mono, di, or tri-valent hexacene, a mono, di, or tri-valent pentacene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene and a mono, di, or tri-valent ethene (e.g., an n81-valent anthracene, an n81-valent fluoranthene, an n81-valent triphenylene, an n81-valent pyrene, an n81-valent chrysene, an n81-valent perylene, an n81-valent hexacene, an n81-valent pentacene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene and an n81-valent ethene); and a mono, di, or tri-valent anthracene, a mono, di, or tri-valent fluoranthene, a mono, di, or tri-valent triphenylene, a mono, di, or tri-valent pyrene, a mono, di, or tri-valent chrysene, a mono, di, or tri-valent perylene, a mono, di, or tri-valent hexacene, a mono, di, or tri-valent pentacene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene (e.g., an n81-valent anthracene, an n81-valent fluoranthene, an n81-valent triphenylene, an n81-valent pyrene, an n81-valent chrysene, an n81-valent perylene, an n81-valent hexacene, an n81-valent pentacene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene, and an n81-valent ethene), each substituted with at least one of a deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, and —Si($Q_{31}$)($Q_{32}$)($Q_{33}$).

$Q_{31}$ to $Q_{33}$ may be each independently selected from a $C_1$-$C_{60}$ alkyl group and a $C_6$-$C_{60}$ aryl group. However, embodiments of the present disclosure are not limited thereto.

In some other embodiments, in Formula 8, $Ar_{81}$ may be selected from a mono, di, or tri-valent anthracene, a mono, di, or tri-valent pyrene, a mono, di, or tri-valent chrysene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene (e.g., an n81-valent anthracene, an n81-valent pyrene, an n81-valent chrysene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene, and an n81-valent ethene); and a mono, di, or tri-valent anthracene, a mono, di, or tri-valent pyrene, a mono, di, or tri-valent chrysene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene (e.g., an n81-valent anthracene, an n81-valent pyrene, an n81-valent chrysene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene, and an n81-valent ethene), each substituted with at least one of a deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a naphthyl group, a pyridinyl group, and —Si($Q_{31}$)($Q_{32}$)($Q_{33}$).

$Q_{31}$ to $Q_{33}$ may be each independently selected from a methyl group, an ethyl group, an n-propyl group, an iso-propyl group, and a phenyl group. However, embodiments of the present disclosure are not limited thereto.

In still other embodiments, $Ar_{81}$ may be selected from:

a mono, di, or tri-valent anthracene, a mono, di, or tri-valent pyrene, a mono, di, or tri-valent chrysene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene (e.g., an n81-valent anthracene, an n81-valent pyrene, an n81-valent chrysene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene, and an n81-valent ethene); and a mono, di, or tri-valent anthracene, a mono, di, or tri-valent pyrene, a mono, di, or tri-valent chrysene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene (e.g., an n81-valent anthracene, an n81-valent pyrene, an n81-valent chrysene, an n81-valent fluorene, an n81-valent benzofluorene, an n81-valent dibenzofluorene, an n81-valent indenophenanthrene, an n81-valent dibenzofuran, an n81-valent dibenzothiophene, an n81-valent benzonaphthofuran, an n81-valent benzonaphthothiophene, and an n81-valent ethene), each substituted with at least one of a deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, and —Si($CH_3$)$_3$. However, embodiments of the present disclosure are not limited thereto.

In Formula 8, $L_{81}$ to $L_{83}$ may be each independently selected from a substituted or unsubstituted $C_6$-$C_{60}$ arylene group and a substituted or unsubstituted $C_1$-$C_{60}$ heteroarylene group.

At least one substituent of the substituted $C_6$-$C_{60}$ arylene group and the substituted $C_1$-$C_{60}$ heteroarylene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 8, $L_{81}$ to $L_{83}$ may be each independently selected from:

a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group. However, embodiments of the present disclosure are not limited thereto.

In some embodiments, in Formula 8, $L_{81}$ to $L_{83}$ may be each independently selected from:

a phenylene group and a naphthylene group; and a phenylene group, and a naphthylene group, each substituted with at least one of a deuterium, —F, —Cl, —Br, —I, a cyano group, a nitro group, a $C_1$-$C_{20}$ alkyl group, a phenyl group, and a naphthyl group. However, embodiments of the present disclosure are not limited thereto.

In some other embodiments, in Formula 8, $L_{81}$ to $L_{83}$ may be each independently selected from groups represented by Formulae 3-1 to 3-15, but embodiments of the present disclosure are not limited thereto.

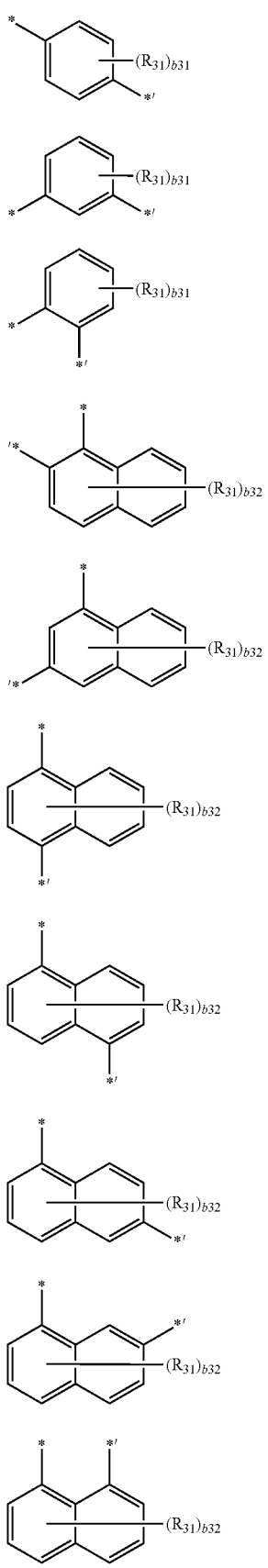
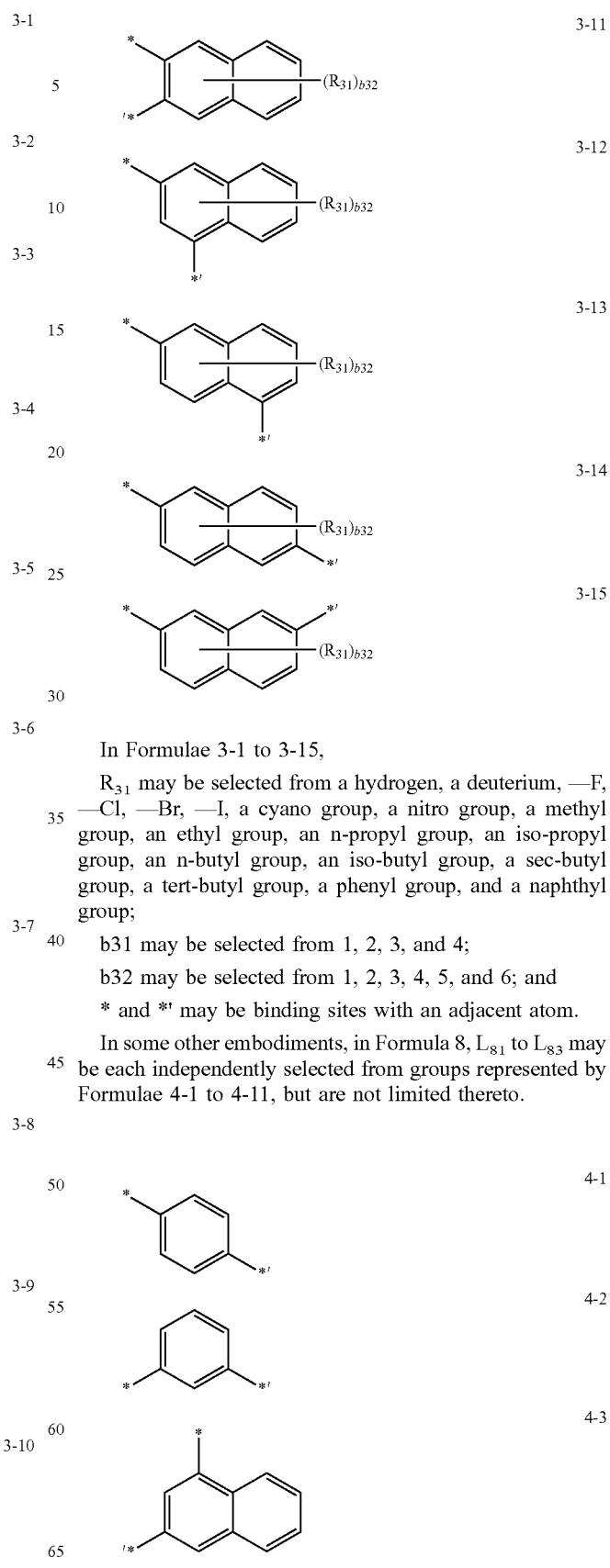

In Formulae 3-1 to 3-15, $R_{31}$ may be selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6; and

* and *' may be binding sites with an adjacent atom.

In some other embodiments, in Formula 8, $L_{81}$ to $L_{83}$ may be each independently selected from groups represented by Formulae 4-1 to 4-11, but are not limited thereto.

-continued

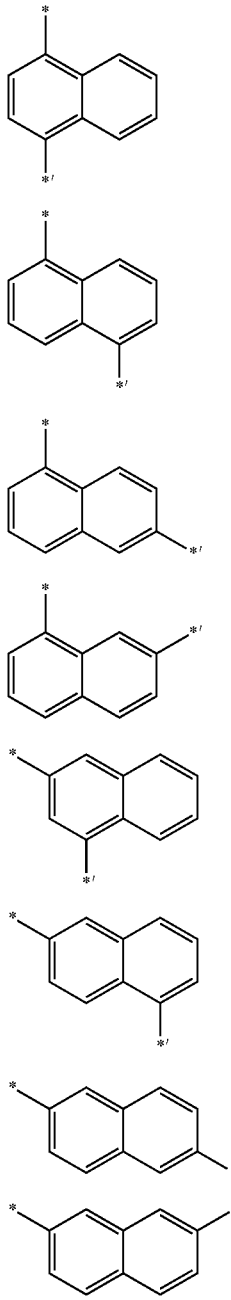

4-4

4-5

4-6

4-7

4-8

4-9

4-10

4-11

In Formulae 4-1 to 4-11, * and *' may be binding sites with an adjacent atom.

In Formula 8, a81, which indicates the number of $L_{81}$s, may be selected from 0, 1, 2, and 3. When a81 is 0, $(L_{81})_{a81}$ indicates a single bond. When a81 is 2 or greater, the plurality of $L_{81}$s may be the same or different.

In Formula 8, a82, which indicates the number of $L_{82}$s, may be selected from 0, 1, 2, and 3. When a82 is 0, $(L_{82})_{a82}$ indicates a single bond. When a82 is 2 or greater, the plurality of $L_{82}$s may be the same or different.

In Formula 8, a83, which indicates the number of $L_{83}$s, may be selected from 0, 1, 2, and 3. When a83 is 0, $(L_{83})_{a83}$ indicates a single bond. When a83 is 2 or greater, the plurality of $L_{83}$s may be the same or different.

For example, in Formula 8, a81 to a83 may be each independently selected from 0 and 1, but embodiments of the present disclosure are not limited thereto.

In Formula 8, $R_{81}$ and $R_{82}$ may be each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

At least one substituent of the substituted $C_6$-$C_{60}$ aryl group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$).

$Q_{11}$ to $Q_{17}$, $Q_{21}$ to $Q_{27}$, and $Q_{31}$ to $Q_{37}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 8, $R_{81}$ and $R_{82}$ may be each independently selected from:

a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyridinyl group, a pyrazinyl group, a pyrimidinyl group, an indolyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a fluorenyl group, a benzofluorenyl group, a spiro-fluorenyl group, a carbazolyl group, a benzocarbazolyl group, a dibenzofuranyl group, and a dibenzothiophenyl group; and a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyridinyl group, a pyrazinyl group, a pyrimidinyl group, an indolyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a fluorenyl group, a benzofluorenyl group, a spiro-fluorenyl group, a carbazolyl group, a benzocarbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —Si($Q_{31}$)($Q_{32}$)($Q_{33}$).

$Q_{31}$ to $Q_{33}$ may be each independently selected from a $C_1$-$C_{20}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. However, embodiments of the present disclosure are not limited thereto.

In some other embodiments, in Formula 8, $R_{81}$ and $R_{82}$ may be each independently selected from:

a phenyl group, a naphthyl group, a fluorenyl group, a carbazolyl group, a dibenzofuranyl group, and a dibenzothiophenyl group; and a phenyl group, a naphthyl group, a fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and —Si($Q_{31}$)($Q_{32}$)($Q_{33}$).

$Q_{31}$ to $Q_{33}$ may be each independently selected from a $C_1$-$C_{20}$ alkyl group and a $C_6$-$C_{60}$ aryl group. However, embodiments of the present disclosure are not limited thereto.

In still other embodiments, in Formula 8, $R_{81}$ and $R_{82}$ may be each independently selected from groups represented by Formulae 7-1 to 7-21, but embodiments of the present disclosure are not limited thereto.

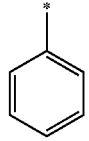

7-1

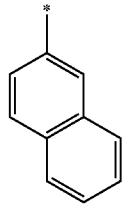

7-2

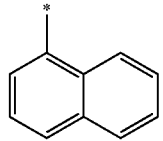

7-3

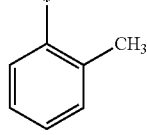

7-4

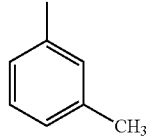

7-5

-continued
7-6 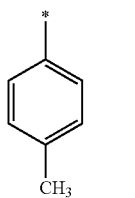
7-7 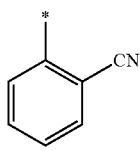
7-8 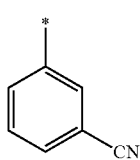
7-9 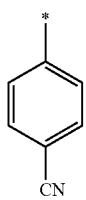
7-10 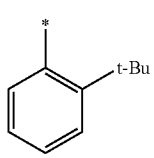
7-11 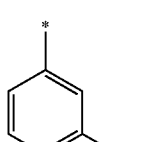
7-12 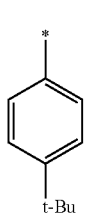
7-13 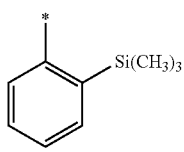
7-14 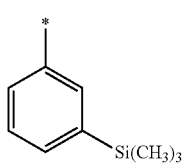
-continued
7-15 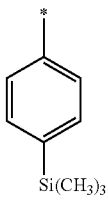
7-16 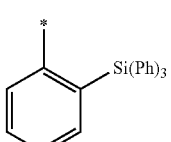
7-17 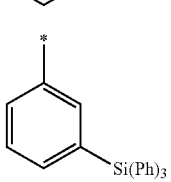
7-18 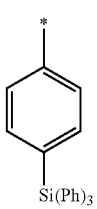
7-19 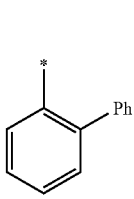
7-20 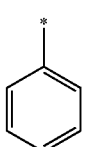
7-21 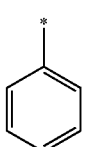
In Formulae 7-1 to 7-21,
t-Bu is a tert-butyl group;
Ph is a phenyl group; and
* is a binding site with an adjacent atom.

In Formula 8, n81, which indicates the number of moieties represented by

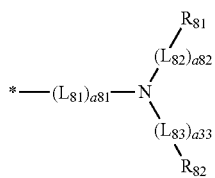

(where * is a binding site with $Ar_{81}$ in Formula 8), may be selected from 1, 2, and 3. When n81 is 2 or greater, the plurality of moieties represented by

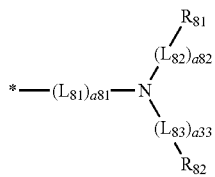

may be the same or different. For example, in Formula 8, n81 may be 2, but it is not limited thereto.

For example, the third material may be represented by Formula 8-1, but the third material is not limited thereto.

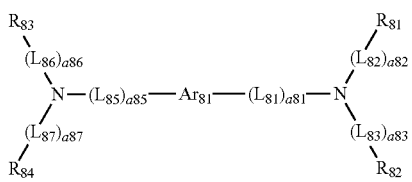

Formula 8-1

In Formula 8-1, $Ar_{81}$, $L_{81}$ to $L_{83}$, a81 to a83, $R_{81}$, and $R_{82}$ may be the same as defined above with respect to Formula 8;

$L_{85}$ to $L_{87}$ may be each independently defined the same as $L_{81}$ in Formula 8;

a85 to a87 may be each independently defined the same as a81 in Formula 8; and $R_{83}$ and $R_{84}$ may be each independently defined the same as $R_{81}$ in Formula 8.

In some other embodiments, the third material may be represented by one of Formulae 8-11 and 8-12, but it is not limited thereto.

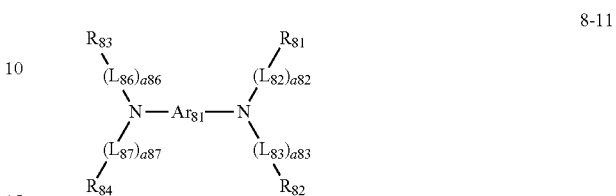

8-11

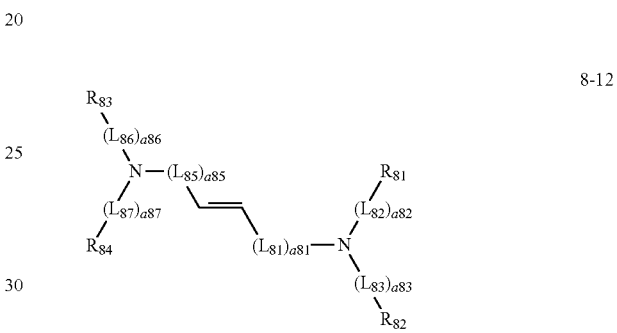

8-12

In Formulae 8-11 and 8-12, $Ar_{81}$, $L_{81}$ to $L_{83}$, a81 to a83, $R_{81}$, and $R_{82}$ may be the same as defined above with respect to Formula 8;

$L_{85}$ to $L_{87}$ may be each independently defined the same as $L_{81}$ in Formula 8;

a85 to a87 may be each independently defined the same as a81 in Formula 8; and $R_{83}$ and $R_{84}$ may be each independently defined the same as $R_{81}$ in Formula 8.

In still other embodiments, the third material may be selected from the following compounds, but it is not limited thereto.

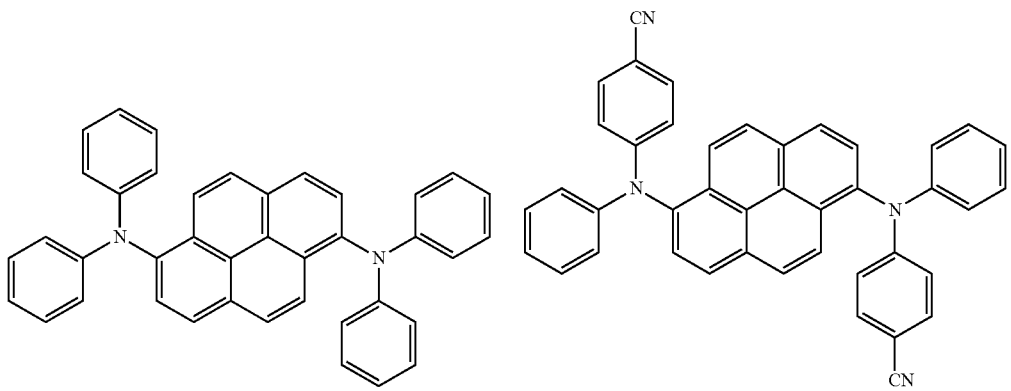

143 144
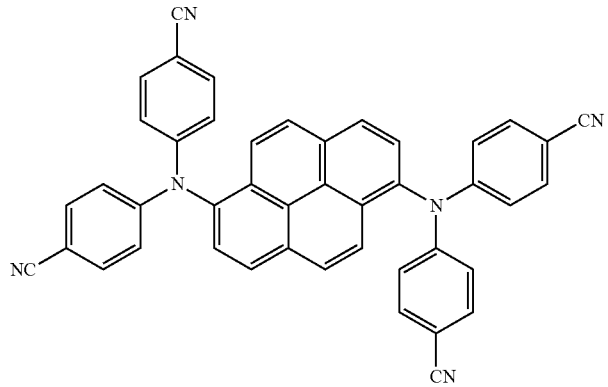
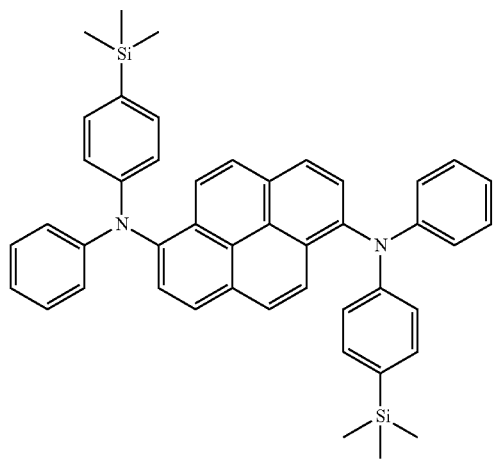
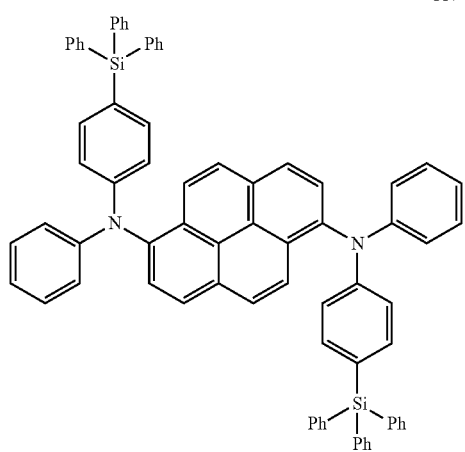
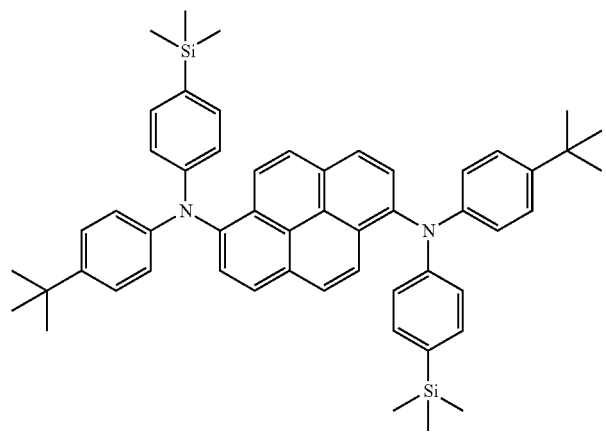
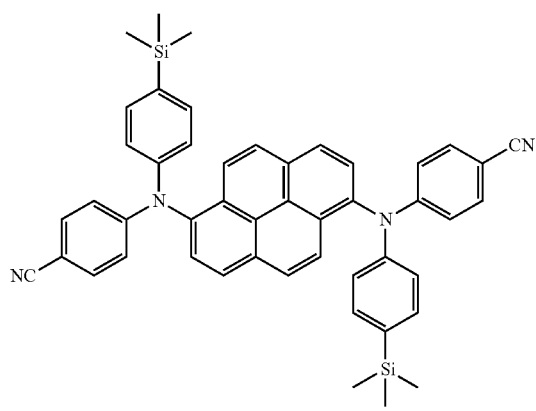
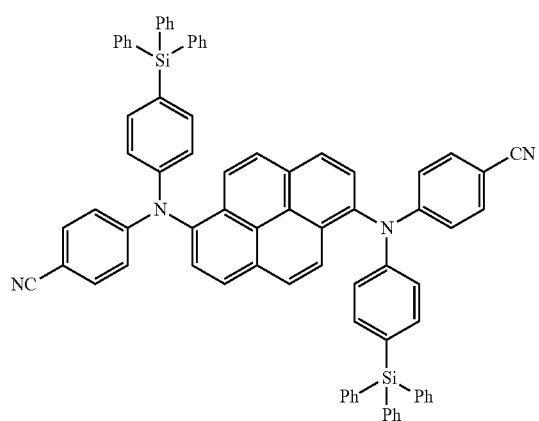
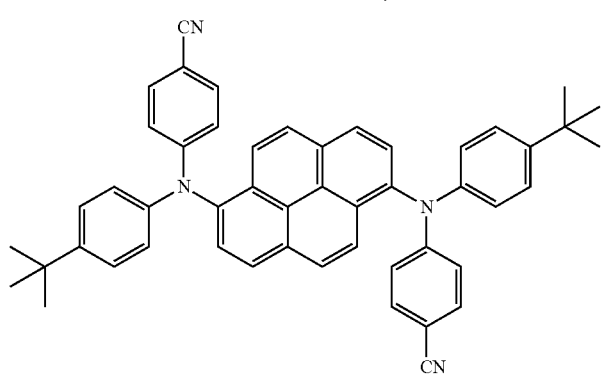
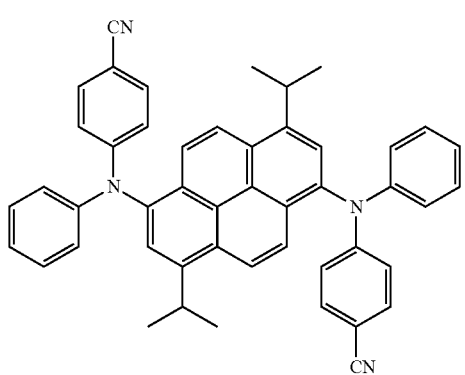

145
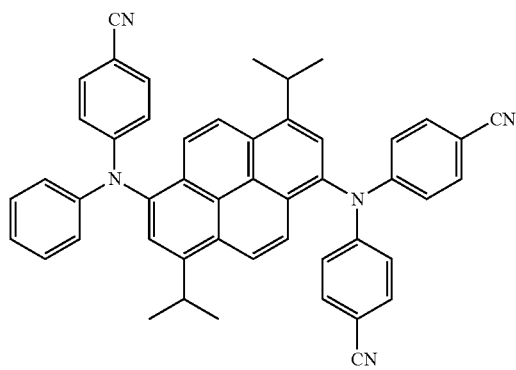
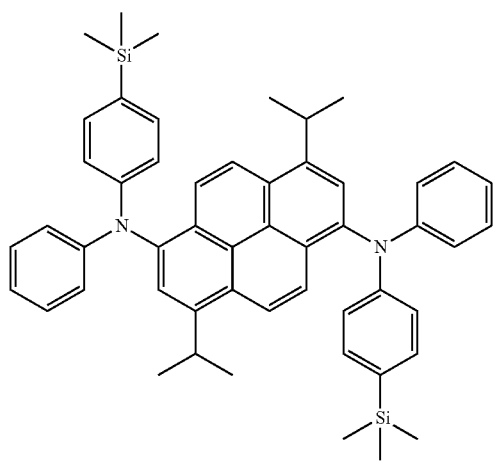
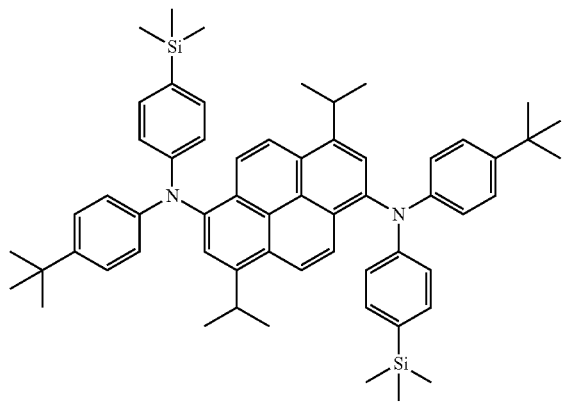
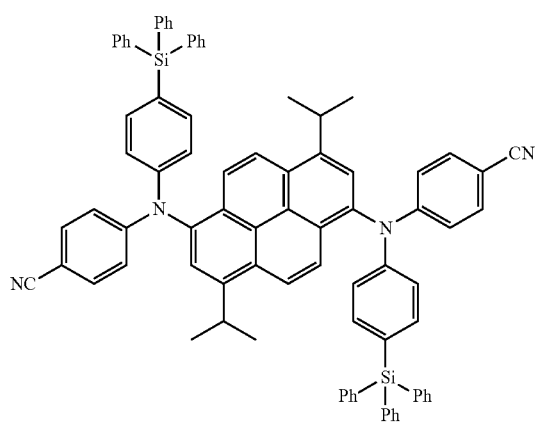
146
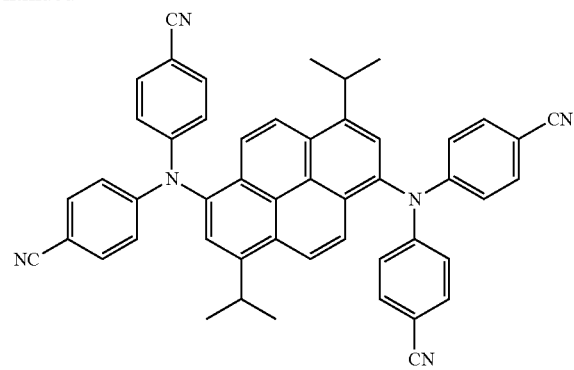
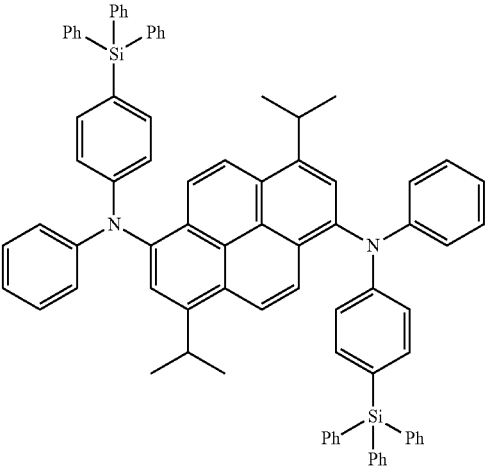
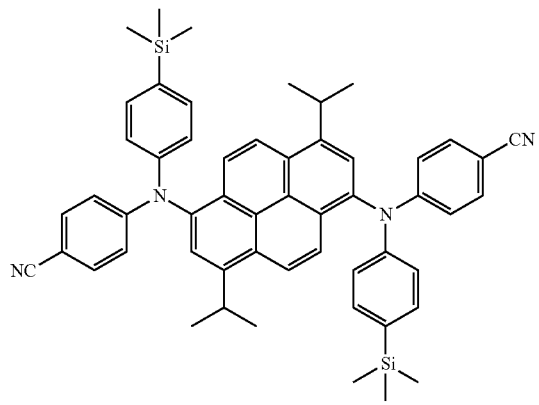
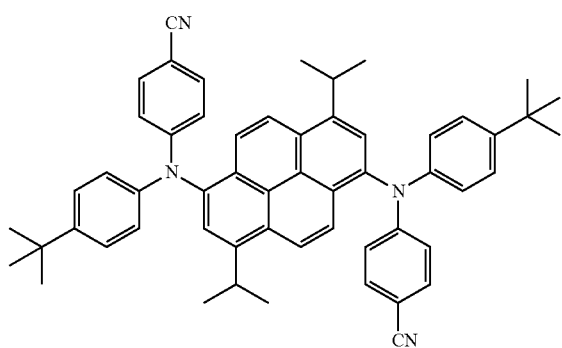

-continued
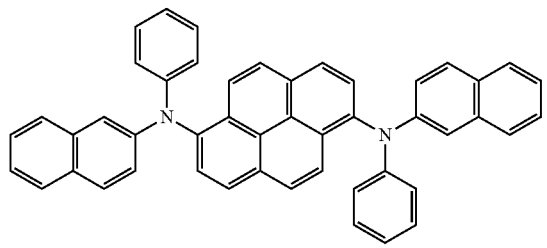
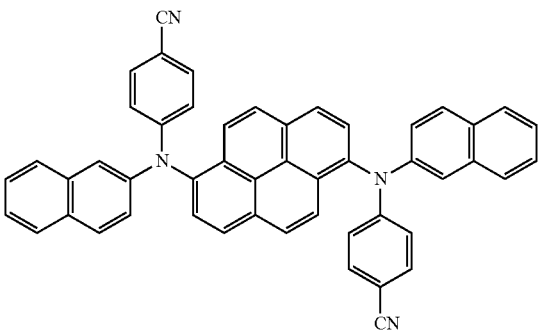
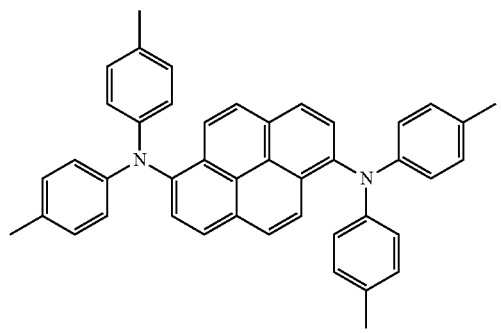
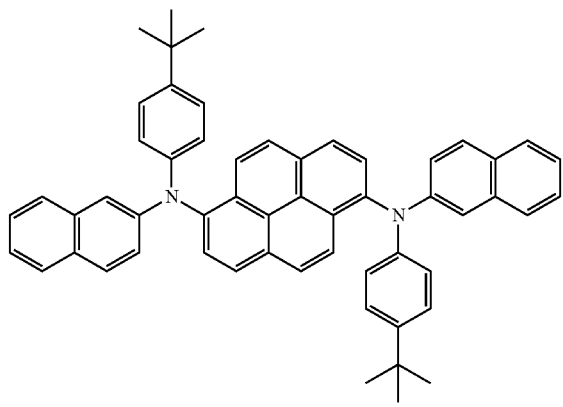
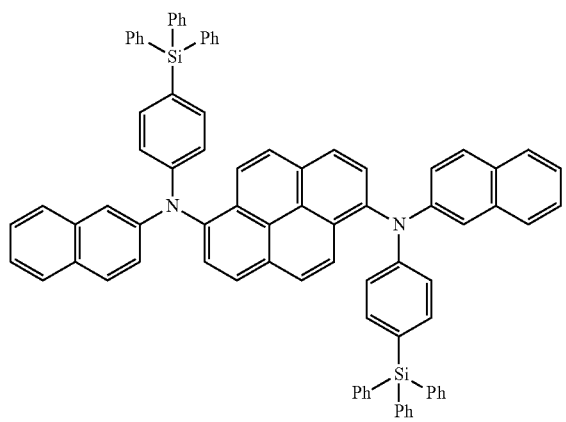
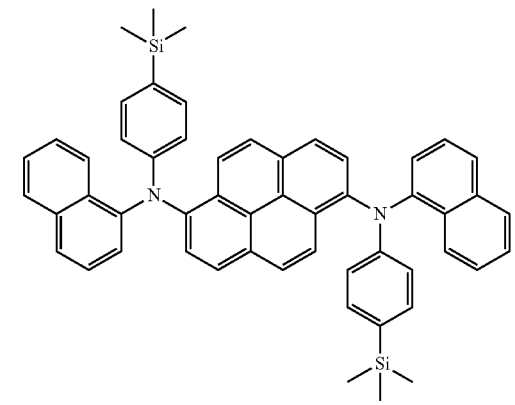
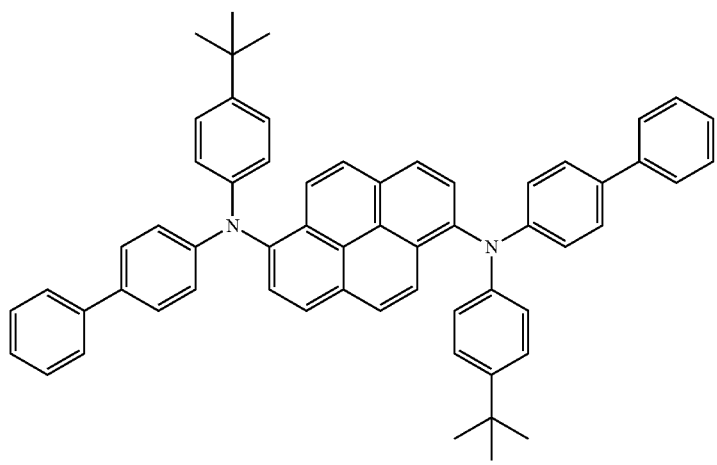

149 150
-continued
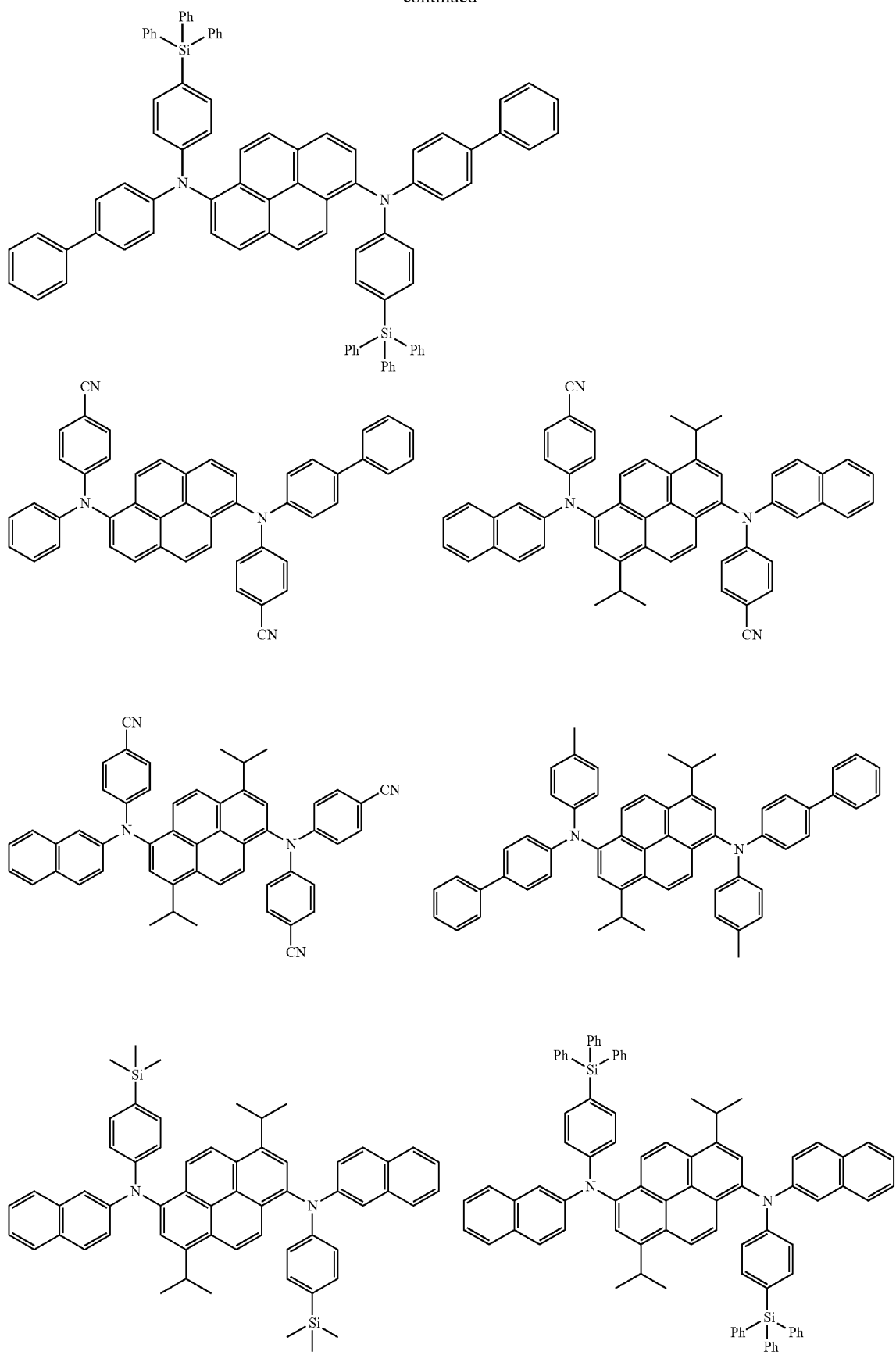

151
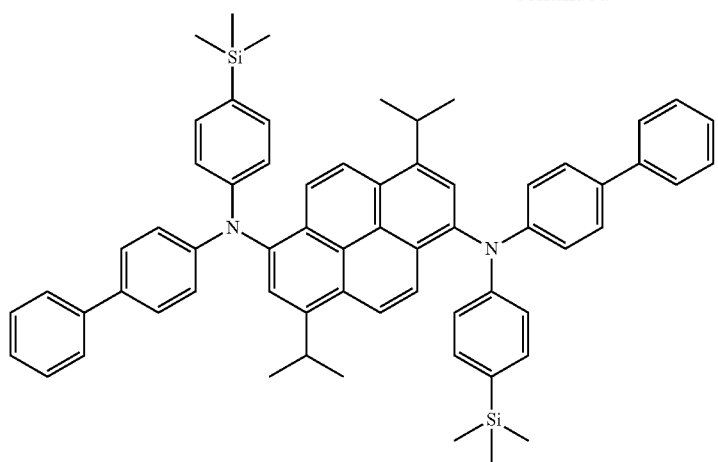
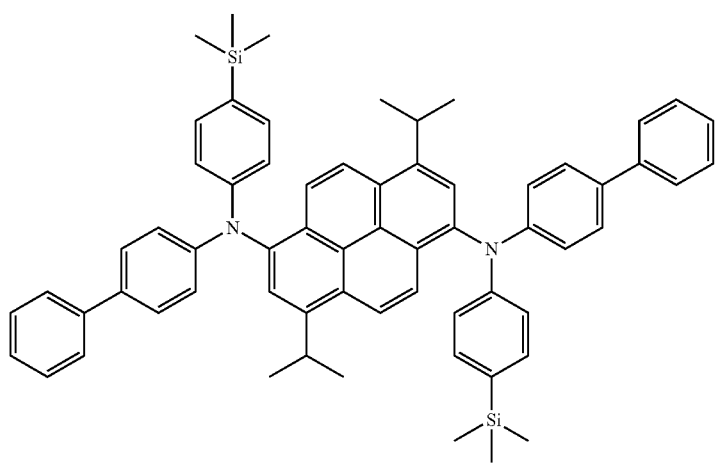
152
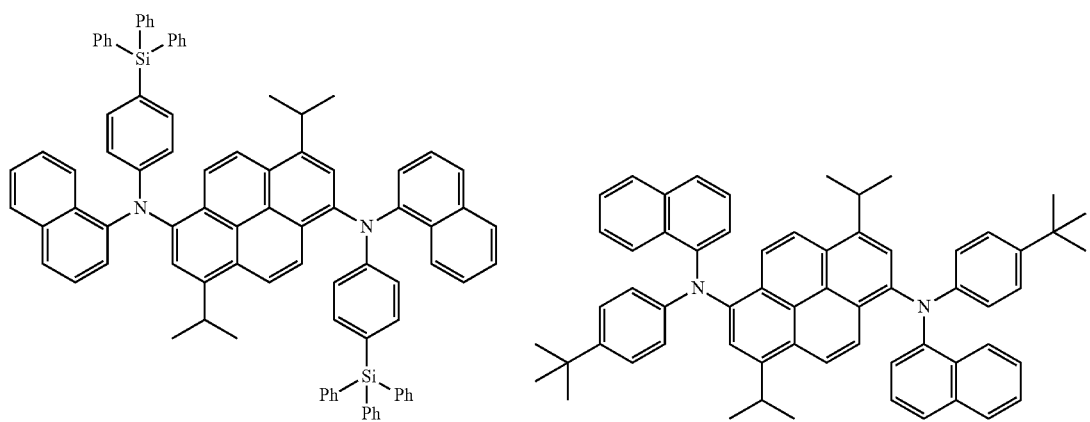

-continued
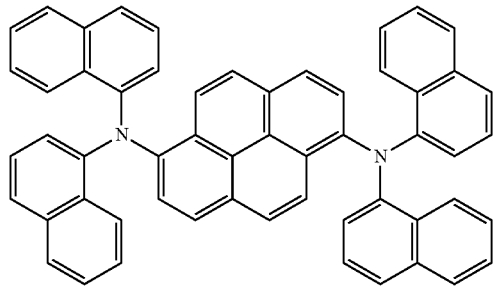
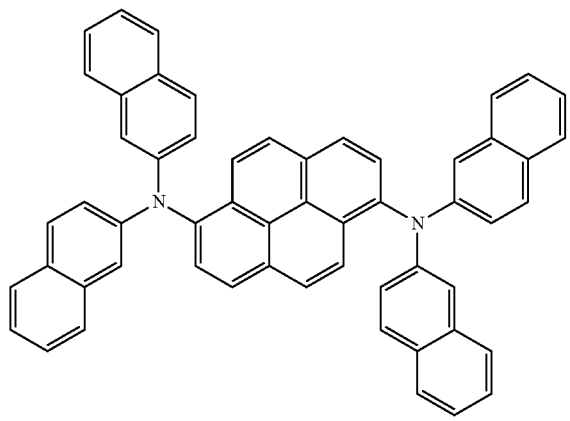
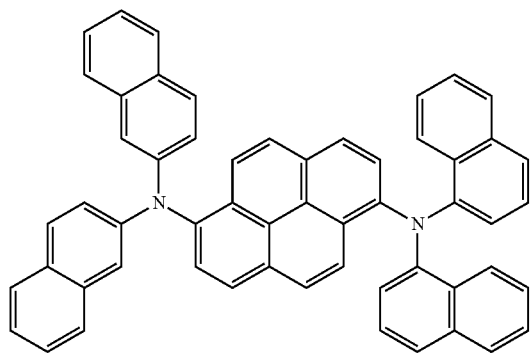
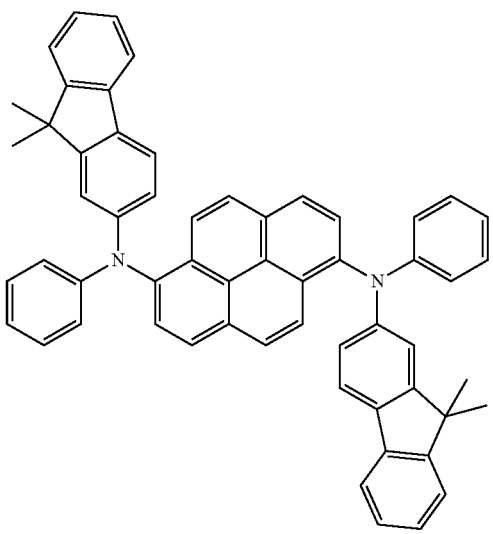
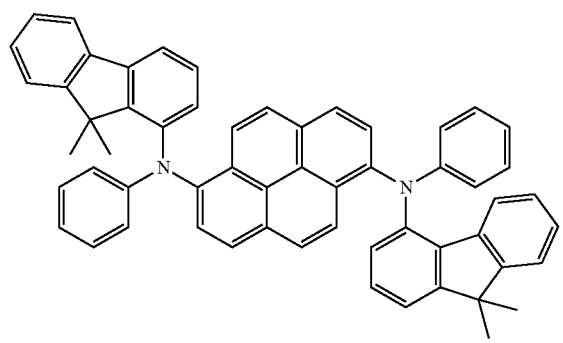
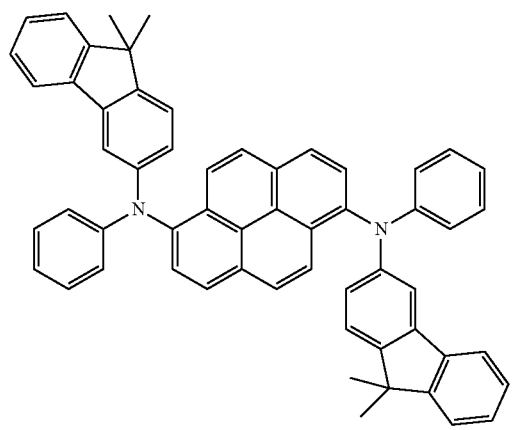

155
156
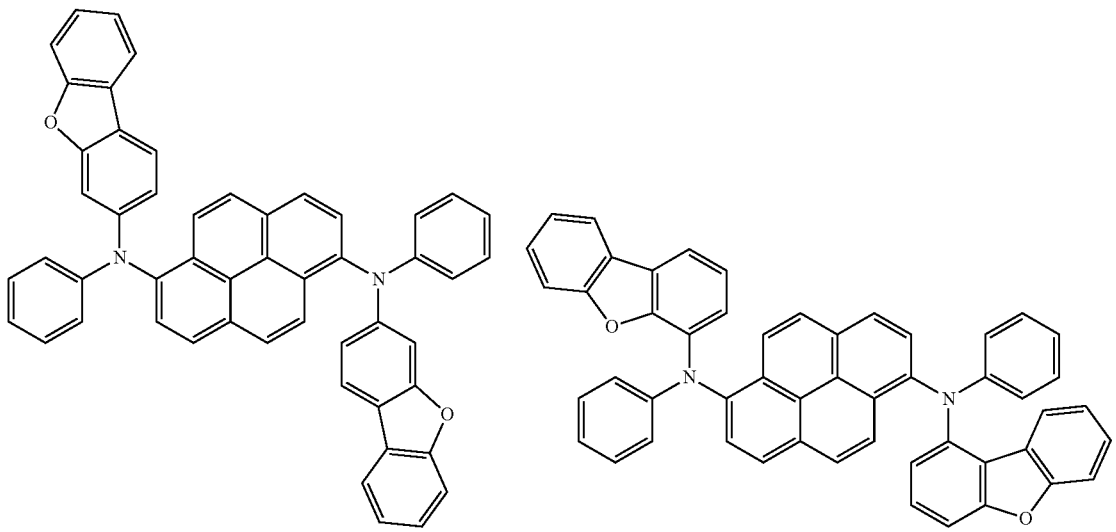
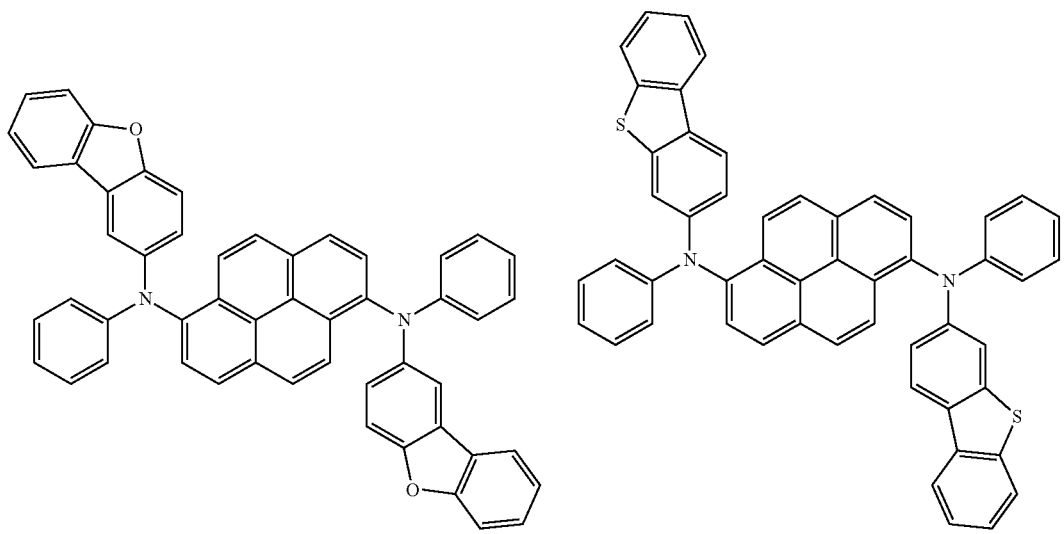
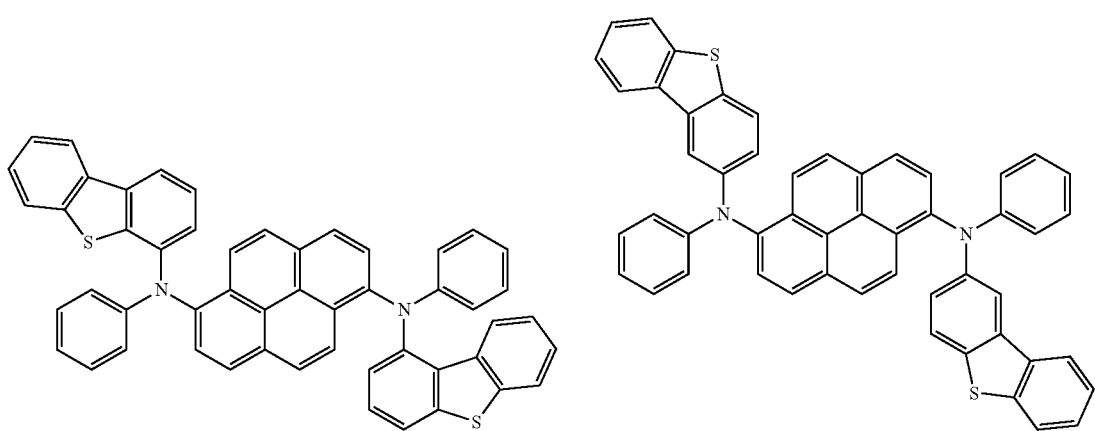

-continued
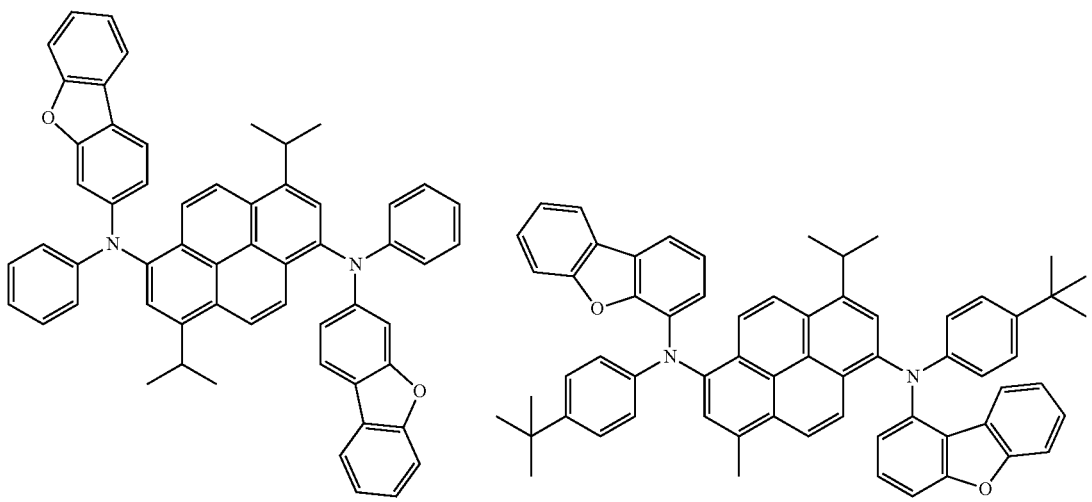
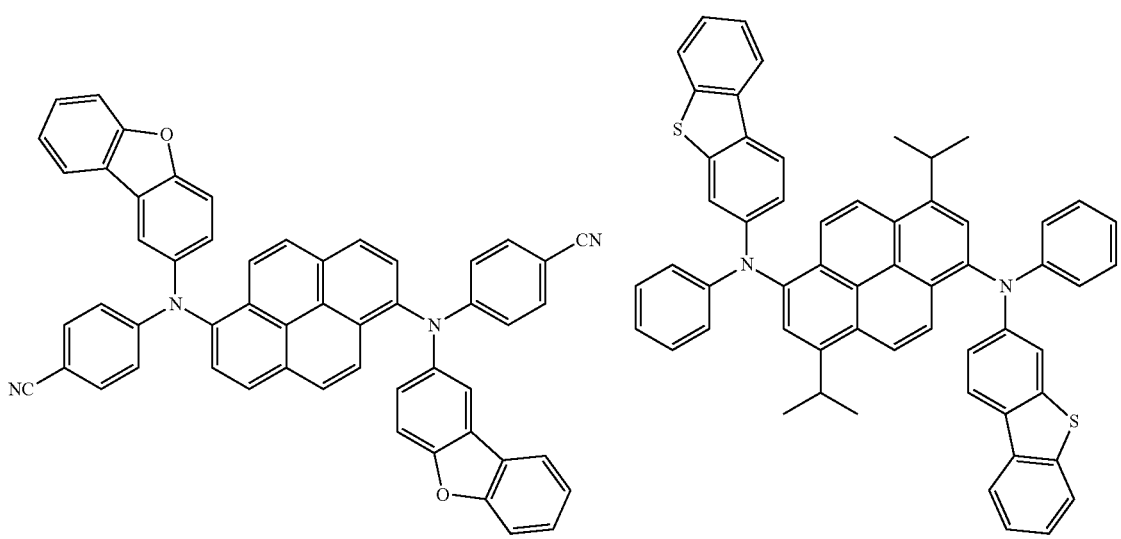
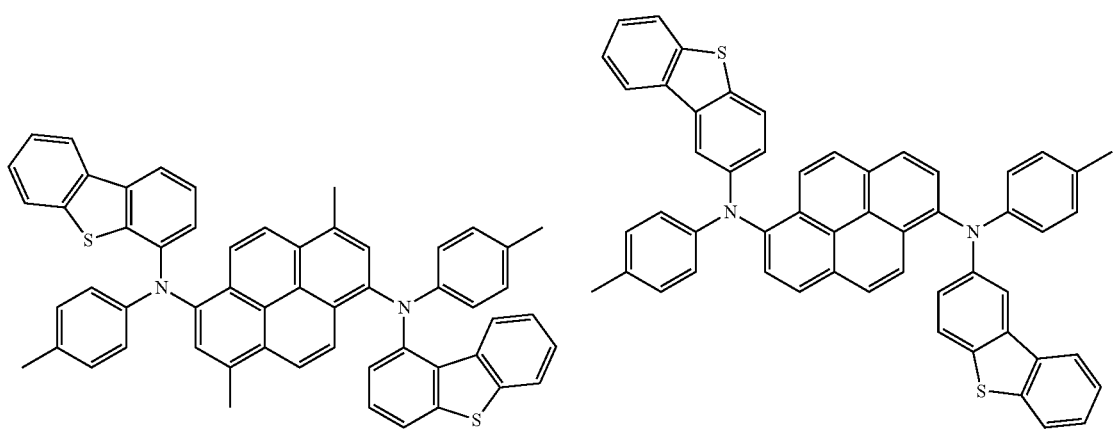

159 160
-continued
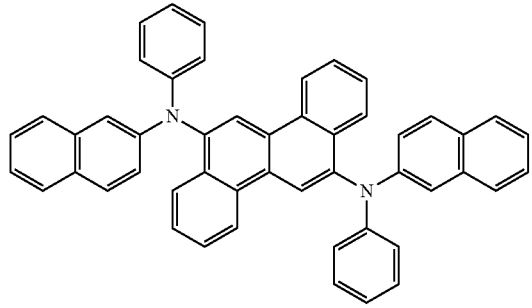
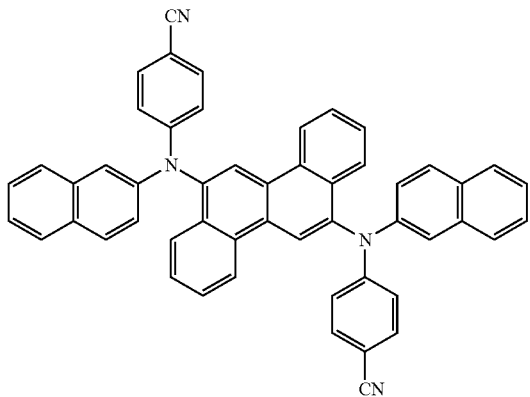
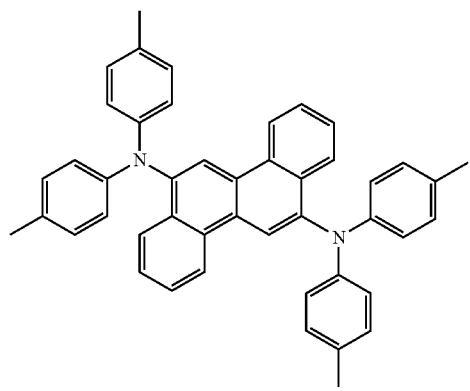
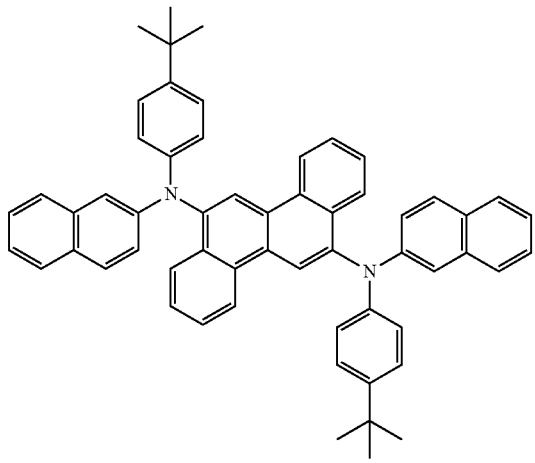
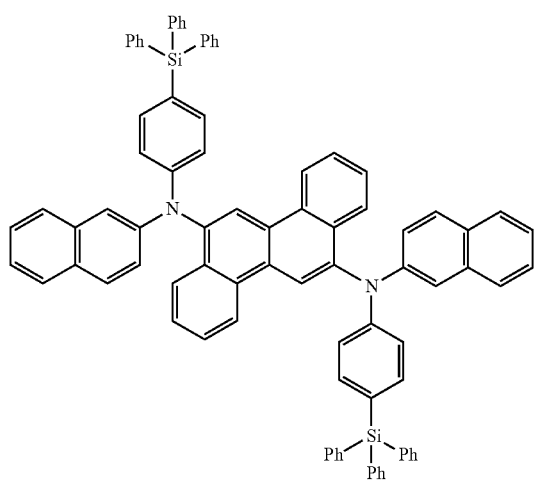
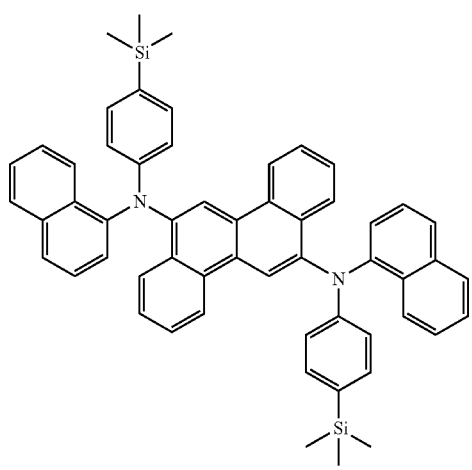

161
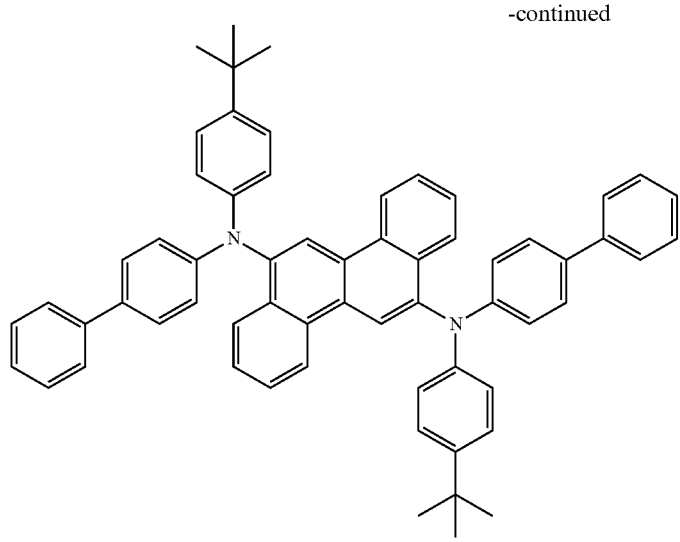
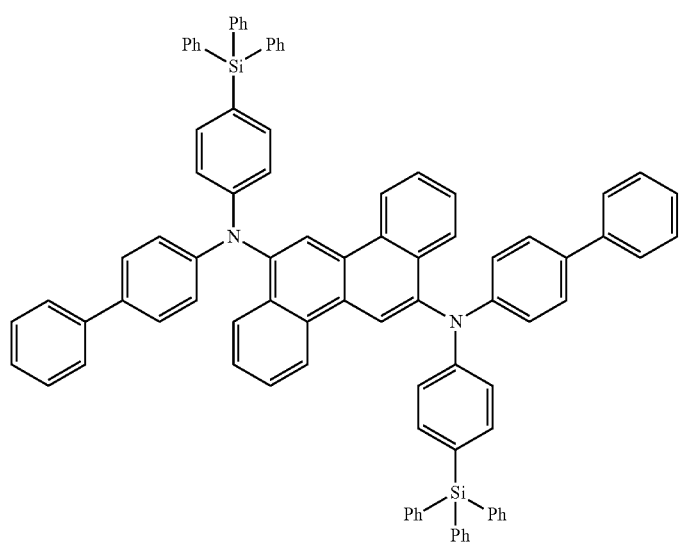
162
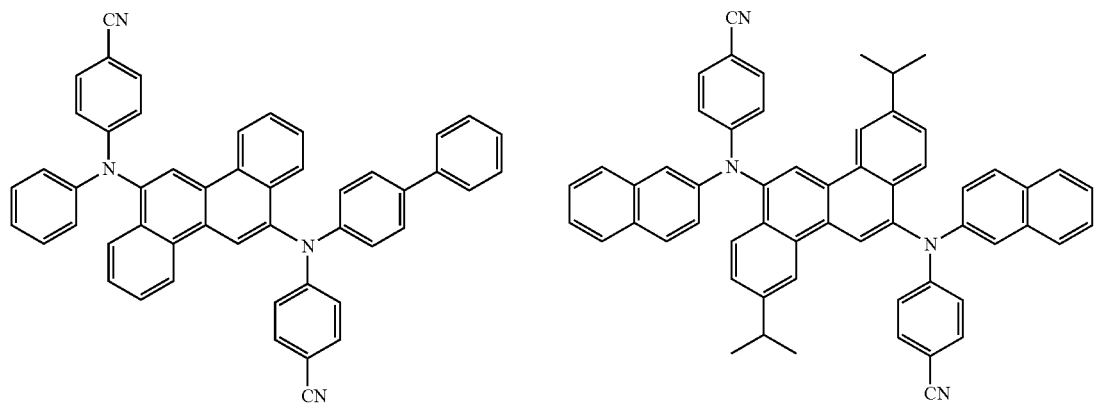

163
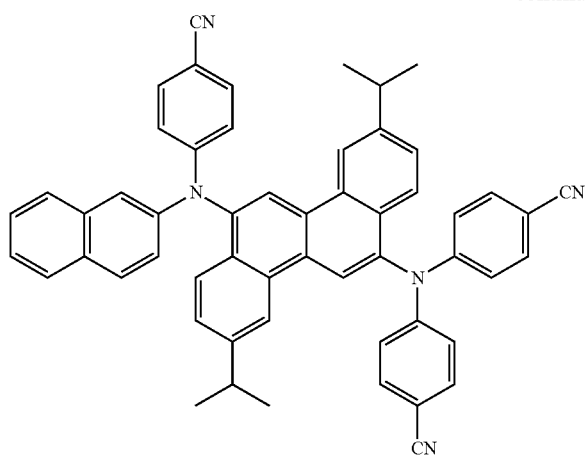
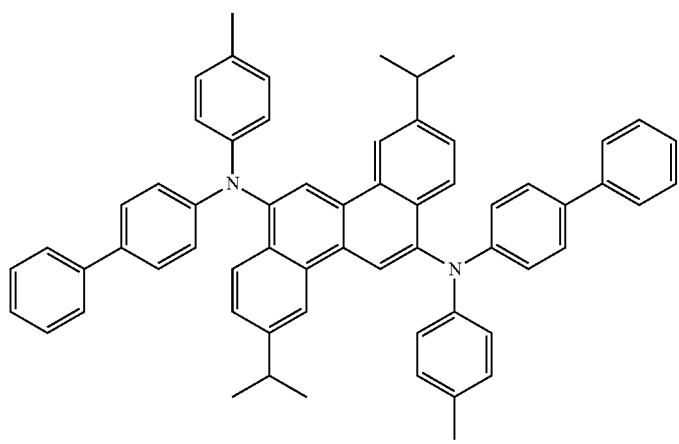
164
-continued
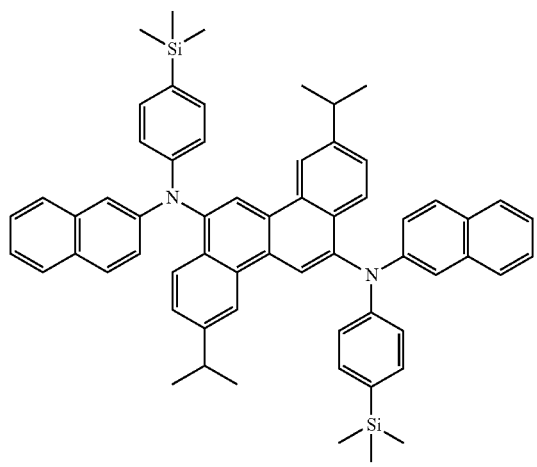
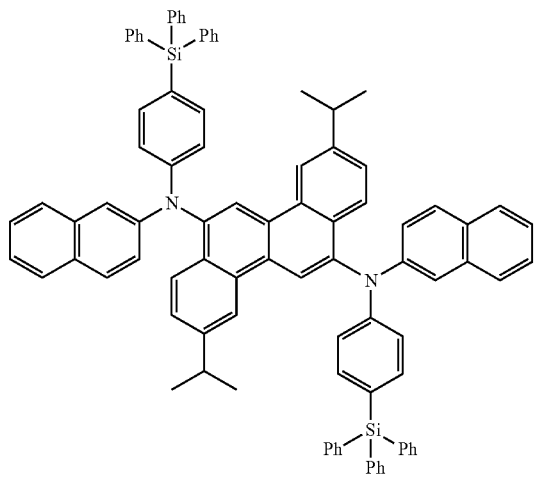

165 166
-continued
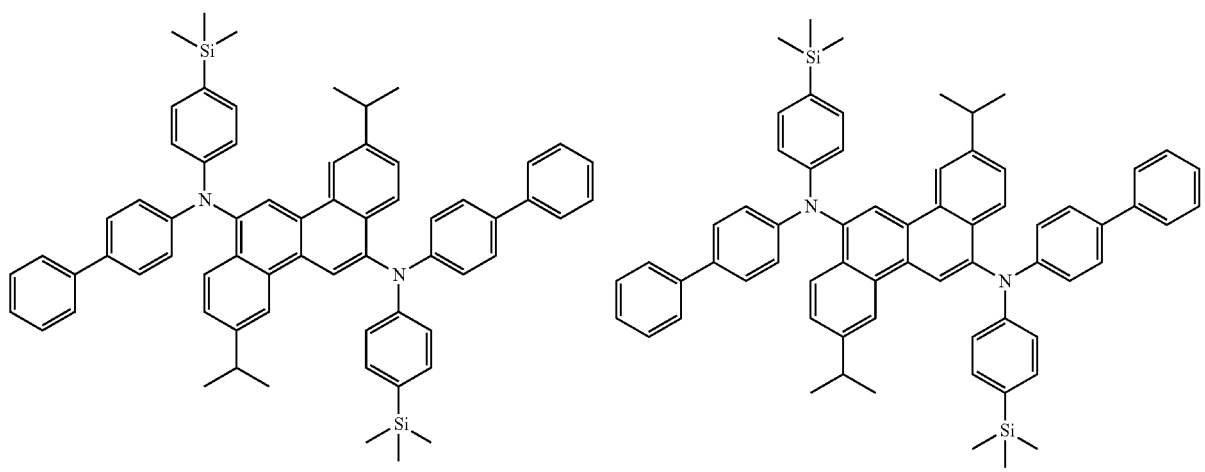
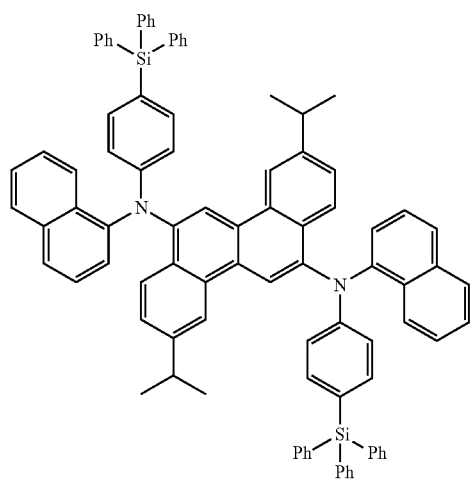
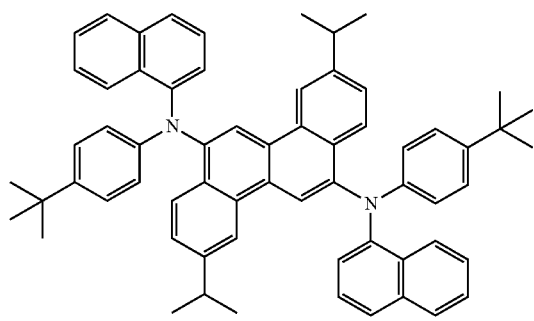
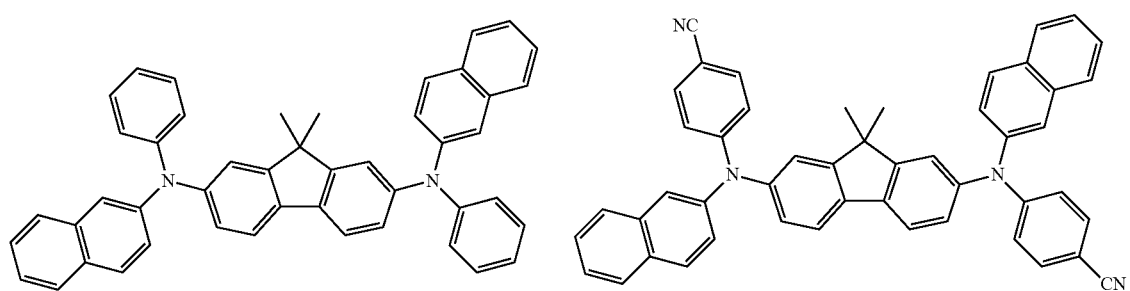

-continued
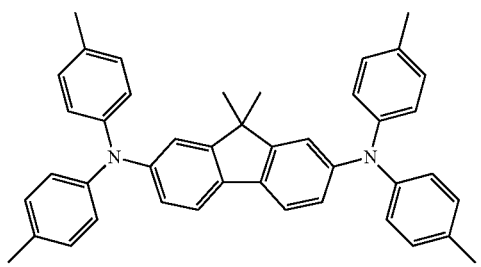
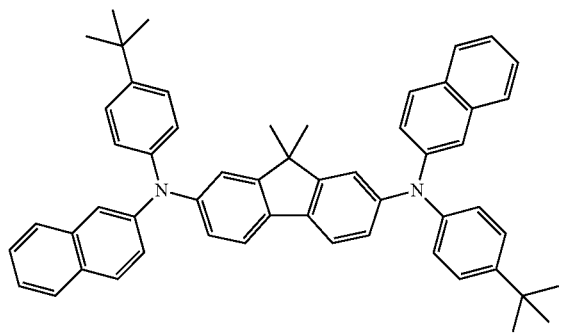
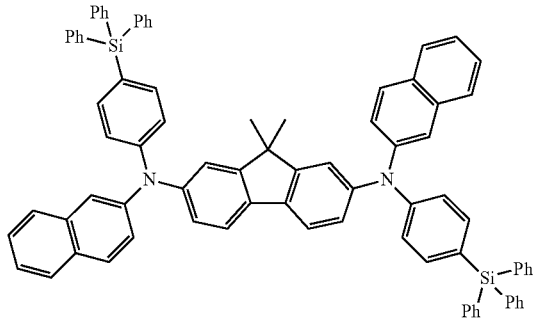
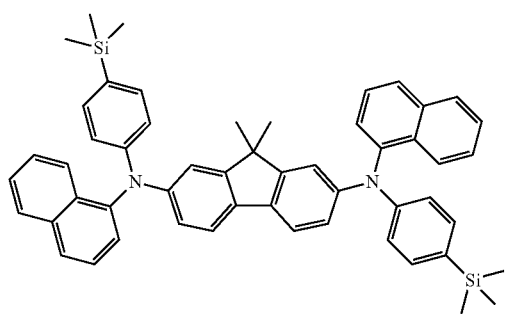
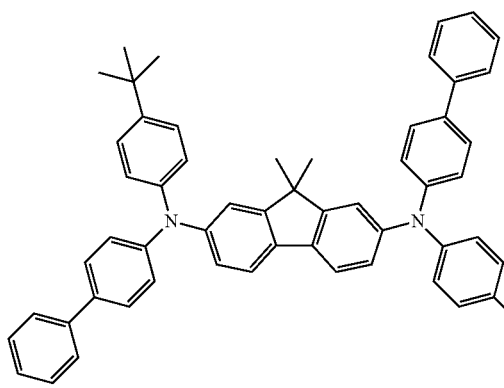
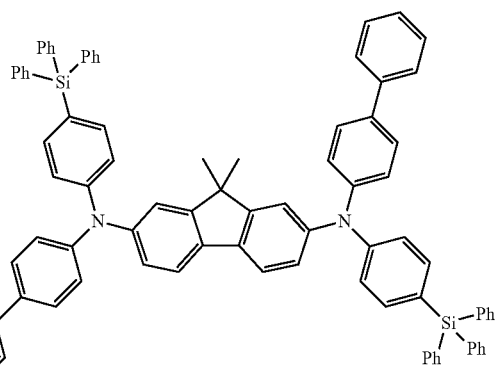
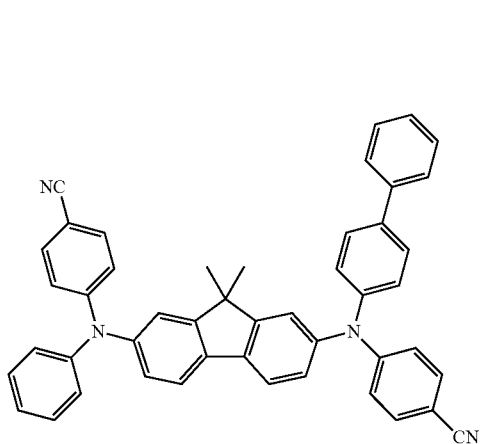
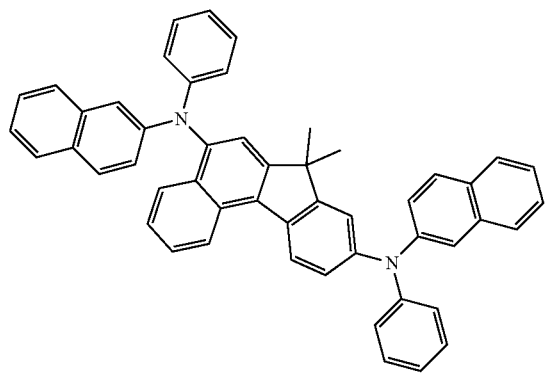

-continued
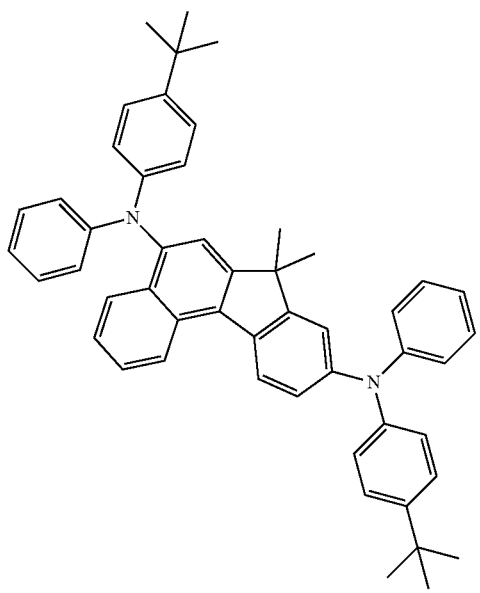
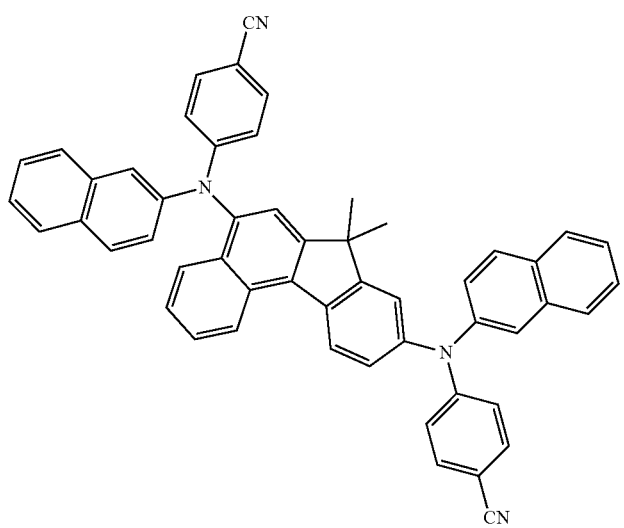
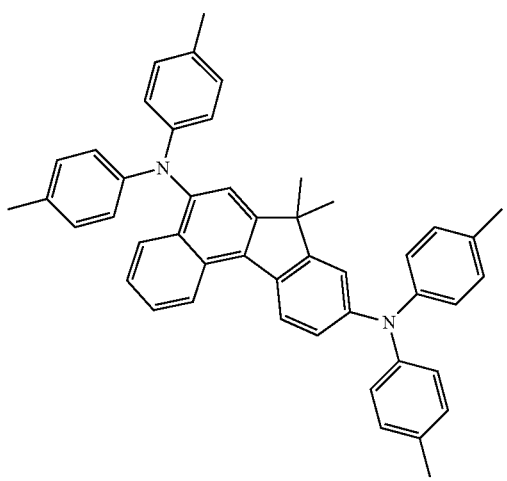
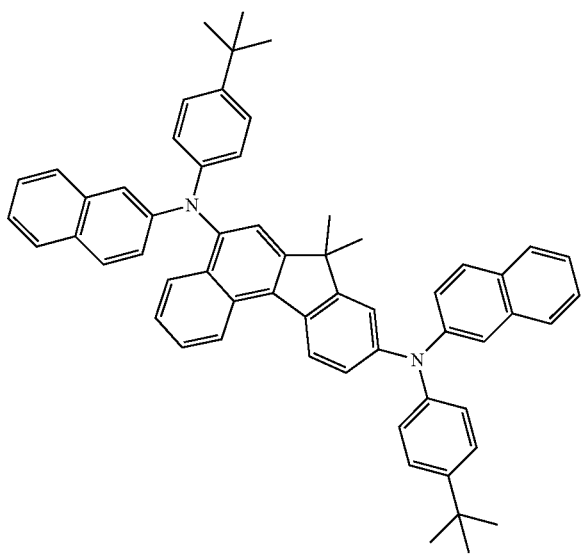
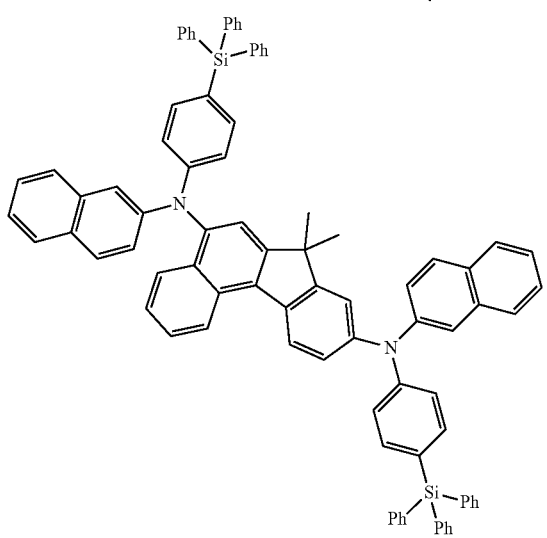
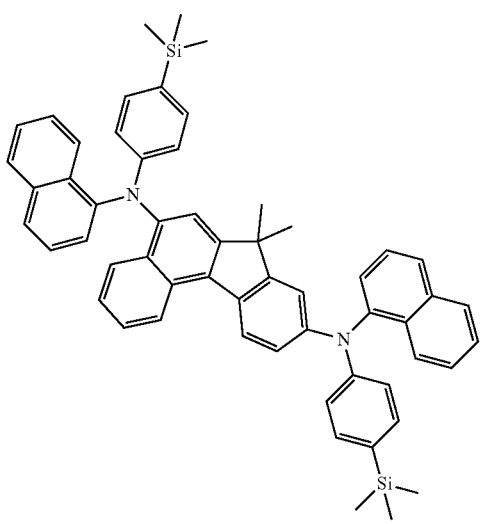

-continued
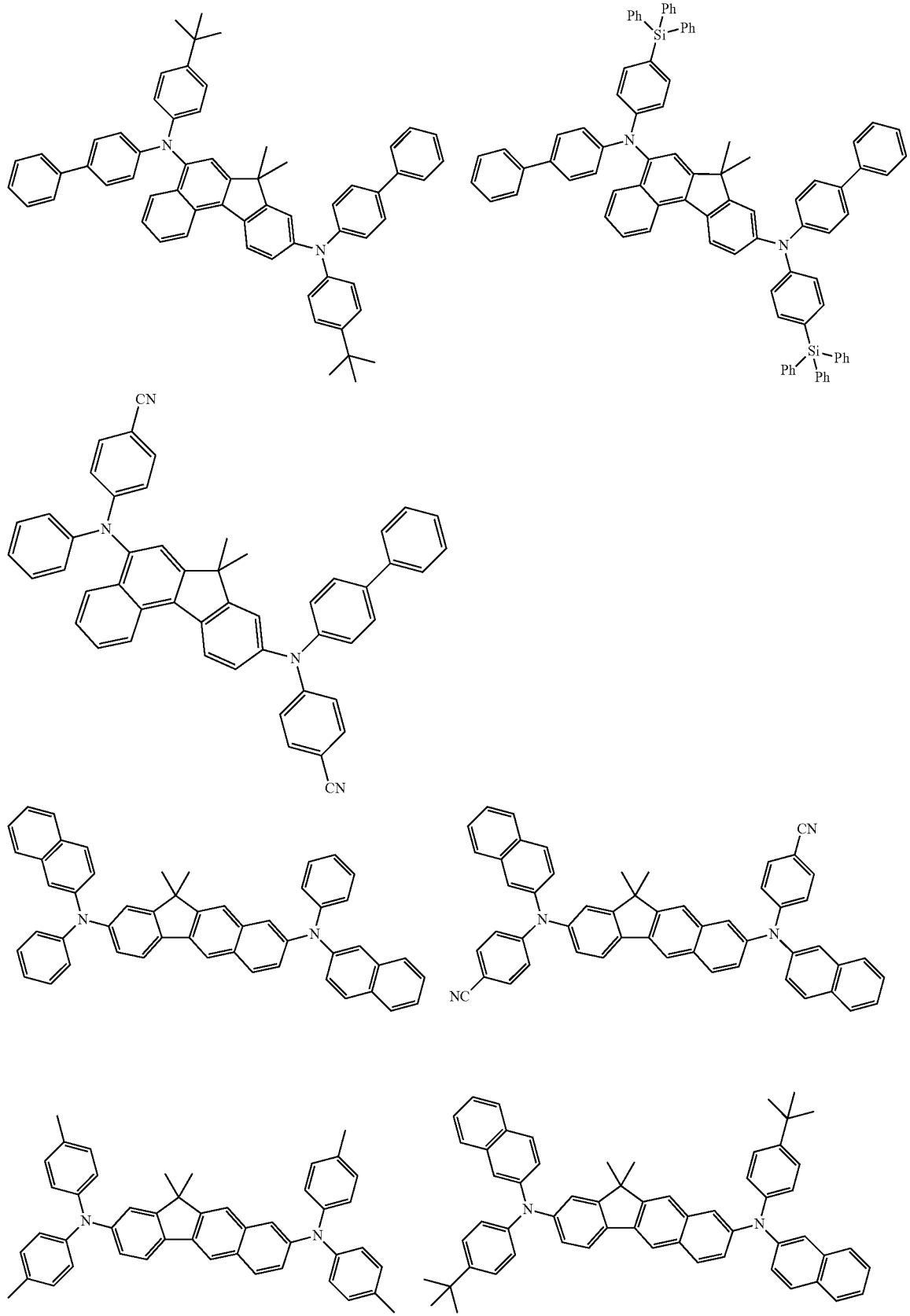

-continued
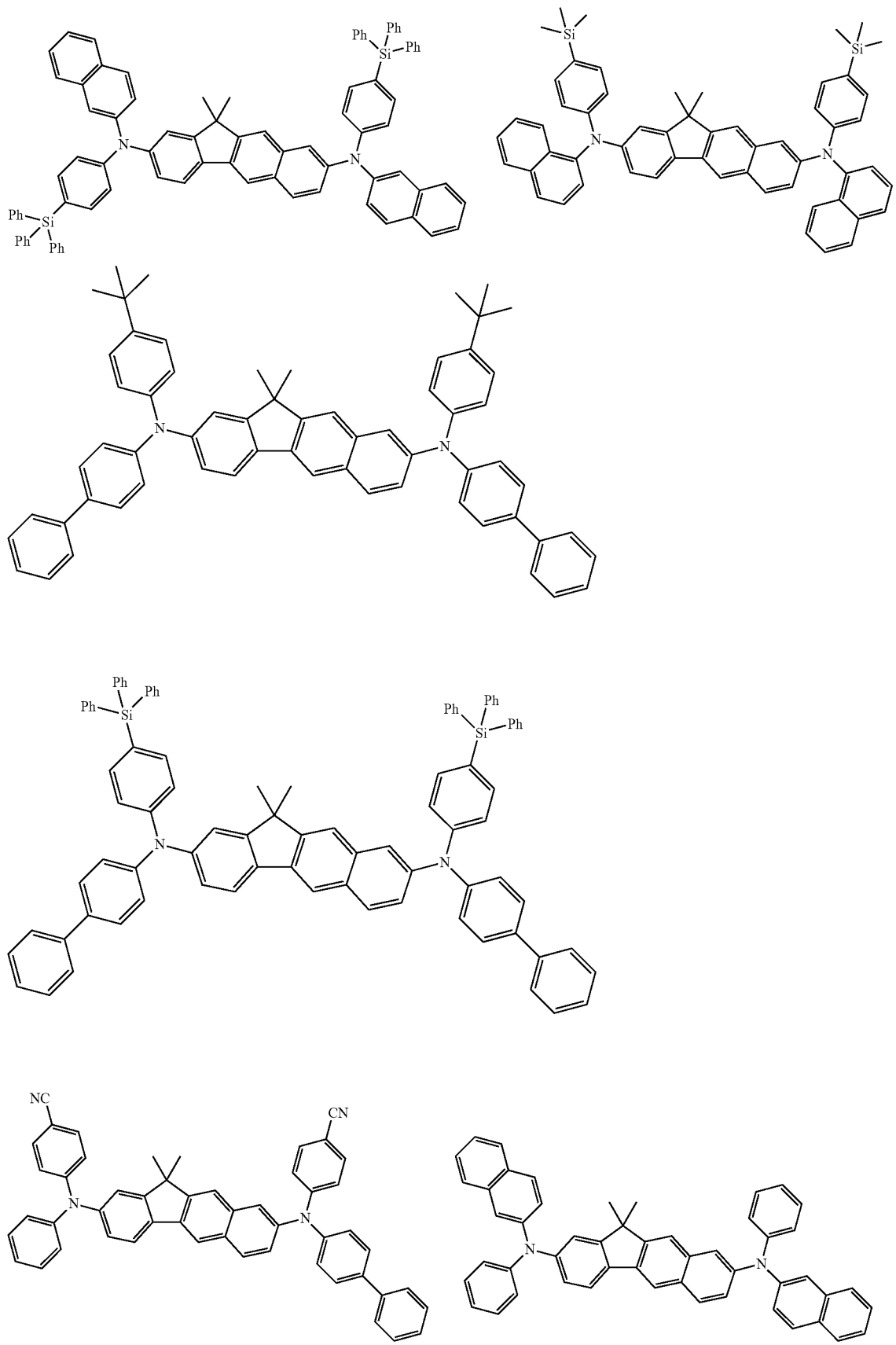

-continued
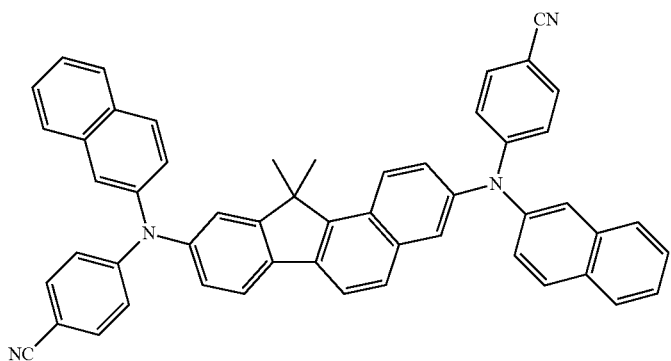
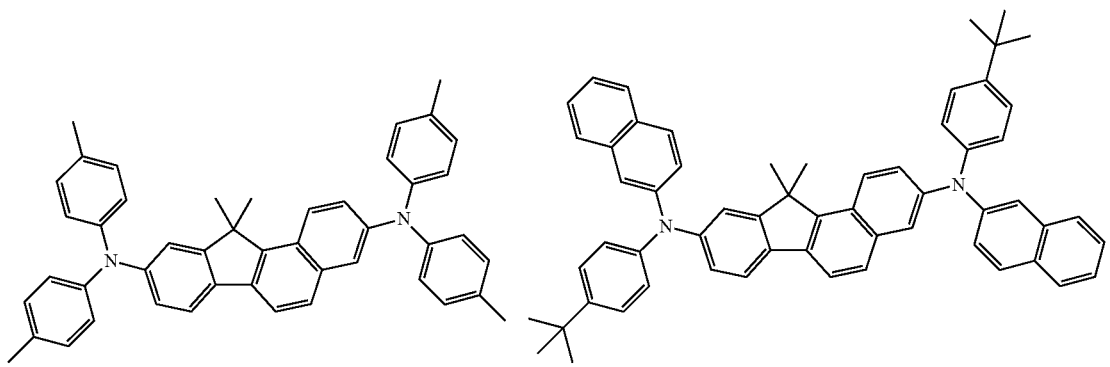
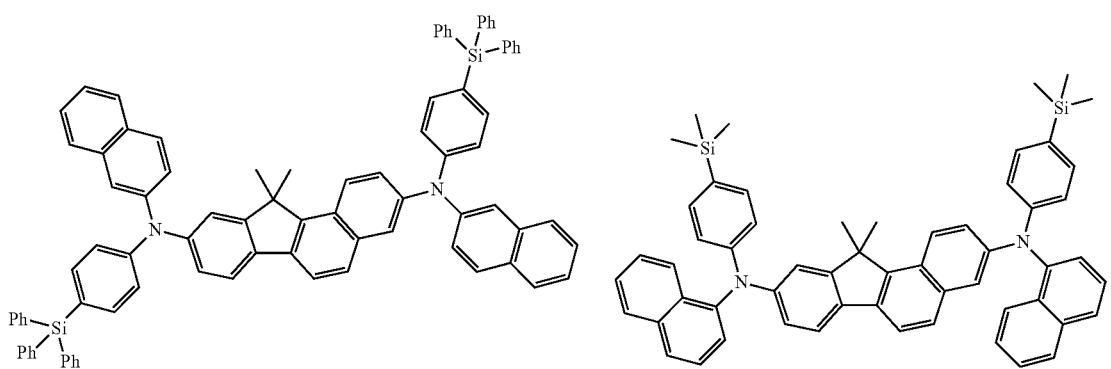
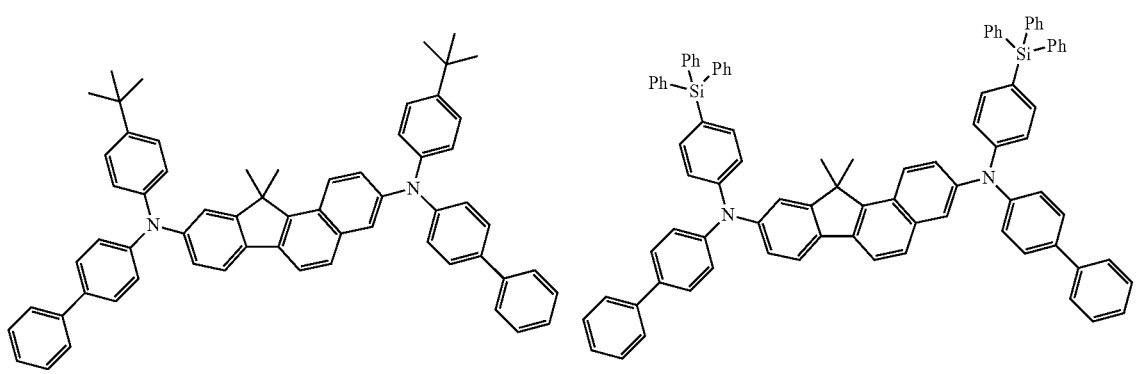

-continued
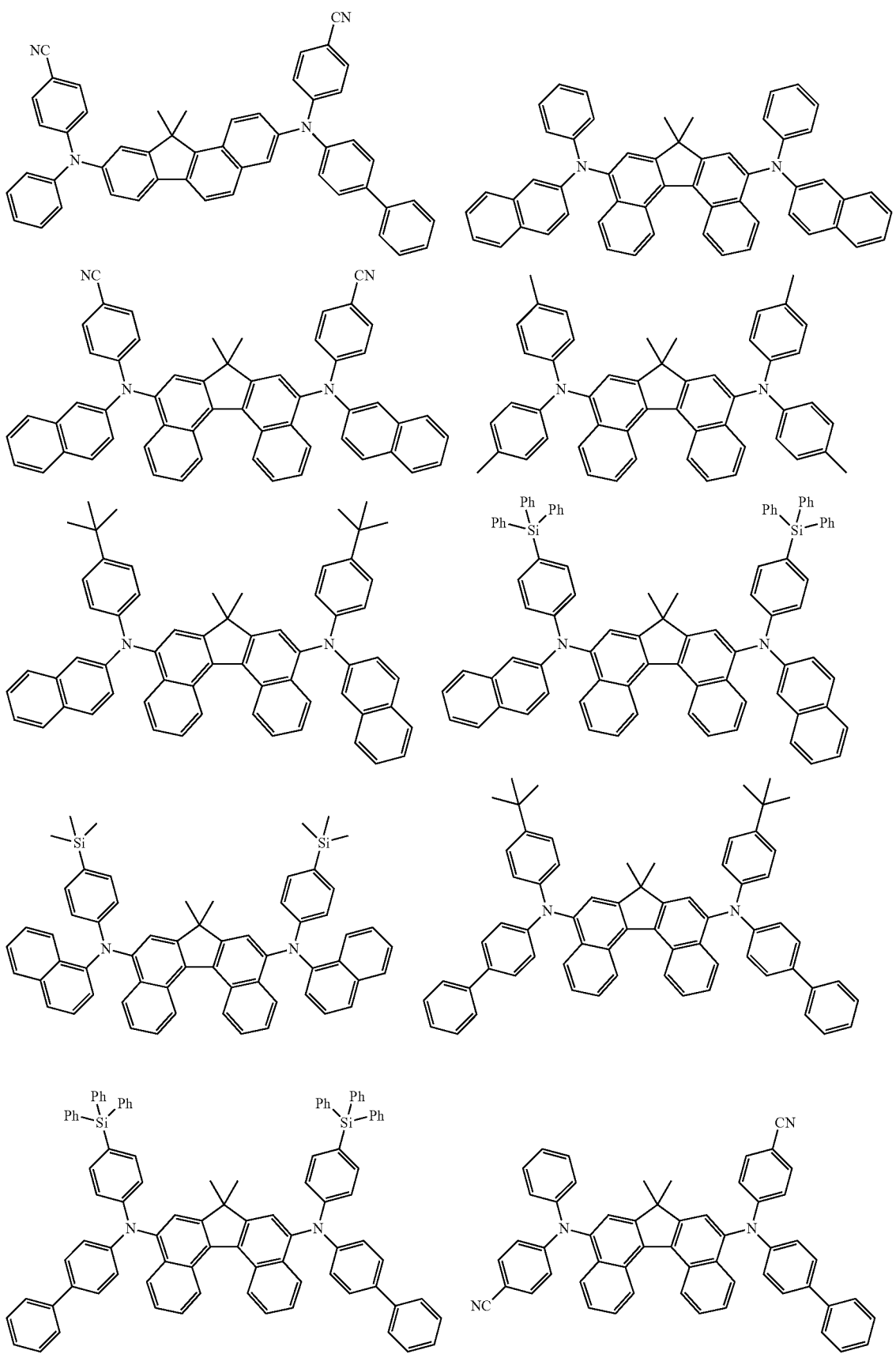

-continued
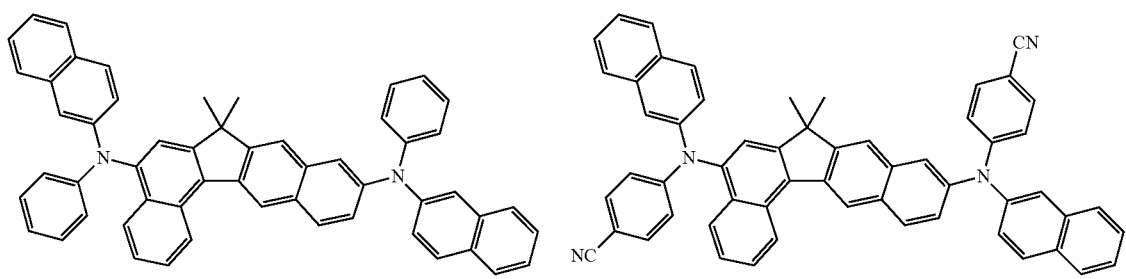
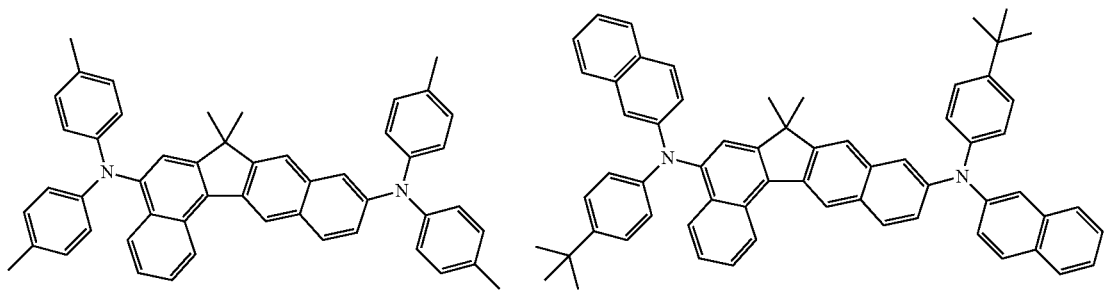
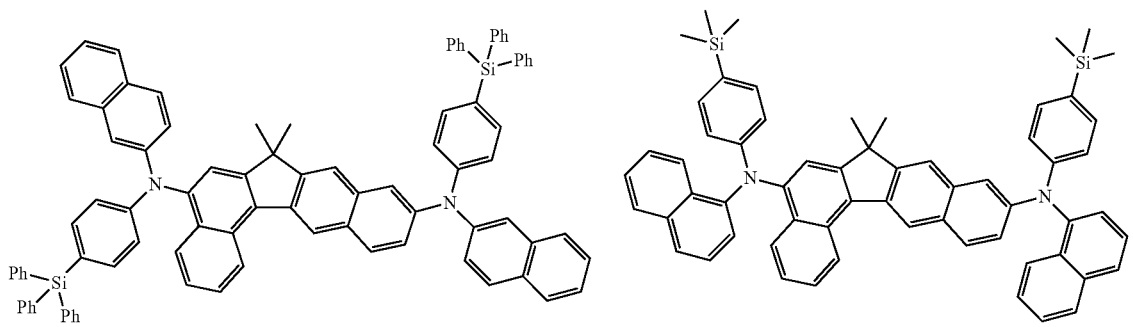
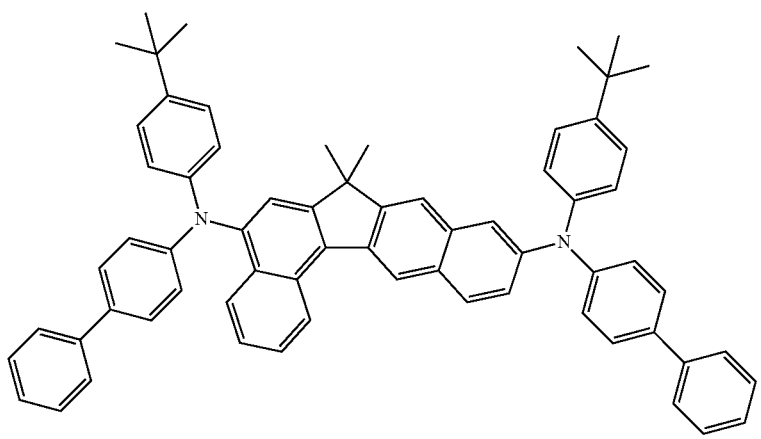

-continued
181
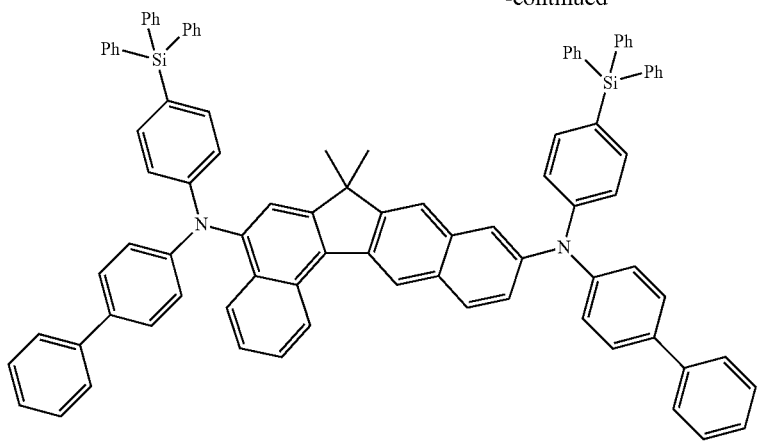
182
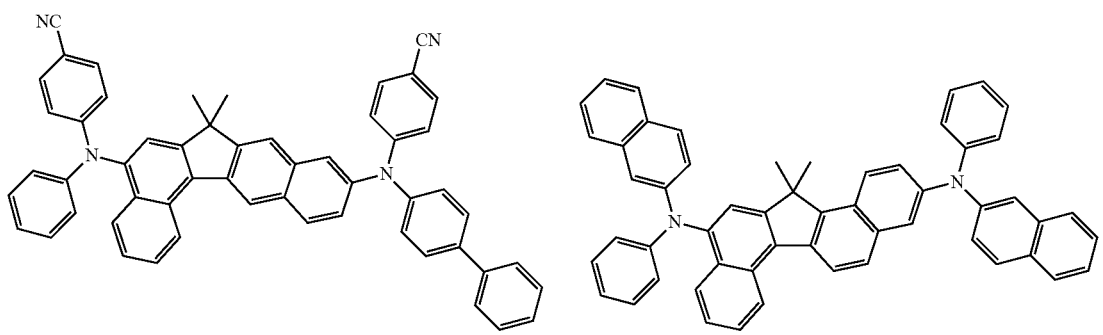
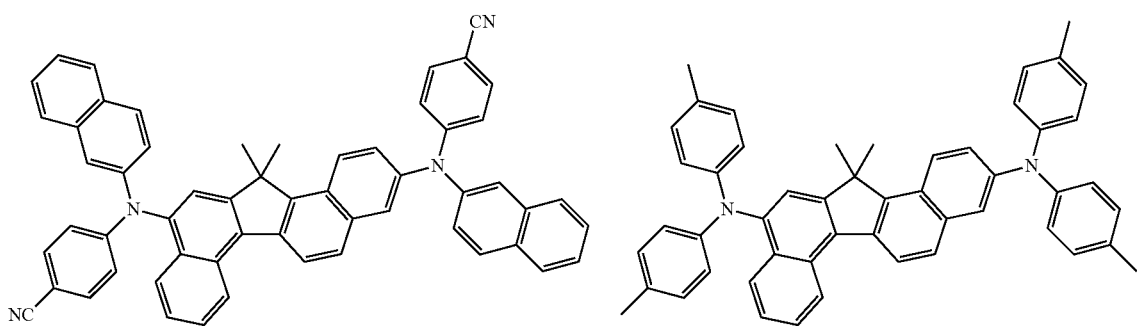
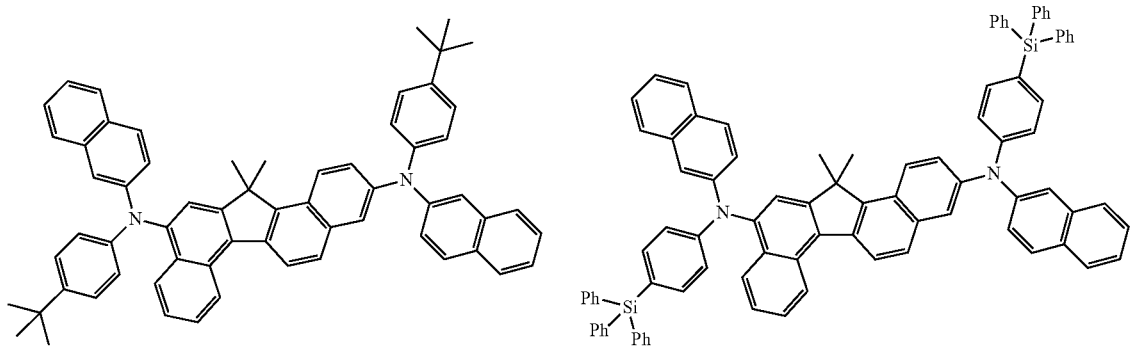

-continued
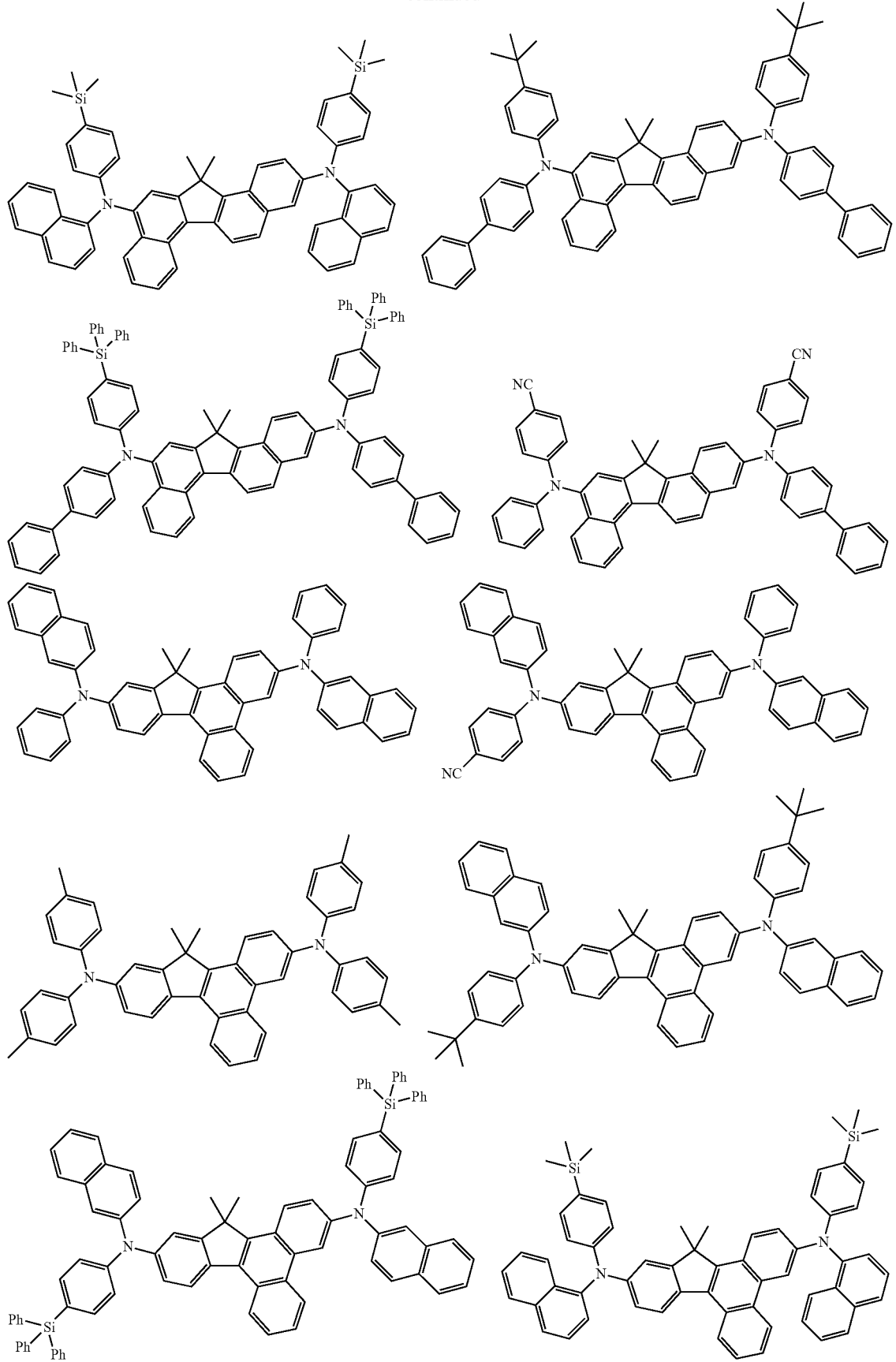

-continued
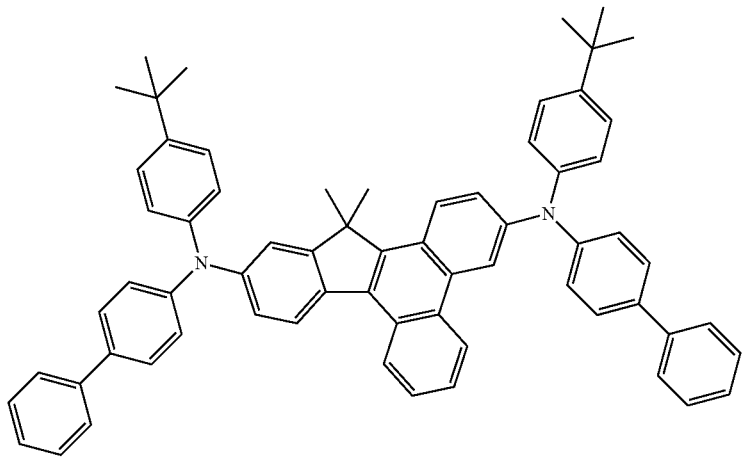
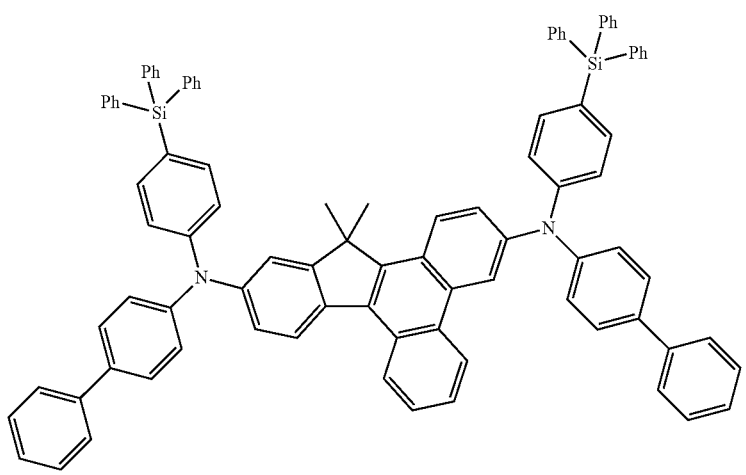
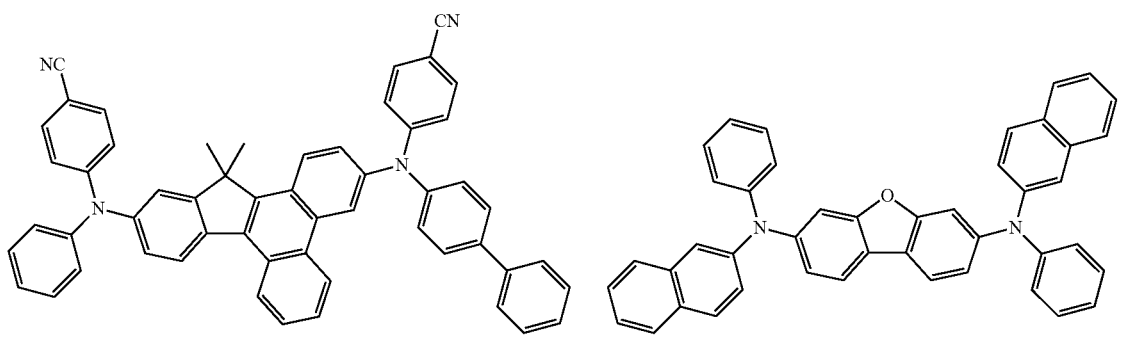
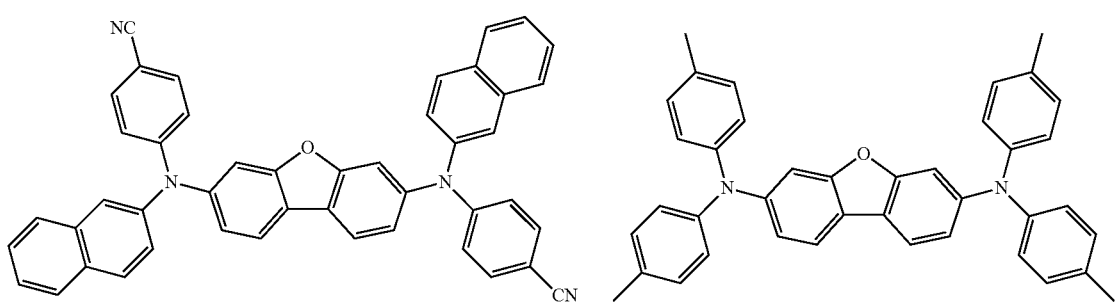

-continued
187
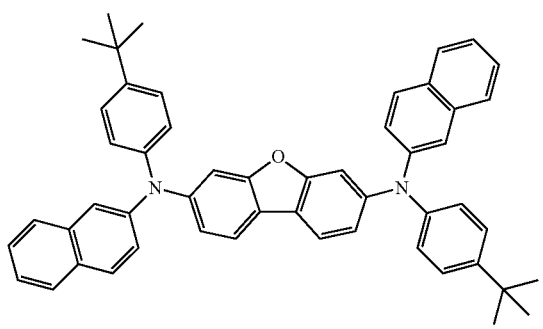
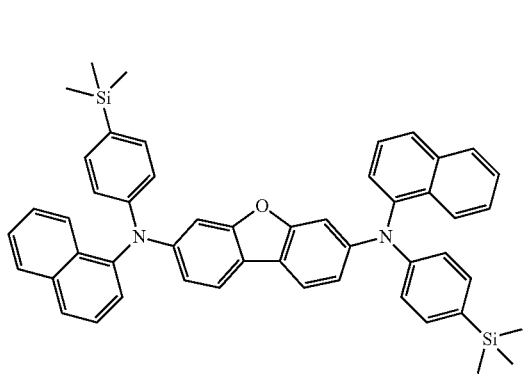
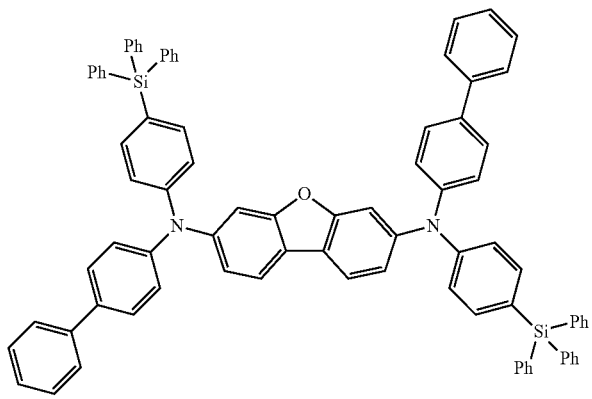
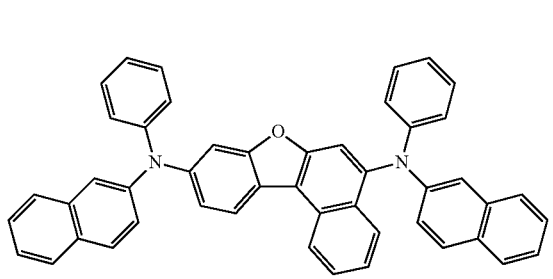
188
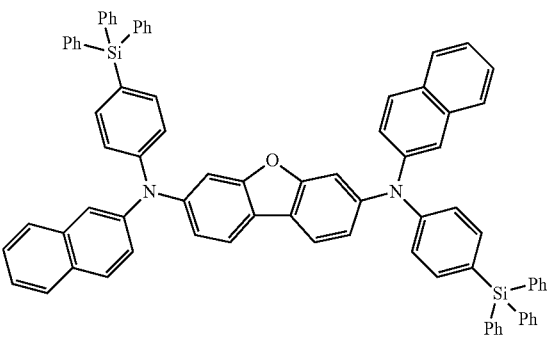
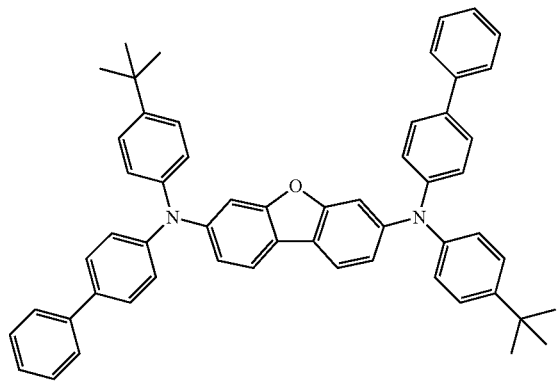
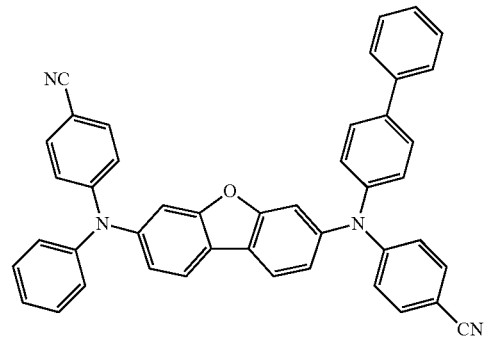
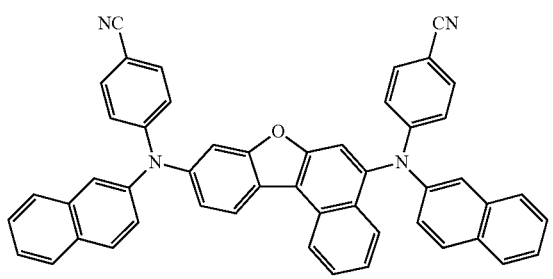

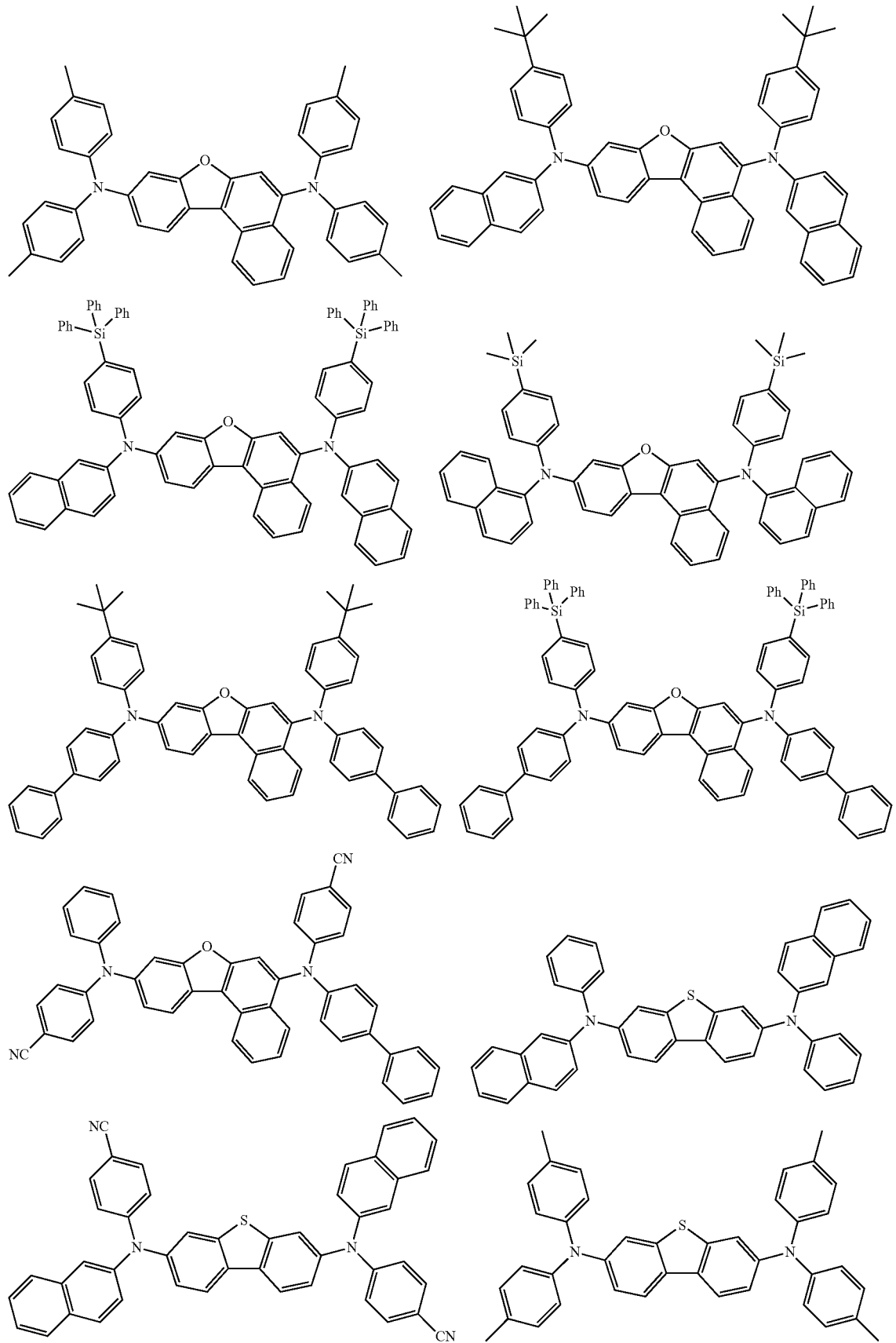

-continued
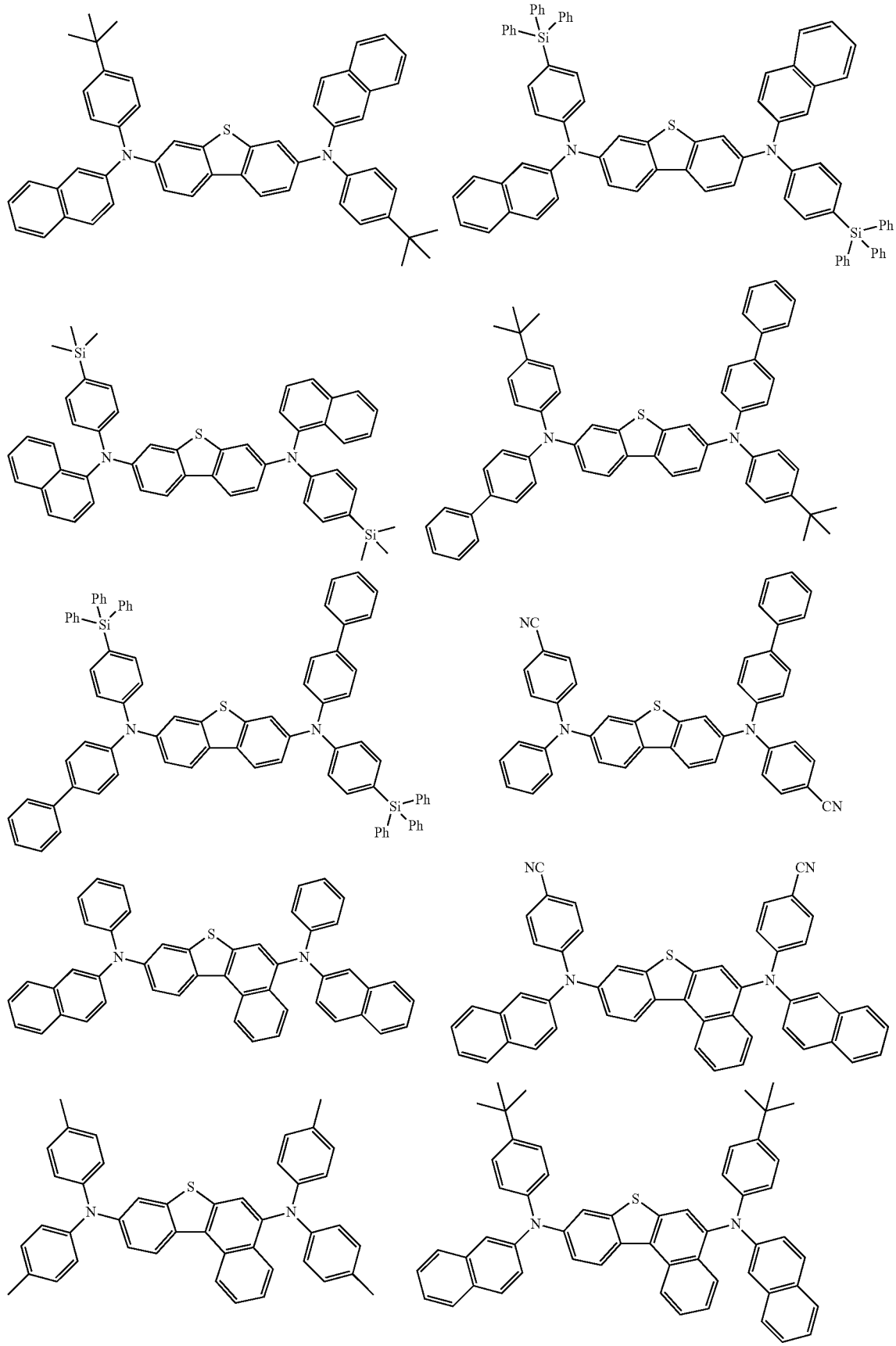

-continued
| 193 | 194 |
|---|---|
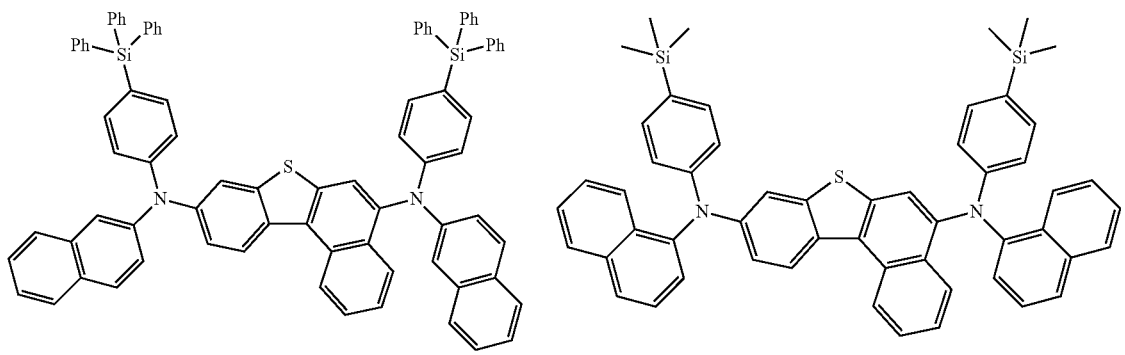
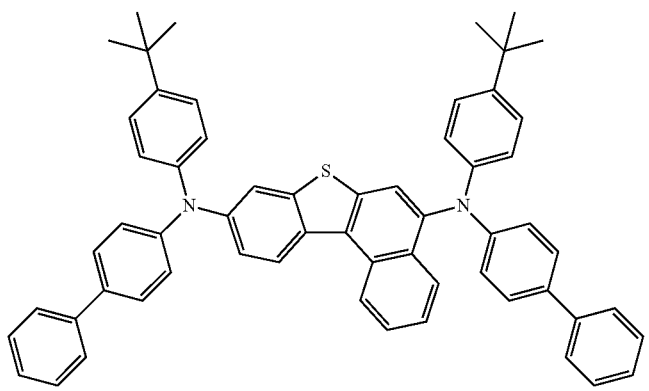 [SMILES: CC(C)(C)c1ccc(N(c2ccc(-c3ccccc3)cc2)c2ccc3c(c2)sc2cc(N(c4ccc(-c5ccccc5)cc4)c4ccc(C(C)(C)C)cc4)c4ccccc4c23)cc1]
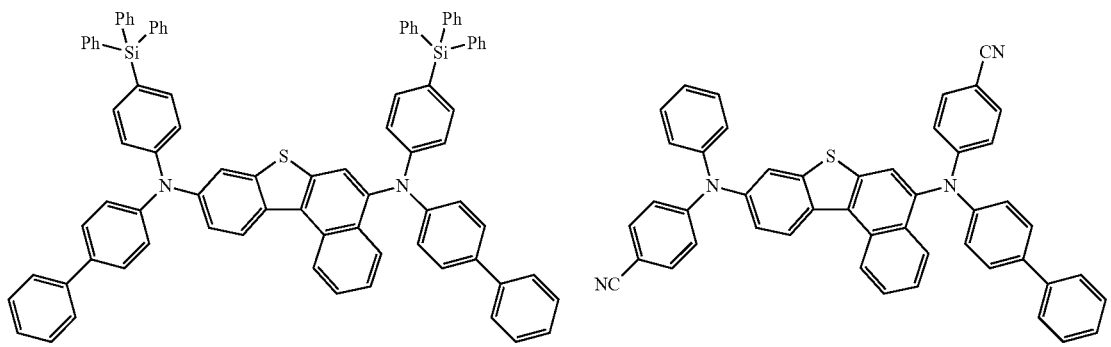
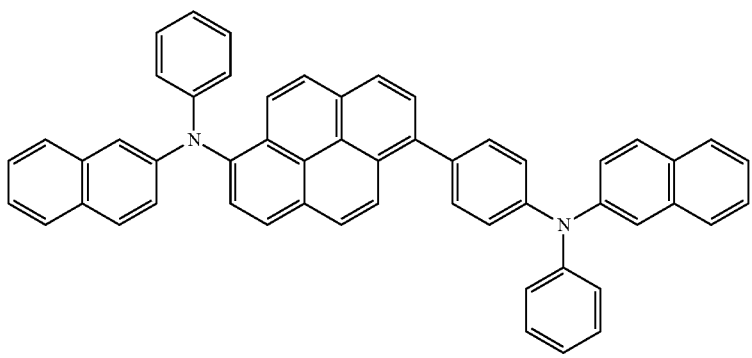

-continued
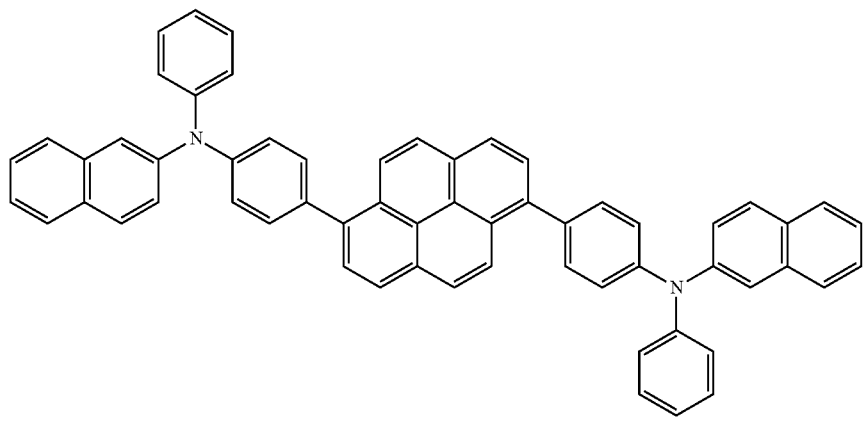
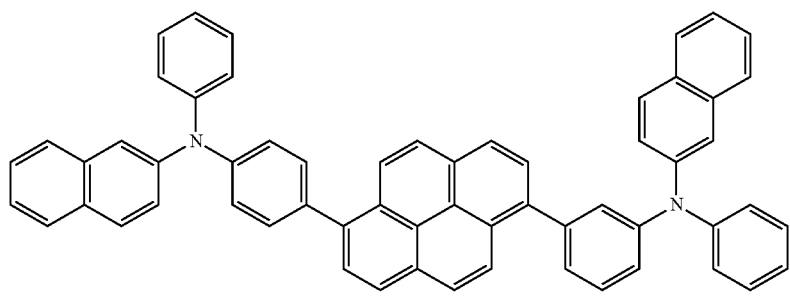
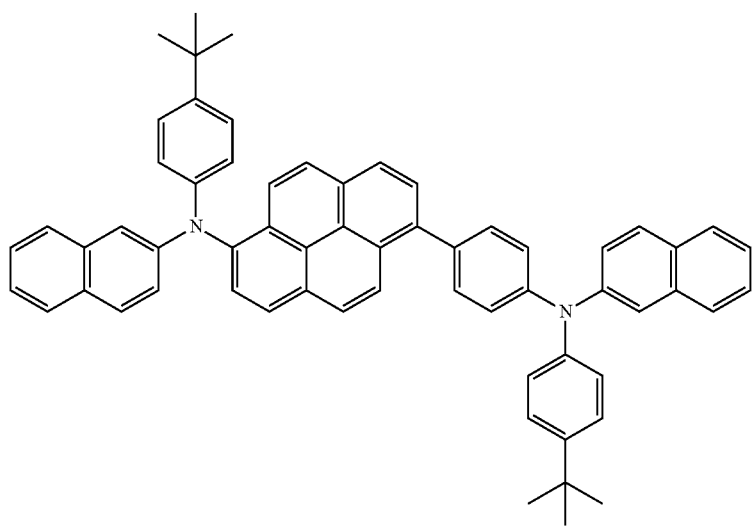

-continued
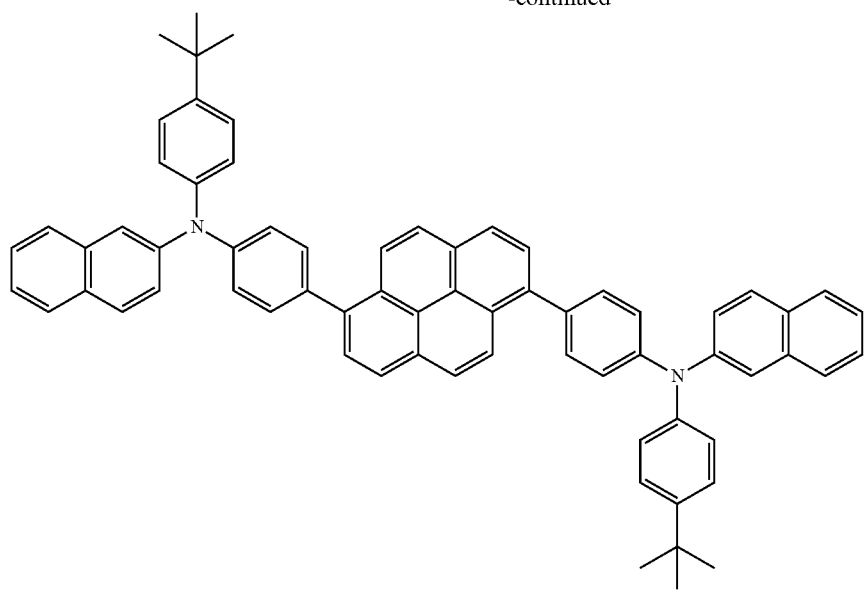
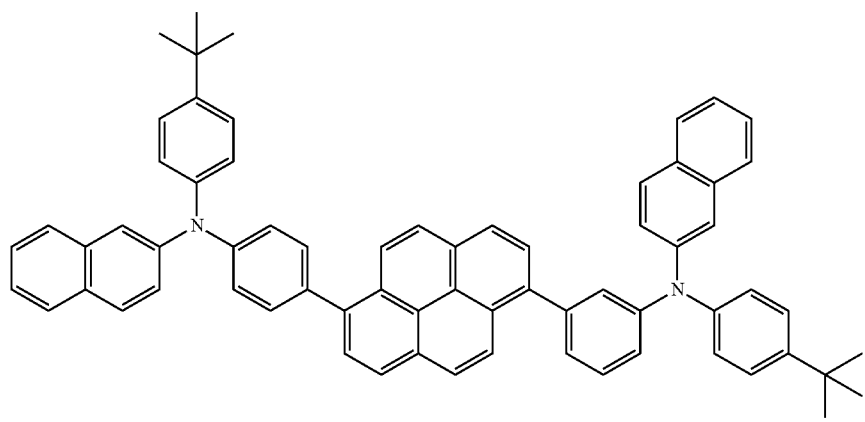
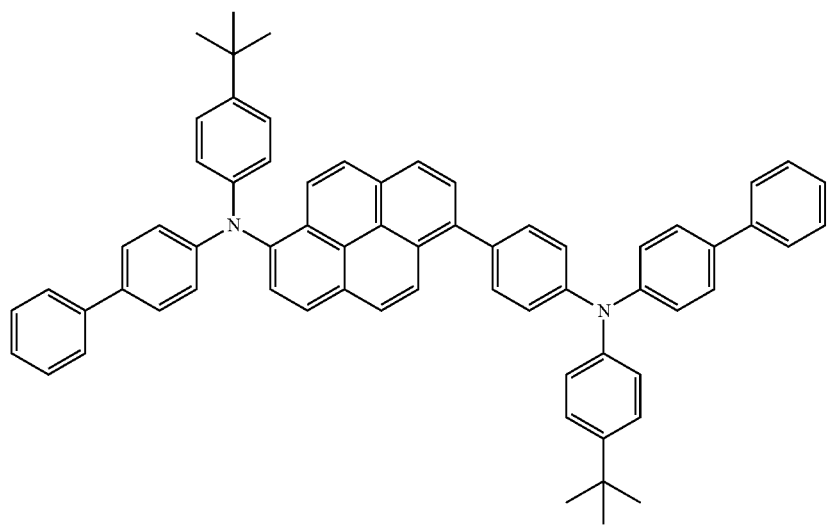

-continued
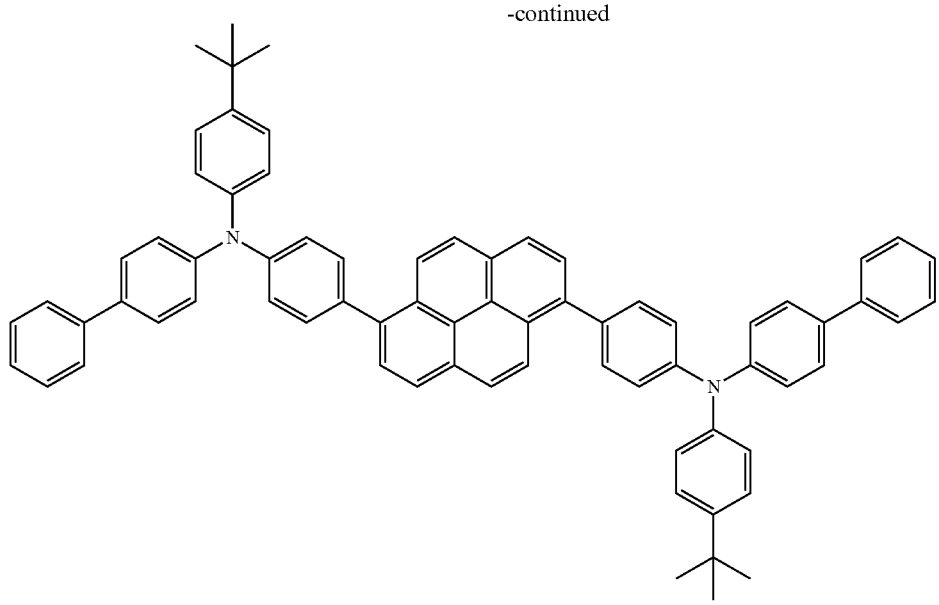
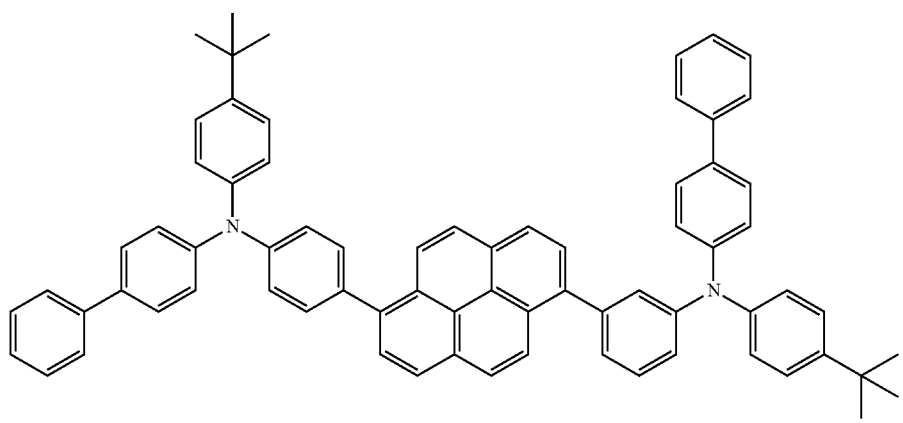
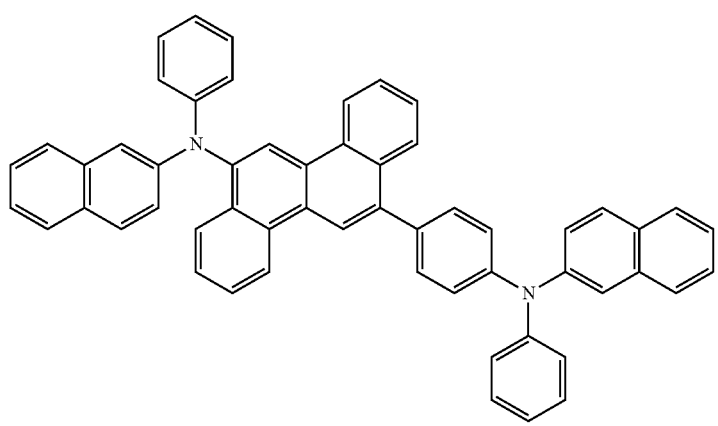

-continued
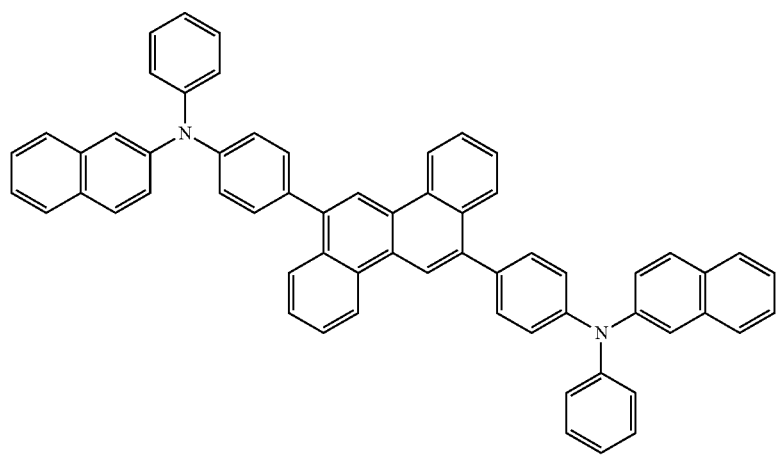
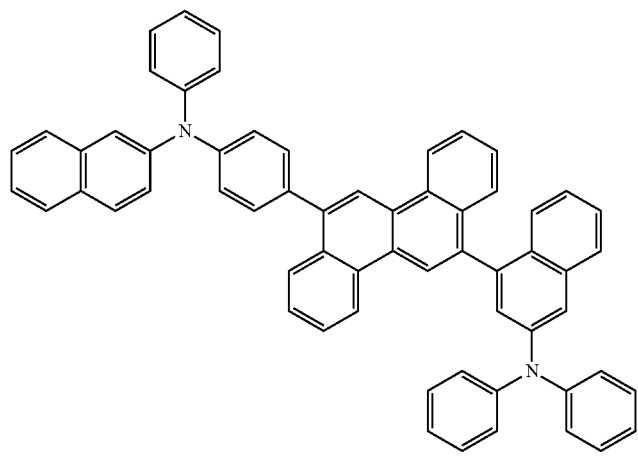
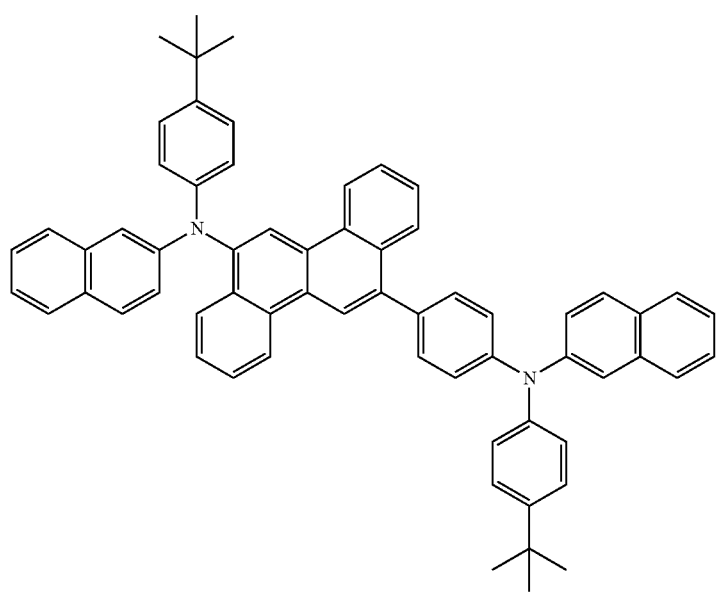

-continued
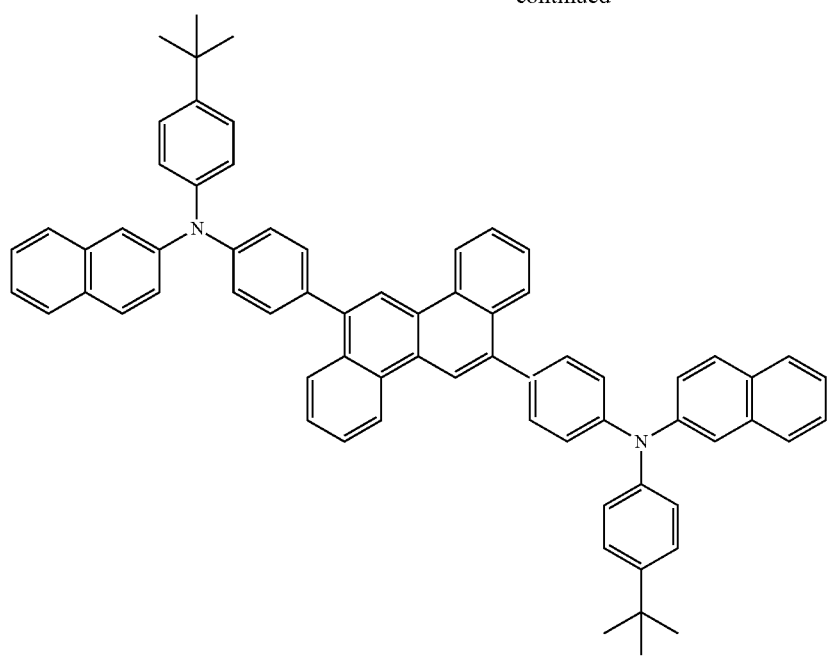
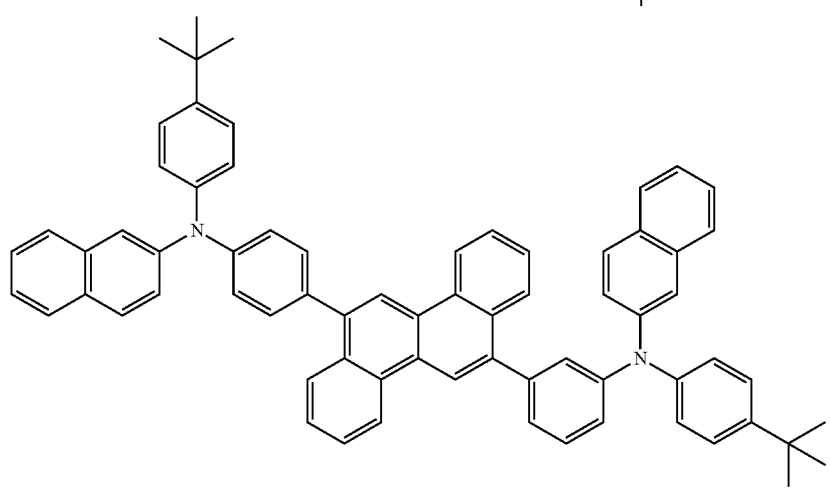
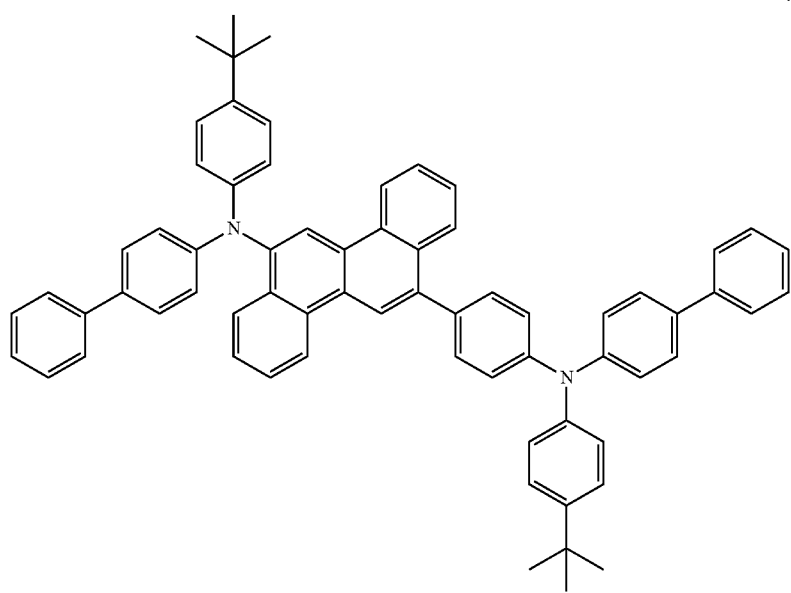

-continued
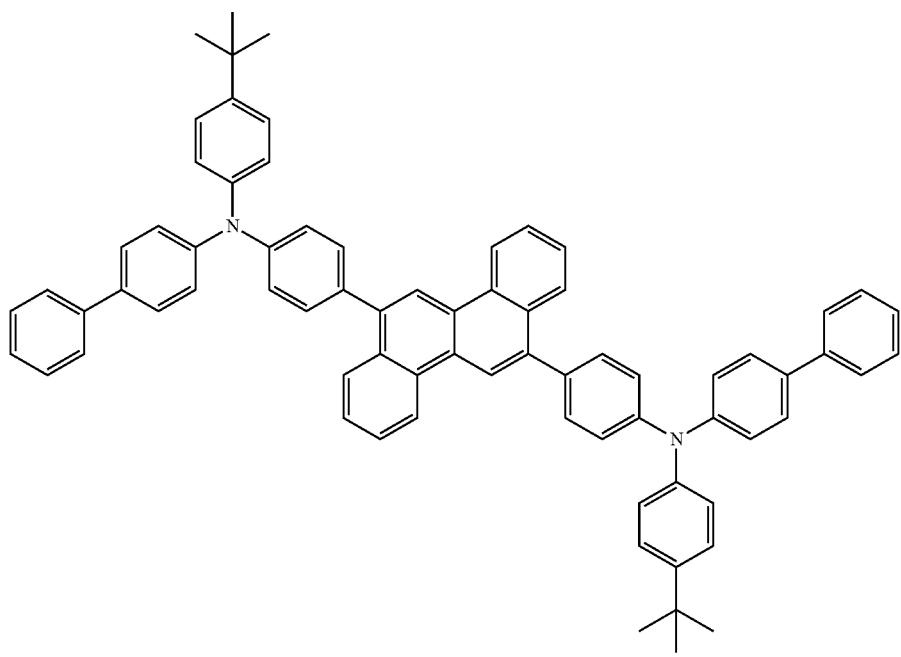
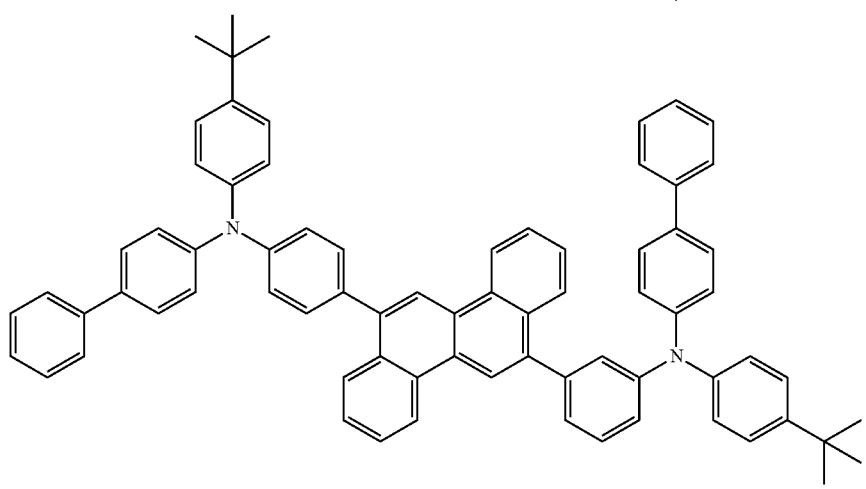
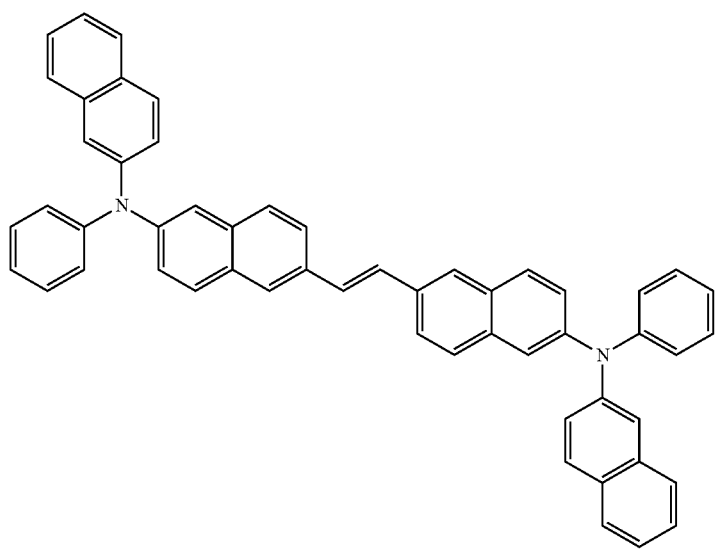

-continued
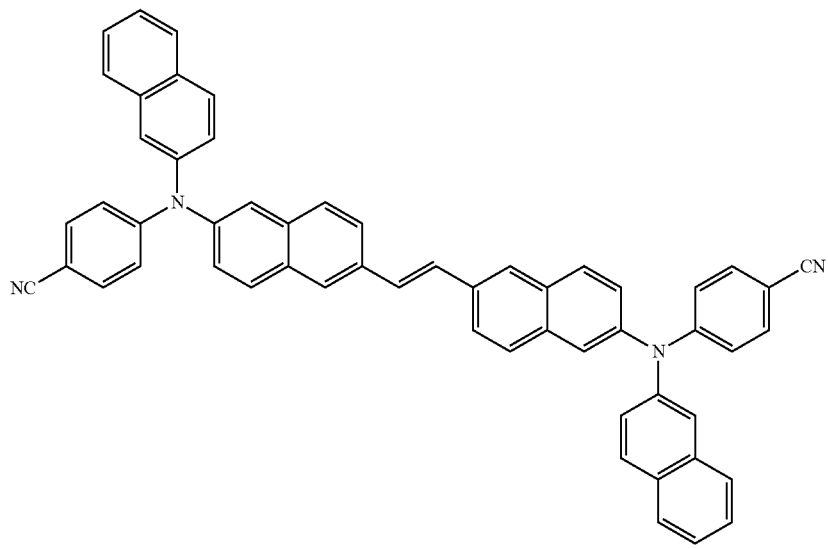
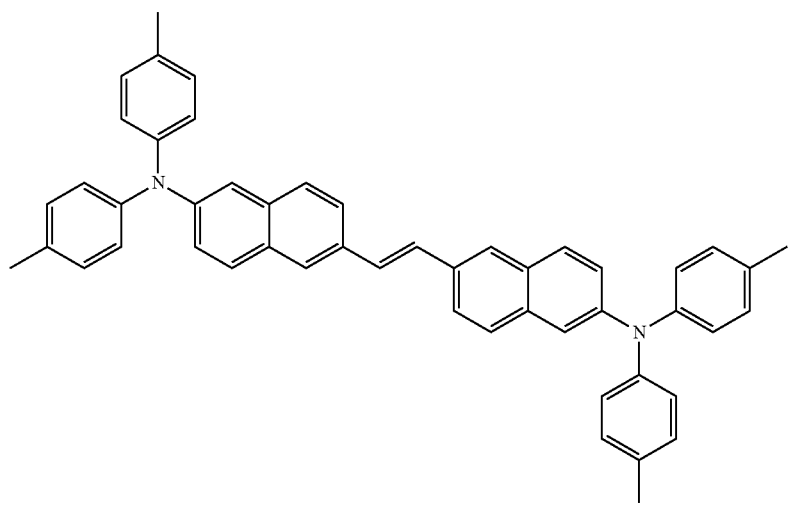
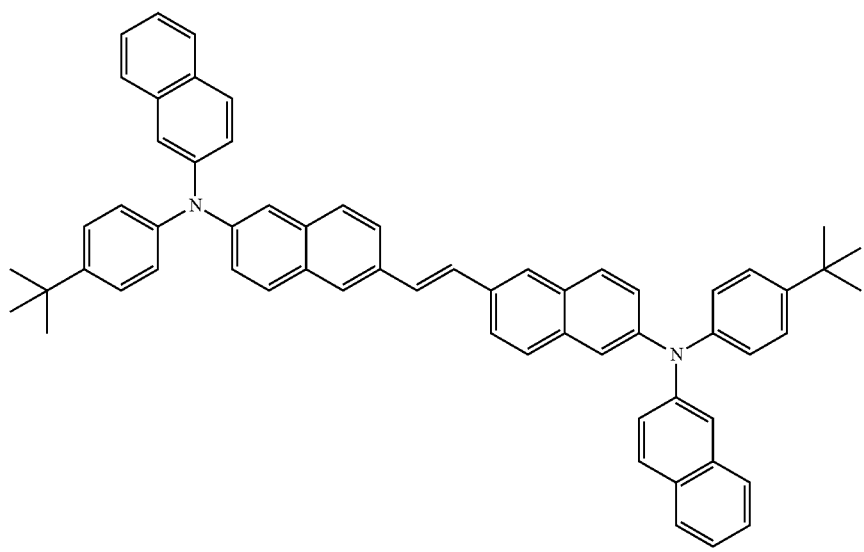

-continued
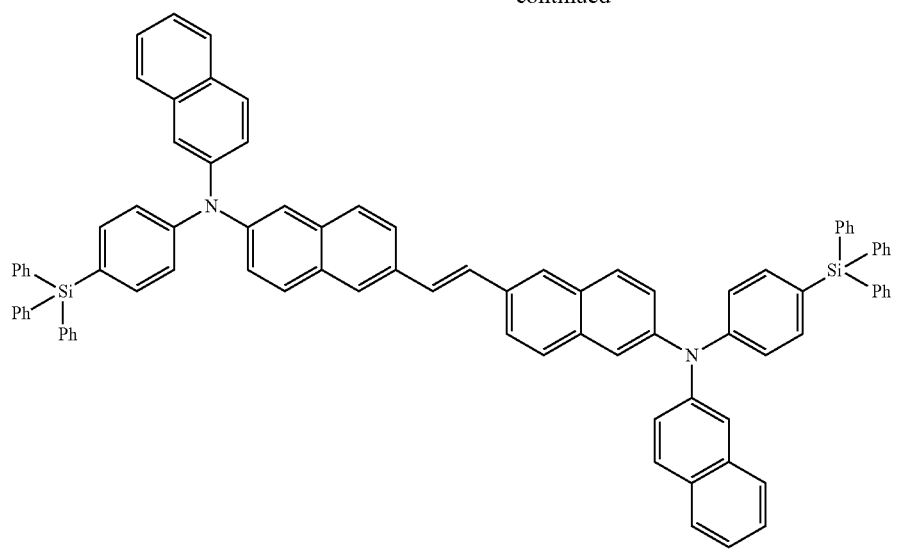
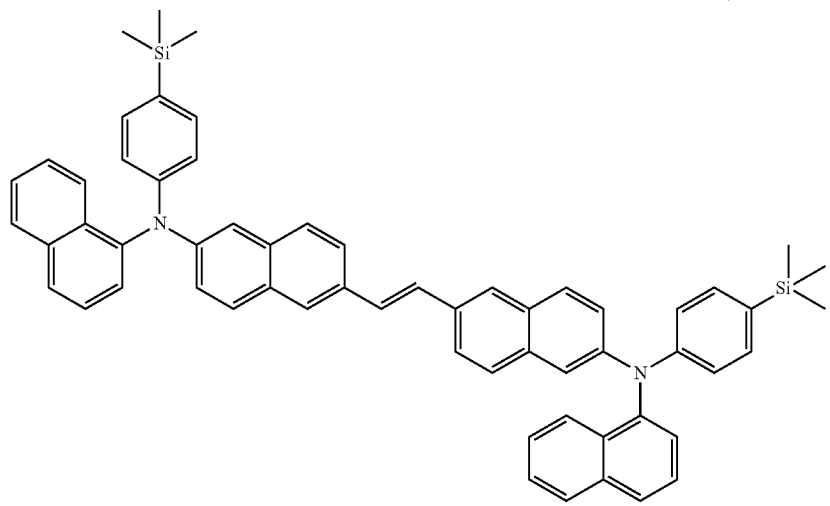
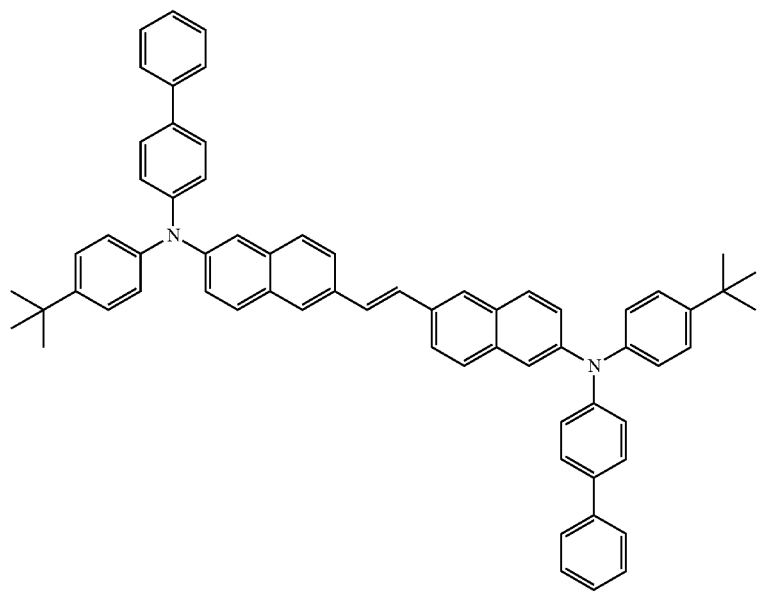

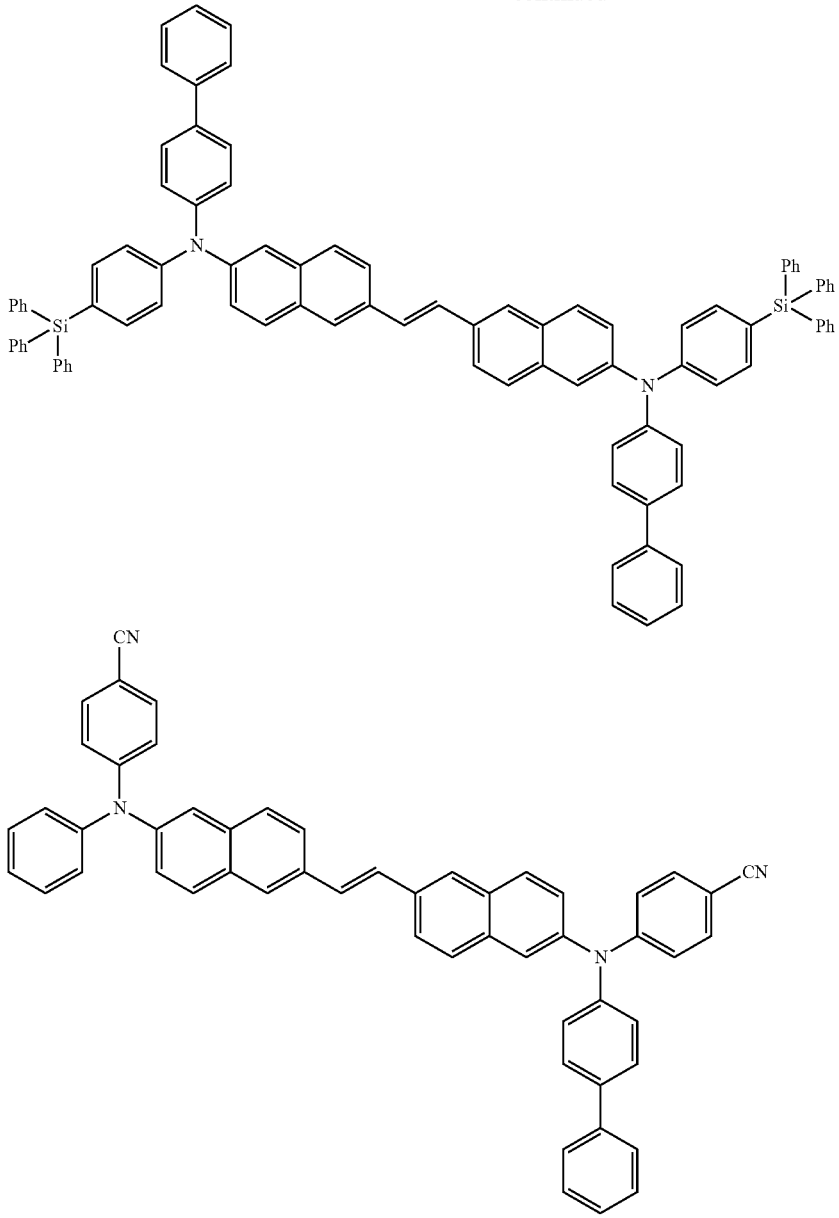

The third material may be a fluorescent dopant. The fluorescent dopant may have a maximum emission wavelength of about 400 nm to about 550 nm. The fluorescent dopant may emit green or blue light.

The amount of the dopant in the EML may be in a range of about 0.01 parts to about 15 parts by volume based on 100 parts by volume of the total volume of the host (i.e., the total volume of the first material and the second material), but the amount of the dopant is not limited thereto.

The first material may improve the efficiency of an organic light-emitting device. The second material may have high hole transport ability, and thus may facilitate the transport of holes in the EML and confine electrons thereto. Therefore, an organic light-emitting device including both the first material and the second material may have an improved carrier balance in the EML, and thus may have improved efficiency and improved lifetime.

When an organic light-emitting device includes the third material, it may emit green or blue light.

A thickness of the EML may be about 100 Å to about 1000 Å, and in some embodiments, may be from about 200 Å to about 600 Å. In one embodiment, when the thickness of the EML is within these ranges, the EML has good light emitting ability without a substantial increase in driving voltage.

The electron transport region may include at least one of a buffer layer (BL), an electron transport layer (ETL), and an electron injection layer (EIL). However, embodiments of the present disclosure are not limited thereto.

For example, the electron transport region may have a structure including an ETL/EIL or a BL/ETL/EIL. The layers forming the structure of the electron transport region may be sequentially stacked on the EML in the stated order. However, embodiments of the present disclosure are not limited thereto.

The electron transport region may include a BL. The BL may effectively or suitably confine excitons to the EML when the EML includes a fluorescent dopant, and thus may improve the efficiency of the organic light-emitting device.

When the electron transport region includes a BL, the BL may be formed on the EML by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like. When the BL is formed utilizing vacuum deposition or spin coating, the deposition and coating conditions for forming the BL may be similar to the above-described deposition and coating conditions for forming the HIL, and accordingly will not be described in more detail here.

For example, the BL may include one of Compounds E1 to E8.

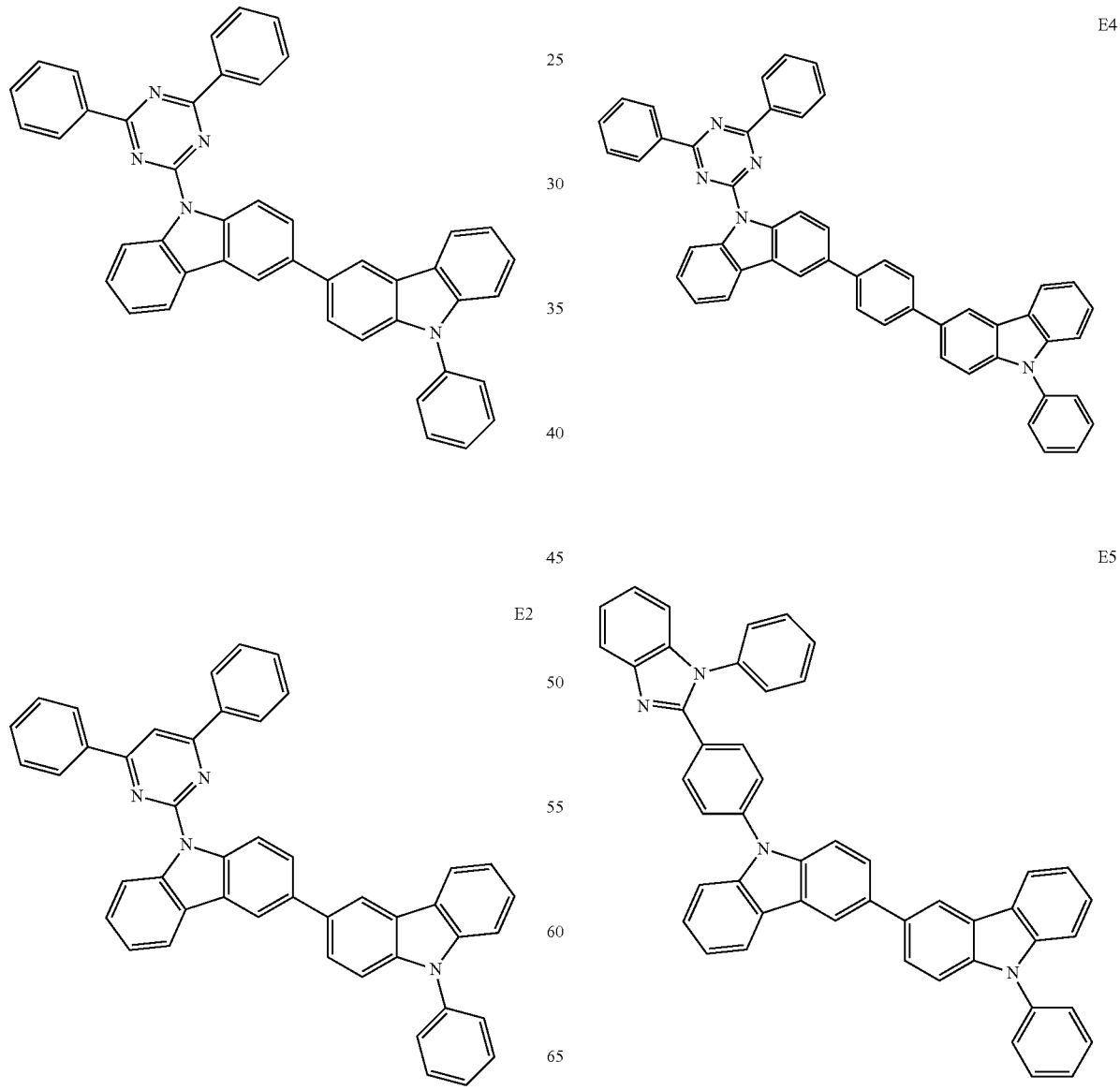
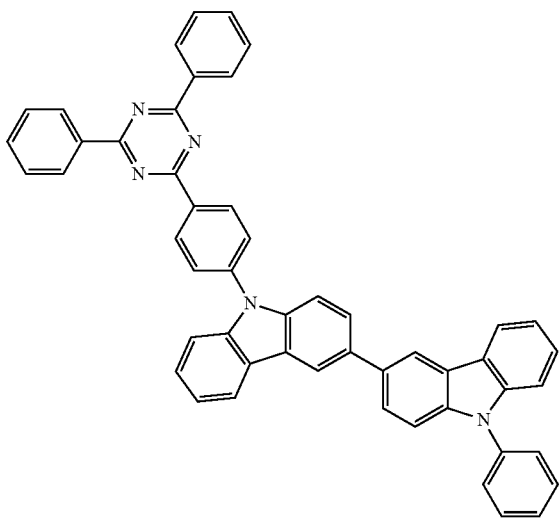

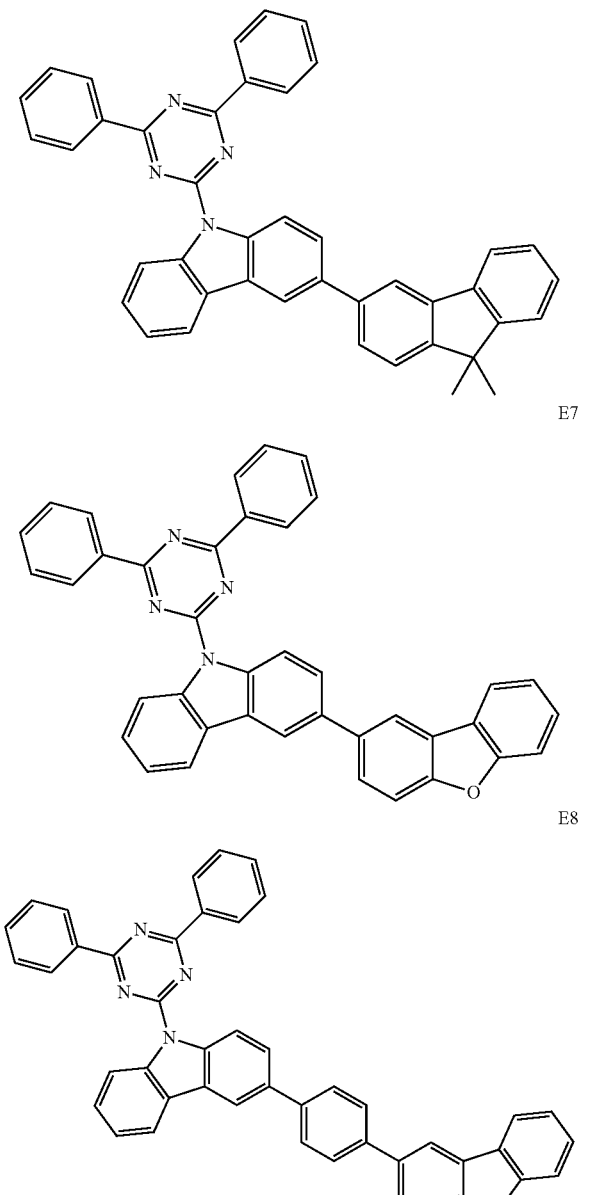

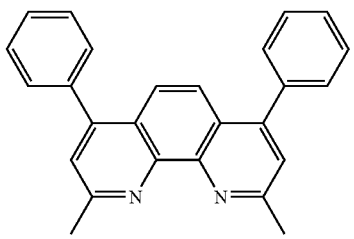

BCP

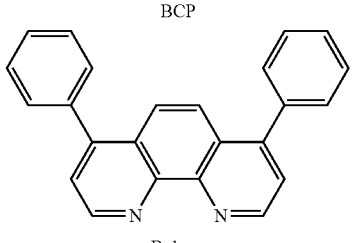

Bphen

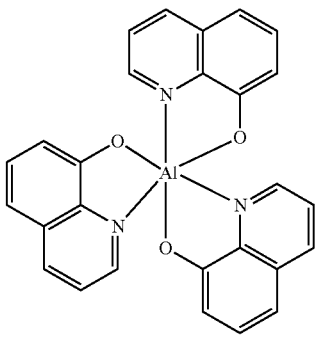

Alq₃

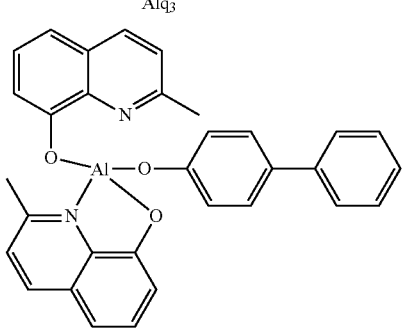

BAlq

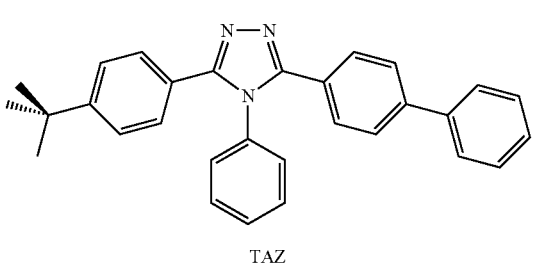

TAZ

For example, the BL may include a compound having a triplet energy level greater than 2.2 eV and electron transport ability.

A thickness of the BL may be from about 20 Å to about 1,000 Å, and in some embodiments, from about 30 Å to about 300 Å. In one embodiment, when the thickness of the BL is within these ranges, the BL effectively or suitably confines excitons to the EML, and thus the organic light-emitting device may have improved efficiency.

The electron transport region may include an ETL. The ETL may be formed on the EML or the BL by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like. When the ETL is formed utilizing vacuum deposition or spin coating, the deposition and coating conditions for forming the ETL may be similar to the above-described deposition and coating conditions for forming the HIL, and accordingly will not be described in more detail here.

For example, the ETL may further include at least one of BCP, BPhen, Alq₃, Balq, TAZ, and NTAZ.

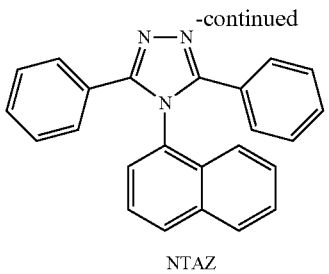

NTAZ

In some embodiments, the ETL may include at least one of the compounds represented by Formula 601.

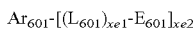  Formula 601

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), wherein $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{601}$ may be defined the same as $L_{201}$ described above;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In some other embodiments, the ETL may include at least one of the compounds represented by Formula 602.

Formula 602

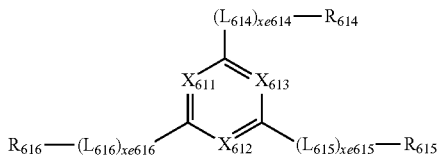

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, at least one of $X_{611}$ to $X_{613}$ may be N;

$L_{611}$ to $L_{616}$ may be defined the same as $L_{201}$ described above;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from, 0, 1, 2, and 3.

The compound of Formula 601 and the compound of Formula 602 may each independently include at least one of Compounds ET1 to ET15.

ET1
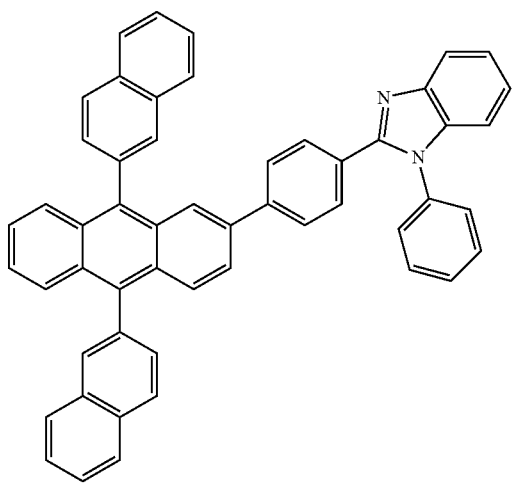

ET2
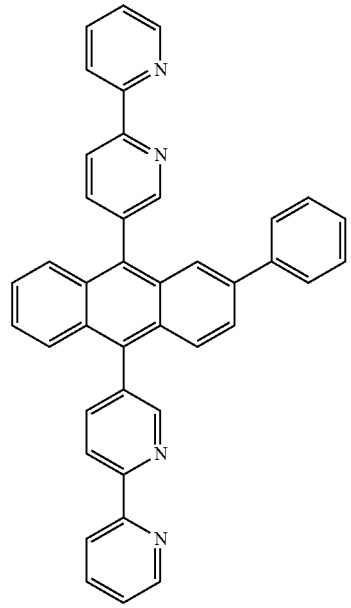

ET3
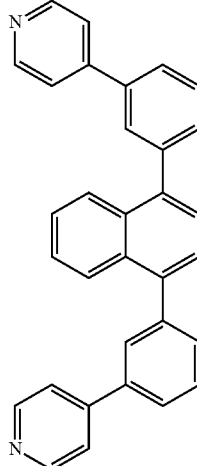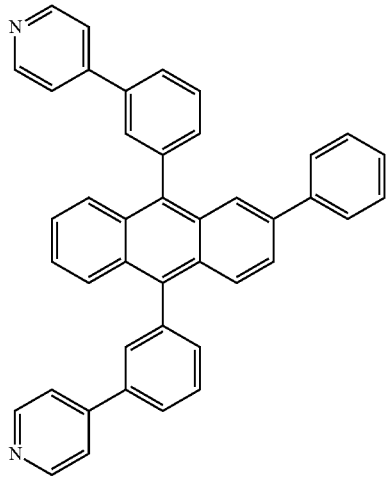

ET4
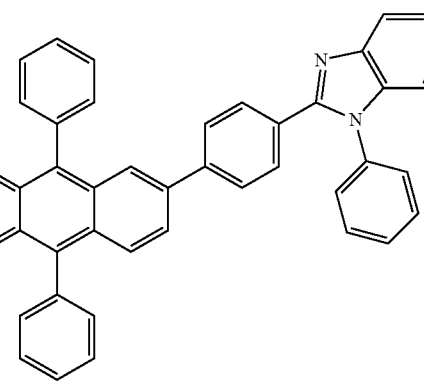

221
-continued
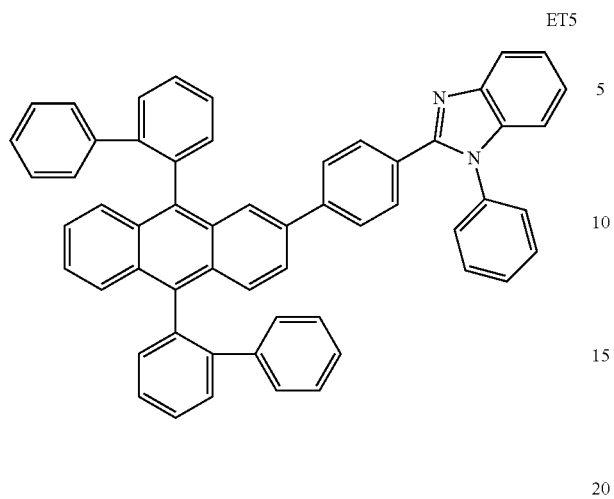
ET5
222
-continued
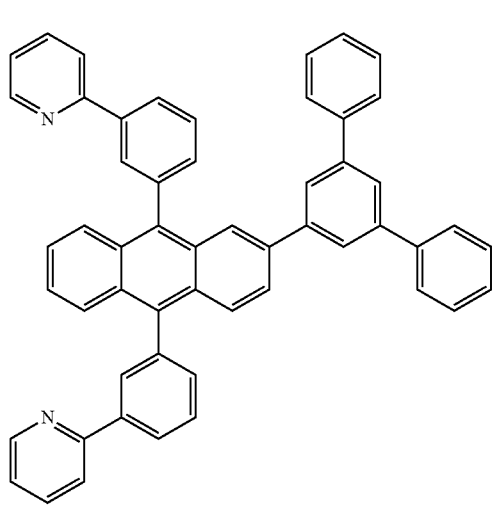
ET8
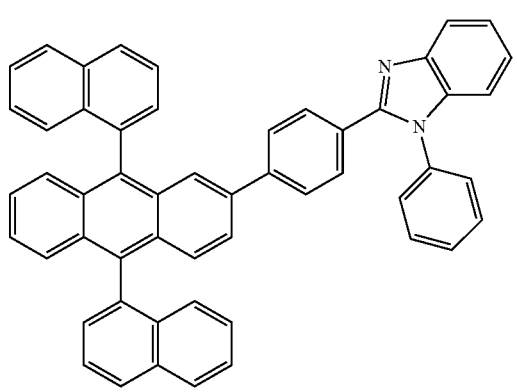
ET6
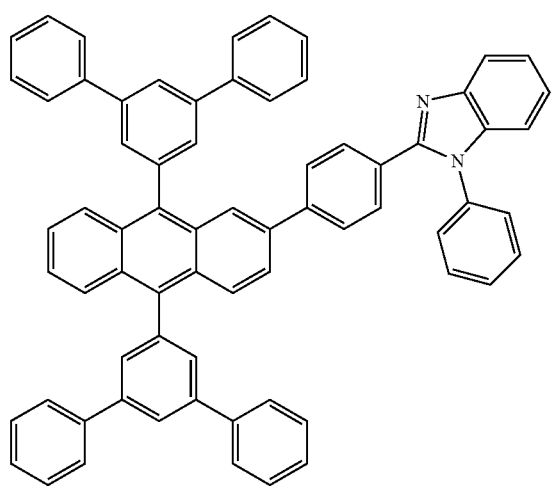
ET7
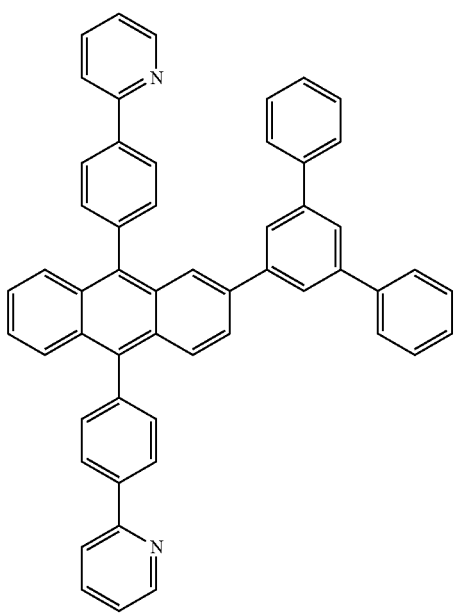
ET9

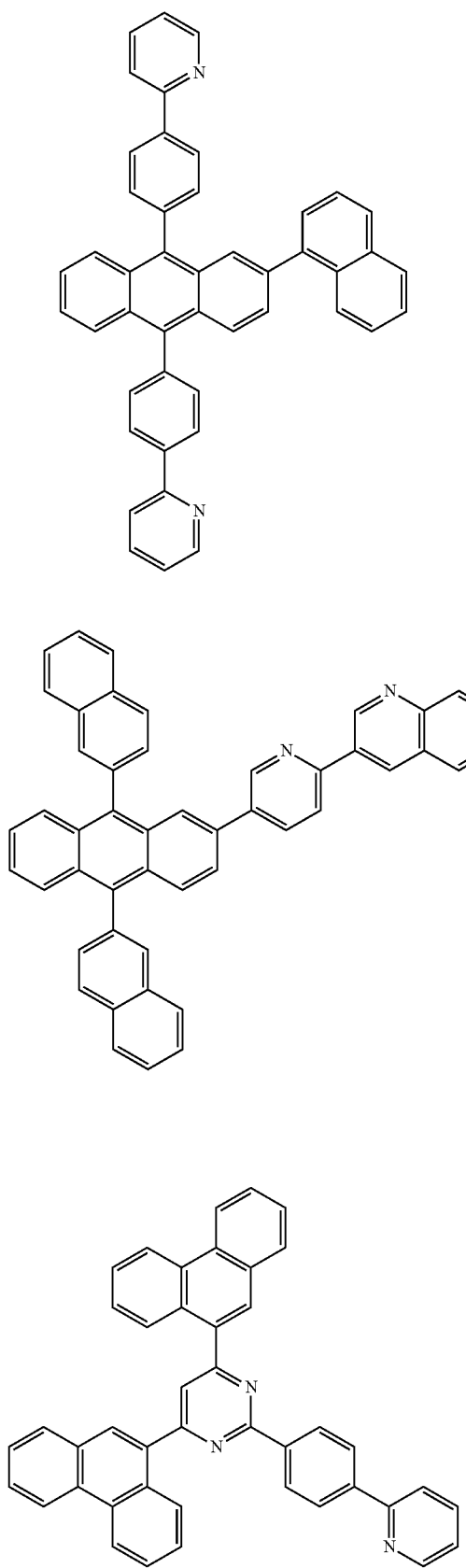
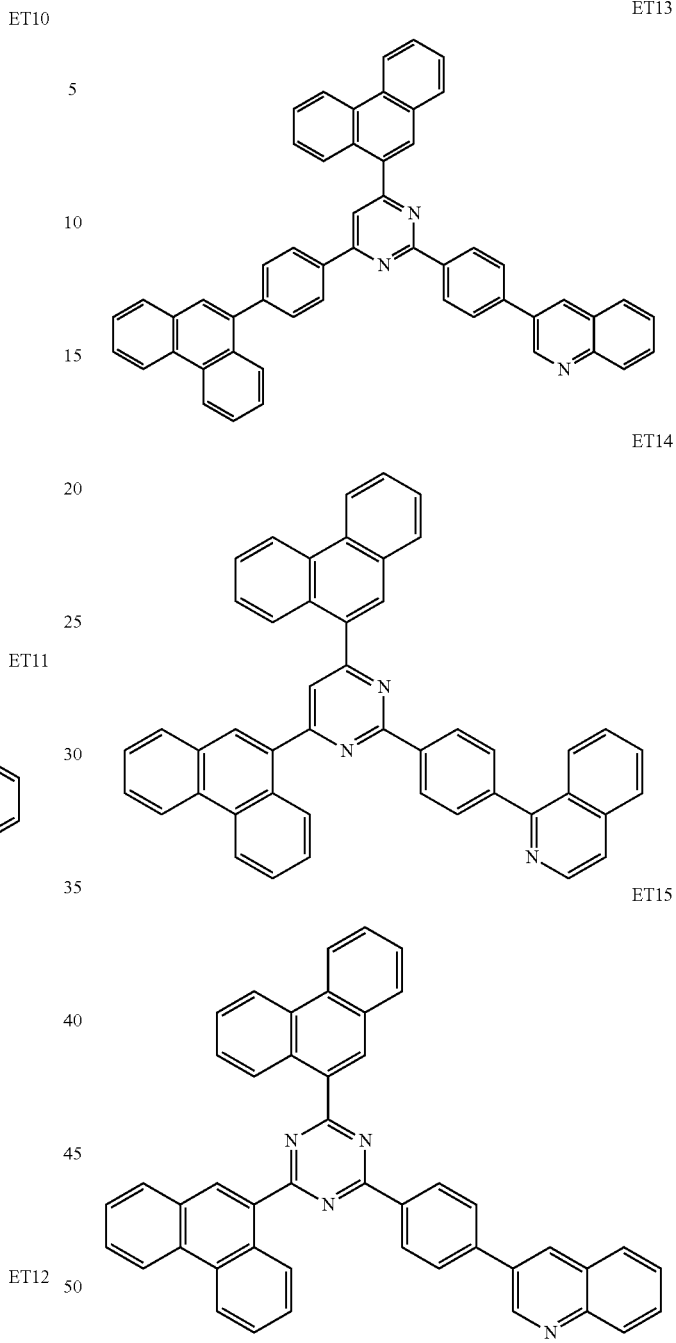

A thickness of the ETL may be from about 100 Å to about 1,000 Å, and in some embodiments, from about 150 Å to about 500 Å. In one embodiment, when the thickness of the ETL is within these ranges, the ETL has satisfactory or suitable electron transporting ability without a substantial increase in driving voltage.

In some embodiments, the ETL may further include a metal-containing material, in addition to the above-described materials.

The metal-containing material may include a lithium (Li) complex. Non-limiting examples of the Li complex are compound ET-D1 (lithium quinolate (LiQ)), and compound ET-D2.

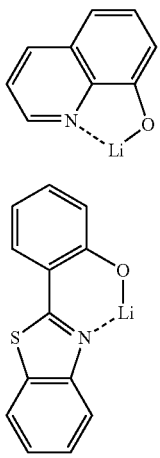

ET-D1

ET-D2

The electron transport region may include an EIL that may facilitate injection of electrons from the second electrode 190.

The EIL may be formed on the ETL by utilizing any of a variety of suitable methods, for example, by utilizing vacuum deposition, spin coating, casting, Langmuir-Blodgett (LB) deposition, inkjet printing, laser printing, laser induced thermal imaging (LITI), or the like. When the EIL is formed utilizing vacuum deposition or spin coating, the deposition and coating conditions for forming the EIL may be similar to the above-described deposition and coating conditions for forming the HIL, and accordingly will not be described in more detail here.

The EIL may include at least one selected from LiF, NaCl, CsF, $Li_2O$, BaO, and LiQ.

A thickness of the EIL may be from about 1 Å to about 100 Å, and in some embodiments, from about 3 Å to about 90 Å. In one embodiment, when the thickness of the EIL is within these ranges, the EIL has satisfactory or suitable electron injection ability without a substantial increase in driving voltage.

The second electrode 190 may be disposed on the electron transport region, as described above. The second electrode 190 may be a cathode as an electron injecting electrode. A material for forming the second electrode 190 may be a metal, an alloy, an electrically conductive compound, which have a low-work function, or a mixture thereof. Non-limiting examples of suitable materials for forming the second electrode 190 are lithium (Li), magnesium (Mg), aluminum (Al), aluminum-lithium (Al—Li), calcium (Ca), magnesium-indium (Mg—In), and magnesium-silver (Mg—Ag). In some embodiments, a material for forming the second electrode 190 may be ITO or IZO. The second electrode 190 may be a reflective electrode, a semi-transmissive electrode, or a transmissive electrode.

The organic light-emitting devices according to the above-described embodiments may be utilized in a flat-panel display device including a thin film transistor. The thin film transistor may include a gate electrode, a source electrode, a drain electrode, a gate insulating layer, and an active layer. One of the source and drain electrodes may be electrically coupled (e.g., electrically connected) to the first electrode of the organic light-emitting device. The active layer may include crystalline silicon, amorphous silicon, an organic semiconductor, an oxide semiconductor, or the like. However, embodiments of the present disclosure are not limited thereto.

As used herein, the term "a $C_1$-$C_{60}$ alkyl group" refers to a linear or branched monovalent aliphatic hydrocarbon group having 1 to 60 carbon atoms. Non-limiting examples of the $C_1$-$C_{60}$ alkyl group include a methyl group, an ethyl group, a propyl group, an n-butyl group, an iso-butyl group, a sec-butyl group, a tert-butyl group, a pentyl group, an iso-amyl group, and a hexyl group. The term "a $C_1$-$C_{60}$ alkylene group" refers to a divalent group having substantially the same structure as the $C_1$-$C_{60}$ alkyl group.

As used herein, the term "a $C_1$-$C_{60}$ alkoxy group" refers to a monovalent group represented by —$OA_{101}$ (where $A_{101}$ is a $C_1$-$C_{60}$ alkyl group, as described above). Non-limiting examples of the $C_1$-$C_{60}$ alkoxy group are a methoxy group, an ethoxy group, and an isopropyloxy group.

As used herein, the term "a $C_2$-$C_{60}$ alkenyl group" refers to a hydrocarbon group including at least one carbon double bond in the main chain (e.g., the middle) or terminal position of the $C_2$-$C_{60}$ alkyl group. Non-limiting examples of the $C_2$-$C_{60}$ alkenyl group are an ethenyl group, a prophenyl group, and a butenyl group. The term "a $C_2$-$C_{60}$ alkylene group" refers to a divalent group having substantially the same structure as the $C_2$-$C_{60}$ alkenyl group.

As used herein, the term "a $C_2$-$C_{60}$ alkynyl group" refers to a hydrocarbon group including at least one carbon triple bond in the main chain (e.g., the middle) or terminal position of the $C_2$-$C_{60}$ alkyl group. Non-limiting examples of the $C_2$-$C_{60}$ alkynyl group are an ethynyl group, and a propynyl group. The term "a $C_2$-$C_{60}$ alkynylene group" used herein refers to a divalent group having substantially the same structure as the $C_2$-$C_{60}$ alkynyl group.

As used herein, the term "a $C_3$-$C_{10}$ cycloalkyl group" refers to a monovalent, monocyclic hydrocarbon group having 3 to 10 carbon atoms. Non-limiting examples of the $C_3$-$C_{10}$ cycloalkyl group are a cyclopropyl group, a cyclobutyl group, a cyclopentyl group, a cyclohexyl group, and a cycloheptyl group. The term "a $C_3$-$C_{10}$ cycloalkylene group" refers to a divalent group having substantially the same structure as the $C_3$-$C_{10}$ cycloalkyl group.

As used herein, the term "a $C_1$-$C_{10}$ heterocycloalkyl group" refers to a monovalent monocyclic group having 1 to 10 carbon atoms in which at least one hetero atom selected from N, O, P, and S is included as a ring-forming atom. Non-limiting examples of the $C_1$-$C_{10}$ heterocycloalkyl group are a tetrahydrofuranyl group, and a tetrahydrothiophenyl group. The term "a $C_1$-$C_{10}$ heterocycloalkylene group" refers to a divalent group having substantially the same structure as the $C_1$-$C_{10}$ heterocycloalkyl group.

As used herein, the term "a $C_3$-$C_{10}$ cycloalkenyl group" refers to a monovalent monocyclic group having 3 to 10 carbon atoms that includes at least one double bond in the ring but does not have aromaticity. Non-limiting examples of the $C_3$-$C_{10}$ cycloalkenyl group are a cyclopentenyl group, a cyclohexenyl group, and a cycloheptenyl group. The term "a $C_3$-$C_{10}$ cycloalkenylene group" refers to a divalent group having substantially the same structure as the $C_3$-$C_{10}$ cycloalkenyl group.

As used herein, the term "a $C_1$-$C_{10}$ heterocycloalkenyl group" refers to a monovalent monocyclic group having 1 to 10 carbon atoms that includes at least one double bond in the ring and in which at least one hetero atom selected from N, O, P, and S is included as a ring-forming atom. Non-limiting examples of the $C_1$-$C_{10}$ heterocycloalkenyl group are a 2,3-hydrofuranyl group, and a 2,3-hydrothiophenyl group. The term "a $C_1$-$C_{10}$ heterocycloalkenylene group" used herein refers to a divalent group having substantially the same structure as the $C_1$-$C_{10}$ heterocycloalkenyl group.

As used herein, the term "a $C_6$-$C_{60}$ aryl group" refers to a monovalent, aromatic carbocyclic aromatic group having 6 to 60 carbon atoms, and the term "a $C_6$-$C_{60}$ arylene group" refers to a divalent, aromatic carbocyclic group having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group, and the $C_6$-$C_{60}$ arylene group include at least two rings, the rings may be fused to each other.

As used herein, the term "a $C_1$-$C_{60}$ heteroaryl group" refers to a monovalent, aromatic carbocyclic aromatic group having 1 to 60 carbon atoms in which at least one hetero atom selected from N, O, P, and S is included as a ring-forming atom, and 1 to 60 carbon atoms. The term "a $C_1$-$C_{60}$ heteroarylene group" refers to a divalent, aromatic carbocyclic group having 1 to 60 carbon atoms in which at least one hetero atom selected from N, O, P, and S is included as a ring-forming atom. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl and the $C_1$-$C_{60}$ heteroarylene include at least two rings, the rings may be fused to each other.

As used herein, the term "a $C_6$-$C_{60}$ aryloxy group" refers to a monovalent group represented by —$OA_{102}$ (where $A_{102}$ is a $C_6$-$C_{60}$ aryl group, as described above), and the term "a $C_6$-$C_{60}$ arylthio group" refers to a monovalent group represented by -$SA_{103}$ (where $A_{103}$ is a $C_6$-$C_{60}$ aryl group, as described above).

As used herein, the term "monovalent non-aromatic condensed polycyclic group" refers to a monovalent group that includes at least two rings condensed to each other and includes only carbon atoms (for example, 8 to 60 carbon atoms) as ring-forming atoms and that represents non-aromaticity as a whole. An example of the monovalent non-aromatic condensed polycyclic group is a fluorenyl group. As used herein, the term "a divalent non-aromatic condensed polycyclic group" refers to a divalent group with substantially the same structure as the monovalent non-aromatic condensed polycyclic group.

As used herein, the term "monovalent non-aromatic condensed heteropolycyclic group" refers to a monovalent group that includes at least two rings condensed to each other and include carbons (for example, 1 to 60 carbon atoms) and hetero atoms selected from N, O, P and S as ring-forming atoms and that represents non-aromaticity as a whole. An example of the monovalent non-aromatic condensed heteropolycyclic group is a carbazolyl group. As used herein, the term "a divalent non-aromatic condensed heteropolycyclic group" refers to a divalent group with substantially the same structure as the monovalent non-aromatic condensed polycyclic group.

The acronym "Ph" used herein refers to a phenyl group, the acronym "Me" used herein refers to methyl, the acronym "Et" used herein refers to ethyl, and the acronym "ter-Bu" or "Bu$^t$" used herein refers to a tert-butyl.

One or more embodiments of the present disclosure will now be described in more detail with reference to the following examples. However, these examples are only for illustrative purposes and are not intended to limit the scope of the one or more embodiments of the present disclosure.

EXAMPLES

Example 1-1

To manufacture an anode, a 15 Ω/cm² ITO glass substrate (having a thickness of 1200 Å, available from Corning) was cut to a size of 50 mm×50 mm×0.7 mm, sonicated in isopropyl alcohol for about 10 minutes and pure water for about 10 minutes, and then cleaned by irradiation of ultra-violet rays for about 30 minutes and exposure to ozone. The resulting glass substrate was mounted into a vacuum deposition device.

After HT13 was deposited on the ITO anode of the glass substrate to form an HIL having a thickness of 500 Å, HT3 was deposited to form an HTL having a thickness of about 450 Å, and then Compounds H-1a (first material), H-1b (second material), and D-1 (third material) were co-deposited in a volume ratio of about 94:3:3 to form an EML having a thickness of about 300 Å.

After Compound E1 was deposited on the EML to form a buffer layer having a thickness of about 100 Å, Bphen and Liq were co-deposited in a volume ratio of about 50:50 on the buffer layer to form an ETL having a thickness of about 150 Å, and then LiF was deposited on the ETL to form an EIL having a thickness of about 5 Å. Subsequently, Al was vacuum-deposited on the EIL to form a cathode having a thickness of about 1500 Å, thereby complete the manufacturing of an organic light-emitting device.

Examples 1-2 to 1-6 and Comparative Examples 1-1 to 1-5

Organic light-emitting devices were manufactured in substantially the same manner as in Example 1-1, except that the ratios of the first material to the second material that were utilized to form the EML were varied as shown in Table 1.

TABLE 1

| Example | First material | Second material | Third material | Volume ratio (First material:Second material:Third material) |
|---|---|---|---|---|
| Example 1-1 | H-1a | H-1b | D-1 | 94:3:3 |
| Example 1-2 | H-1a | H-1b | D-1 | 92:5:3 |
| Example 1-3 | H-1a | H-1b | D-1 | 87:10:3 |
| Example 1-4 | H-1a | H-1b | D-1 | 77:20:3 |
| Example 1-5 | H-1a | H-1b | D-1 | 47:50:3 |
| Example 1-6 | H-1a | H-1b | D-1 | 27:70:3 |
| Comparative Example 1-1 | H-1a | — | D-1 | 97:0:3 |
| Comparative Example 1-2 | — | H-1b | D-1 | 0:97:3 |
| Comparative Example 1-3 | Compound A | NPB | D-1 | 94:3:3 |
| Comparative Example 1-4 | Compound A | NPB | D-1 | 92:5:3 |
| Comparative Example 1-5 | Compound A | NPB | D-1 | 87:10:3 |

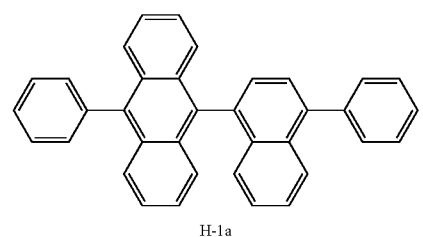 [SMILES: c1ccc(-c2ccc(-c3c4ccccc4c(-c4ccccc4)c4ccccc34)c3ccccc23)cc1]

H-1a

TABLE 1-continued

| Example | First material | Second material | Third material | Volume ratio (First material:Second material:Third material) |
|---------|----------------|-----------------|----------------|---------------------------------------------------------------|

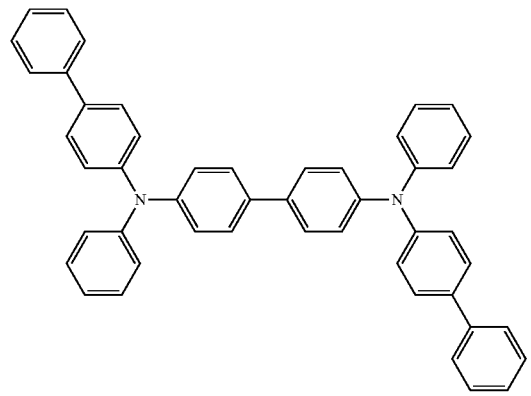

H-1b

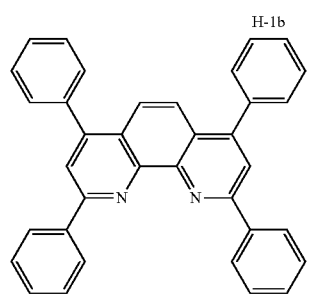

A

Example 2-1

To manufacture an anode, a 15 Ω/cm² ITO glass substrate (having a thickness of 1200 Å, available from Corning) was cut to a size of 50 mm×50 mm×0.7 mm, sonicated in isopropyl alcohol for about 10 minutes and pure water for about 10 minutes, and then cleaned by irradiation of ultraviolet rays for about 30 minutes and exposure to ozone. The resulting glass substrate was mounted into a vacuum deposition device.

After HT13 was deposited on the ITO anode of the glass substrate to form an HIL having a thickness of 500 Å, HT3 was deposited to form an HTL having a thickness of about 450 Å, and then Compounds H-1a (first material), H-1b (second material), and D-1 (third material) were co-deposited in a volume ratio of about 92:3:5 to form an EML having a thickness of about 300 Å.

After Compound E1 was deposited on the EML to form a buffer layer having a thickness of about 100 Å, Bphen and Liq were co-deposited in a volume ratio of about 50:50 on the buffer layer to form an ETL having a thickness of about 150 Å, and then LiF was deposited on the ETL to form an EIL having a thickness of about 5 Å. Subsequently, Al was vacuum-deposited on the EIL to form a cathode having a thickness of about 1500 Å, thereby complete the manufacturing of an organic light-emitting device.

Examples 2-2 to 2-31 and Comparative Examples 2-1 to 2-5

Organic light-emitting devices were manufactured in substantially the same manner as in Example 2-1, except that the first material and the second material that were utilized to form the EML were varied as shown in Table 2.

TABLE 2

| Example | First material | Second material | Third material |
|---------|---------------|-----------------|----------------|
| Example 2-1 | H-1a | H-1b | D-1 |
| Example 2-2 | H-1a | H-2b | D-1 |
| Example 2-3 | H-1a | H-3b | D-1 |
| Example 2-4 | H-1a | H-4b | D-1 |
| Example 2-5 | H-1a | H-5b | D-1 |
| Example 2-6 | H-1a | H-6b | D-1 |
| Example 2-7 | H-1a | H-7b | D-1 |
| Example 2-8 | H-1a | H-8b | D-1 |
| Example 2-9 | H-2a | H-2b | D-1 |
| Example 2-10 | H-3a | H-2b | D-1 |
| Example 2-11 | H-4a | H-2b | D-1 |
| Example 2-12 | H-5a | H-2b | D-1 |
| Example 2-13 | H-6a | H-2b | D-1 |
| Example 2-14 | H-7a | H-2b | D-1 |
| Example 2-15 | H-8a | H-2b | D-1 |
| Example 2-16 | H-9a | H-2b | D-1 |
| Example 2-17 | H-10a | H-2b | D-1 |
| Example 2-18 | H-11a | H-2b | D-1 |
| Example 2-19 | H-12a | H-2b | D-1 |
| Example 2-20 | H-3a | H-3b | D-1 |
| Example 2-21 | H-5a | H-3b | D-1 |
| Example 2-22 | H-7a | H-3b | D-1 |
| Example 2-23 | H-12a | H-3b | D-1 |
| Example 2-24 | H-3a | H-4b | D-1 |
| Example 2-25 | H-5a | H-4b | D-1 |
| Example 2-26 | H-7a | H-4b | D-1 |
| Example 2-27 | H-12a | H-4b | D-1 |
| Example 2-28 | H-3a | H-6b | D-1 |
| Example 2-29 | H-5a | H-6b | D-1 |
| Example 2-30 | H-7a | H-6b | D-1 |
| Example 2-31 | H-12a | H-6b | D-1 |
| Comparative Example 2-1 | Compound1 | — | D-1 |
| Comparative Example 2-2 | Compound2 | — | D-1 |
| Comparative Example 2-3 | — | H-1b | D-1 |
| Comparative Example 2-4 | Compound 1 | H-1b | D-1 |
| Comparative Example 2-5 | Compound A | NPB | D-1 |

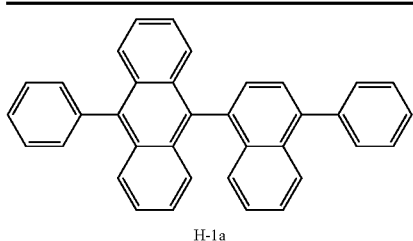

H-1a

TABLE 2-continued
| Example | First material | Second material | Third material |
|---|---|---|---|
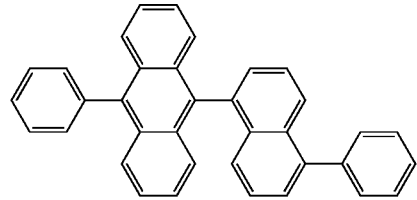
H-2a
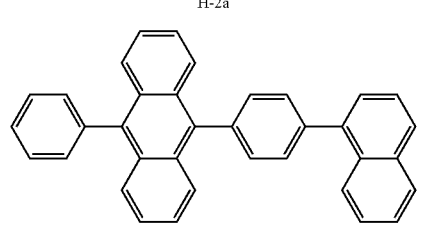
H-3a
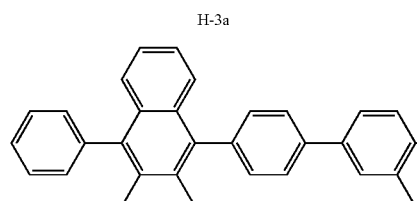
H-4a
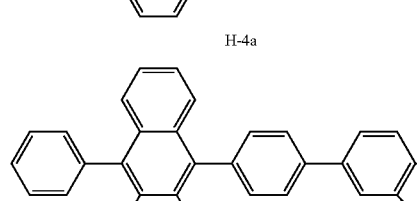
H-5a
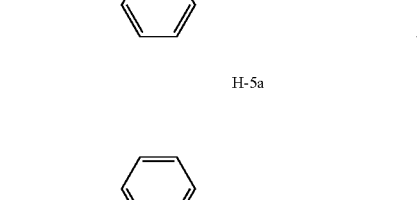
H-6a
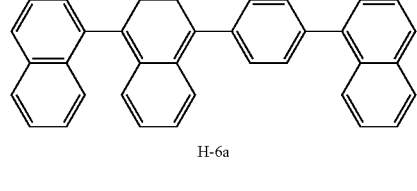
H-7a
TABLE 2-continued
| Example | First material | Second material | Third material |
|---|---|---|---|
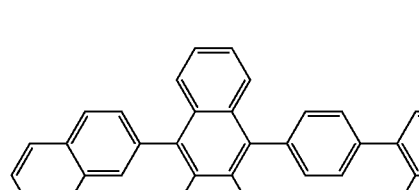
H-8a
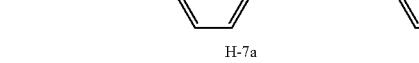
H-9a
H-10a
H-11a
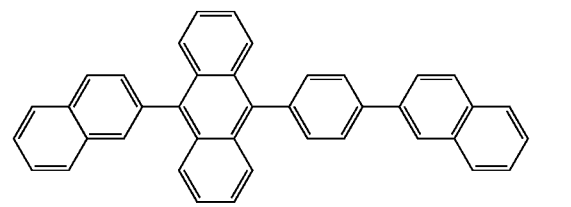
H-12a
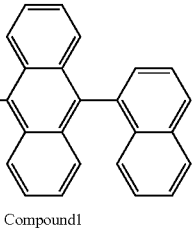
Compound1

TABLE 2-continued
| Example | First material | Second material | Third material |
|---|---|---|---|
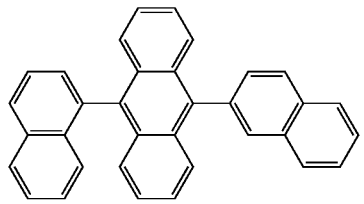
Compound 2
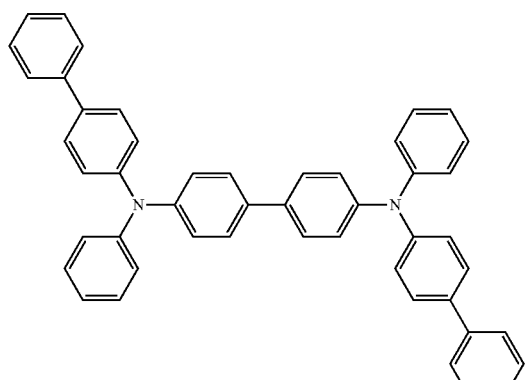
H-1b
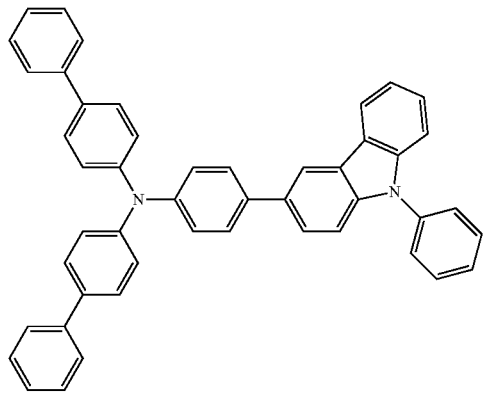
H-2b
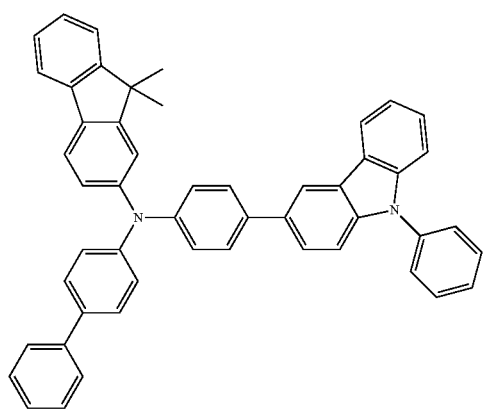
H-3b
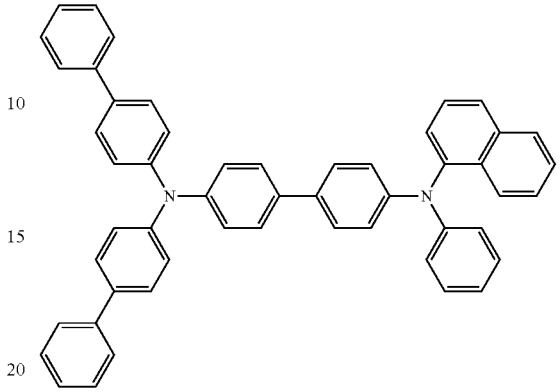
H-4b
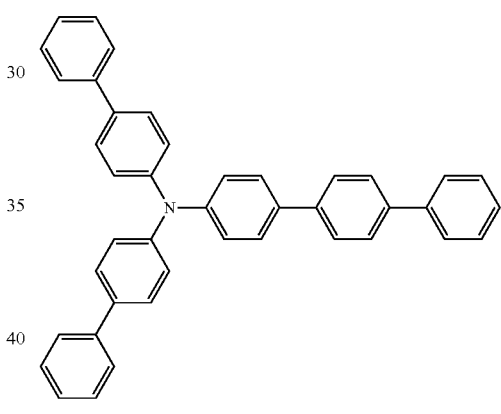
H-5b
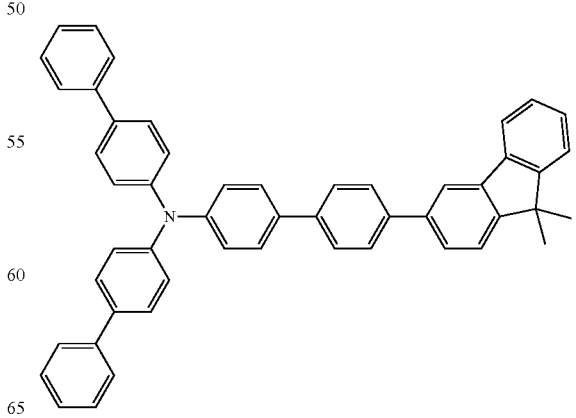
H-6b TABLE 2-continued
| Example | First material | Second material | Third material |
|---|---|---|---|
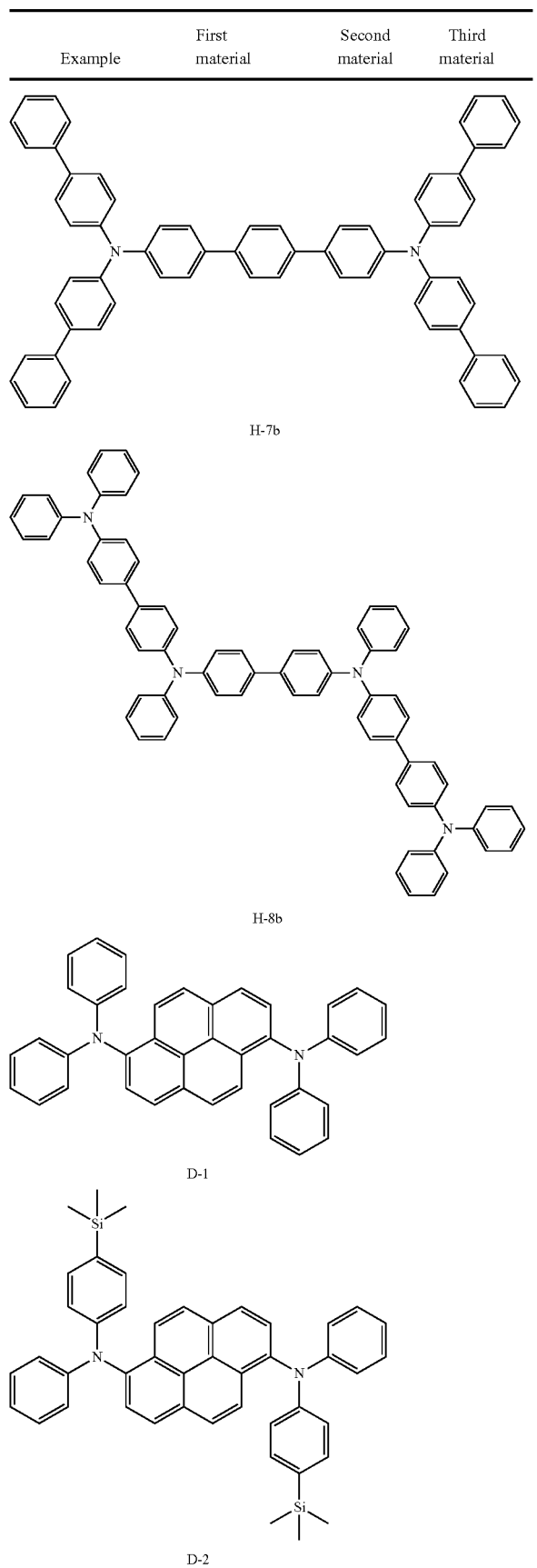
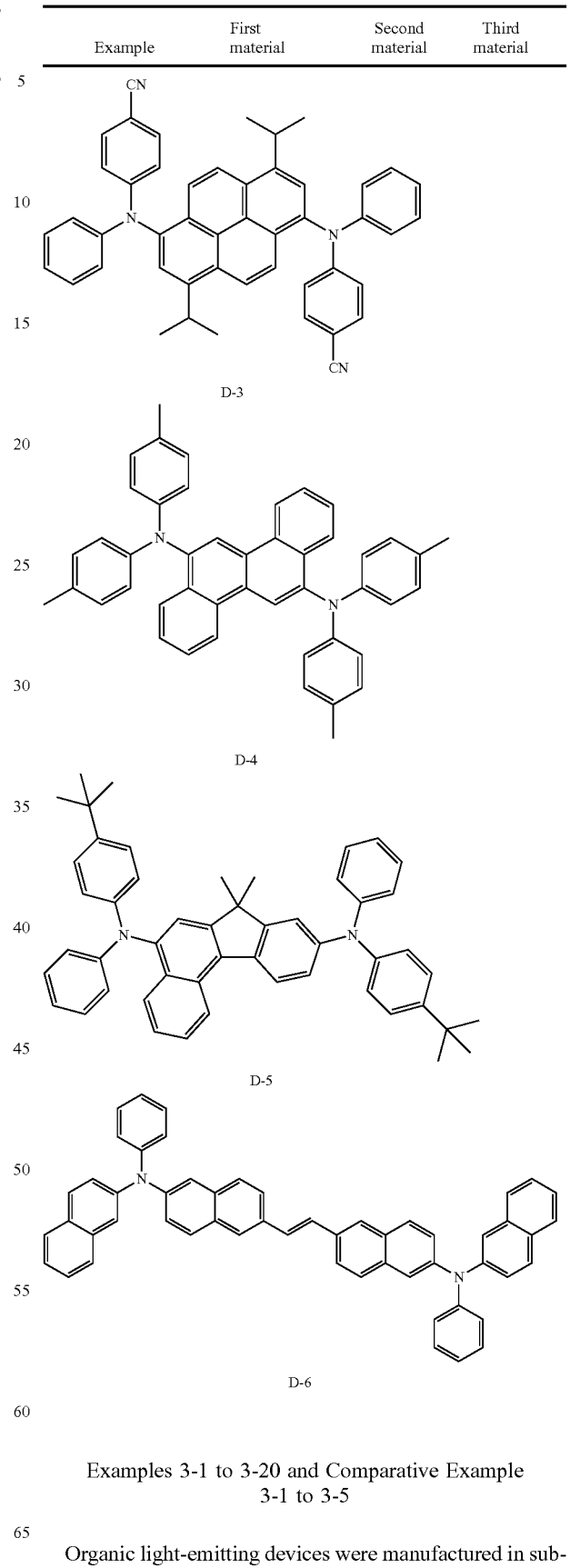
Examples 3-1 to 3-20 and Comparative Example 3-1 to 3-5
Organic light-emitting devices were manufactured in substantially the same manner as in Example 2-1, except that the first material, the second material, and the third material that were utilized to form the EML were varied as shown in Table 3.

TABLE 3

| Example | First material | Second material | Third material |
|---|---|---|---|
| Example 3-1 | H-1a | H-1b | D-2 |
| Example 3-2 | H-1a | H-3b | D-2 |
| Example 3-3 | H-1a | H-4b | D-2 |
| Example 3-4 | H-1a | H-6b | D-2 |
| Example 3-5 | H-1a | H-1b | D-3 |
| Example 3-6 | H-1a | H-3b | D-3 |
| Example 3-7 | H-1a | H-4b | D-3 |
| Example 3-8 | H-1a | H-6b | D-3 |
| Example 3-9 | H-1a | H-1b | D-4 |
| Example 3-10 | H-1a | H-3b | D-4 |
| Example 3-11 | H-1a | H-4b | D-4 |
| Example 3-12 | H-1a | H-6b | D-4 |
| Example 3-13 | H-1a | H-1b | D-5 |
| Example 3-14 | H-1a | H-3b | D-5 |
| Example 3-15 | H-1a | H-4b | D-5 |
| Example 3-16 | H-1a | H-6b | D-5 |
| Example 3-17 | H-1a | H-1b | D-6 |
| Example 3-18 | H-1a | H-3b | D-6 |
| Example 3-19 | H-1a | H-4b | D-6 |
| Example 3-20 | H-1a | H-6b | D-6 |
| Comparative Example 3-1 | Compound 1 | — | D-2 |
| Comparative Example 3-2 | Compound 1 | — | D-3 |
| Comparative Example 3-3 | Compound 1 | — | D-4 |
| Comparative Example 3-4 | Compound 1 | — | D-5 |
| Comparative Example 3-5 | Compound 1 | — | D-6 |

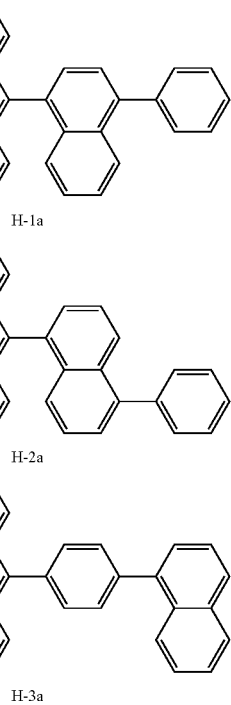

H-1a

H-2a

H-3a

H-4a

H-5a

H-6a

H-7a

H-8a

H-9a

TABLE 3-continued
| Example | First material | Second material | Third material |
|---|---|---|---|
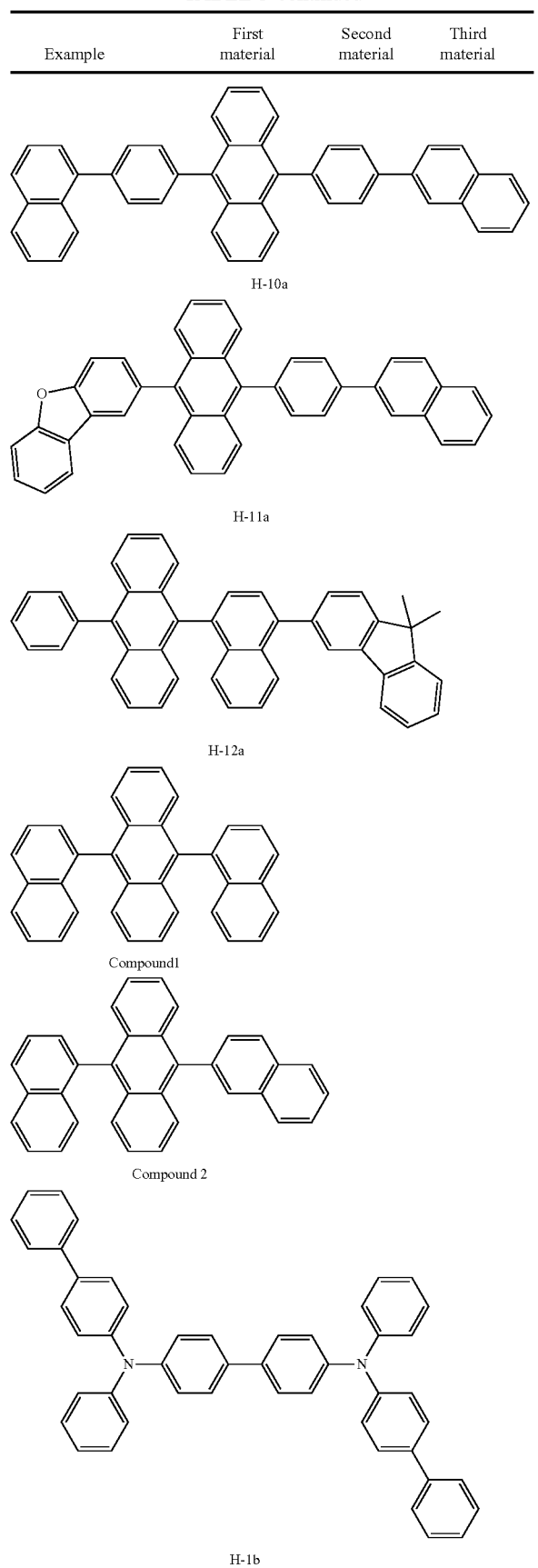
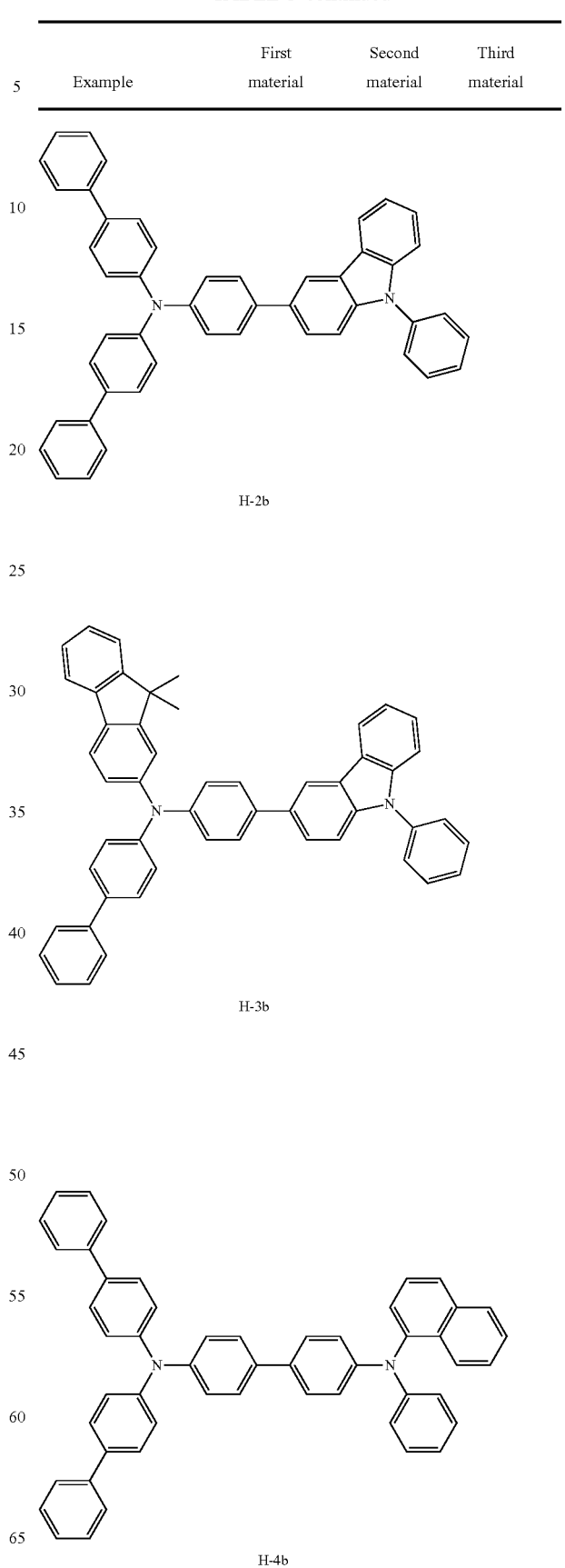

TABLE 3-continued
| Example | First material | Second material | Third material |
|---|---|---|---|
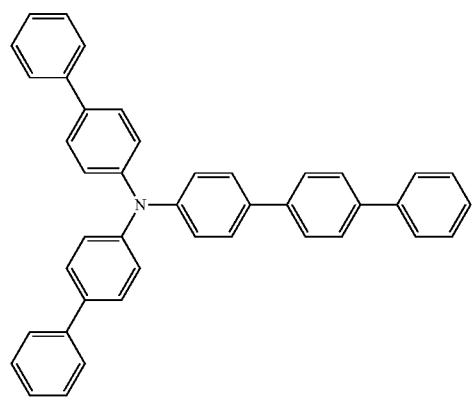
H-5b
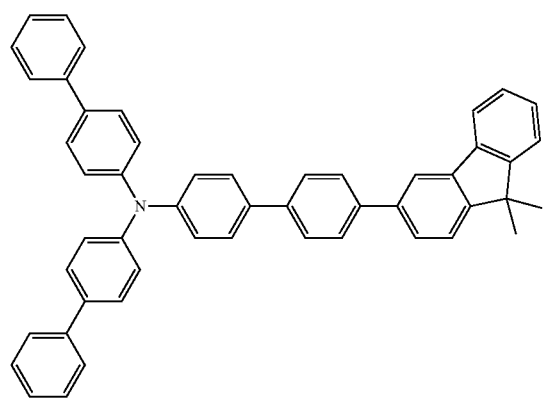
H-6b
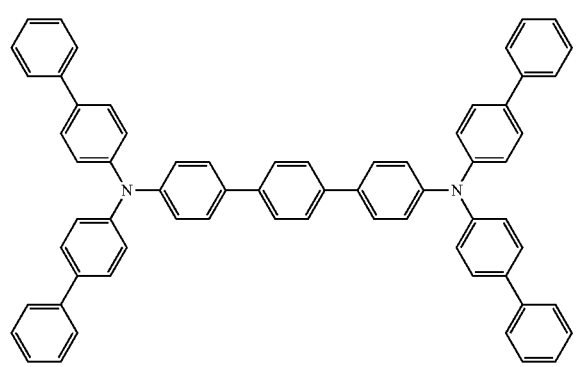
H-7b
TABLE 3-continued
| Example | First material | Second material | Third material |
|---|---|---|---|
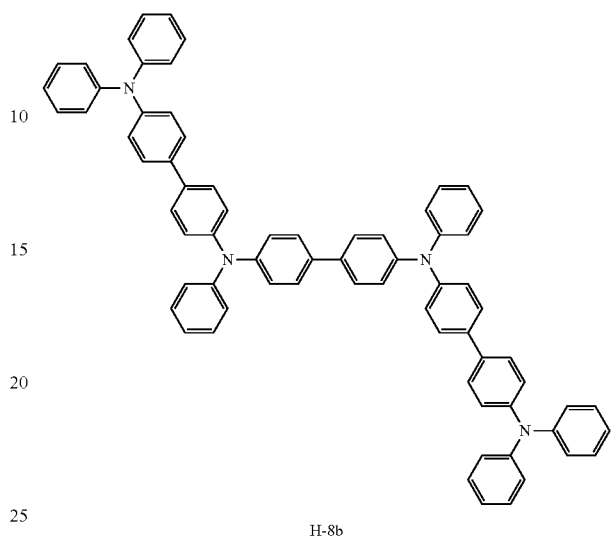
H-8b
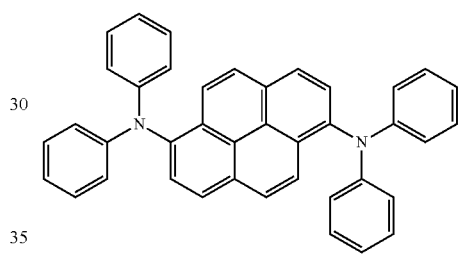
D-1
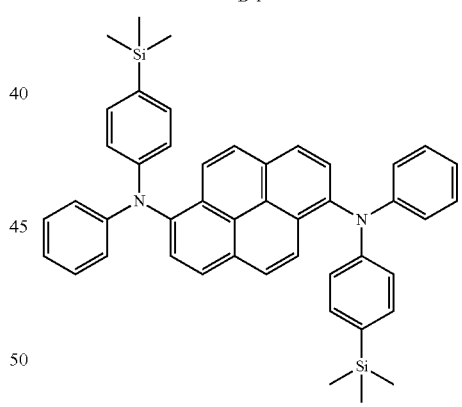
D-2
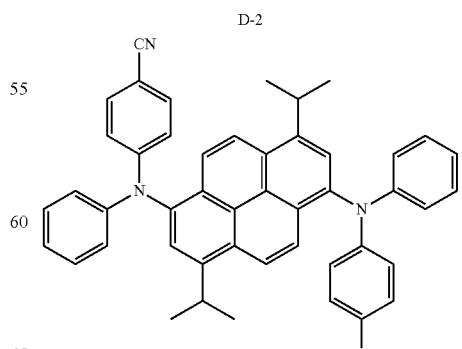
D-3

Evaluation Example 1

Efficiencies and lifetimes as $T_{90}$ of the organic light-emitting devices of Examples 1-1 to 1-6, Examples 2-1 to 2-31, Examples 3-1 to 3-20, Comparative Examples 1-1 to 1-5, Comparative Examples 2-1 to 2-5, and Comparative Examples 3-1 to 3-5 were evaluated utilizing an IVL measurement device (PhotoResearch PR650, Keithley 238). The results are shown in Tables 4 to 6. $T_{90}$ (at a current density of 50 mA/cm$^2$) refers to the time taken until a measured initial luminance (assumed as 100%) is reduced to 90% after operation.

TABLE 4

| Example | First material | Second material | Third material | Volume ratio (First material:Second material:Third material) | Efficiency (cd/A) | $T_{90}$ (hour) |
|---|---|---|---|---|---|---|
| Example 1-1 | H-1a | H-1b | D-1 | 94:3:3 | 5.2 | 130 |
| Example 1-2 | H-1a | H-1b | D-1 | 92:5:3 | 5.3 | 130 |
| Example 1-3 | H-1a | H-1b | D-1 | 87:10:3 | 5.1 | 100 |
| Example 1-4 | H-1a | H-1b | D-1 | 77:20:3 | 4.6 | 60 |
| Example 1-5 | H-1a | H-1b | D-1 | 47:50:3 | 4.4 | 50 |
| Example 1-6 | H-1a | H-1b | D-1 | 27:70:3 | 4.0 | 40 |
| Comparative Example 1-1 | H-1a | — | D-1 | 97:0:3 | 5.0 | 90 |
| Comparative Example 1-2 | — | H-1b | D-1 | 0:97:3 | 3.5 | 40 |
| Comparative Example 1-3 | Compound A | NPB | D-1 | 94:3:3 | 3.0 | 40 |
| Comparative Example 1-4 | Compound A | NPB | D-1 | 92:5:3 | 3.2 | 50 |
| Comparative Example 1-5 | Compound A | NPB | D-1 | 87:10:3 | 3.2 | 50 |

TABLE 5

| Example | First material | Second material | Third material | Efficiency (cd/A) | $T_{90}$ (hour) |
|---|---|---|---|---|---|
| Example 2-1 | H-1a | H-1b | D-1 | 5.3 | 130 |
| Example 2-2 | H-1a | H-2b | D-1 | 5.2 | 120 |
| Example 2-3 | H-1a | H-3b | D-1 | 5.4 | 110 |
| Example 2-4 | H-1a | H-4b | D-1 | 5.2 | 140 |
| Example 2-5 | H-1a | H-5b | D-1 | 5.3 | 130 |
| Example 2-6 | H-1a | H-6b | D-1 | 5.4 | 120 |
| Example 2-7 | H-1a | H-7b | D-1 | 5.2 | 130 |
| Example 2-8 | H-1a | H-8b | D-1 | 5.0 | 110 |
| Example 2-9 | H-2a | H-2b | D-1 | 5.2 | 120 |
| Example 2-10 | H-3a | H-2b | D-1 | 5.1 | 130 |
| Example 2-11 | H-4a | H-2b | D-1 | 5.2 | 120 |
| Example 2-12 | H-5a | H-2b | D-1 | 5.3 | 110 |
| Example 2-13 | H-6a | H-2b | D-1 | 5.1 | 120 |
| Example 2-14 | H-7a | H-2b | D-1 | 5.1 | 110 |
| Example 2-15 | H-8a | H-2b | D-1 | 5.2 | 110 |
| Example 2-16 | H-9a | H-2b | D-1 | 5.1 | 120 |
| Example 2-17 | H-10a | H-2b | D-1 | 5.0 | 120 |
| Example 2-18 | H-11a | H-2b | D-1 | 5.2 | 110 |
| Example 2-19 | H-12a | H-2b | D-1 | 5.3 | 110 |
| Example 2-20 | H-3a | H-3b | D-1 | 5.2 | 130 |
| Example 2-21 | H-5a | H-3b | D-1 | 5.4 | 110 |
| Example 2-22 | H-7a | H-3b | D-1 | 5.2 | 120 |
| Example 2-23 | H-12a | H-3b | D-1 | 5.3 | 110 |
| Example 2-24 | H-3a | H-4b | D-1 | 5.2 | 130 |
| Example 2-25 | H-5a | H-4b | D-1 | 5.3 | 110 |
| Example 2-26 | H-7a | H-4b | D-1 | 5.1 | 120 |
| Example 2-27 | H-12a | H-4b | D-1 | 5.2 | 120 |
| Example 2-28 | H-3a | H-6b | D-1 | 5.3 | 130 |
| Example 2-29 | H-5a | H-6b | D-1 | 5.3 | 110 |
| Example 2-30 | H-7a | H-6b | D-1 | 5.1 | 120 |
| Example 2-31 | H-12a | H-6b | D-1 | 5.2 | 120 |
| Comparative Example 2-1 | Compound 1 | — | D-1 | 4.5 | 40 |
| Comparative Example 2-2 | Compound 2 | — | D-1 | 4.6 | 50 |
| Comparative Example 2-3 | — | H-1b | D-1 | 3.5 | 40 |
| Comparative Example 2-4 | Compound 1 | H-1b | D-1 | 4.4 | 90 |
| Comparative Example 2-5 | Compound A | NPB | D-1 | 3.2 | 50 |

TABLE 6

| Example | First material | Second material | Third material | Efficiency (cd/A) | $T_{90}$ (hour) |
|---|---|---|---|---|---|
| Example 3-1 | H-1a | H-1b | D-2 | 5.3 | 120 |
| Example 3-2 | H-1a | H-3b | D-2 | 5.5 | 120 |
| Example 3-3 | H-1a | H-4b | D-2 | 5.1 | 130 |
| Example 3-4 | H-1a | H-6b | D-2 | 5.4 | 120 |
| Example 3-5 | H-1a | H-1b | D-3 | 5.3 | 110 |
| Example 3-6 | H-1a | H-3b | D-3 | 5.4 | 110 |
| Example 3-7 | H-1a | H-4b | D-3 | 5.2 | 130 |
| Example 3-8 | H-1a | H-6b | D-3 | 5.3 | 130 |
| Example 3-9 | H-1a | H-1b | D-4 | 5.1 | 120 |
| Example 3-10 | H-1a | H-3b | D-4 | 5.2 | 110 |
| Example 3-11 | H-1a | H-4b | D-4 | 5.1 | 130 |
| Example 3-12 | H-1a | H-6b | D-4 | 5.3 | 110 |
| Example 3-13 | H-1a | H-1b | D-5 | 5.4 | 140 |
| Example 3-14 | H-1a | H-3b | D-5 | 5.5 | 130 |
| Example 3-15 | H-1a | H-4b | D-5 | 5.3 | 130 |
| Example 3-16 | H-1a | H-6b | D-5 | 5.5 | 130 |
| Example 3-17 | H-1a | H-1b | D-6 | 5.0 | 100 |
| Example 3-18 | H-1a | H-3b | D-6 | 5.1 | 120 |
| Example 3-19 | H-1a | H-4b | D-6 | 5.0 | 130 |
| Example 3-20 | H-1a | H-6b | D-6 | 5.2 | 110 |
| Comparative Example 3-1 | Compound1 | — | D-2 | 4.5 | 50 |
| Comparative Example 3-2 | Compound1 | — | D-3 | 4.6 | 60 |
| Comparative Example 3-3 | Compound1 | — | D-4 | 4.4 | 50 |
| Comparative Example 3-4 | Compound1 | — | D-5 | 4.4 | 50 |
| Comparative Example 3-5 | Compound1 | — | D-6 | 4.3 | 60 |

Referring to Table 4, the organic light-emitting devices of Examples 1-1 to 1-6 were found to have improved efficiencies and improved lifetime characteristics, compared to the organic light-emitting devices of Comparative Examples 1-1 to 1-5.

Referring to Table 5, the organic light-emitting devices of Examples 2-1 to 2-31 were found to have improved efficiencies and improved lifetime characteristics, compared to the organic light-emitting devices of Comparative Examples 2-1 to 2-5.

Referring to Table 6, the organic light-emitting devices of Example 3-1 to 3-20 were found to have improved efficiencies and improved lifetime characteristics, compared to the organic light-emitting devices of Comparative Examples 3-1 to 3-5.

As described above, according to the one or more of the above embodiments of the present disclosure, an organic light-emitting device with an emission layer that includes a first material of Formula 1, a second material of Formula 2, and a third material of Formula 8 may have improved efficiency and improved lifetime characteristics.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the FIGURE, it will be understood by those of ordinary skill in the art that various changes in form and details may be made therein without departing from the spirit and scope of the present disclosure as defined by the following claims, and equivalents thereof.

What is claimed is:

1. An organic light-emitting device comprising:
a first electrode;
a second electrode facing the first electrode; and
an organic layer between the first electrode and the second electrode and comprising an emission layer,
wherein the emission layer comprises a first material represented by Formula 1, a second material represented by Formula 2, and a third material different from the second material and represented by Formula 8:

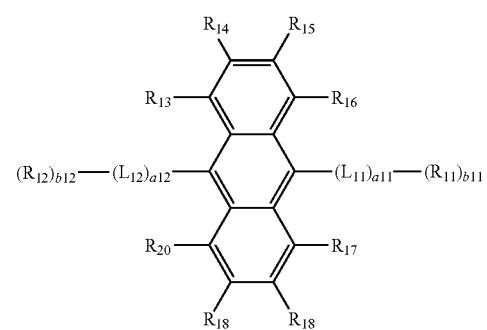

Formula 1

Formula 2

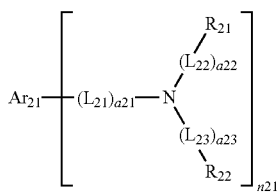

Formula 8

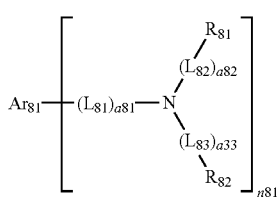

wherein, in Formulae 1, 2 and 8, $L_{11}$ and $L_{12}$ are each independently selected from a substituted or unsubstituted $C_6$-$C_{60}$ arylene group, and a substituted or unsubstituted $C_1$-$C_{60}$ heteroarylene group;

a11 and a12 are each independently selected from 0, 1, 2, and 3;

$R_{11}$ and $R_{12}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b11 and b12 are each independently selected from 1, 2, and 3;

$R_{13}$ to $R_{20}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

$Ar_{21}$ is selected from a mono, di, or tri-valent substituted or unsubstituted $C_6$-$C_{60}$ arene and a mono, di, or tri-valent substituted or unsubstituted non-aromatic condensed polycycle, a valency of the $C_6$-$C_{60}$ arene and the non-aromatic condensed polycycle corresponding to a value of n21;

$L_{21}$ to $L_{23}$ are each independently selected from a substituted or unsubstituted $C_6$-$C_{60}$ arylene group, and a substituted or unsubstituted $C_1$-$C_{60}$ heteroarylene group;

a21 to a23 are each independently selected from 0, 1, 2, and 3;

$R_{21}$ and $R_{22}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

n21 is selected from 1, 2, and 3;

$Ar_{81}$ is selected from a mono, di, or tri-valent substituted or unsubstituted $C_6$-$C_{60}$ arene, a mono, di, or tri-valent substituted or unsubstituted non-aromatic condensed polycycle, a mono, di, or tri-valent substituted or unsubstituted non-aromatic condensed heteropolycycle, and a mono, di, or tri-valent substituted or unsubstituted $C_2$-$C_{60}$ alkene, a valency of the $C_6$-$C_{60}$ arene, the non-aromatic condensed polycycle, the non-aromatic condensed heteropolycycle, and the $C_2$-$C_{60}$ alkene corresponding to a value of n81;

$L_{81}$ to $L_{83}$ are each independently selected from a substituted or unsubstituted $C_6$-$C_{60}$ arylene group, and a substituted or unsubstituted $C_1$-$C_{60}$ heteroarylene group;

a81 to a83 are each independently selected from 0, 1, 2, and 3;

$R_{81}$ and $R_{82}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; and n81 is selected from 1, 2, and 3, wherein at least one substituent of the substituted $C_6$-$C_{60}$ arene, the substituted non-aromatic condensed polycycle, the substituted non-aromatic condensed heteropolycycle, the substituted $C_2$-$C_{60}$ alkene, the substituted $C_6$-$C_{60}$ arylene group, the substituted $C_1$-$C_{60}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$); —N($Q_{34}$)($Q_{35}$); and —B($Q_{36}$)($Q_{37}$), wherein $Q_1$ to $Q_3$, $Q_{11}$ to $Q_{17}$, $Q_{21}$ to $Q_{27}$, and $Q_{31}$ to $Q_{37}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein $L_{11}$, $L_{12}$, $L_{21}$ to $L_{23}$, and $L_{81}$ to $L_{83}$ are each independently selected from groups represented by Formulae 3-1 to 3-15:

3-1
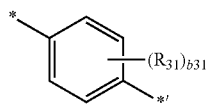

3-2
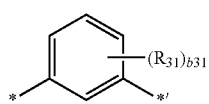

3-3
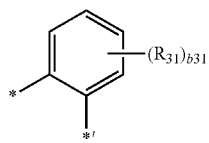

3-4
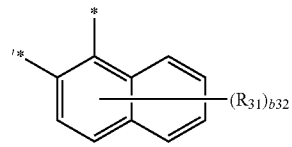

3-5
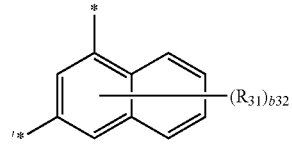

3-6
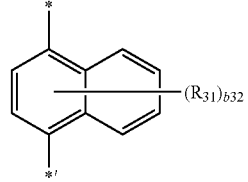

3-7
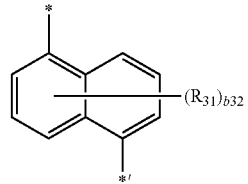

3-8
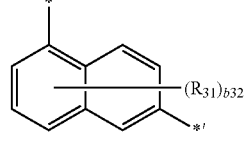

3-9
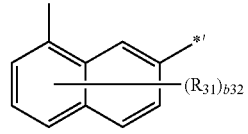

3-10
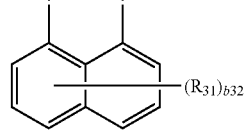

3-11
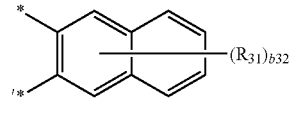

3-12
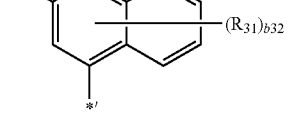

3-13
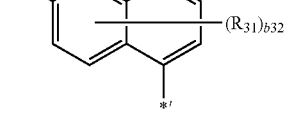

-continued 3-14

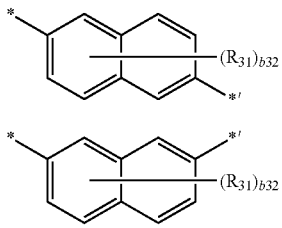

3-15 wherein, in Formulae 3-1 to 3-15,
R$_{31}$ is selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a phenyl group, and a naphthyl group;
b31 is selected from 1, 2, 3, and 4;
b32 is selected from 1, 2, 3, 4, 5, and 6; and
* and *' are binding sites with an adjacent atom.

3. The organic light-emitting device of claim 1, wherein R$_{11}$ and R$_{12}$ are each independently selected from:
a phenyl group; a naphthyl group; a fluorenyl group; a phenanthrenyl group; an anthracenyl group; a dibenzofuranyl group; and a dibenzothiophenyl group; and
a phenyl group, a naphthyl group, a fluorenyl group, a phenanthrenyl group, an anthracenyl group, a dibenzofuranyl group, and a dibenzothiophenyl group, each substituted with at least one of a methyl group, an ethyl group, an n-propyl group, an iso-propyl group, an n-butyl group, a sec-butyl group, an iso-butyl group, a tert-butyl group, a phenyl group, and a naphthyl group.

4. The organic light-emitting device of claim 1, wherein R$_{11}$ and R$_{12}$ are each independently selected from groups represented by Formulae 5-1 to 5-26:

5-1

5-2

5-3

5-4

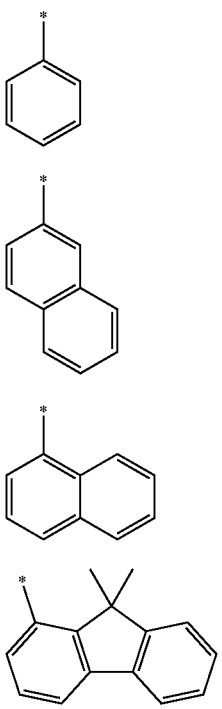

5-5

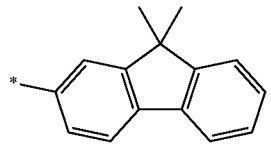

5-6

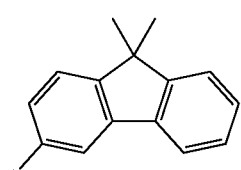

5-7

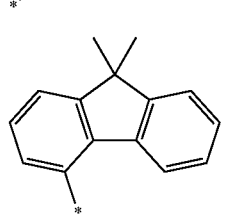

5-8

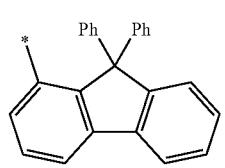

5-9

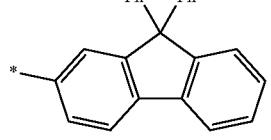

5-10

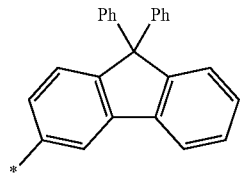

5-11

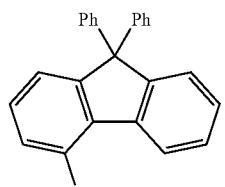

5-12

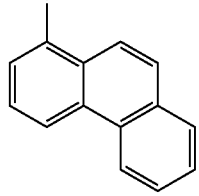

5-13

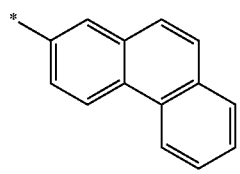

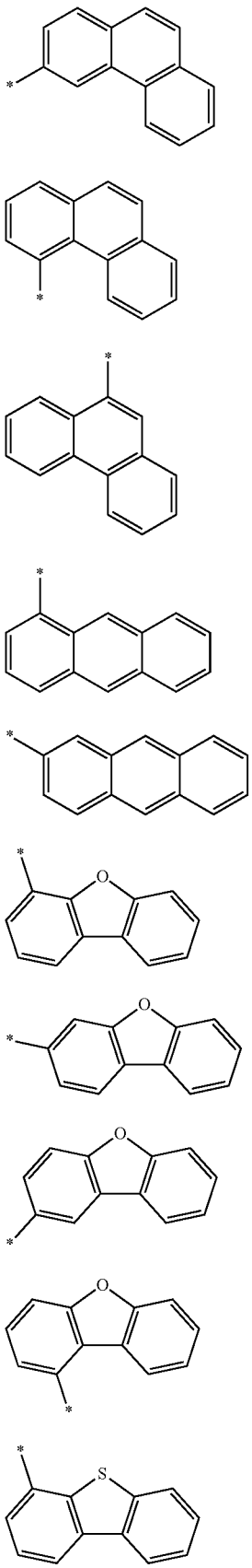

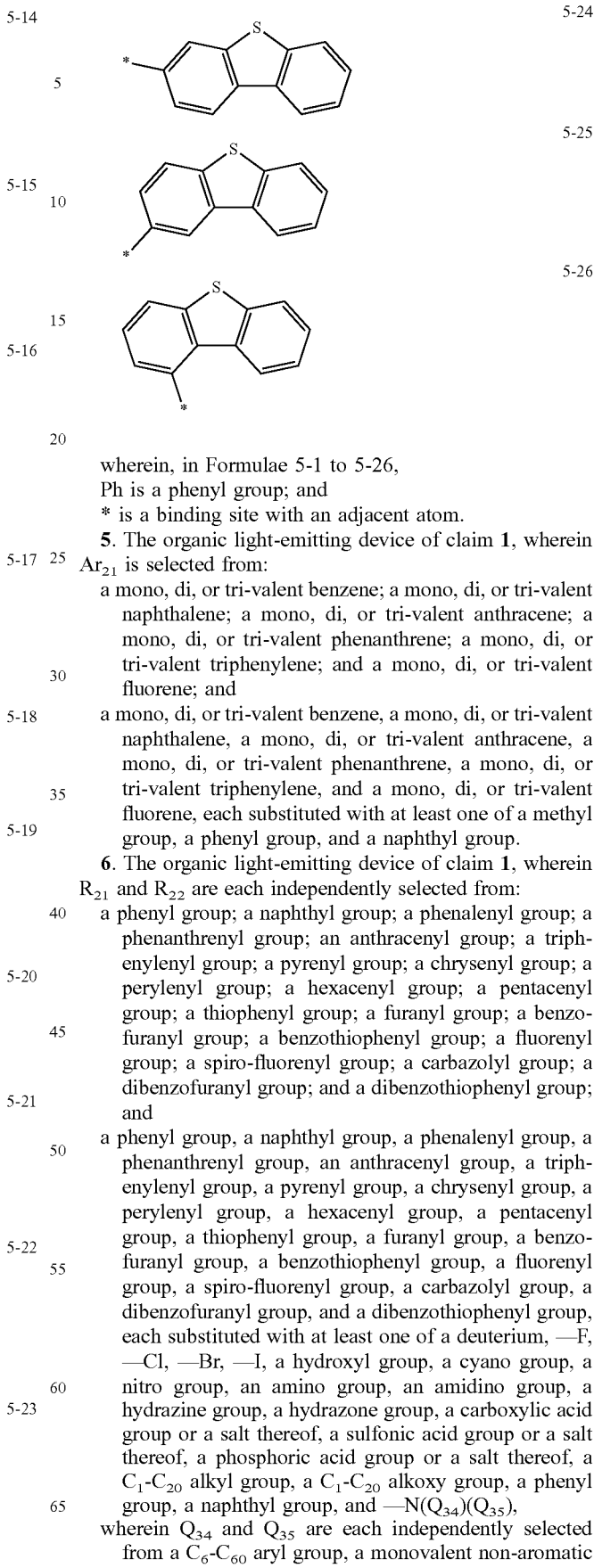

wherein, in Formulae 5-1 to 5-26,
Ph is a phenyl group; and
* is a binding site with an adjacent atom.

5. The organic light-emitting device of claim 1, wherein $Ar_{21}$ is selected from:
a mono, di, or tri-valent benzene; a mono, di, or tri-valent naphthalene; a mono, di, or tri-valent anthracene; a mono, di, or tri-valent phenanthrene; a mono, di, or tri-valent triphenylene; and a mono, di, or tri-valent fluorene; and
a mono, di, or tri-valent benzene, a mono, di, or tri-valent naphthalene, a mono, di, or tri-valent anthracene, a mono, di, or tri-valent phenanthrene, a mono, di, or tri-valent triphenylene, and a mono, di, or tri-valent fluorene, each substituted with at least one of a methyl group, a phenyl group, and a naphthyl group.

6. The organic light-emitting device of claim 1, wherein $R_{21}$ and $R_{22}$ are each independently selected from:
a phenyl group; a naphthyl group; a phenalenyl group; a phenanthrenyl group; an anthracenyl group; a triphenylenyl group; a pyrenyl group; a chrysenyl group; a perylenyl group; a hexacenyl group; a pentacenyl group; a thiophenyl group; a furanyl group; a benzofuranyl group; a benzothiophenyl group; a fluorenyl group; a spiro-fluorenyl group; a carbazolyl group; a dibenzofuranyl group; and a dibenzothiophenyl group; and
a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a thiophenyl group, a furanyl group, a benzofuranyl group, a benzothiophenyl group, a fluorenyl group, a spiro-fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and —N($Q_{34}$)($Q_{35}$),
wherein $Q_{34}$ and $Q_{35}$ are each independently selected from a $C_6$-$C_{60}$ aryl group, a monovalent non-aromatic condensed polycyclic group, and a monovalent non-aromatic condensed heteropolycyclic group.
7. The organic light-emitting device of claim 1, wherein $R_{21}$ and $R_{22}$ are each independently selected from groups represented by Formulae 6-1 to 6-49:
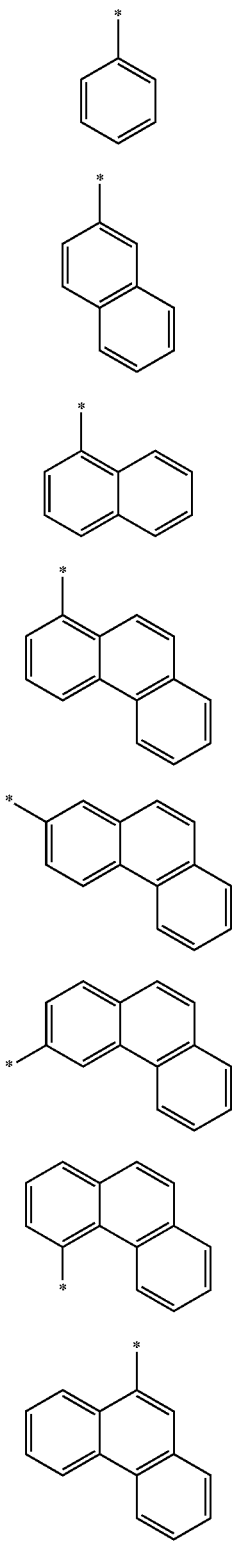
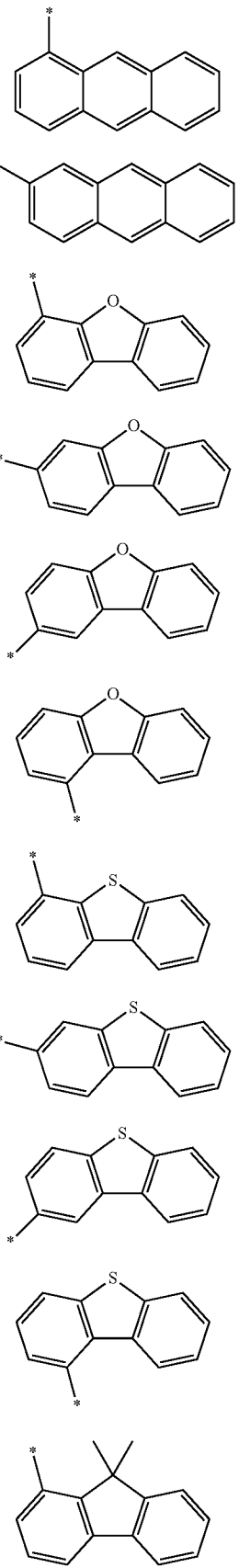

6-20 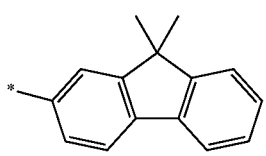
6-21 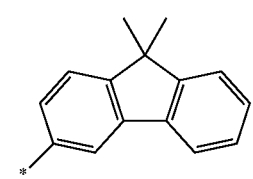
6-22 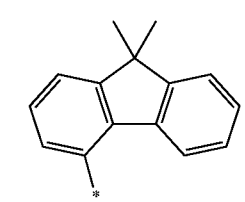
6-23 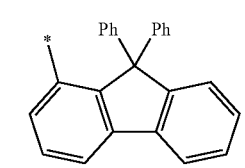
6-24 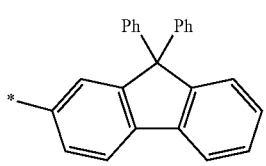
6-25 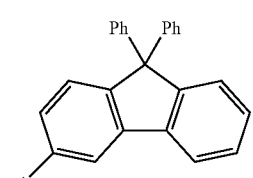
6-26 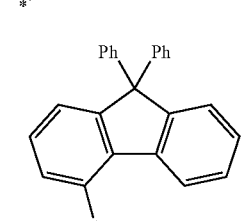
6-27 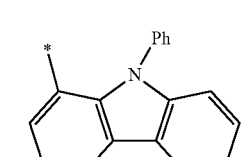
6-28 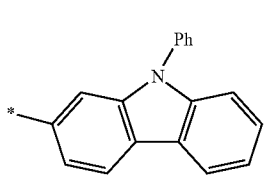
6-29 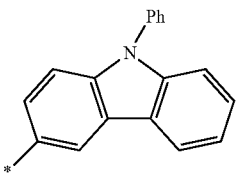
6-30 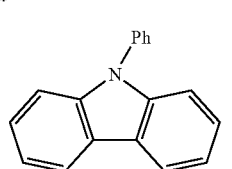
6-31 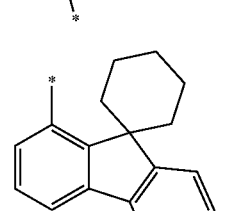
6-32 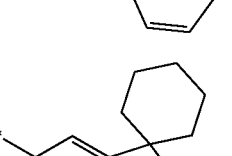
6-33 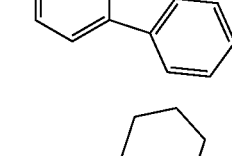
6-34 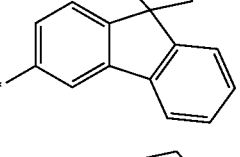
6-35 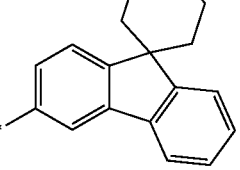
6-36 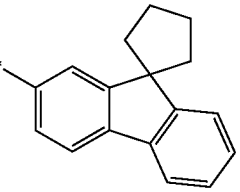
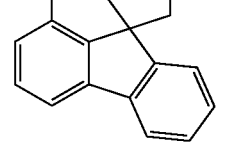

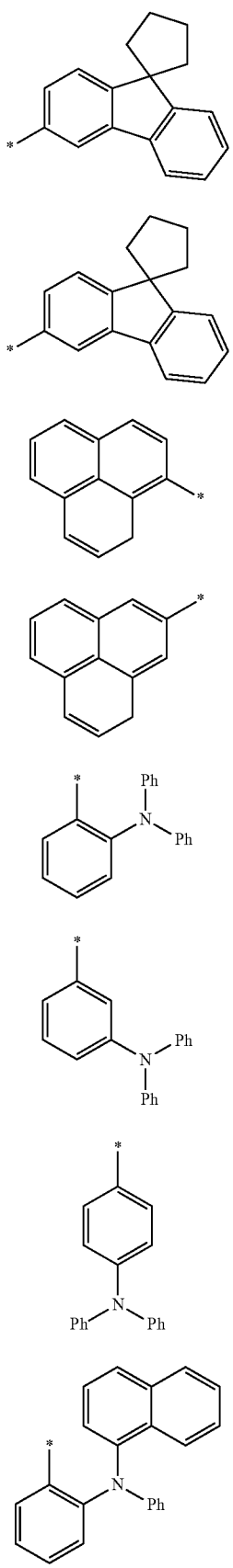

wherein, in Formulae 6-1 to 6-49,
Ph is a phenyl group; and
* is a binding site with an adjacent atom.

8. The organic light-emitting device of claim 1, wherein n21 is selected from 1 and 2.

9. The organic light-emitting device of claim 1, wherein Ar$_{81}$ is selected from:
a mono, di, or tri-valent anthracene; a mono, di, or tri-valent fluoranthene; a mono, di, or tri-valent triphenylene; a mono, di, or tri-valent pyrene; a mono, di, or tri-valent chrysene; a mono, di, or tri-valent perylene; a mono, di, or tri-valent hexacene; a mono, di, or tri-valent pentacene; a mono, di, or tri-valent fluorene; a mono, di, or tri-valent benzofluorene; a mono, di, or tri-valent dibenzofluorene; a mono, di, or tri-valent indenophenanthrene; a mono, di, or tri-valent dibenzofuran; a mono, di, or tri-valent dibenzothiophene; a mono, di, or tri-valent benzonaphthofuran; a mono, di, or tri-valent benzonaphthothiophene; and a mono, di, or tri-valent ethene; and a mono, di, or tri-valent anthracene, a mono, di, or tri-valent fluoranthene, a mono, di, or tri-valent triphenylene, a mono, di, or tri-valent pyrene, a mono, di, or tri-valent chrysene, a mono, di, or tri-valent perylene, a mono, di, or tri-valent hexacene, a mono, di, or tri-valent pentacene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene, each substituted with at least one of a deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, and —Si($Q_{31}$)($Q_{32}$)($Q_{33}$), wherein $Q_{31}$ to $Q_{33}$ are each independently selected from a $C_1$-$C_{60}$ alkyl group and a $C_6$-$C_{60}$ aryl group.

10. The organic light-emitting device of claim 1, wherein $Ar_{81}$ is selected from:

a mono, di, or tri-valent anthracene; a mono, di, or tri-valent pyrene; a mono, di, or tri-valent chrysene; a mono, di, or tri-valent fluorene; a mono, di, or tri-valent benzofluorene; a mono, di, or tri-valent dibenzofluorene; a mono, di, or tri-valent indenophenanthrene; a mono, di, or tri-valent dibenzofuran; a mono, di, or tri-valent dibenzothiophene; a mono, di, or tri-valent benzonaphthofuran; a mono, di, or tri-valent benzonaphthothiophene; and a mono, di, or tri-valent ethene; and a mono, di, or tri-valent anthracene, a mono, di, or tri-valent pyrene, a mono, di, or tri-valent chrysene, a mono, di, or tri-valent fluorene, a mono, di, or tri-valent benzofluorene, a mono, di, or tri-valent dibenzofluorene, a mono, di, or tri-valent indenophenanthrene, a mono, di, or tri-valent dibenzofuran, a mono, di, or tri-valent dibenzothiophene, a mono, di, or tri-valent benzonaphthofuran, a mono, di, or tri-valent benzonaphthothiophene, and a mono, di, or tri-valent ethene, each substituted with at least one of a deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a naphthyl group, a pyridinyl group and —Si($Q_{31}$)($Q_{32}$)($Q_{33}$), wherein $Q_{31}$ to $Q_{33}$ are each independently selected from a methyl group, an ethyl group, an n-propyl group, an iso-propyl group, and a phenyl group.

11. The organic light-emitting device of claim 1, wherein $R_{81}$ and $R_{82}$ are each independently selected from:

a phenyl group; a naphthyl group; a phenalenyl group; a phenanthrenyl group; an anthracenyl group; a triphenylenyl group; a pyrenyl group; a chrysenyl group; a perylenyl group; a hexacenyl group; a pentacenyl group; a pyrrolyl group; a thiophenyl group; a furanyl group; an imidazolyl group; a pyridinyl group; a pyrazinyl group; a pyrimidinyl group; an indolyl group; a quinolinyl group; an isoquinolinyl group; a benzoquinolinyl group; a phthalazinyl group; a naphthyridinyl group; a quinoxalinyl group; a quinazolinyl group; a phenanthridinyl group; an acridinyl group; a phenanthrolinyl group; a phenazinyl group; a benzimidazolyl group; a benzofuranyl group; a benzothiophenyl group; a triazolyl group; a triazinyl group; a fluorenyl group; a benzofluorenyl group; a spiro-fluorenyl group; a carbazolyl group; a benzocarbazolyl group; a dibenzofuranyl group; and a dibenzothiophenyl group; and a phenyl group, a naphthyl group, a phenalenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyridinyl group, a pyrazinyl group, a pyrimidinyl group, an indolyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a fluorenyl group, a benzofluorenyl group, a spiro-fluorenyl group, a carbazolyl group, a benzocarbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —Si($Q_{31}$)($Q_{32}$)($Q_{33}$), wherein $Q_{31}$ to $Q_{33}$ are each independently selected from a $C_1$-$C_{20}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

12. The organic light-emitting device of claim 1, wherein $R_{81}$ and $R_{82}$ are each independently selected from:

a phenyl group; a naphthyl group; a fluorenyl group; a carbazolyl group; a dibenzofuranyl group; and a dibenzothiophenyl group; and a phenyl group, a naphthyl group, a fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and —Si($Q_{31}$)($Q_{32}$)($Q_{33}$), wherein $Q_{31}$ to $Q_{33}$ are each independently selected from a $C_1$-$C_{20}$ alkyl group and a $C_6$-$C_{60}$ aryl group.

13. The organic light-emitting device of claim 1, wherein n81 is 2.

14. The organic light-emitting device of claim 1, wherein the first material is represented by Formula 1-11:

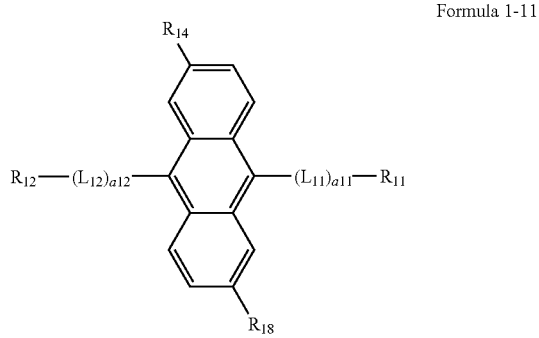

Formula 1-11 wherein, in Formula 1-11,
a11 and a12 are each independently selected from 0 and 1.

15. The organic light-emitting device of claim 1, wherein the second material is represented by one of Formulae 2-1 and 2-2:

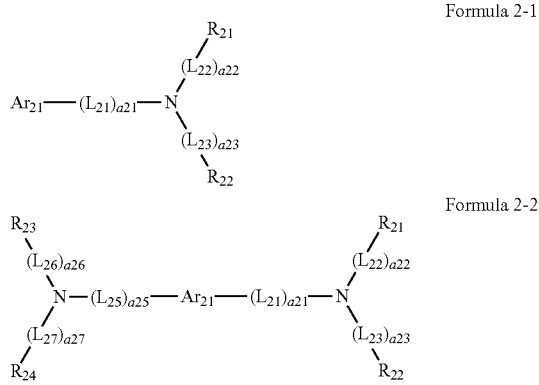

Formula 2-1

Formula 2-2 wherein, in Formulae 2-1 and 2-2,
$L_{25}$ to $L_{27}$ are each independently selected from a substituted or unsubstituted $C_6$-$C_{60}$ arylene group, and a substituted or unsubstituted $C_1$-$C_{60}$ heteroarylene group;
a25 to a27 are each independently selected from 0, 1, 2, and 3; and
$R_{23}$ and $R_{24}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

16. The organic light-emitting device of claim 1, wherein the third material is represented by one of Formulae 8-11 and 8-12:

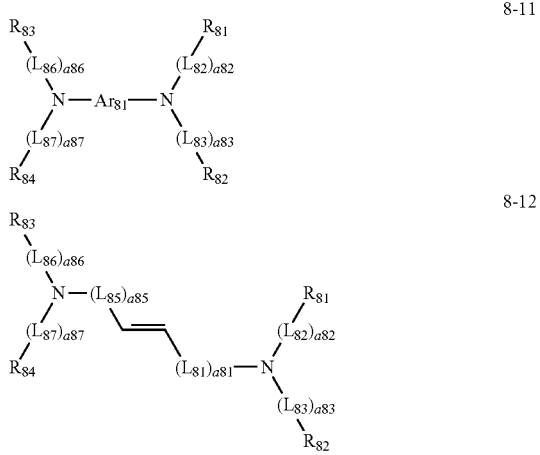

8-11

8-12 wherein, in Formulae 8-11 and 8-12,
$L_{85}$ to $L_{87}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;
a85 to a87 are each independently selected from 0, 1, 2, and 3; and
$R_{83}$ and $R_{84}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

17. The organic light-emitting device of claim 1, wherein the third material is a fluorescent dopant.

18. The organic light-emitting device of claim 1, wherein the third material has a maximum emission wavelength of about 400 nm to about 550 nm.

19. The organic light-emitting device of claim 1, wherein the organic light-emitting device comprises one or more subpixels; and each subpixel comprises a single emission layer.

20. The organic light-emitting device of claim 1, wherein the organic light-emitting device further comprises a hole transport region and an electron transport region; and stacked upon one another in an order of the first electrode, the hole transport region, the emission layer, the electron transport region, and the second electrode.

* * * * *